United States Patent
Kawasaki et al.

(10) Patent No.: US 6,498,524 B1
(45) Date of Patent: Dec. 24, 2002

(54) INPUT/OUTPUT DATA SYNCHRONIZING DEVICE

(75) Inventors: Kenichi Kawasaki, Kawasaki (JP); Yasuharu Sato, Kawasaki (JP); Terumasa Kitahara, Kawasaki (JP); Masao Nakano, Kawasaki (JP); Masao Taguchi, Kawasaki (JP); Yoshihiro Takemae, Kawasaki (JP); Yasurou Matsuzaki, Kawasaki (JP); Koichi Nishimura, Kawasaki (JP); Yoshinori Okajima, Kawasaki (JP); Naoharu Shinozaki, Kawasaki (JP); Hiroko Douchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/706,731

(22) Filed: Nov. 7, 2000

Related U.S. Application Data

(62) Division of application No. 09/448,432, filed on Nov. 24, 1999, now Pat. No. 6,201,423, which is a division of application No. 08/892,790, filed on Jul. 15, 1997, now Pat. No. 6,298,004.

(30) Foreign Application Priority Data

Aug. 13, 1996 (JP) .............................. 8-213882
Dec. 19, 1996 (JP) .............................. 8-339988
Apr. 8, 1997 (JP) .............................. 9-89516

(51) Int. Cl.⁷ .............................................. H03L 7/08
(52) U.S. Cl. ...................................... 327/158; 327/161
(58) Field of Search .............................. 327/158, 159, 327/161, 393, 276; 365/233

(56) References Cited

U.S. PATENT DOCUMENTS

| | | | |
|---|---|---|---|
| 4,100,541 A | 7/1978 | Quesnell, Jr. | 341/70 |
| 4,739,231 A * | 4/1988 | Miyata et al. | 318/369 |
| 5,060,145 A | 10/1991 | Scheuneman et al. | 365/189.04 |
| 5,260,608 A | 11/1993 | Marbot | 327/261 |
| 5,262,865 A * | 11/1993 | Herz | 348/705 |

(List continued on next page.)

FOREIGN PATENT DOCUMENTS

| | | | |
|---|---|---|---|
| EP | 0 127 508 | 12/1984 | G06F/9/38 |
| EP | 0445 574 A2 | 9/1991 | G06F/1/10 |
| EP | 0463 641 A2 | 1/1992 | G06F/1/04 |
| EP | 0 639 003 | 2/1995 | H03K/5/13 |
| EP | 0 647 025 | 4/1995 | H03K/5/13 |

(List continued on next page.)

Primary Examiner—Timothy P. Callahan
Assistant Examiner—Terry L. Englund
(74) Attorney, Agent, or Firm—Arent Fox Kintner Plotkin & Kahn PLLC

(57) ABSTRACT

Disclosed is a semiconductor device for outputting an output signal with a given phase held relative to an external clock despite a difference in characteristic, a change in temperature, and a fluctuation in supply voltage. The semiconductor device comprises an input circuit for inputting the external clock and outputting a reference signal, an output circuit for receiving an output timing signal and outputting an output signal according to the timing of the output timing signal, and an output timing control circuit for controlling the output timing so that the output signal exhibits a given phase relative to the external clock. The output timing control circuit includes a delay circuit for delaying the reference signal by a specified magnitude and generating an output timing signal, a phase comparison circuit for comparing the phase of the output timing signal with the phase of the reference signal, and a delay control circuit for specifying the magnitude of a delay to be produced by the delay circuit according to the result of comparison performed by the phase comparison circuit.

1 Claim, 88 Drawing Sheets

U.S. PATENT DOCUMENTS

| | | | |
|---|---|---|---|
| 5,287,025 A | 2/1994 | Nishimichi | 327/156 |
| 5,355,037 A | 10/1994 | Andresen et al. | 327/158 |
| 5,402,389 A | 3/1995 | Flannagan et al. | 365/233 |
| 5,440,514 A | 8/1995 | Flannagan et al. | 327/158 |
| 5,440,515 A | 8/1995 | Chang et al. | 327/271 |
| 5,479,128 A | 12/1995 | Jan et al. | 327/270 |
| 5,514,990 A | 5/1996 | Mukaine et al. | 327/116 |
| 5,528,200 A | 6/1996 | Yamauchi et al. | 331/45 |
| 5,544,203 A | 8/1996 | Casasanta et al. | 327/149 |
| 5,548,235 A | 8/1996 | Marbot | 327/158 |
| 5,554,949 A | 9/1996 | Suwald | 327/276 |
| 5,610,543 A | 3/1997 | Chang et al. | 327/158 |
| 5,670,895 A * | 9/1997 | Kazarian et al. | 326/39 |
| 5,708,611 A | 1/1998 | Iwamoto et al. | 365/195 |
| 5,740,123 A | 4/1998 | Uchida | 365/233 |
| 5,818,769 A | 10/1998 | Tweed et al. | 365/194 |
| 5,822,255 A | 10/1998 | Uchida | 365/194 |
| 5,991,232 A * | 11/1999 | Matsumura et al. | 365/233 |
| 6,252,441 B1 * | 6/2001 | Lee et al. | 327/141 |

FOREIGN PATENT DOCUMENTS

| | | | |
|---|---|---|---|
| GB | 1 338 776 | 11/1973 | H03B/3/04 |
| GB | 2 129 634 A | 5/1984 | H03L/7/00 |
| GB | 2243060 | 10/1991 | G06F/13/38 |
| GB | 2 246 004 | 1/1992 | G11C/7/00 |
| GB | 2 251 994 | 7/1992 | H03K/5/14 |
| GB | 2 304 435 | 3/1997 | G11C/7/00 |
| JP | 3-217919 | 9/1991 | G06F/1/12 |
| WO | 94/29870 | 12/1994 | G11C/7/00 |

\* cited by examiner

Fig. 47

| STATE | RG0 | RG1 | RG2 | UP/DOWN | HOLD | OPERATION |
|---|---|---|---|---|---|---|
| 1 | H | H | H | H | L | NO CHANGE |
| 2 | L | L | L | H | L | NO CHANGE |
| 3 | H | H | L | L | H | DELAY IS DECREASED. |
| 4 | H | L | L | H | H | DELAY IS INCREASED. |
| 5 | L | L | H | L | H | DELAY IS DECREASED. |
| 6 | L | H | H | H | H | DELAY IS INCREASED. |

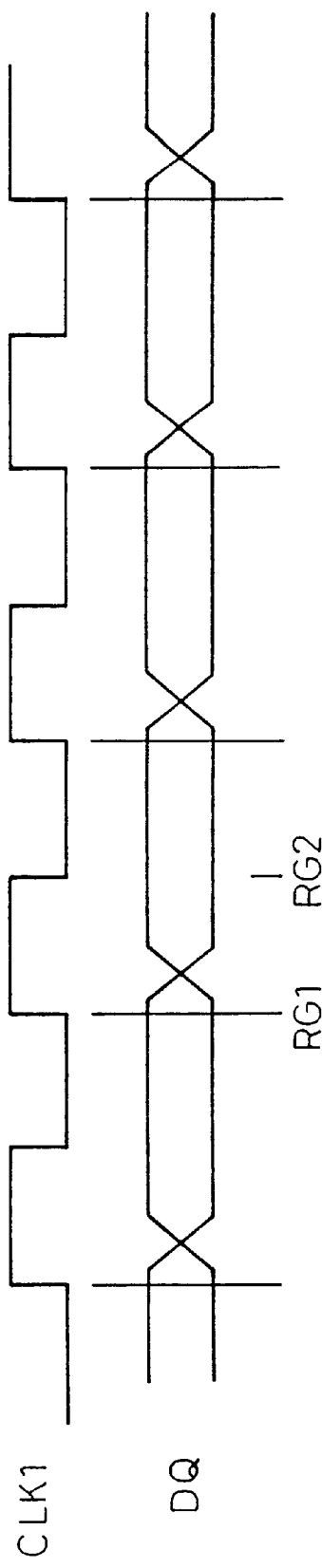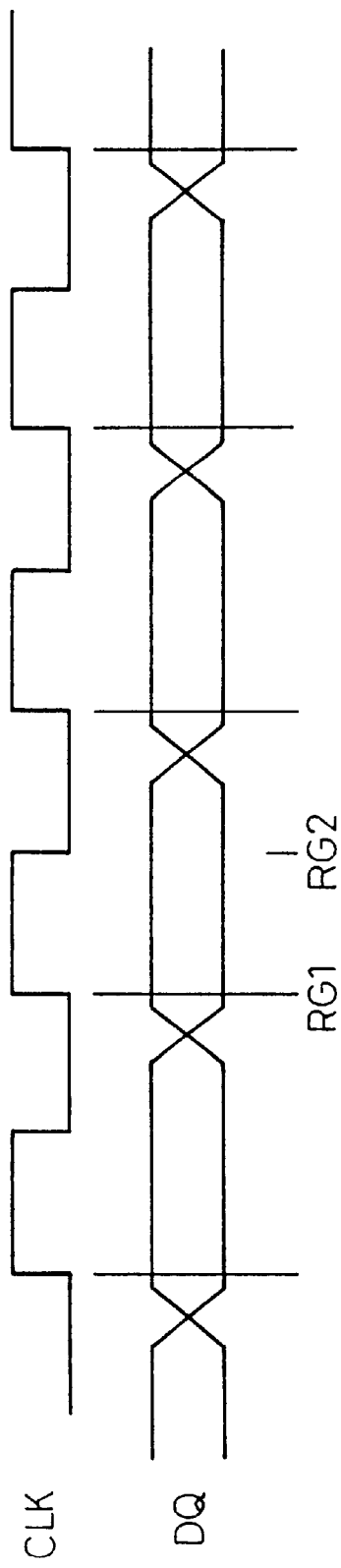

| RG1 | RG2 | UP/DOWN SIGNAL | OPERATION |
|-----|-----|----------------|-----------|
| L | L | H | DELAY IS INCREASED. |
| H | H | H | |
| L | H | L | DELAY IS DECREASED. |
| H | L | L | |

INPUT/OUTPUT DATA SYNCHRONIZING DEVICE

The following application is a divisional of application Ser. No. 09/448,432 filed Nov. 24, 1999, which was issued as U.S. Pat. No. 6,201,423 on Mar. 13, 2001, which in turn was a division of U.S. application Ser. No. 08/892,790 filed Jul. 15, 1997, which was issued as U.S. Pat. No. 6,298,004 on Oct. 2, 2001.

BACKGROUND OF THE INVENTION

1. Field of the Invention

The present invention relates to a semiconductor device for outputting a signal with a given accurate phase held relative to an externally-input signal, a semiconductor system composed of such semiconductor devices, and a digital delay circuit employed in the semiconductor system. More particularly, this invention is concerned with a synchronous semiconductor memory from which a signal is output with a given phase held relative to an external clock despite a change in ambient temperature or a fluctuation in supply voltage.

2. Description of the Related Art

Normally, a semiconductor integrated circuit (including a large scale integration (LSI)) accepts an external signal, and outputs an output signal after carrying out processing according to the input signal. Timing relative to an external input signal according to which an output signal is provided is therefore important. In a general-purpose LSI, the timing is usually determined as one of the specifications for the LSI. Taking a dynamic random access memory (DRAM) for instance, a maximum frequency of an address signal as well as the timing of outputting data relative to a transition edge of the address signal and a data setup time required for writing data are stipulated.

In recent years, it has been earnestly requested to increase the operating speed of an interface in line with an increase in frequency of a clock used in a CPU within a computer system or with increases in processing speeds of other various electronic circuits. For example, a CPU using a clock with a frequency of 100 MHz or higher has made its debut. However, the access rate and data transfer rate of a Dram widely adopted as a main memory are lower than the frequency of the clock by one decade. Various novel DRAM architectures such as a synchronous DRAM (SDRAM) permitting a data transfer rate of 100 MHz or higher have been proposed to date.

The SDRAM inputs or outputs data synchronously with a high-frequency clock that is input externally, and includes a plurality of units capable of inputting or outputting a plurality of bits of data in parallel. A method of interfacing an external unit at a high speed falls into a method of converting a plurality of bits of data into serial data and a method of pipelining internal operations and carrying out the operations of pipes in parallel. The description will proceed by taking a DRAM having a pipelined architecture as an example. However, the present invention is not limited to this kind of DRAM.

In the SDRAM, internal operations and input or output of signals are carried out synchronously with a clock supplied externally. When this SDRAM is employed in a high-speed memory system, if the SDRAM is accessed continuously, a clock access time tAC that is a time interval between the leading edge of a clock and the output of data, and an output data retention time tOH that is a time interval starting with the leading edge of the clock, during which data is retained, are significant. The times tAC and tOH are determined in relation with the same path. When consideration is taken into a difference in characteristic of one SDRAM from another, and the temperature dependency and supply voltage-dependency of the SDRAM, the times tAC and tOH do not coincide with each other but differ from each other to some extent. The time comparable to the difference is the time during which data is uncertain, the time during which it is uncertain what kind of data is output, the time is unusable by a memory system, or is a so-called dead band. It is important to make the uncertain data time as short as possible.

To shorten the uncertain data time, it should be guaranteed that despite a difference in characteristic, a change in temperature, or a fluctuation in supply voltage, data is always output with a given phase held relative to an external clock, or in other words, the clock access time tAC is constant all the time. For example, if it is preferable that output of data is carried out synchronously with the rise of an external clock CLK, the clock access time tAC should be zero all the time.

The necessity of providing an output signal synchronously with an externally-input signal has been described by taking a synchronous DRAM as an example. This is not limited to the synchronous DRAM but is true among many semiconductor devices. As far as the interior of a semiconductor device is concerned, various measures can be taken to enable the semiconductor device to carry out desired operations. For outputting the result of processing performed internally by a semiconductor device, the relationships of the semiconductor device with other semiconductor devices must be defined. It is important to stabilize the timing of the output. The present invention relates to an art for stabilizing the timing of output relative to an external clock in a semiconductor device.

SUMMARY OF THE INVENTION

An object of the present invention is to realize a semiconductor device capable of outputting data with a given phase held relative to an external clock CLK despite a difference in characteristic, a change in temperature, or a fluctuation in supply voltage.

A semiconductor device in accordance with the present invention comprises an input circuit for inputting an external input signal and outputting a reference signal, an output circuit for receiving an output timing signal and outputting an output signal according to the timing of the output timing signal, and an output timing control circuit for controlling the output timing of an output signal sent from the output circuit so that the output signal exhibits a given phase relative to the external input signal. The output timing control circuit includes a delay circuit for which a magnitude of a delay can be specified, and which delays a reference signal by the specified magnitude, and applies the resultant reference signal as an output timing signal to the output circuit, a phase comparison circuit for comparing the phase of the output timing signal with the phase of the reference signal, and a delay control circuit for specifying the magnitude of a delay to be produced by the delay circuit according to the result of the comparison performed by the phase comparison circuit.

In the semiconductor device of the present invention, the magnitude of a delay needed for adjusting timing by the output timing control circuit is not fixed. For adjusting the magnitude of a delay so that a signal output from an actual circuit has a given phase relationship relative to an external clock (corresponding to the reference signal) output from the input circuit, the phase relationship of the output signal relative to the external clock can be retained accurately at a given value despite a difference in characteristic of one semiconductor device from another, a change in temperature, or a fluctuation in supply voltage.

What is compared with the external clock must be a signal delayed by the same magnitude as the magnitude of a delay produced by the actual circuit. From this viewpoint, a dummy input circuit for producing the same magnitude of a delay as the input circuit and a dummy output circuit for producing the same delay as the output circuit are included. For comparing phases, it is essential that an output signal of the output circuit makes a state transition. During normal operation, the output circuit provides output data. The output data is a varying signal that may be at a high level or at low level. For comparing the phase of an output signal of the output circuit with the phase of the external clock during a normal operation, the phase comparison circuit 22 judges whether or not the output signal has made a state transition. Only when the output signal has made a state transition, are phases compared. If the output signal makes no state transition, the delay control circuit gives control so that the ongoing magnitude of a delay can be retained. Thus, if the output signal makes no state transition, the output signal is fed back so that control is given until the output signal is in phase with the external clock.

In another configuration, initialization is carried out before a normal operation starts. During the initialization, dummy data that makes a state transition at intervals of a given cycle is output. The phase of the dummy data is compared with that of the external clock. The dummy data is fed back so that control is given until the dummy data is in phase with the external clock. After the dummy data is in phase with the external clock, an adjusted magnitude of a delay is retained. The dummy data makes a state transition at intervals of a given cycle without fail. The phase comparison circuit can compare phases merely by judging in which direction the dummy data makes a state transition.

Using the dummy output circuit, a signal suitable for judging a phase which is independent of an output signal of the output circuit can be output all the time. This means that dummy data can always be output for feedback control. Moreover, if the dummy data is a signal that makes a state transition by taking time longer than the cycle of the clock, the power consumption of the circuit can be minimized.

Furthermore, a second output timing control circuit to be associated with the dummy output circuit is included separately from the first output timing control circuit associated with the output circuit. During initialization, an output signal and dummy output signal are synchronized with the external clock. This means that the output signal and the dummy output signal become synchronous with each other. Thereafter, the dummy output signal is fed back to the first output timing control circuit for the purpose of giving control. Owing to this configuration, the dummy output circuit can be used to achieve adjustment even under the effect of a load connected to the actual output circuit.

BRIEF DESCRIPTION OF THE DRAWINGS

FIG. 47 is a truth table concerning a phase judging operation in the seventh embodiment;

FIGS. 51A and 51B are diagrams for explaining a phase judging operation in the ninth embodiment;

DESCRIPTION OF THE PREFERRED EMBODIMENTS

Prior to the description of the embodiments of the present invention, output timing in a synchronous DRAM of a prior art will be described for a better understanding of the differences between the present invention and prior art. The embodiments in which the present invention is adapted to a synchronous DRAM will be described later.

As mentioned previously, the present invention is not limited to the synchronous DRAM but can apply to any semiconductor integrated circuit for providing an output signal synchronously with an externally-input signal.

Figure 1:
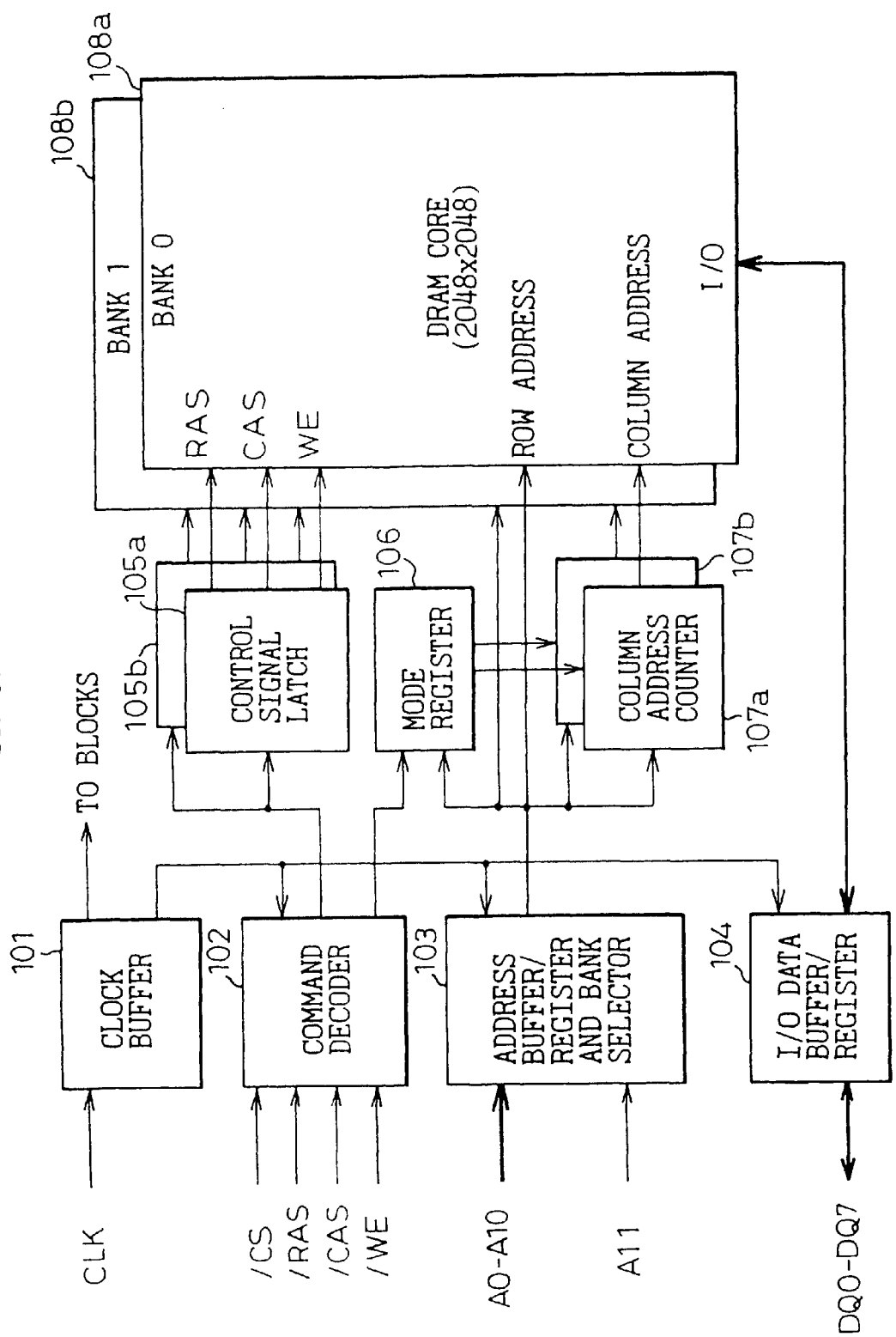
FIG. 1 is a block diagram showing the overall configuration of a synchronous DRAM (SDRAM)

FIG. 1 is a block diagram showing the configuration of a synchronous DRAM (SDRAM) having a storage capacity of 16 megabytes, including two memory banks, and handling data of 8 bits long, which is an example of a pipelined SDRAM.

The SDRAM comprises core memories 108a and 108b that are general-purpose DRAMs, a clock buffer 101, a command decoder 102, an address buffer/register and bank address selector 103 (hereinafter, simply, an address buffer), an I/O data buffer/register 104, control signal latches 105a and 105b, a mode register 106, and column address counters 107a and 107b. The actions of terminals /CS, /RAS, /CAS, and /WE are different from those in the prior art. The terminals are combined in order to input various commands, whereby an operation mode is determined. The various commands are interpreted by the command decoder and used to control the circuits according to an operation mode. Signals /CS, /RAS, /CAS, and /WE are also input to the control signal latches 105a and 105b, and have the states thereof latched until a subsequent command is input.

An address signal (A0–A11) is amplified by the address buffer 103 and used as a load address of each bank. The address signal is also used as an initial value by the column address counters 107a and 107b. Signals read from the core memories 108a and 108b are amplified by the I/O data buffer/register 104 and output synchronously with the rise of an external clock CLK that is input externally. The same operation is performed on an input. That is to say, input data is written in the I/O data buffer/register 104.

Figure 2:
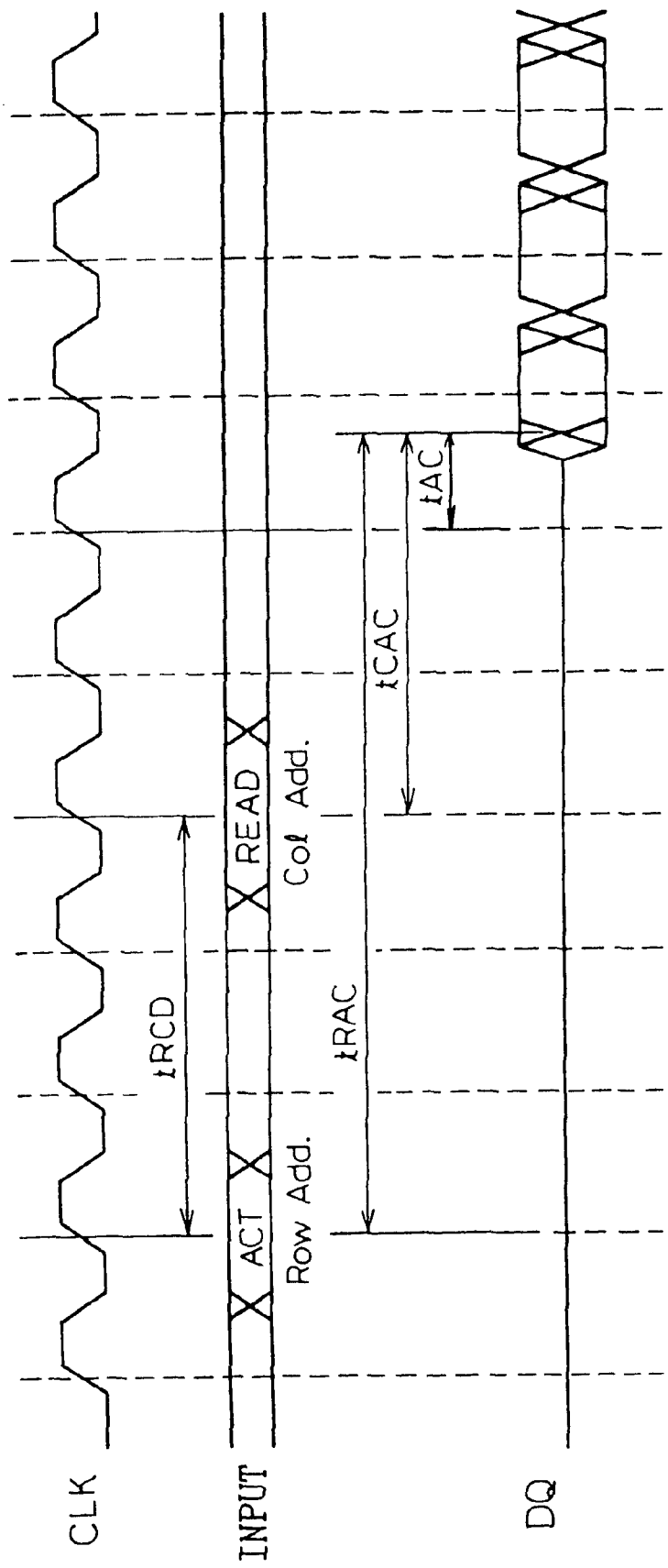
FIG. 2 is a timing chart showing the basic operations of the SDRAM.

FIG. 2 is a diagram showing the read operation timing in a general SDRAM.

The external clock CLK is a signal supplied from a system in which the SDRAM is employed. Synchronously with the rise of the clock CLK, various commands, an address signal, and input data are fetched and output data is provided.

Assuming that data is read from the SDRAM, an active (ACT) command that is a combination of command signals /CS, /RAS, /CAS, and /WE) is input through a command terminal, and a row address signal is input through an address terminal. With the input of the command and row address, the SDRAM becomes active, selects a word line corresponding to the row address, outputs cell information lying on the word line over a bit line, and amplifies the information using a sense amplifier.

When the operating time (tRCD) of a unit handing a row address has elapsed, a read command and column address are input. Data provided by a sense amplifier selected according to the column address is output over a data bus, amplified by a data bus amplifier, further amplified by an output buffer, and output through an output terminal (DQ). This series of operations is identical to that in a general-purpose DRAM. In the case of the SDRAM, the circuits for handling a column address are pipelined. Read data is output continuously during each cycle. A data transfer cycle is therefore equal to the cycle of the external clock.

There are three kinds of access times in the SDRAM. The access times are defined with reference to the rise time instant of the clock CLK. In FIG. 2, the time tRAC is a row address access time, the time tCAC is a column address access time, and the time tAC is a clock access time. When the SDRAM is employed in a high-speed memory system, the time tRAC that is a time interval between the instant at which a command is input and the instant at which the first data is obtained, and the time tCAC are important. For improving the data transfer rate, the clock access time tAC is significant.

Figure 3:
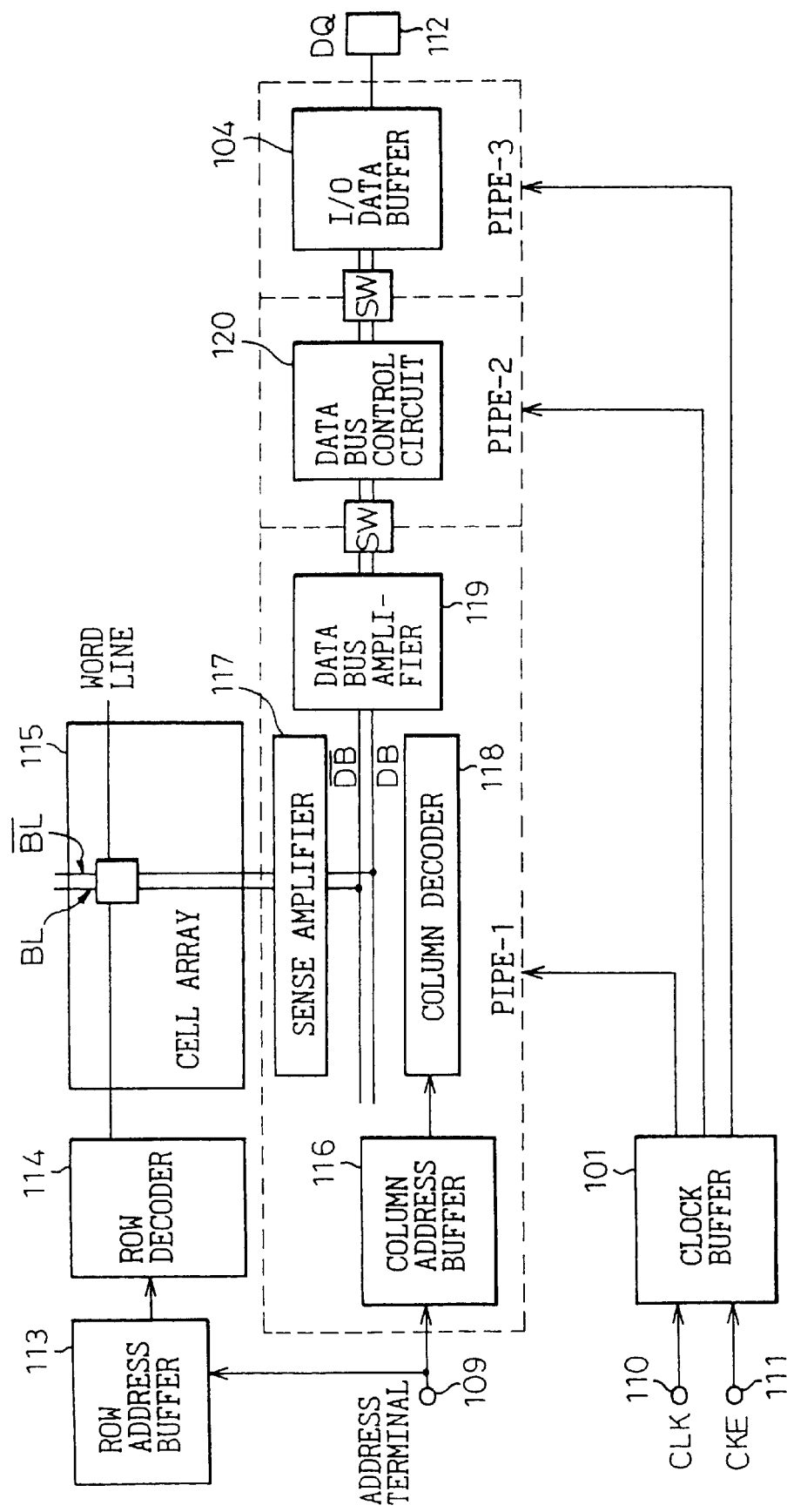
FIG. 3 is a diagram showing the basic operations of a pipelined SDRAM.

FIG. 3 is a block diagram for explaining pipelining in the SDRAM by taking a configuration including three stages of pipes as an example.

Processing circuits for handling a column address in the SDRAM are divided into a plurality of stages according to the flow of processing. The division stages shall be referred to as pipes. In the clock buffer 101, an internal clock to be supplied to each pipe is produced using the clock CLK. Each pipe is controlled according to a supplied internal clock. A switch for controlling the timing of transmitting a signal is placed on a border between pipes. The switches are also controlled with the internal clock produced by the clock buffer 101.

In this example, in pipe-1, a column address buffer 116 amplifies an address signal, and sends a resultant address signal to a column decoder 118. Information provided by a sense amplifier 117, which is concerned with an address selected by the column decoder 118, is output over a data bus. Information on the data bus is amplified by a data bus amplifier 119. Pipe-2 includes only a data bus control circuit 120. Pipe-3 includes only an I/O buffer 104. If the circuits in the pipes complete their operations within the time corresponding to the cycle of a clock, data can be sent out successively like being relayed by turning on or off the switches each located between pipes synchronously with the clock CLK. Consequently, the processing in the pipes is carried out in parallel. Data is output successively synchronously with the clock CLK through an output terminal.

Figure 4:
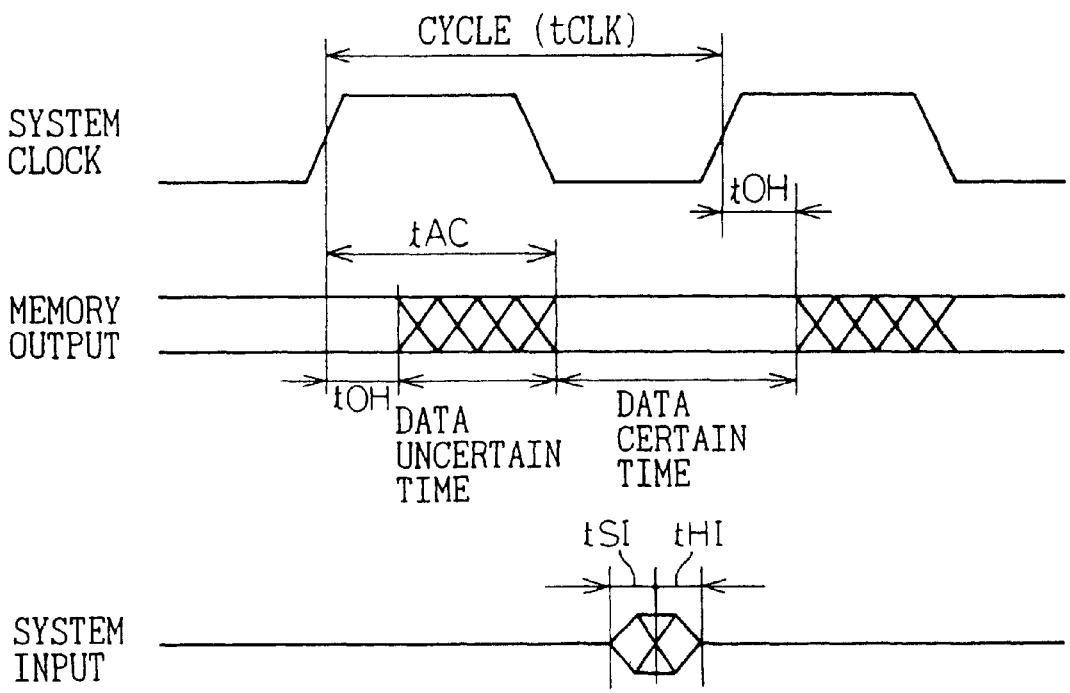
FIG. 4 is a diagram for explaining the timing of the SDRAM and a problem underlying a high-speed operation.

FIG. 4 is a diagram for explaining a problem occurring when the known SDRAM explained in conjunction with FIGS. 1 to 3 is employed in a high-speed memory system.

In FIG. 4, there are shown a clock access time tAC starting with the leading edge of a system clock CLK, an output data retention time tOH defined after the end of a preceding cycle and before the start of a succeeding cycle. The times tAC and tOH are determined in relation to the same path. Because of a difference in characteristic of one SDRAM from another, and the temperature-dependency and supply voltage-dependency thereof, the times tAC and tOH do not coincide with each other but differ from each other to some extent. The time equivalent to the difference is the time during which data is uncertain, the time during which it is unknown what kind of data is output, the time unusable by a memory system, or a so-called dead band. In other words, the time tOH can be said to be a delay time occurring along a path when the highest operating speed is attained due to the conditions such as a voltage and temperature, and the time tAC can be said to be a delay time occurring along the path when the lowest operating speed is attained. If there is no difference between the times tAC and tOH, the time during which data is uncertain is shortened. It is therefore preferable that the difference between the times tAC and tOH is as small as possible. It is noted that the dead band includes a delay time occurring over a wiring on a printed-circuit board and a difference of the dead band occurring in one SDRAM from that occurring in another, though the delay time and difference are not illustrated.

For fetching (receiving) an output of the SDRAM, the memory system requires a setup time (tSI) and hold time (tHI). These times must be defined within the time during which data output from the memory is certain. The time during which data is certain is expressed as tCLK+tOH−tAC in the illustration.

Thinking of, for example, a system operating at 100 MHz, the cycle of a clock (tCLK) is 10 ns, the memory access time (tAC) is 6 ns, and the hold time is 3 ns. The time usable by the system is 7 ns. The setup time and hold time required by a receiving-side logic in the system using a normal input circuit come to 3 ns (tSI+tHI) in total. The remaining 4 ns is a system tolerance time usable for absorbing a delay of a signal occurring on a printed-circuit board and a difference in data rate of one terminal DQ from another. Thinking of a signal propagation time required on a printed-circuit board, the value of 4 ns is very small. If the operating speed of the system is made higher, a more severe timing adjustment is required. From this viewpoint, it is essential to make the time, during which data is uncertain, shown in FIG. 4 as short as possible.

For shortening the data uncertain time, despite a difference in characteristic, a change in temperature, and a fluctuation in supply voltage, data should always be output with a given phase held relative to the external clock CLK, that is, the clock access time tAC should be constant all the time. When, for example, it is preferred that output of data is carried out synchronously with the rise of the external clock CLK, the clock access time tAC should remain zero.

By taking the synchronous DRAM for instance, the necessity of providing an output signal synchronously with an externally-input signal has been described. This is not limited to the synchronous DRAM but is true among many semiconductor devices. For the interior of a semiconductor device, various measures can be taken so that the semiconductor device can operate desirably. However, for outputting the result of processing performed inside a semiconductor device, the relationships with other semiconductor devices must be defined. It is essential to stabilize output timing.

Figure 5A:
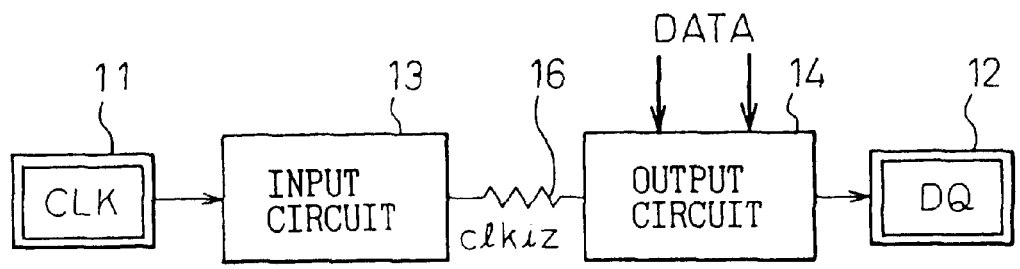
FIGS. 5A and 5B are diagrams for explaining the phase relationship of an output relative to a clock in a prior art.
Figure 5B:
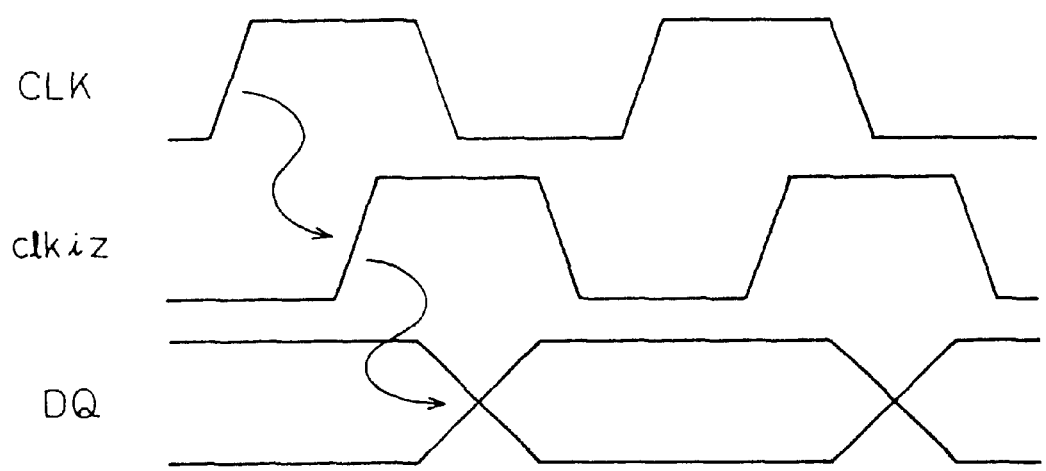

FIGS. 5A and 5B are diagrams for explaining the phase relationship of an output relative to a clock in a prior art. FIG. 5A shows a signal path along which a signal propagates after an external signal CLK is input through a clock terminal 11, and is then output through a data DQ terminal 12. FIG. 5B is a timing chart showing operation timing in the configuration shown in FIG. 5A. For example, an input terminal 110 through which a clock CLK is input, a clock buffer 101, a line from the clock buffer 101 to an I/O data buffer 104, the I/O data buffer 104, and an output terminal 112 through which data DQ is output, which are shown in FIG. 3, are comparable to the clock terminal 11, an input circuit 13, a line 16, an output circuit 14, and the data terminal 12 which are shown in FIG. 5A. As far as this path is concerned, the external signal CLK input through the clock terminal 11 is delayed by the input circuit 13 and line 16 and then input as a signal clkiz to the output circuit 14. The output circuit 14 carries out an output operation according to the signal clkiz. An output DQ developing at the data terminal is output while lagging behind the signal clkiz. In other words, the output DQ is output while lagging behind the external signal CLK as illustrated. As mentioned above, the time lag affects the times tAC and tOH, varies depending on a difference of a semiconductor device from another occurring in the process of manufacturing, and on the ambient conditions including a temperature and supply voltage. This becomes an obstacle to a higher operating speed.

According to the present invention, a semiconductor device capable of outputting data with a given phase held relative to an external clock despite a difference in characteristic, a change in temperature, and a fluctuation in supply voltage can be realized.

Figure 6:
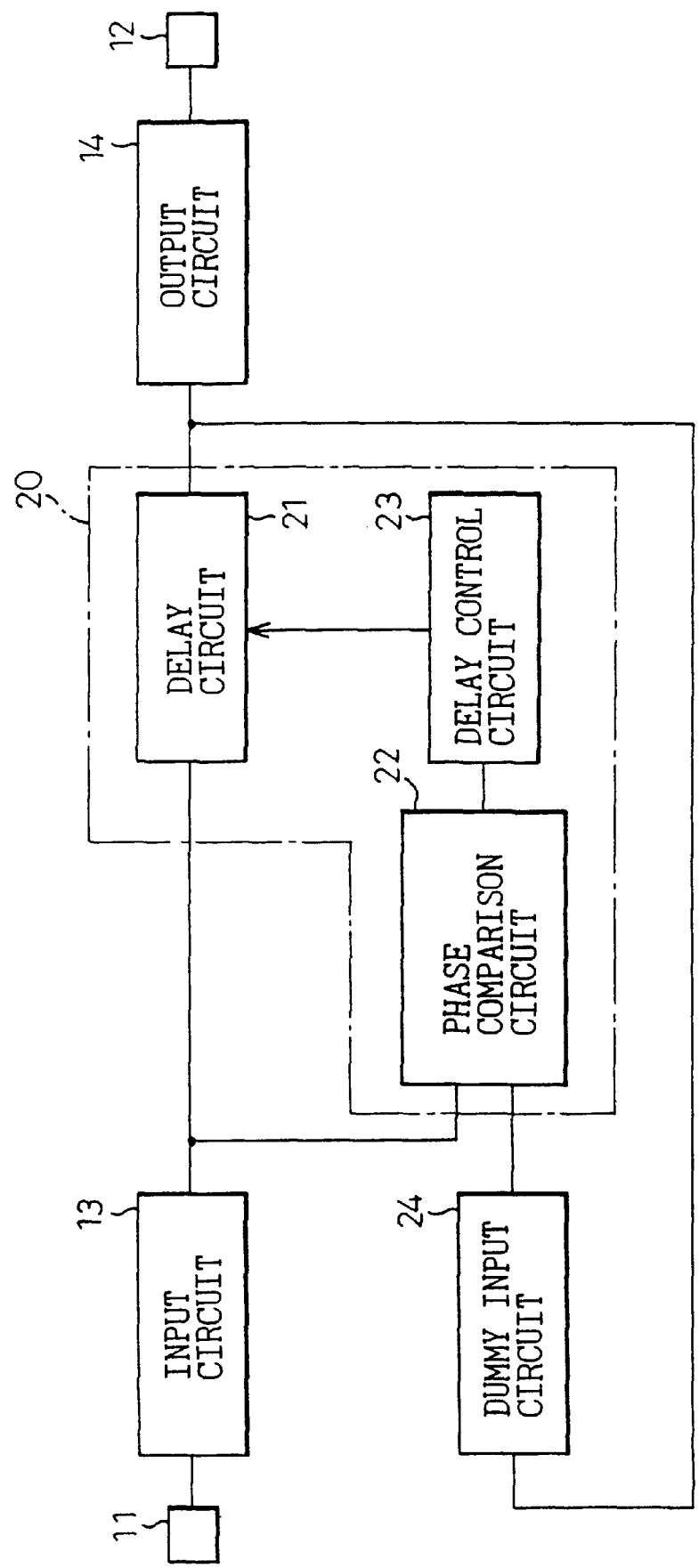
FIG. 6 is a diagram showing the basic configuration of a semiconductor device of the present invention for synchronizing a timing signal to be applied to an output circuit with an external clock.

FIG. 6 is a diagram showing the basic configuration of a semiconductor device in accordance with the present invention.

As shown in FIG. 6, a semiconductor device of the present invention comprises an input circuit 13 for inputting an external input signal and outputting a reference signal, an output circuit 14 for receiving an output timing signal and outputting an output signal according to the timing of the output timing signal, and an output timing control circuit 20 for controlling the timing of outputting an output signal sent from the output circuit 14 so that the output signal exhibits a given phase relative to an external input signal. The timing control circuit 20 includes a delay circuit 21 enabling specification of a magnitude of a delay, delaying a reference signal by the specified magnitude, and applying a resultant signal as an output timing signal to the output circuit 14, a phase comparison circuit 22 for comparing the phase of the output timing signal with the phase of the reference signal, and a delay control circuit 23 for specifying the magnitude of a delay to be produced by the delay circuit 21 according to the result of the comparison performed by the phase comparison circuit 22.

In the semiconductor device of the present invention, the magnitude of a delay used to adjust timing by the output timing control circuit 20 is not fixed. In contrast, the magnitude of a delay is adjusted so that a signal provided by an actual circuit has a given phase relationship relative to an external clock (comparable to the reference signal) output from the input circuit 13. Even if there is a difference in characteristic of the semiconductor device from another, a change in temperature, and a fluctuation in supply voltages the phase relationship of the output signal relative to the external clock can be retained accurately at a given value.

What is compared with the external clock must be a signal delayed by a magnitude equivalent to the magnitude of a delay occurring in an actual circuit. The external clock is input to the input circuit 13 in the semiconductor device and subjected to amplification and other processing. The external clock that can be compared is therefore an external clock output from the input circuit, and has a phase difference comparable to a delay occurring in the input circuit 13 relative to an actual external clock. It is therefore preferred that a dummy input circuit 24 for producing the same magnitude of a delay as the input circuit 13 is included, and a signal made by passing an output timing signal through the dummy input circuit 24 is compared with an external clock output from the input circuit 13 in order to cancel the magnitude of a delay caused by the input circuit 13.

In the configuration shown in FIG. 6, an output of the delay circuit 21 is input to the dummy input circuit 24. An object-of-comparison signal to be compared with an external clock by the phase comparison circuit 22 does not therefore undergo a delay occurring in the output circuit 14. A phase relationship to be controlled is determined in consideration of correction for the delay. The delay occurring in the output circuit 14 is larger than a delay occurring in any other component. When there is a difference in characteristic of the semiconductor device from another, a change in temperature, and a fluctuation in supply voltage, there arises a problem that a variation of the magnitude of a delay occurring in the output circuit 14 is too large to be ignored.

Figure 7:
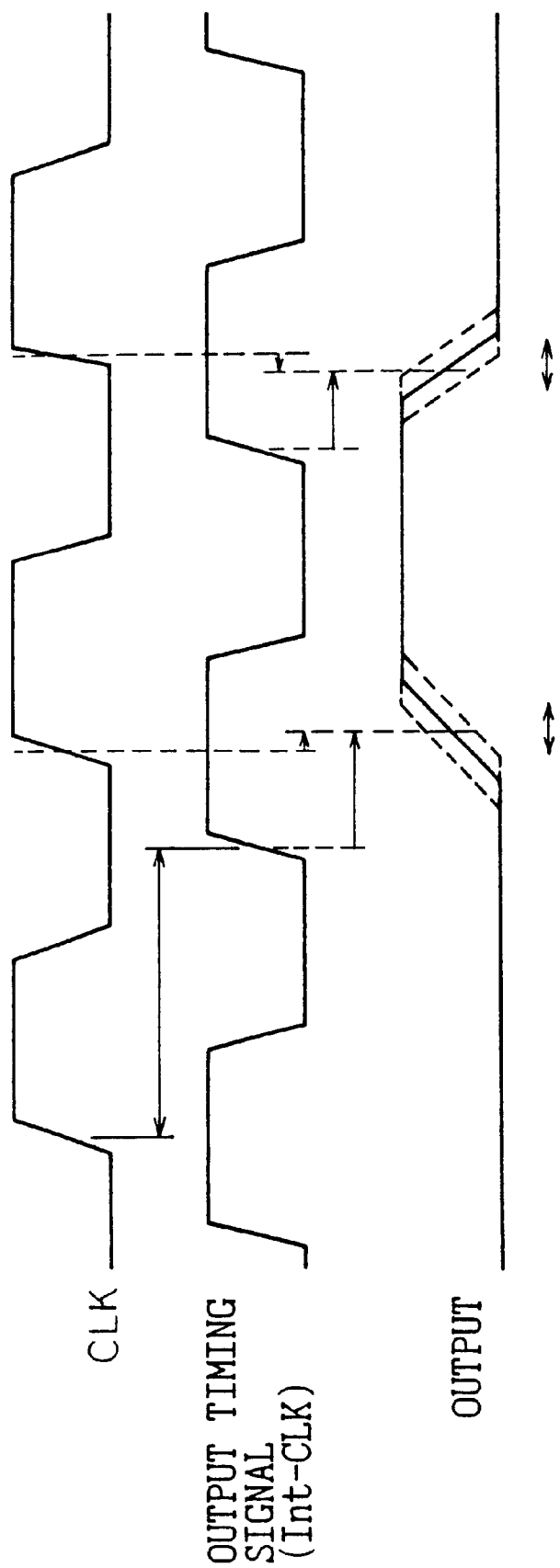
FIG. 7 is a diagram for explaining a problem underlying the basic configuration shown in FIG. 6.

FIG. 7 is a diagram for explaining this problem. Assume that control is given so that a signal is output synchronously with the leading edge of an external clock CLK. An output timing signal supplied from the delay circuit 21 to the output circuit 14 and used to define the timing of outputting a signal from the output circuit 14 rises at a time instant succeeding by a given time the leading edge of the clock CLK in anticipation of a delay occurring in the output circuit 14. If the magnitude of the delay occurring in the output circuit 14 has a predicted value, an output makes a state transition synchronously with the leading edge of the clock CLK. However, because of the aforesaid factors, when the magnitude of a delay occurring in the output circuit 14 varies, the output timing of a signal from the output circuit deviates from the leading edge of the clock CLK by a time corresponding to the variation. When this kind of variation is predicted, a margin must be preserved accordingly. This makes it hard to realize a higher operating speed.

For solving this kind of problem, an input signal of the output circuit 14 is input to the dummy input circuit 24 and compared in phase with the external clock. For comparing phases, the input signal of the output circuit 14 is required to make a state transition. During a normal operation, the output circuit 14 outputs output data. The output data is a varying signal that may be at a high level or at low level. For comparing the phase of an input signal of the output circuit 14 with the phase of the external clock during a normal operation, the phase comparison circuit 22 judges whether the input signal has made a state transition. Only when the input signal has made a state transition, are phases compared. When the input signal has not made a state transition, the delay control circuit 23 gives control so that the ongoing magnitude of a delay can be retained. When the input signal has not made a state transition, the input signal is fed back so that control is given according to the result of comparison performed by the phase comparison circuit 22 until the input signal is phased with the external clock.

In another configuration, initialization is carried out before a normal operation is started. During the initialization, dummy data that makes a state transition at intervals of a given cycle is output. The dummy data is compared in phase with the external clock, and fed back so that control is given until the dummy data is phased with the external clock. After the dummy data is phased with the external clock, the adjusted magnitude of a delay is retained. Since the dummy data makes a state transition at intervals of the given cycle without fail, the phase comparison circuit 22 should merely judge in which direction the dummy data has made a state transition so as to compare phases.

Figure 8:
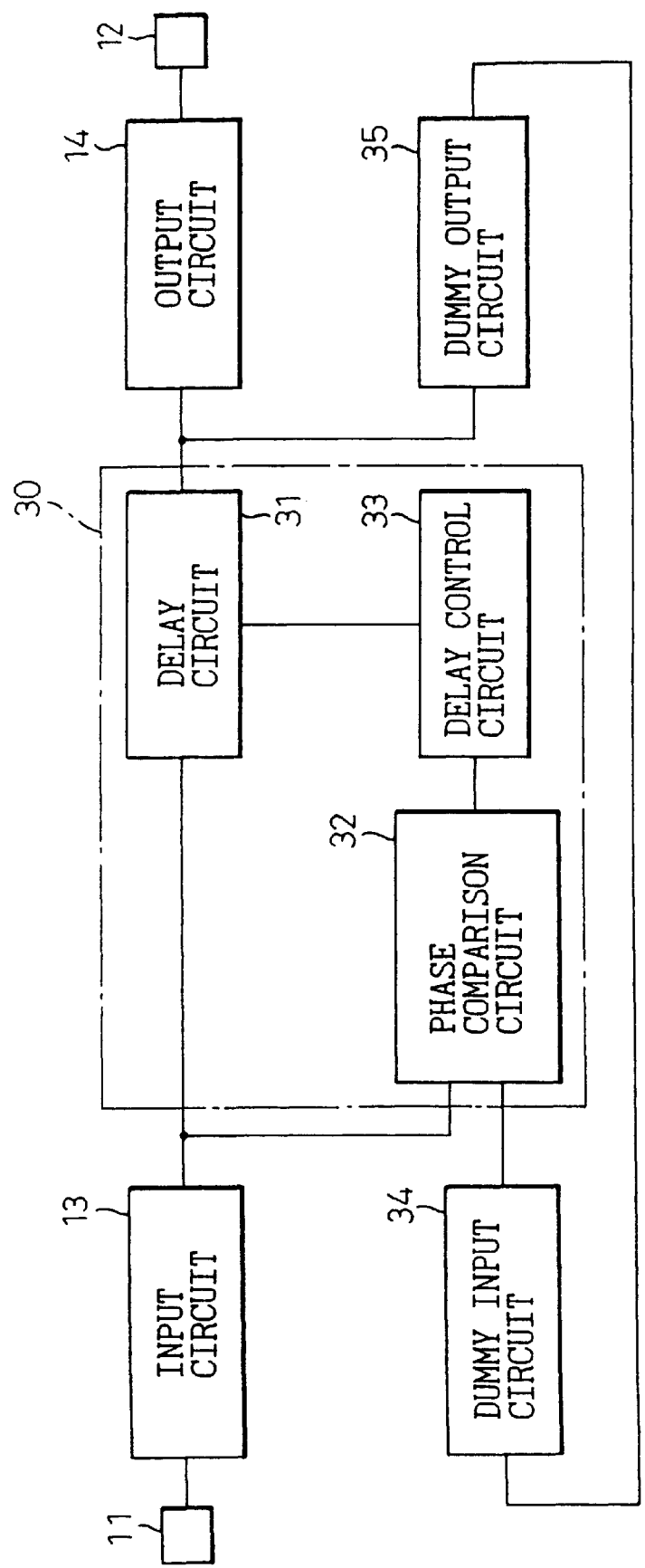
FIG. 8 is a diagram showing the configuration of a semiconductor device in accordance with another aspect of the present invention which is realized by modifying the basic configuration shown in FIG. 6.

As shown in FIG. 8, a dummy output circuit having the same characteristic as the output circuit 14 may be included so that an output signal of the dummy output circuit can be compared in phase with an external clock. A semiconductor device shown in FIG. 8 is different from the one having the configuration shown in FIG. 6 in the points that a dummy output circuit 35 is included, that an output timing signal output from the delay circuit 31 is input to the dummy output circuit 35, that the dummy output circuit 35 outputs a dummy output signal according to the output timing signal and sends the dummy output signal to the phase comparison circuit 32 via the dummy input circuit 34, and the dummy output signal is compared with an external clock sent from the input circuit.

In the configuration shown in FIG. 8, the dummy output circuit can always output a signal suitable for judging a phase which is independent of an output signal of the output circuit. The aforesaid dummy data can therefore be output all the time for the purpose of feedback control.

Figure 9:
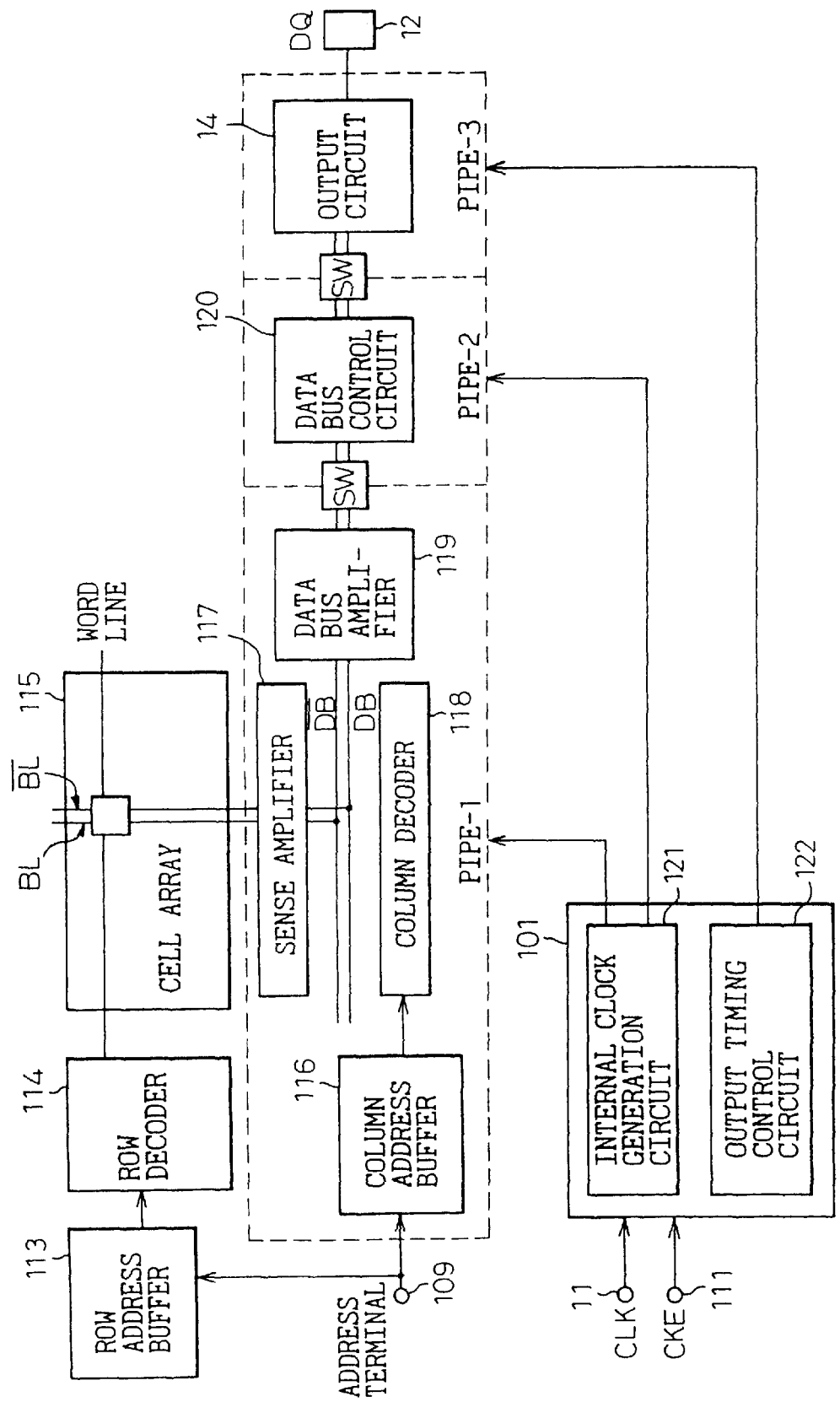
FIG. 9 is a diagram showing the operations of an SDRAM of an embodiment.

Embodiments in which the present invention is adapted to a synchronous DRAM (SDRAM) will be described below. The SDRAMs of the embodiments have the overall configuration shown in FIG. 1. FIG. 9 is a diagram showing signal paths along which a read operation is carried out in the SDRAMs of the embodiments.

As is apparent from the comparison of FIG. 9 with FIG. 3, the SDRAMs of the embodiments have substantially the same configuration as the SDRAM of the prior art. However, the configuration of the clock buffer 101 is different. In the SDRAMs of the embodiments, the clock buffer 101 includes an internal clock generation circuit 121 and output timing control circuit 122. The internal clock generation circuit 121 is similar to the clock buffer 101 included in the SDRAM of the prior art, generates an internal clock from an external clock CLK, and supplies the internal clock to pipe-1 and pipe-2. The output timing control circuit 122 has the basic configuration shown in FIG. 8, and controls the output timing of data supplied from the output circuit 14 so that the data exhibits a given phase relative to the external clock CLK.

Figure 10:
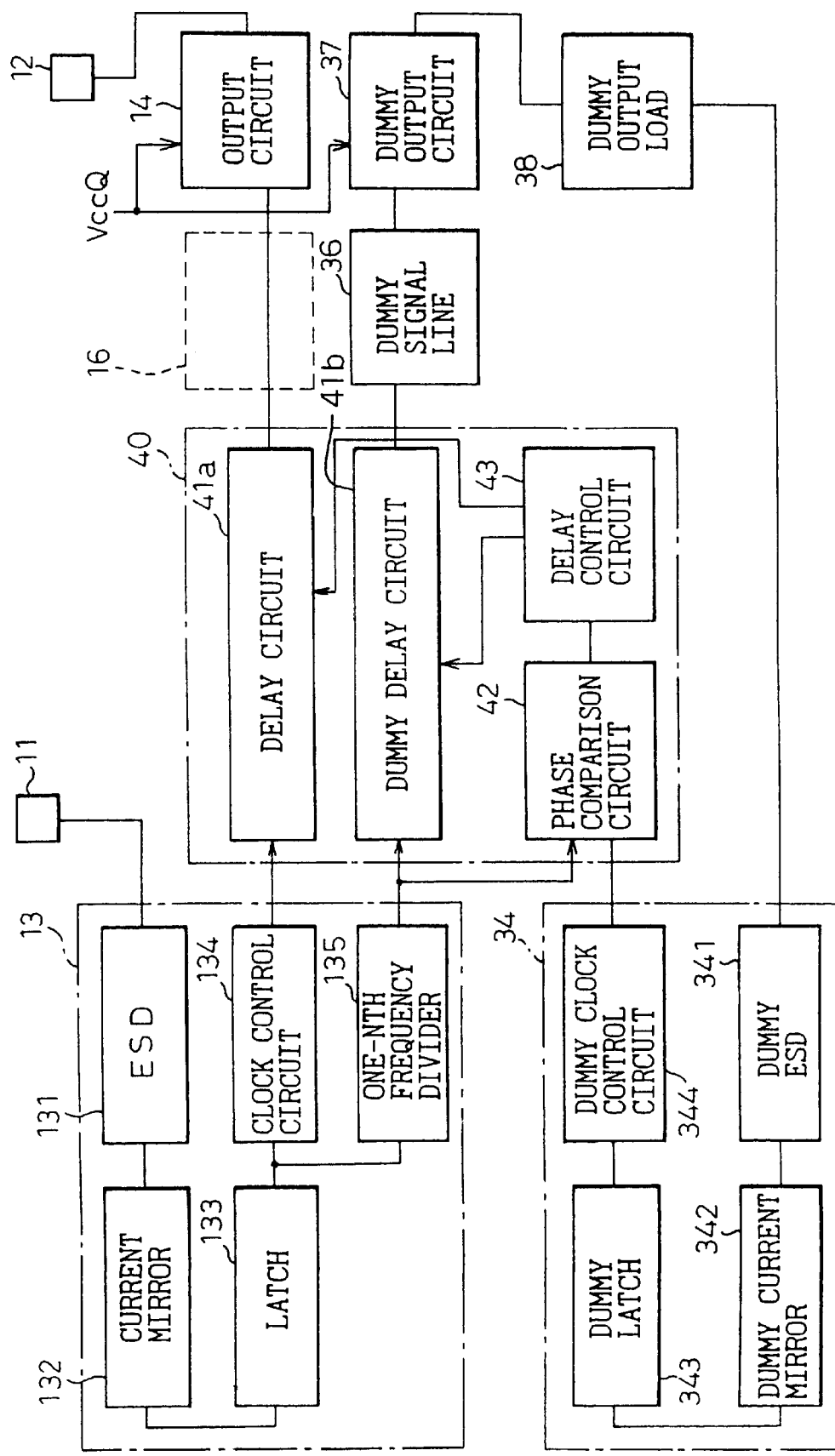
FIG. 10 is a diagram showing the configuration of the portion of an SDRAM of the first embodiment responsible for output timing control.

FIG. 10 is a diagram showing the configuration of the output timing control circuit 122 in the first embodiment, wherein the terminal 11 through which the external clock CLK is input, the output circuit 14, and the data output terminal 12 are also shown.

As shown in FIG. 10, the output timing control circuit in the first embodiment comprises an input circuit 13 for receiving an external clock CLK input through the external clock input terminal 11, a delay locked loop (DLL) for delaying the clock CLK input from the input circuit 13 and generating an output clock that defines the output timing of data from the output circuit 14, a dummy input circuit 34 having the same circuitry as the input circuit 13, a dummy output circuit 37 having the circuitry equivalent to that of the output circuit 14, a dummy signal line 36 linking the DLL 40 and dummy output circuit 37 which is equivalent to the signal line 16 linking the DLL 40 and output circuit 14, and a dummy output load 38 having a load equivalent to a load predicted to be connected to the data output terminal 12.

The input circuit 13 includes an electrostatic defense circuit (ESD) 131, a current mirror 132 for amplifying a clock CLK, a latch 133, a clock control circuit 134, and an one-Nth frequency divider 135. The input circuit 13 is the same as a widely-adopted external clock input circuit except the one-nth frequency divider 135. The one-Nth frequency divider 135 will be described later. Herein, the detailed description will be omitted. The dummy input circuit 34 includes, like the input circuit 13, a dummy ESD 341, a dummy current mirror 342, a dummy latch 343, and a dummy clock control circuit 344. The circuits have the same circuitries as those of the input circuit 13. The magnitude of a delay of a signal occurring in the dummy input circuit is the same as that occurring in the input circuit.

The DLL 40 includes a delay circuit 41a for delaying a signal input from the clock control circuit 134 by a specified magnitude, a dummy delay circuit 41b for delaying a signal input from the one-Nth frequency divider 135 by a specified magnitude, a phase comparison circuit 42 for comparing a signal sent from the one-Nth frequency divider 135 with a signal sent from the dummy clock control circuit 344, a delay control circuit 43 for specifying the magnitudes of delays to be produced by the delay circuit 41a and dummy delay circuit 41b according to the result of the comparison performed by the phase comparison circuit 42.

Figure 11B:
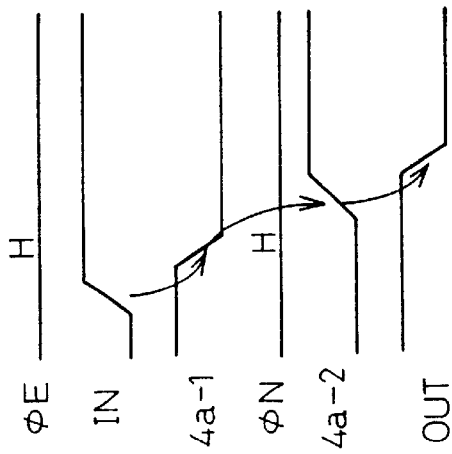
FIGS. 11A to 11C are diagrams showing the circuitry and operations of a delay circuit in the first embodiment.
Figure 11A:
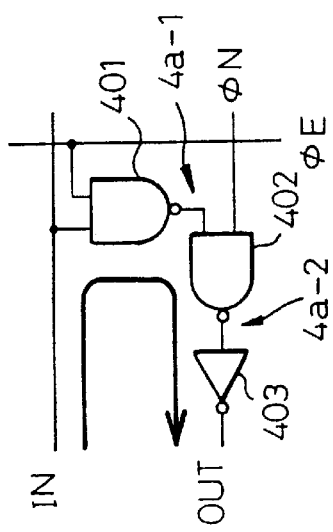
Figure 11C:
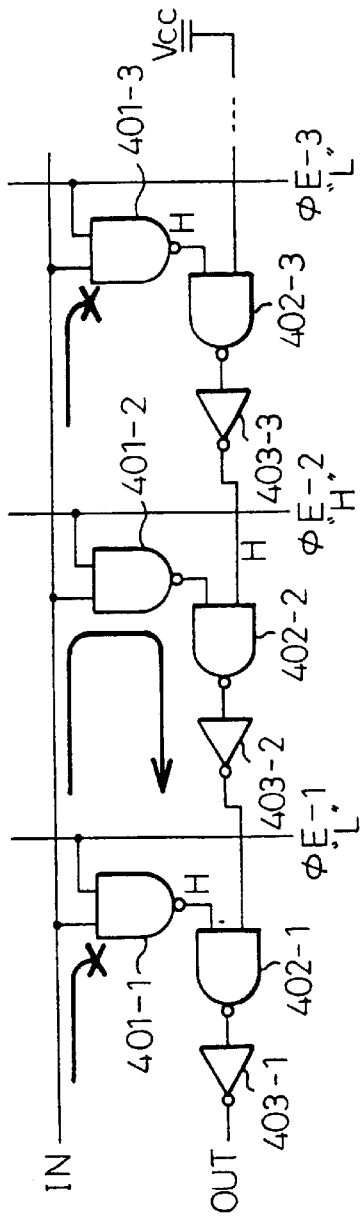

FIGS. 11A to 11C are diagrams showing the circuitry of the delay circuit 41a and dummy delay circuit 41b, and the waveforms of operating waves. FIG. 11A shows the circuitry of a delay circuit for handling one bit, FIG. 11C shows the circuitry in which the delay circuit for handling one bit is connected on a plurality of stages, and explains the operations of the connected delay circuits, and FIG. 11B is a timing chart showing the operations of the delay circuit for handling one bit.

As shown in FIG. 11A, a delay circuit for handling one bit is composed of two NAND circuits 401 and 402, and an inverter 403. The operations of the delay circuit for handling one bit will be described in conjunction with FIG. 11B. An input φE is an activation signal. When the input φE goes high, the delay circuit operates. In FIG. 11B, the input φE is high, and reception is enabled. A signal IN is an input signal to be supplied to the delay circuit for handling one bit. A signal φN is a signal. supplied from a right-hand delay circuit out of the plurality of stages of delay circuits. A signal OUT is an output signal sent from the delay circuit for handling one bit. Waves 4a-1 and 4a-2 are waves developing at associated internal terminals in the circuitry shown in FIG. 11A. The output signal OUT serves as a signal ON to be supplied to a left-hand delay circuit.

When the signal φN is low, the signal OUT remains low. When the signal φN is high and the signal φE is low, the signal OUT is high. When the signal φN is high and the signal φE is high, if the input signal IN is low, the signal OUT goes high. If the signal IN is high, the signal OUT goes low. In FIG. 11B, the signal φE is high and the signal φN is high. When the signal IN rises or makes a low-to-high transition, the input signal IN is reversed while passing through the NAND gates 401 and 402 and the inverter 403. Consequently, the output OUT is provided.

FIG. 11C shows an example in which a plurality of stages of delay circuits each handling one bit, each of which has the circuitry shown in FIG. 11A, are cascaded to constitute an actual delay circuit. Only three stages are shown. However, in practice, a plurality of stages of delay circuits are cascaded. A signal line over which the activation signal φE is transmitted is provided for each circuit element. That is to say, there are a plurality of signal lines φE-1, φE-2, φE-3. The signals are controlled by the delay control circuit 43.

In FIG. 11C, a delay circuit for handling one bit located in the center is activated, and the signal φE-2 is driven high. In this case, when the input signal IN makes a low-to-high transition, since the signals φE-1 and φE-3 applied to the left-hand delay circuit for handling one bit and to the right-hand delay circuit for handling one bit are low, the input signal IN is cut off by NAND circuits 401-1 and 401-3 respectively. The signal φE-2 applied to the activated center delay circuit for handling one bit is high. The input signal IN therefore passes through a NAND circuit 401-2. Since an output OUT of the right-hand delay circuit for handling one bit is high, the input signal IN passes through a NAND circuit 402-2 and is transmitted as a low-level signal to an output terminal OUT. As mentioned above, when the output OUT of the right-hand delay circuit, that is, the signal φN is low, the output OUT of the center delay circuit is always low. The low-level signal is transmitted to the NAND circuit and inverter of the left-hand delay circuit for handling one bit, and fetched as a final signal OUT.

The input signal IN is thus transmitted via an activated delay circuit for handling one bit while being routed along a folded path, and finally fetched as a signal OUT. Depending on the activation signal φE for a delay circuit which is driven high, the magnitude of a delay can be controlled. The magnitude of a delay to be produced by a delay circuit for handling one bit is determined with a total signal propagation time required for a signal to propagate the NAND circuits and inverter. The time is regarded as a unit delay time of the DLL. A total delay time is calculated by multiplying the magnitude of a delay to be produced by a delay circuit for handling one bit by the number of stages through which a signal is passed.

Figure 12:
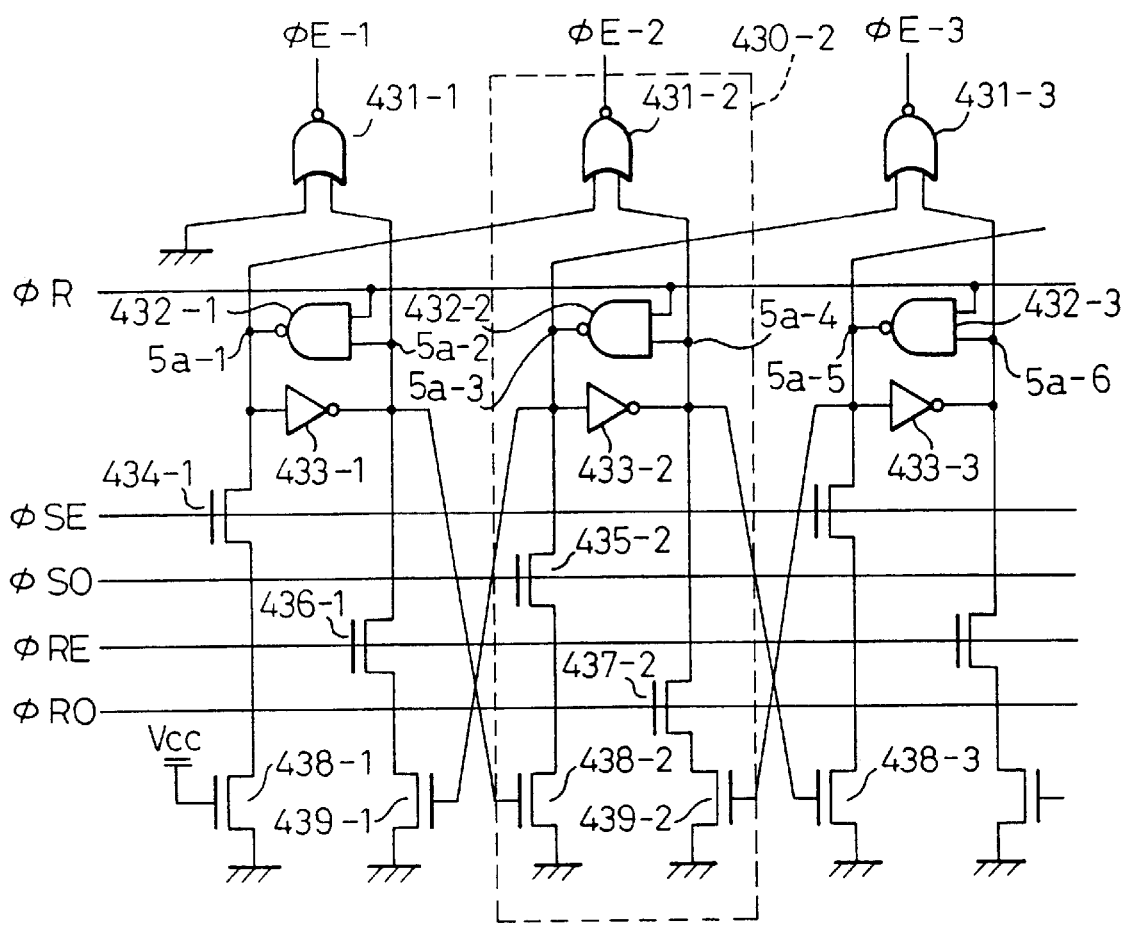
FIG. 12 is a diagram showing the circuitry of a delay control circuit in the first embodiment.
Figure 13:
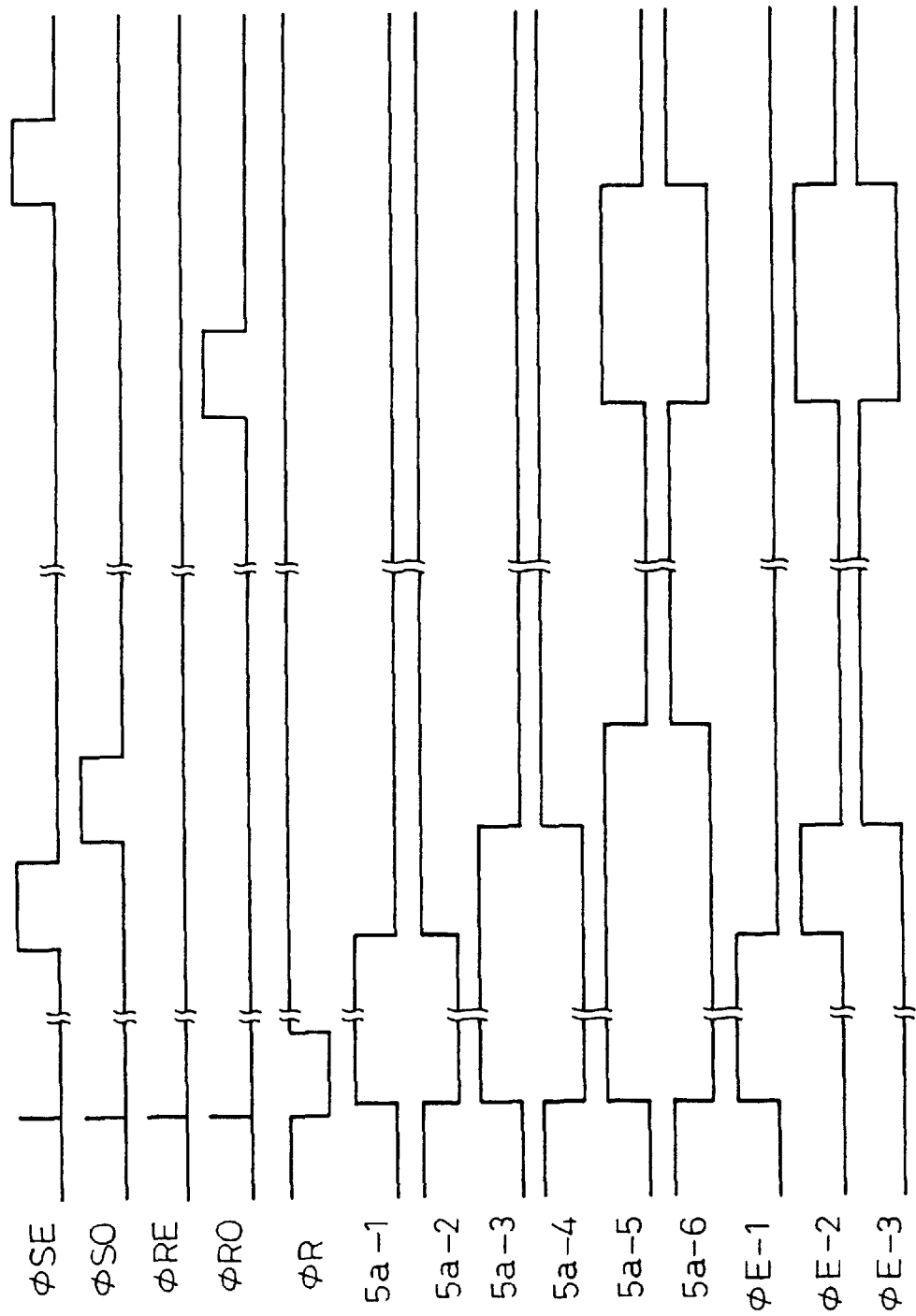
FIG. 13 a timing chart showing the operations of the delay control circuit in the first embodiment.

FIG. 12 is a diagram showing the circuitry of a delay control circuit, and FIG. 13 is a timing chart showing the operations thereof. As shown in FIG. 12, the delay control circuit has a delay control circuit 430-2 for handling one bit, which is encircled with a dashed line, connected by the number of the plurality of stages of delay circuits. An output of each stage is the activation signal φE to be applied to each stage of a delay circuit.

The delay control circuit 430-2 for handling one bit has transistors 435-2 and 438-2-connected in series and 437-2 and 439-2 connected in series with one another to both terminals of a flip-flop composed of a NAND circuit 432-2 and inverter 433-2, and further includes a NOR circuit 431-2. The gate of the transistor 438-2 is connected to terminal 5a-s of a delay control circuit of a preceding stage. The gate of the transistor 439-2 is connected to a terminal 5a-5 of a delay control circuit of a succeeding stage. Thus, signals provided by the preceding and succeeding stages are received. Set signals φSE and φSO used for a counting-up operation are applied alternately to every other delay control circuit. Reset signals φRE and φRO used for a counting-down operation are applied alternately to every other delay control circuit. As illustrated, in the delay control circuit 430-2 for handling one bit located in the center, the transistor 435-2 is connected on a signal line over which the signal φSO is transmitted and the transistor 437-2 is connected on a signal line over which the signal φRO is transmitted. The equivalent transistor of the delay control circuit on both sides of the delay control circuit 430-2 are connected on the signal lines φSE and φRE. Signals developing at a terminal 5a-1 of the left-hand delay control circuit and at a terminal 5a-4 of the center delay control circuit are input to the NOR circuit 431-2. A signal φR is a signal for resetting a delay control circuit. After the power supply is turned on, the signal φR is driven low temporarily. Thereafter, the signal φR is fixed high.

FIG. 13 is a diagram showing the operations of the delay control circuit shown in FIG. 12.

First, the signal φR is driven low temporarily. The potentials at the terminal 5a-1, 5a-3, and 5a-5 are driven high, and the potentials at the terminals 5a-2, 5a-4, and 5a-6 are reset to low. For a counting-up operation, the counting-up signals φSE and φSO go high and low alternately repeatedly. When the signal φSE makes a low-to-high transition, the terminal 5a-1 is grounded to have the potential thereof driven low, and the potential at the terminal 5a-2 is driven high. When the potential at the terminal 5a-2 is driven high, the signal φE-1 makes a high-to-low transition. This state is latched by the flip-flop. Even when the signal φSE goes back to low, the output φE-1 remains low. When the potential at the terminal 5a-1 is driven low, the output φE-2 makes a low-to-high transition. Since the potential at the terminal 5a-2 is driven high, the transistor 438-2 is turned on. When the signal φSO makes a low-to-high transition, the terminal 5a-3 is grounded to have the potential thereof driven low, and the potential at the terminal 5a-4 is driven high. When the potential at the terminal 5a-4 is driven high, the signal φE-2 makes a high-to-low transition. Since this state is latched by the flip-flop, even if the signal φSO goes back to low, the output φE-2 remains low. When the potential at the terminal 5a-3 is driven low, the output φE-3 makes a low-to-high transition. In the drawing, only one of the pulses φSE and φSO is output. Since many stages of delay control circuits are connected, when the signal φSE and φSO go high and low alternately repeatedly, a stage whose output φE goes high is shifted sequentially rightward. When it is judged from the result of comparison performed by the phase comparison circuit 42 that the magnitude of a delay should be increased, the pulses φSE and φSO are input alternately.

If a state in which the counting-up signals φSE and φSO and the counting-down signals φRE and φRO are not output, that is, remain low is retained, a stage whose output φE goes high is fixed. When it is judged from the result of comparison performed by the phase comparison circuit 42 that the magnitude of a delay should be retained intact, the pulses φSE, φSO, φRE, and φRO are not input.

For a counting-down operation, the pulses φRE and φRO are input alternately. On the contrary to the counting-up operation, a stage whose output φE goes high is shifted sequentially leftward.

As mentioned above, in the delay control circuit shown in FIG. 12, a stage whose output φE goes high can be shifted one by one with input of pulses. When the delay circuit shown in FIG. 11C is controlled using outputs φE, the magnitude of a delay can be increased or decreased in units of one unit value.

The delay circuit and delay control circuit will be explained in more detail. In the first embodiment, the circuit shown in FIG. 11C is used as the delay circuit and a delay control circuit like the one shown in FIG. 12 is used to control the delay circuit. For realizing a circuit capable of changing the magnitude of a delay stepwise in units of a unit value, a delay line having a plurality of signal paths connected in series with one another is generally used so that the magnitude of a delay can be specified by selectively outputting a signal over part of the plurality of signal paths. As far as this kind of delay line is concerned, it should be avoided that any one of the signal paths is not selected even in a transient state in which one signal path over which a signal is output is shifted to an adjoining one in order to change the magnitude of a delay. The delay control circuit for controlling the delay line is therefore required to output a signal specifying any one of the signal paths even in the transient state. Each stage of the delay control circuit shown in FIG. 12 outputs two complementary signals. That is to say, an output of the NAND circuit and an output of the inverter are mutually complementary. The stages ending with a certain stage output complementary signals of one states, and the subsequent stages output reversed complementary signals. The stage from which the reversed complementary signals are first output is shifted sequentially. In other words, the delay control circuit shown in FIG. 12 operates in the same manner as a shift register. In the circuitry shown in FIG. 12, a NOR circuit on each-stage of the shift register calculates the NOR of one of complementary signals output from one stage and the other one of complementary signals output from an adjoining stage, and an output of the NOR circuit is placed on a selected signal line of each stage shown in FIG. 11C. In a MOS transistor, a fall or a transition from a logical "high" state to a logical "low" state is quicker than a rise or a transition from the logical "low" state to the logical "high" state. In the circuitry shown in FIG. 12, an output of a NOR circuit whose inputs represent the logical "low" state indicates a selected position of the delay line. One of the inputs of the NOR circuit changes to the logical "high" state slowly. The logical "high" state of an input of a NOR circuit for indicating the next selected position of the delay line changes to the logical "low" state more quickly. Before an output of a NOR circuit that has indicated a selected position previously stops indicating the selected position, an output of another NOR circuit that indicates the next selected position starts indicating the selected position. Thus, the state in which no NOR circuit indicates a selected position can be avoided.

Figure 14:
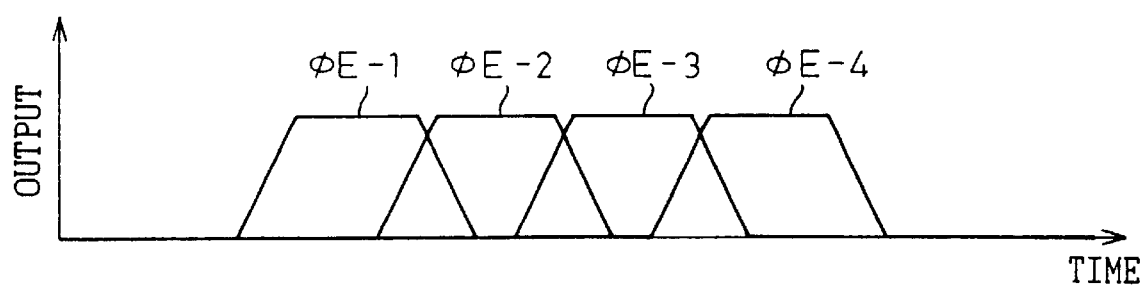
FIG. 14 is a diagram showing the state transition of an output signal of the delay control circuit in the first embodiment.

FIG. 14 is a diagram showing a change of outputs taking place when a NOR circuit indicating a selected position is shifted sequentially in the delay control circuit shown in FIG. 12. As illustrated, before a previous selector signal falls, the next selector signal rises. The problem that a path of the delay line is not selected will not arise.

Another conceivable delay control circuit is, for example, such that AND circuits having the nodes 5a-2 and 5a-3 and the nodes 5a-4 and 5a-5 in the circuitry shown in FIG. 12 as input terminals thereof are included, and the outputs of the AND circuits are provided as the signals φE-1 and φE-2. This circuit has a problem that the outputs of all the AND circuits are low in a transient state.

Figure 15:
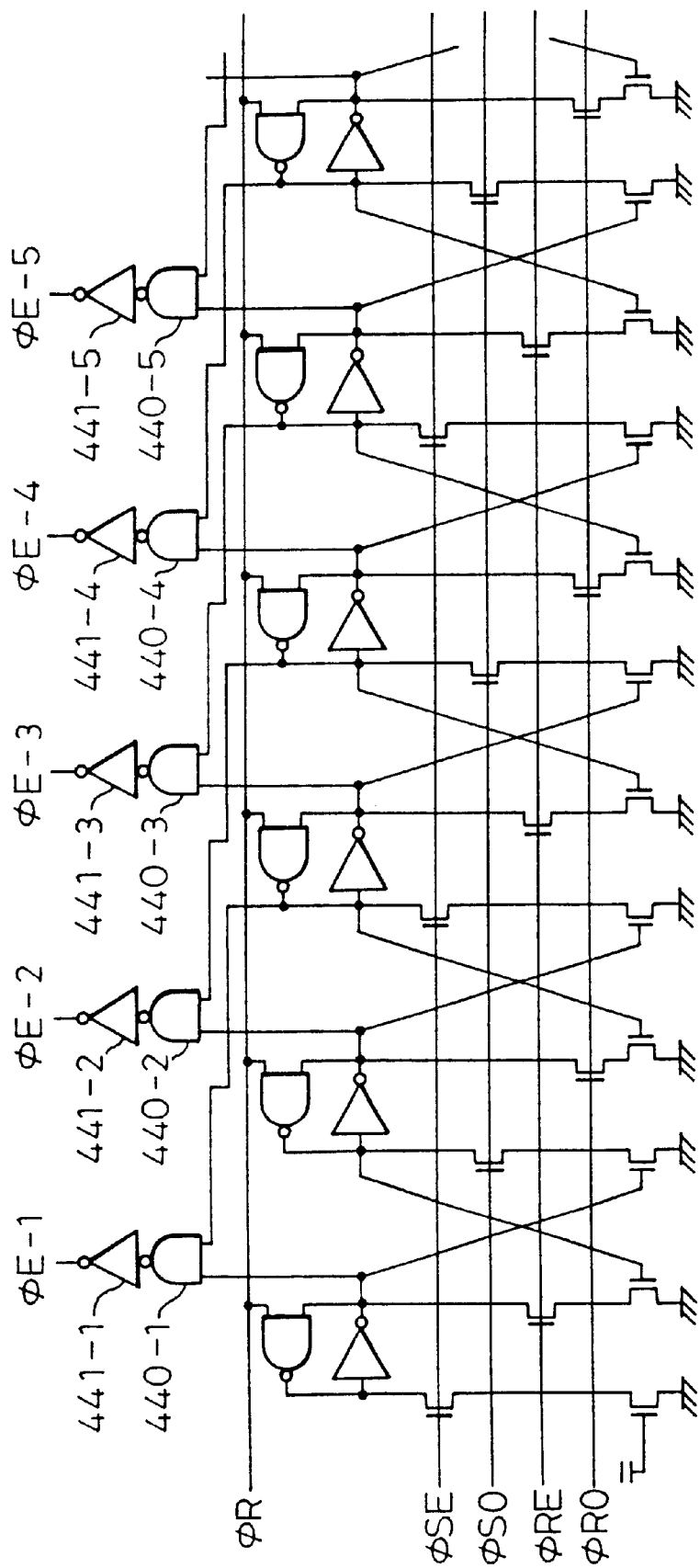
FIG. 15 is a diagram showing another example of the delay control circuit.

FIG. 15 is a diagram showing an example of circuitry in which AND circuits (combinations of NAND circuits and inverters) are substituted for the NOR circuits in the circuitry shown in FIG. 12. In this circuitry, inputs to an AND circuit are one of complementary signals output from one stage and the other one of complementary signals output from a stage succeeding an adjoining stage. Owing to this circuitry, outputs of two adjoining AND circuits are driven high at the same time, that is, indicate a selected position. Two AND circuits indicating a selected position are shifted one by one to adjoining circuits. One of the outputs of the two AND circuits therefore remains high. The state in which neither of the AND circuits indicates a selected position can be avoided. When the outputs of two AND circuits are high, two paths in the delay line shown in FIG. 11C are activated simultaneously. The waveform of a signal is therefore deformed slightly. However, the deformation can be ignored as long as the magnitude of a delay on one stage is small.

Figure 16:
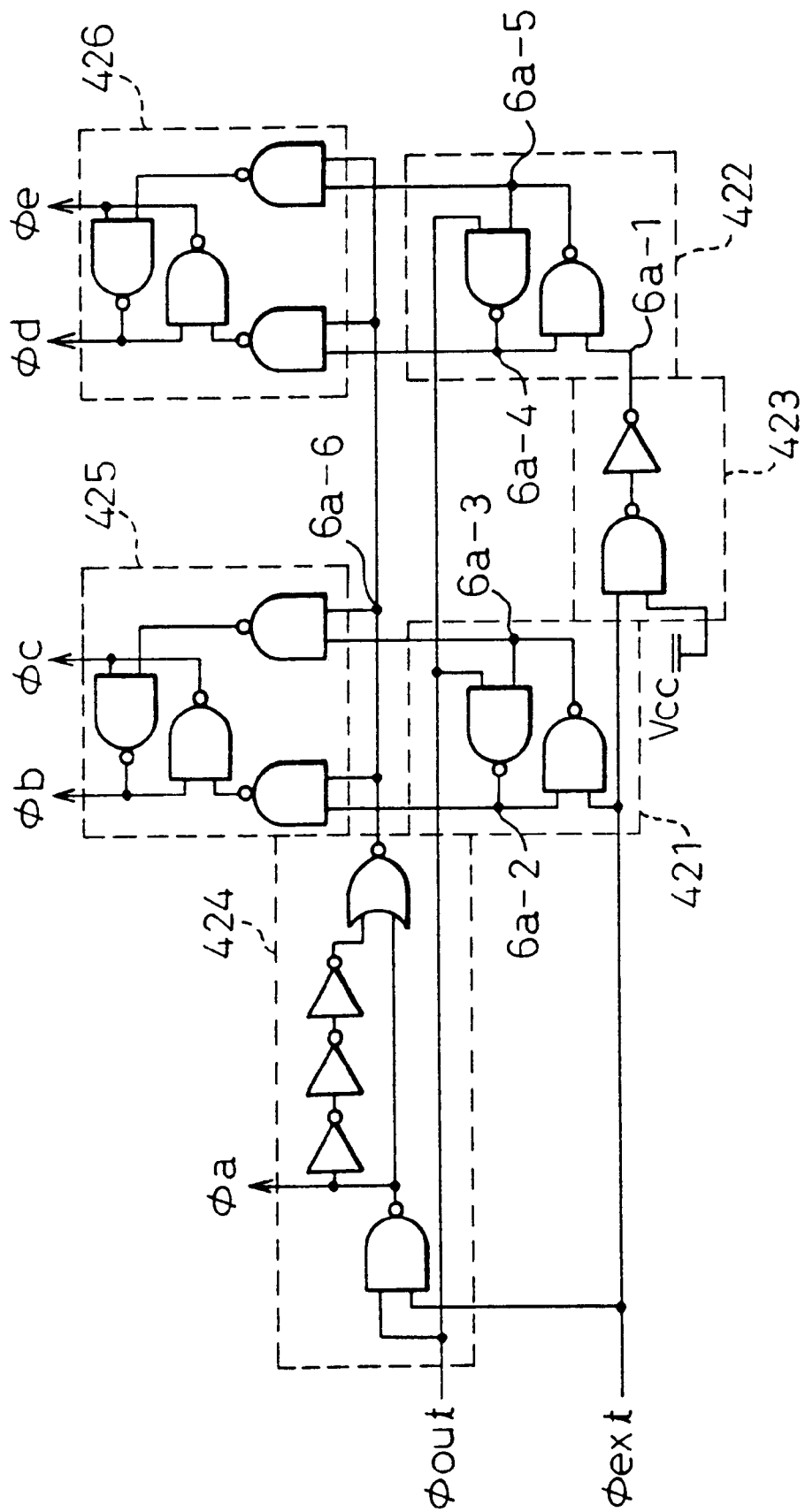
FIG. 16 is a diagram showing the circuitry of a phase comparison unit of a phase comparison circuit in the first embodiment.
Figure 19:
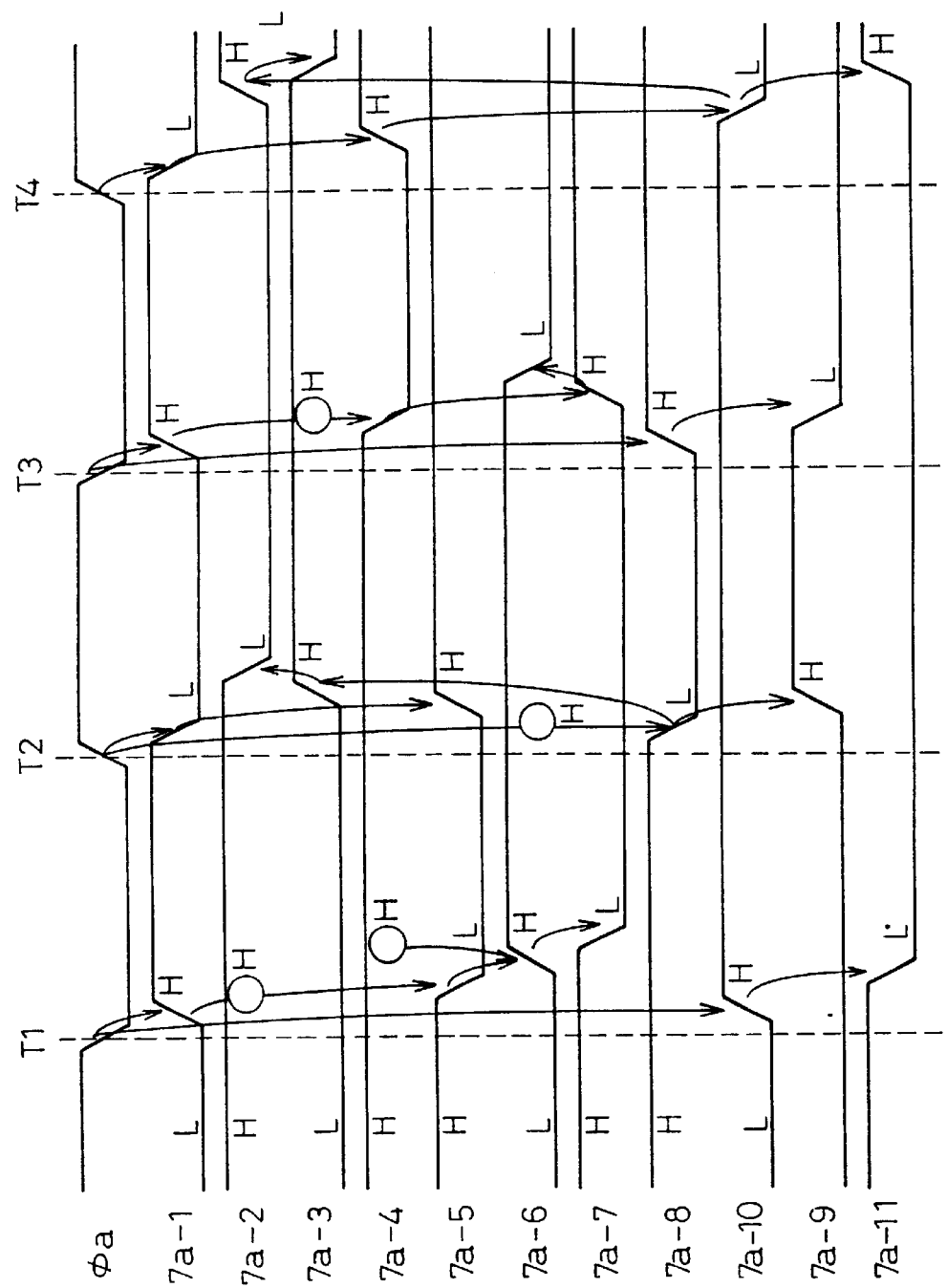
FIG. 19 is a timing chart showing the operations of a JK flip-flop included in the amplifier unit of the phase comparison circuit in the first embodiment.

The phase comparison circuit 42 is composed of two circuits; a phase comparator and amplifier unit. FIG. 16 is a diagram showing the circuitry of the phase comparator, FIGS. 17A to 17C are timing charts showing the operations of the phase comparator, and FIG. 19 is a timing chart showing the operations of the amplifier unit.

In FIG. 16, there are shown an output signal φout and external clock φext which are compared by the phase comparison circuit 42. The phase of the output φout is judged with reference to that of the clock φext. Output signals φa to φe are supplied to the amplifier unit. As shown in FIG. 16, the phase comparator consists of flip-flops 421 and 422 each composed of two NAND circuits, latches 425 and 426 for latching the states of the flip-flops, a circuit 424 for generating an activation signal for the latches, and a delay circuit 423 for providing the permissible value of the phase of the external clock φext and producing one delay.

Figures 17A, 17B, 17C:
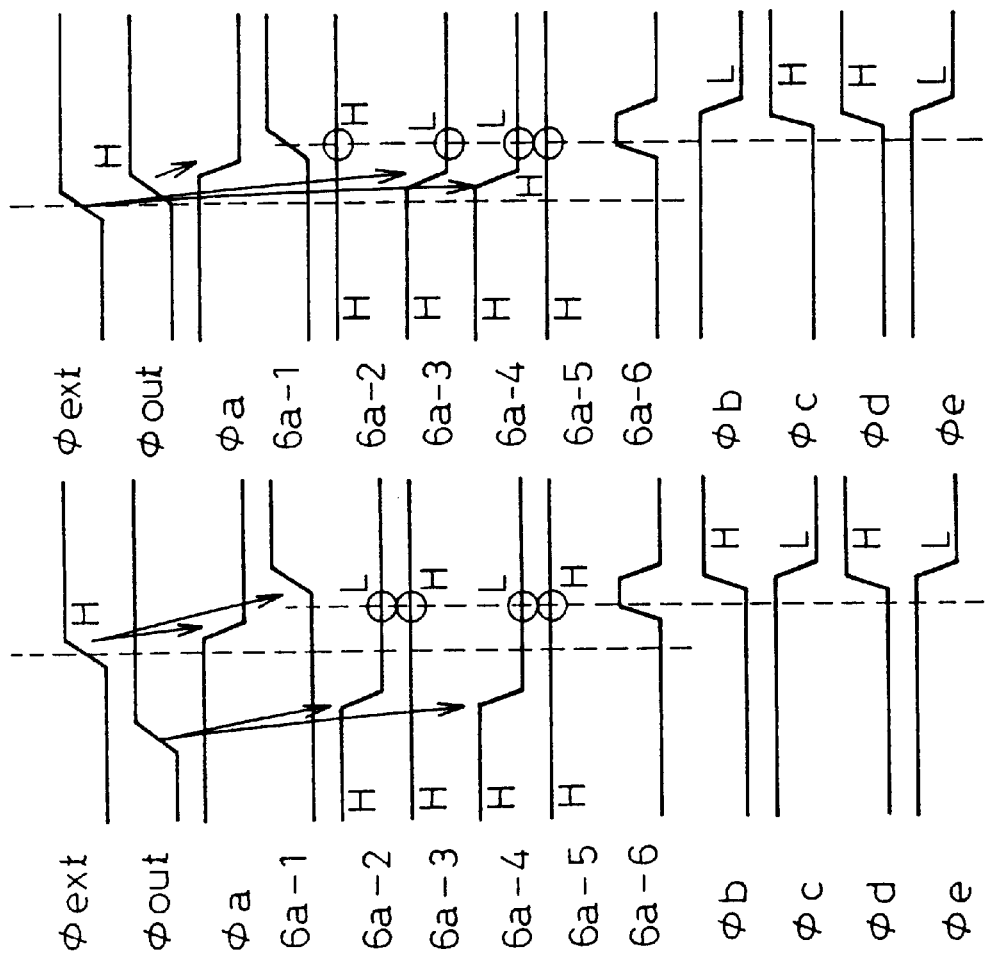
FIGS. 17A to 17C are timing charts showing the operations of the phase comparator of the phase comparison circuit in the first embodiment.

FIG. 17A shows a situation in which the object-of-comparison signal φout is leading the reference-of-comparison signal φext and the signal φout makes a low-to-high transition earlier than the signal φext. When both the signals φout and φext are low, the potentials at the terminals 6a-2, 6a-3, 6a-4, and 6a-5 of the flip-flops 421 and 422 are high. When the output φout makes a low-to-high transition, the terminals 6a-2 and 6a-4 make a high-to-low transition. Thereafter, the signal φext makes a low-to-high transition. The time corresponding to one delay later, a terminal 6a-1 makes a low-to-high transition. However, since the potentials across the flip-flops are already finalized, no transition occurs. The terminal 6a-2 remains low, the terminal 6a-3 remains high, the terminal 6a-4 remains low, and the terminal 6a-5 remains high. When the signal φext makes a low-to-high transition, the output signal φa of the circuit 424 makes a high-to-low transition. A high level pulse is applied temporarily to a terminal 6a-6. Since the terminal 6a-6 is connected to NAND circuits of the latches 425 and 426, the NAND circuits are activated temporarily. The potentials across the flip-flops 421 and 422 are therefore fetched into the latches 425 and 426. Finally, the output signal φb goes high, the output signal φc goes low, the output signal φd goes high, and the output φe goes low.

Next, FIG. 17B shows a situation in which the object-of-comparison signal φout is substantially in phase with the reference-of-comparison φext and the signal φout makes a low-to-high transition substantially simultaneously with the signal φext. The signal φout makes a low-to-high transition within a time interval between the rise time instant of the signal φext and the rise time instant of the potential at the terminal 6a-1. In this case, when the signal φext makes a low-to-high transition, the potential at the terminal 6a-3 of the flip-flop 421 makes a high-to-low transition. However, the potential at the terminal 6a-1 of the flip-flop 422 remains low and the potential at the terminal 6a-4 makes a high-to-low transition. Thereafter, the potential at the terminal 6a-1 makes a low-to-high transition. However, since the state of the flip-flop 422 is already finalized, no transition occurs. Thereafter, the terminal 6a-6 is driven high temporarily, the state is latched by the latch. Finally, the output signal φb goes the output signal φc goes high, the output signal φd goes high, and the output signal φe goes low.

FIG. 17C shows a situation in which the object-of-comparison signal φout lags behind the reference-of-comparison signal φext and the signal φout makes a low-to-high transition later than the signal φext. In this case, the signal φext causes the flip-flops 421 and 422 to make a state transition. The potentials at the terminals 6a-3 and 6a-5 make high-to-low transitions. Finally, the output signal φb goes low, the output signal φc goes high, the output signal φd goes low, and the output signal φe goes high.

Thus, it becomes possible to detect using the rise time instant of the signal φext as a reference whether the signal φout goes high earlier, nearly simultaneously, or later. The result of the detection is latched by setting the output signals φb, φc, φd, and φe to specific values. Based on the values, it is determined whether either a counting-up or counting-down operation should be carried out in order to select a stage of the delay control circuit.

Figure 18:
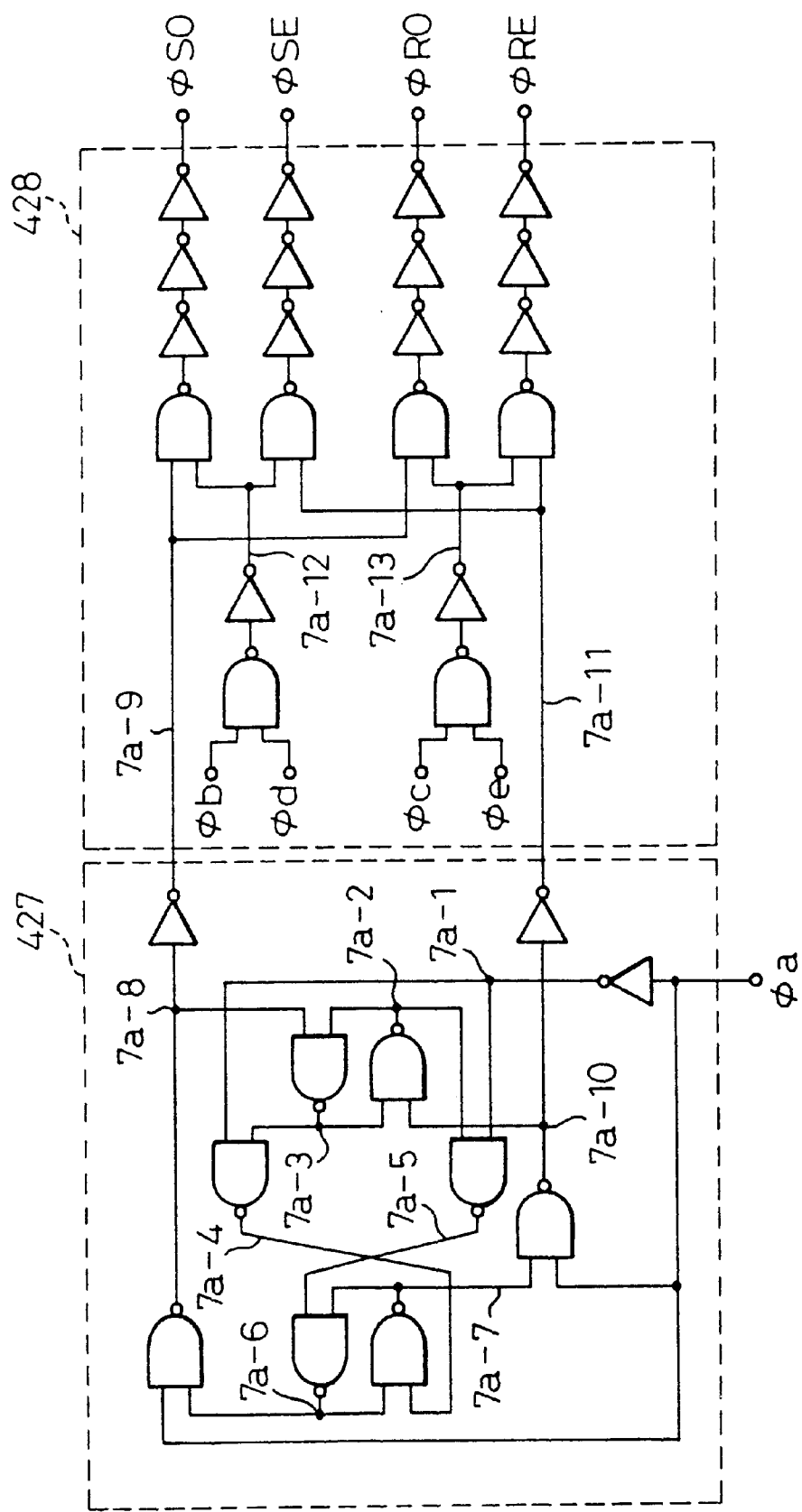
FIG. 18 is a diagram showing the circuitry of an amplifier unit of the phase comparison circuit in the first embodiment.

FIG. 18 is a diagram showing the circuitry of the amplifier unit of the phase comparison circuit 42.

The amplifier unit consists of two blocks; a JK flip-flop 427 and an amplifier 428 composed of NAND circuits and inverters. The JK flip-flop 427 inputs a signal φa from the phase comparator shown in FIG. 16. Depending on whether the signal φa is low or high, the potentials at terminals 7a-9 and 7a-11 go low and high alternately and repeatedly. The amplifier 428 amplifies and outputs an output signal of the JK flip-flop 427 according to the signals φb to φd.

To begin with, the operations of the JK flip-flop 427 will be described with reference to the timing chart of FIG. 19. When the signal φa makes a high-to-low transition at a time instant T1, the potential at a node 7a-10 makes a low-to-high transition. With the state transition of the potential at a node 7a-1, the potentials at terminals 7a-1, 7a-6, and 7a-7 make a state transition. However, since the signal φa is low, the potential at a node 7a-8 does not make a state transition. Consequently, an output 7a-9 makes no state transition Only an output 7a-11 makes a low-to-high transition. Thereafter, when the signal φa makes a low-to-high transition at a time instant T2, the potential at a node 7a-8 makes a high-to-low transition opposite to that at the time instant T1. The potential at the node 7a-10 makes no state transition because the potential at a terminal 7a-7 makes no state transition. The output 7a-9 makes a low-to-high transition, while the output 7a-11 makes no state transition. Thus, the outputs 7a-9 and 7a-11 of the JK flip-flop 427 go high and low alternately and repeatedly in responsive to the state transition of the signal φa.

Figure 20:
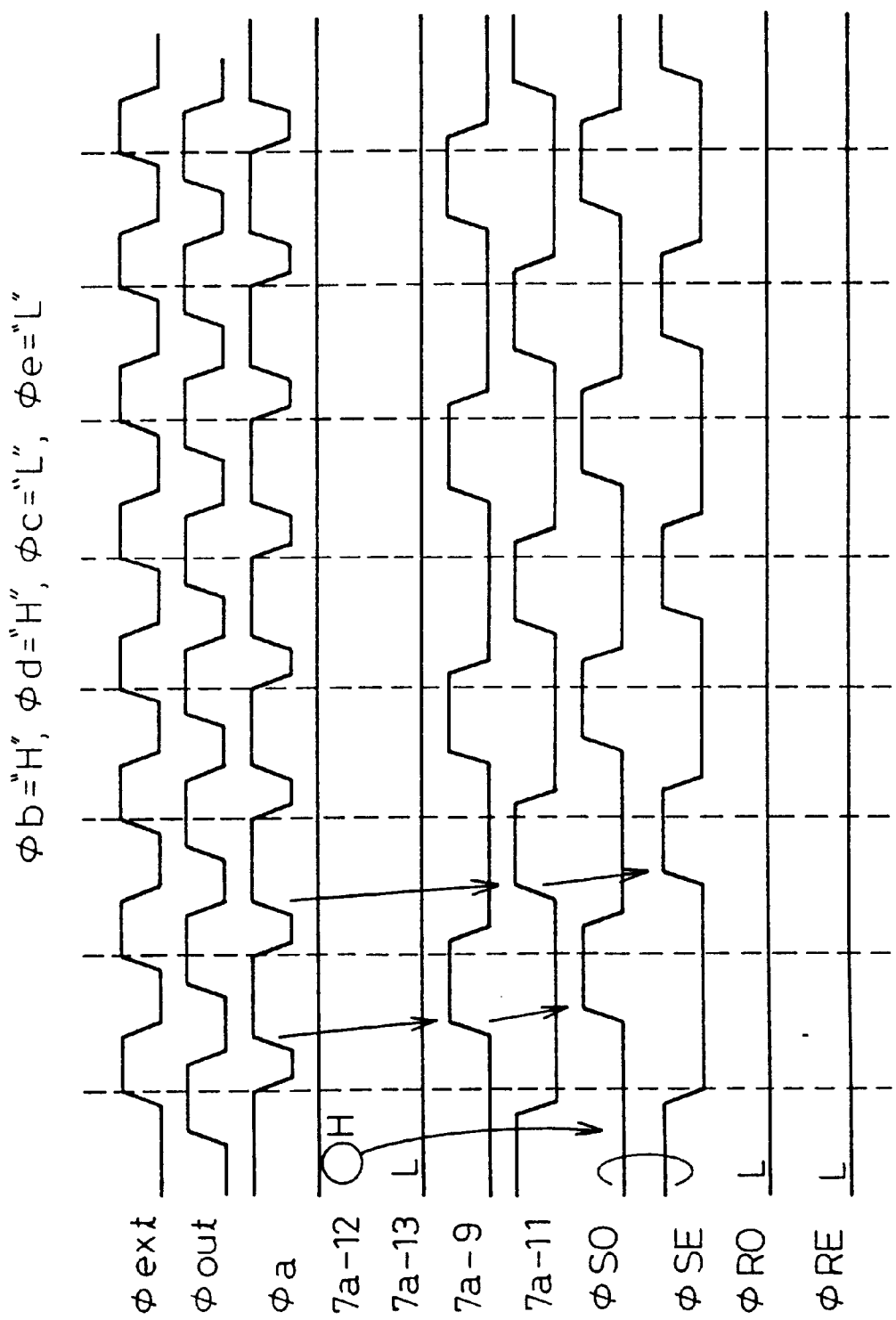
FIG. 20 is a timing chart showing a counting-up operation performed by the amplifier unit of the phase comparison circuit in the first embodiment.

Next, the operations of the amplifier 428 will be described with reference to FIGS. 20 to 22. FIG. 20 shows a situation in which the object-of-comparison signal φout makes a low-to-high transition earlier than the rise of the reference-of-comparison signal φext. The input signal φb sent from the phase comparator goes high, the input signal φc goes low, the input signal φd goes high, and the input signal φe goes low. Consequently, the potential at a terminal 7a-12 is fixed to high and the potential at a terminal 7a-13 is fixed to low. The signals φSO and φSE make a state transition according to the state of the JK flip-flop. However, the signals φRO and φRE make no state transition because the potential at the terminal 7a-13 is low.

Figure 21:
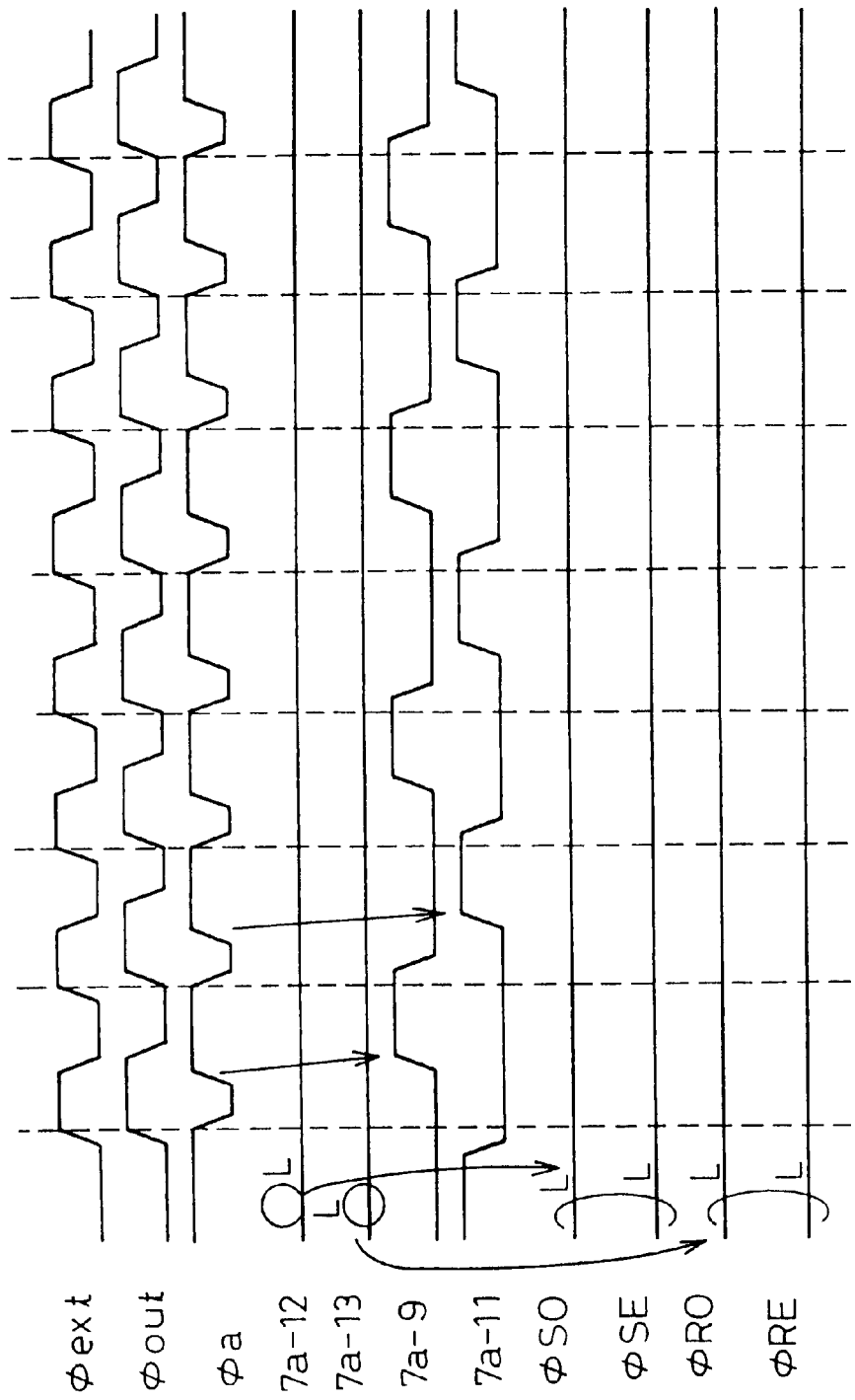
FIG. 21 is a timing chart showing a count retaining operation performed by the amplifier unit of the phase comparison circuit in the first embodiment.

FIG. 21 shows a situation in which the object-of-comparison signal φout and reference-of-comparison signal φext make a low-to-high transition nearly simultaneously. The signal input from the phase comparator, φb, is low, the input signal φc is high, the input signal φd is high, and the input signal φe is low. Consequently, the potentials at the terminals 7a-12 and 7a-13 are fixed to low. The output of the JK flip-flow will not affect an output of the amplifier, and the signals φSO, φSE, φRO, and φRE remain low.

Figure 22:
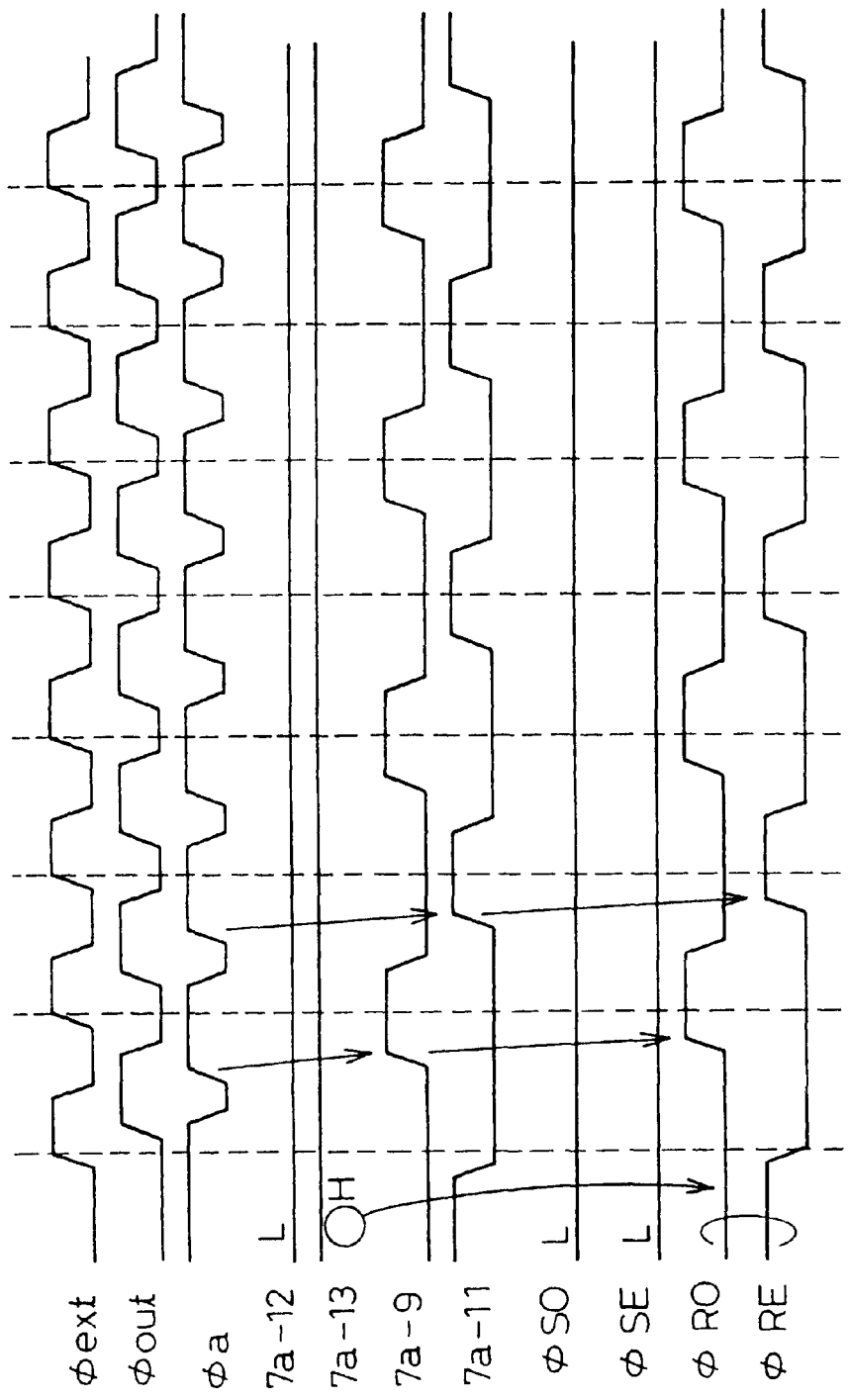
FIG. 22 is a timing chart showing a counting-down operation performed by the amplifier circuit of the phase comparison circuit in the first embodiment.

FIG. 22 shows a situation in which the object-of-comparison signal φout makes a low-to-high transition later than the rise of the reference-of-comparison signal φext. In this case, the signal input from the phase comparator, φb is low, the input signal φc is high, the input signal φd φis low and the input signal φe is high. Consequently, the potential at the terminal 7a-12 is fixed to low and the potential at the terminal 7a-13 is fixed to high. The signals φRO and φRE make a state transition according to the state of the JK flip-flop. The signals φSO and φSE make no state transition because the potential at the terminal 7a-12 is low.

Figure 23:
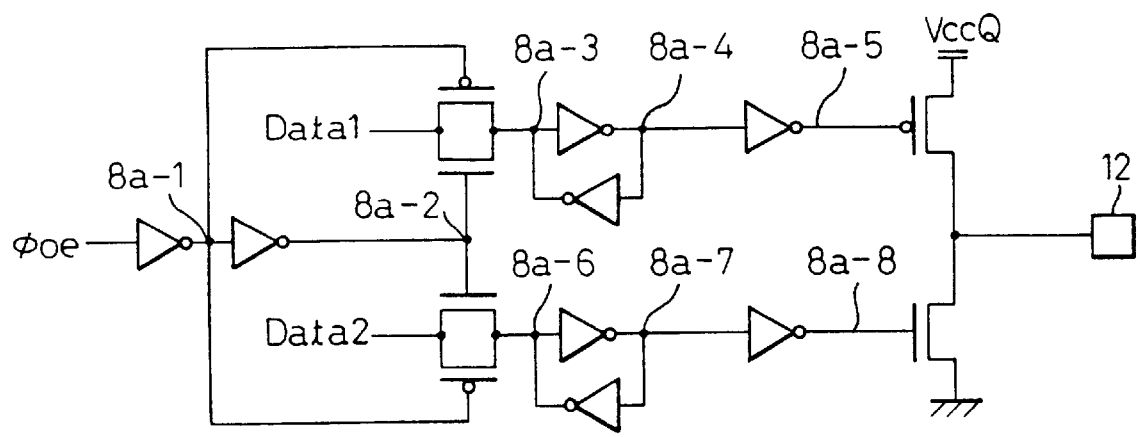
FIG. 23 is a diagram showing the circuitry of an output circuit in the first embodiment.

FIG. 23 is a diagram showing the circuitry of the output circuit 14.

In FIG. 23, signals Data 1 and Data 2 are associated with stored data items that are read from a cell array 115 and output via the sense amplifier 117, data bus amplifier 119, and data bus control circuit 120. When the output data is high, the signals Data1 and Data2 are low. When the output data is low, the signals Data1 and Data2 are high. The output data may be neither high nor low but may exhibit a high impedance. In this case, the data bus control circuit 120 causes the signal Data1 to go high and the signal Data2 to go low. A signal φoe is an output signal of the delay circuit 40. According to the signal φoe, the output timing of the output circuit is controlled. When the signal φoe goes high, information represented by the signal Data1 or Data2 is output through the data output terminal 12. For outputting a high-level signal through the data output terminal 12, the signal φoe makes a low-to-high transition, the potential at a node 8a-1 goes low, the potential at a node 8a-2 goes high, and transfer gates are turned on. The signals Data1 and Data2 are therefore transmitted to nodes 8a-3 and 8a-6. Consequently, the potential at terminal 8a-5 is driven low, and the potential at terminal 8a-8 is driven low. A p-channel transistor for output is turned on, while an n-channel transistor is turned off. A high-level output is developed at the data output terminal 14. When the signal φoe is driven low, the transfer gates are turned off. The previous output state is retained.

Figure 24:
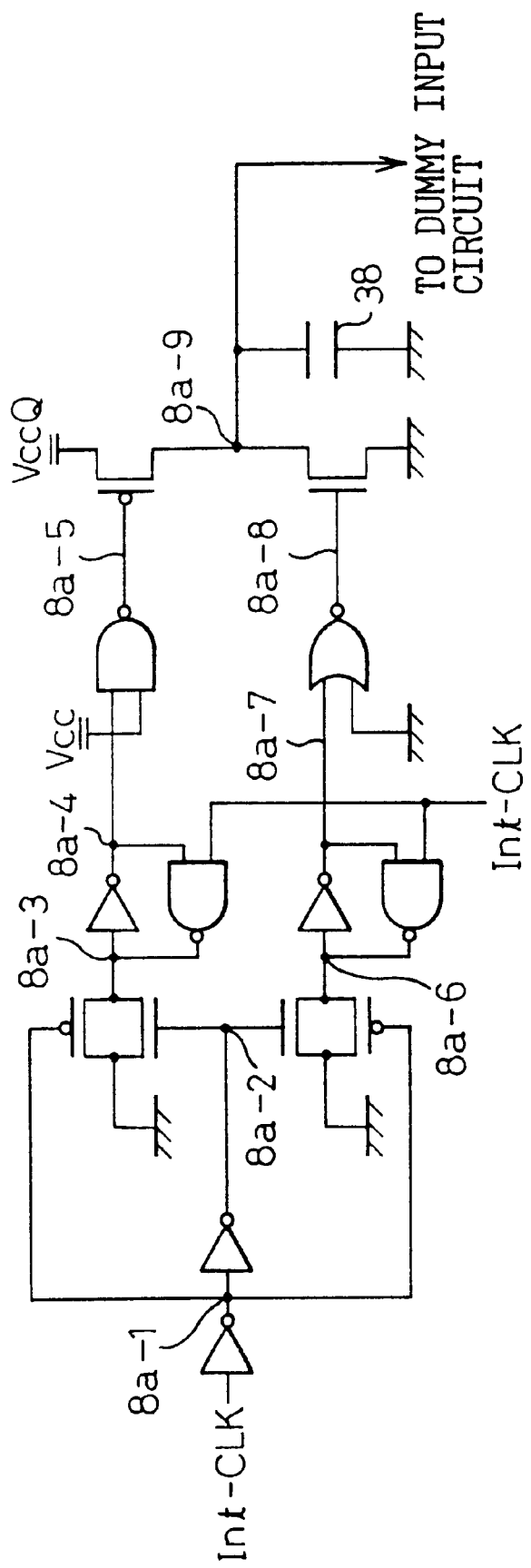
FIG. 24 is a diagram showing the circuitry of a dummy output circuit in the first embodiment.
Figure 25A:
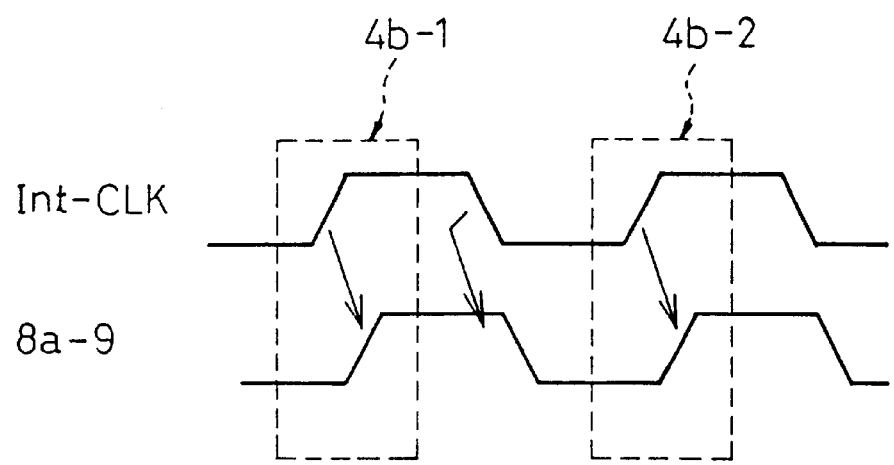
FIGS. 25A and 25B are timing charts showing the operations of the dummy output circuit in the first embodiment.
Figure 25B:
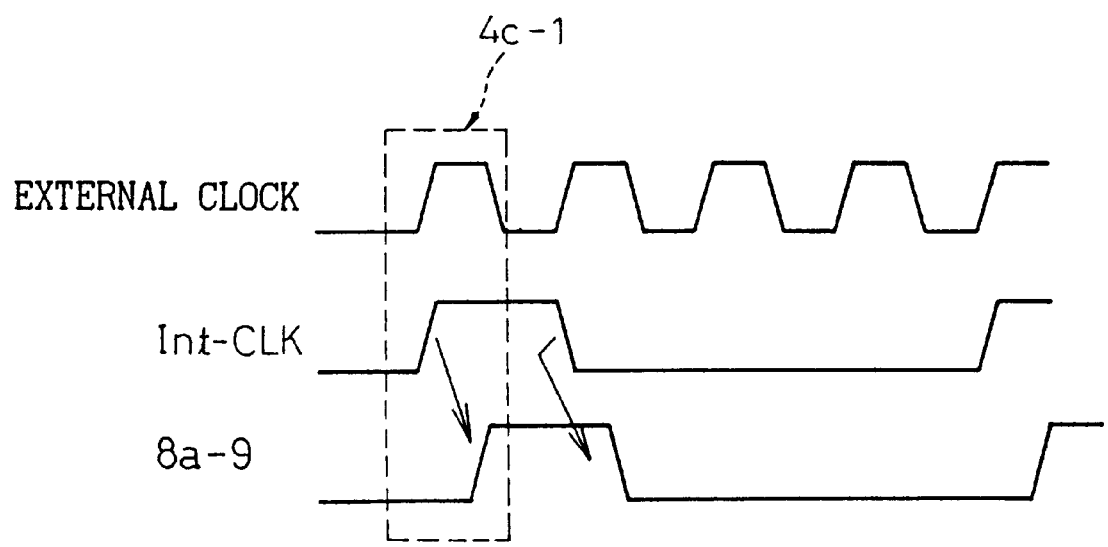

FIG. 24 is a diagram showing the circuitry of the dummy output circuit 37 as well as a capacitive device 38 serving as a dummy output load. FIGS. 25A and 25B are diagrams showing the operations of the dummy output circuit 37 and indicating the relationship of an internal clock with a dummy output signal developing at a terminal 8a-9. FIG. 25A shows the operations performed without the one-Nth frequency divider 135. FIG. 25B shows the operations performed with a frequency division ratio set to 4.

As apparent from the output circuit 14 shown in FIG. 23, the dummy output circuit 37 has circuitry analogous to that of the output circuit 14. Unlike the output circuit 14, the dummy output circuit need not output data. Signals input through transfer gates are therefore fixed to low. For outputting data, the dummy output 8a-9 goes high without fail. A clock Int-CLK is an internal clock that is used to open or close transfer gates for controlling the output timing of the dummy output circuit and is input to one of the terminals of a NAND circuit including a feedback inverter. As shown in FIG. 25A, when the clock- int-CLK goes high, the dummy output 8a-9 is driven high through the same operations as the output circuit 14. When the clock Int-CLK goes back to low, the transfer gates are closed and the potentials at nodes 8a-3 and 8a-6 are driven high. The dummy output 8a-9 is driven low.

FIG. 25A shows waveforms attained without the one-Nth frequency divider 135. A clock int-CLK has the same cycle as an external clock CLK. In FIG. 25A, the capacitance of the dummy output load 38 is very small. In practice, a load having a capacitance corresponding to the capacitance of a line on which the output circuit of the SDRAM is connected or the capacitance of a device to be driven must be included. The rise and fall times of the dummy output 8a-9 become vary long. The operations of the dummy output circuit are restricted by the rise and fall times of the dummy output 8a-9. When the cycle of the external clock CLK gets shorter, the dummy output circuit may not operate.

In this embodiment, as shown in FIG. 10, the one-Nth frequency divider 135 is included. The one-Nth divider 135 calculates a submultiple of the frequency of an output of the latch 133, and generates a clock Int-CLK shown in FIG. 25B in relation to the external clock. The clock Int-CLK goes high during one cycle of the external clock with every four external clock pulses. Using the clock Int-CLK for the dummy output circuit, a problem, that the frequency at which the dummy output circuit can operate is restricted by the rise and fall times of a dummy output, can be avoided.

When the one-Nth frequency divider 135 is included, the dummy output 8a-9 has a waveform shown in FIG. 25B. The phase comparison circuit 42 compares the phase of the dummy output with that of the external clock once per four cycles of the external clock. The power consumption is reduced accordingly.

The components of the SDRAM of the first embodiment have been described so far. In the SDRAM of the first embodiment, for specifying the magnitude of a delay to be produced by the delay circuit 41a or 41b, a reset is carried out to specify an initial position. Thereafter, a selected position is shifted stage by stage on the basis of the result of comparison of phases in order to attain a given phase relationship. Some time is therefore required after the magnitude of a delay is reset at the time of turning on the power supply until an optimal magnitude of a delay is specified. When the SDRAM of the first embodiment is employed, therefore, a given initialization period must be preserved after the power supply is turned on so that an external clock can be applied for a given number of pulses.

In the SDRAM of the first embodiment, the internal processing system is divided into a plurality of pipes that successively carry out processing. The pipes operate in parallel. The above description has referred to the output operations alone. The input operations are also pipelined. Input or output of data can therefore be carried out synchronously with a high-frequency external clock. The transfer rate improves drastically.

As mentioned above, in the SDRAM of the first embodiment, the output timing of data is controlled so that the data exhibits a given phase relative to the external clock. Even if the temperature or supply voltage changes during the use of the SDRAM, data is always output synchronously with the given phase of the external clock. Moreover, dummy circuits equivalent to the input circuit and output circuit are included. In consideration of variations of the magnitudes of delays occurring in the input and output circuits, control is given so that the given phase can be attained relative to the external clock. Thus, a phase relationship can be controlled very accurately. This results in a further improved transfer rate.

In an existing semiconductor device, the ratings of an output signal and other signals are stipulated to be compatible with any other semiconductor device. An SDRAM or a semiconductor device to be used in combination with the SDRAM generally adopts either of two standards "Low Voltage Transistor Transistor Logic (LVTTL)" and "Series Stub Termination Logic (SSTL)." In some SDRAMs, an output circuit capable of outputting data according to either of the two standards is included, and a selector signal is applied externally in order to set the output circuit to either of the two standards. If an output circuit can be switched to either of modes so that an output can be provided according to either of different standards, the characteristic of the output circuit changes with the switching. As already described, since a variation of the magnitude of a delay occurring in an output circuit is so large that it is important to include a dummy output circuit equivalent to the output circuit and to use a signal passing through the dummy output circuit for phase comparison. If the characteristic of the output circuit changes with switching, the characteristic of the dummy output circuit must be changed accordingly. The second to fourth embodiments are embodiments of SDRAMs in which the characteristic of an output circuit can be changed by switching.

Figure 26:
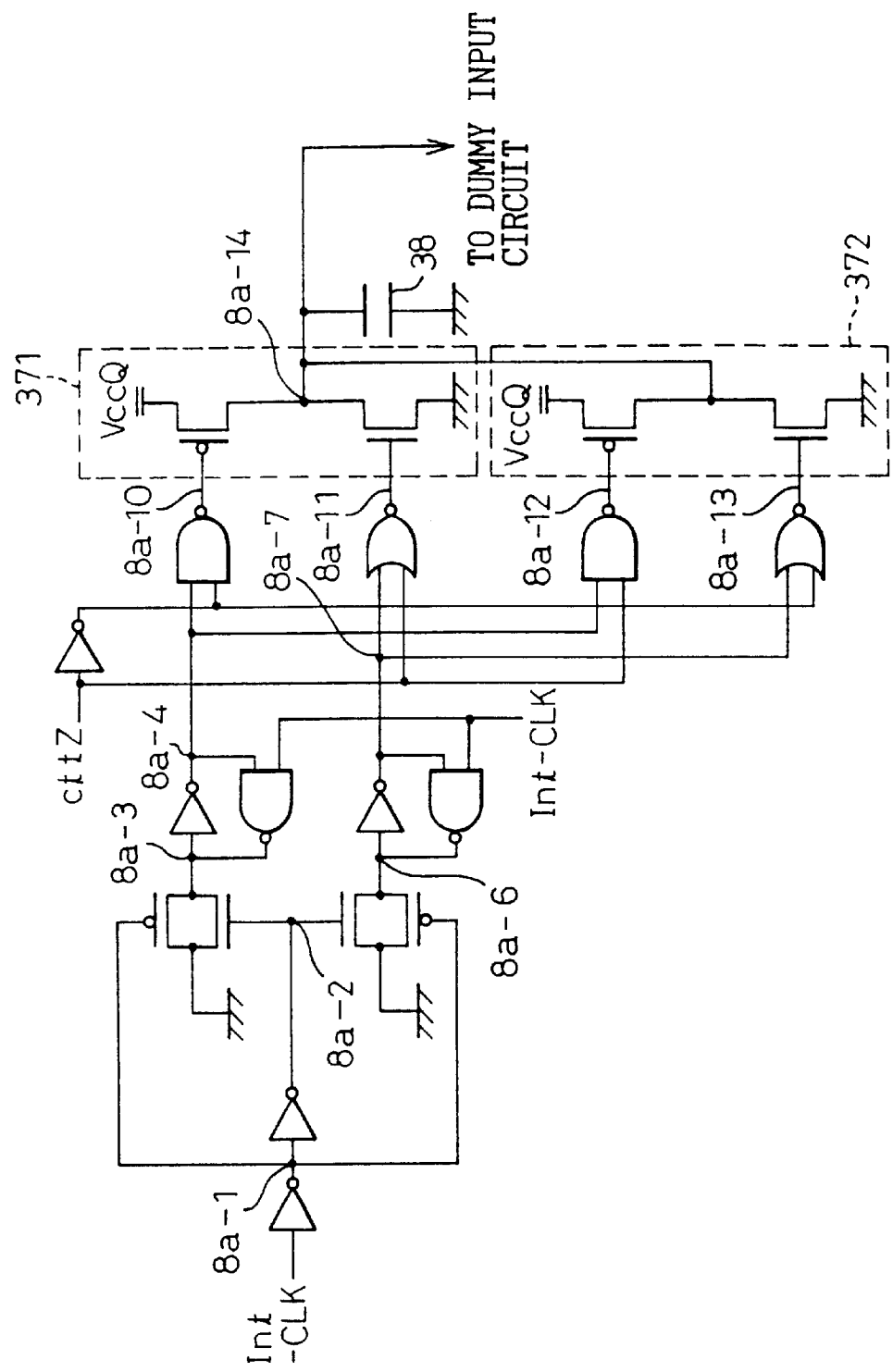
FIG. 26 is a diagram showing the circuitry of a dummy output circuit in the second embodiment.

FIG. 26 is a diagram showing the circuitry of a dummy output circuit in an SDRAM of the second embodiment. The SDRAM of the second embodiment has the same components as that of the first embodiment except for the dummy output circuit.

As apparent from comparison with FIG. 24, a difference of the dummy output circuit in the SDRAM of the second embodiment from that in the first embodiment lies in that two drivers each composed of an n-channel transistor and p-channel transistor are included; that is, a driver 371 conformable to the LVTTL and a driver 372 conformable to the SSTL, and that a selector signal cttz for instructing which driver should be selected is input to NAND circuits and NOR circuits connected to the gates of the n-channel transistors and p-channel transistors. The sizes of the p-channel transistor and n-channel transistor constituting the LVTTL-conformable driver 371 are different from those of the p-channel transistor and n-channel transistor constituting the SSTL-conformable driver 372. The sizes of transistors constituting each driver are defined appropriately according to an output mode. The selector signal cttz is driven high in order to indicate the SSTL standard, and driven low in order to indicate the LVTTL standard. The selector signal cttZ is generated by judging whether a voltage applied externally to a reference power terminal is equal to or larger than a given value Vref. In the circuitry shown in FIG. 26, when the selector signal cttz is high, signals to be applied to the gates of the n-channel transistor and p-channel transistor of the LVTTL-conformable driver 371 make a state transition according to the potentials at nodes 8a-4 and 8a-7. Consequently, a dummy signal is output. Low-level and high-level signals are applied to the gates of the n-channel transistor and p-channel transistor of the SSTL-conformable driver 371, and both the n-channel transistor and p-channel transistor of the SSTL-conformable driver 371 are turned off to enter a so-called high-impedance state. By contrast, when the selector signal cttz is low, the LVTTL-conformable driver 371 enters a high-impedance state and the SSTL-conformable driver 371 outputs a dummy signal.

Thus, in the SDRAM of the second embodiment, the characteristic of the dummy output circuit is switched.

Figure 27:
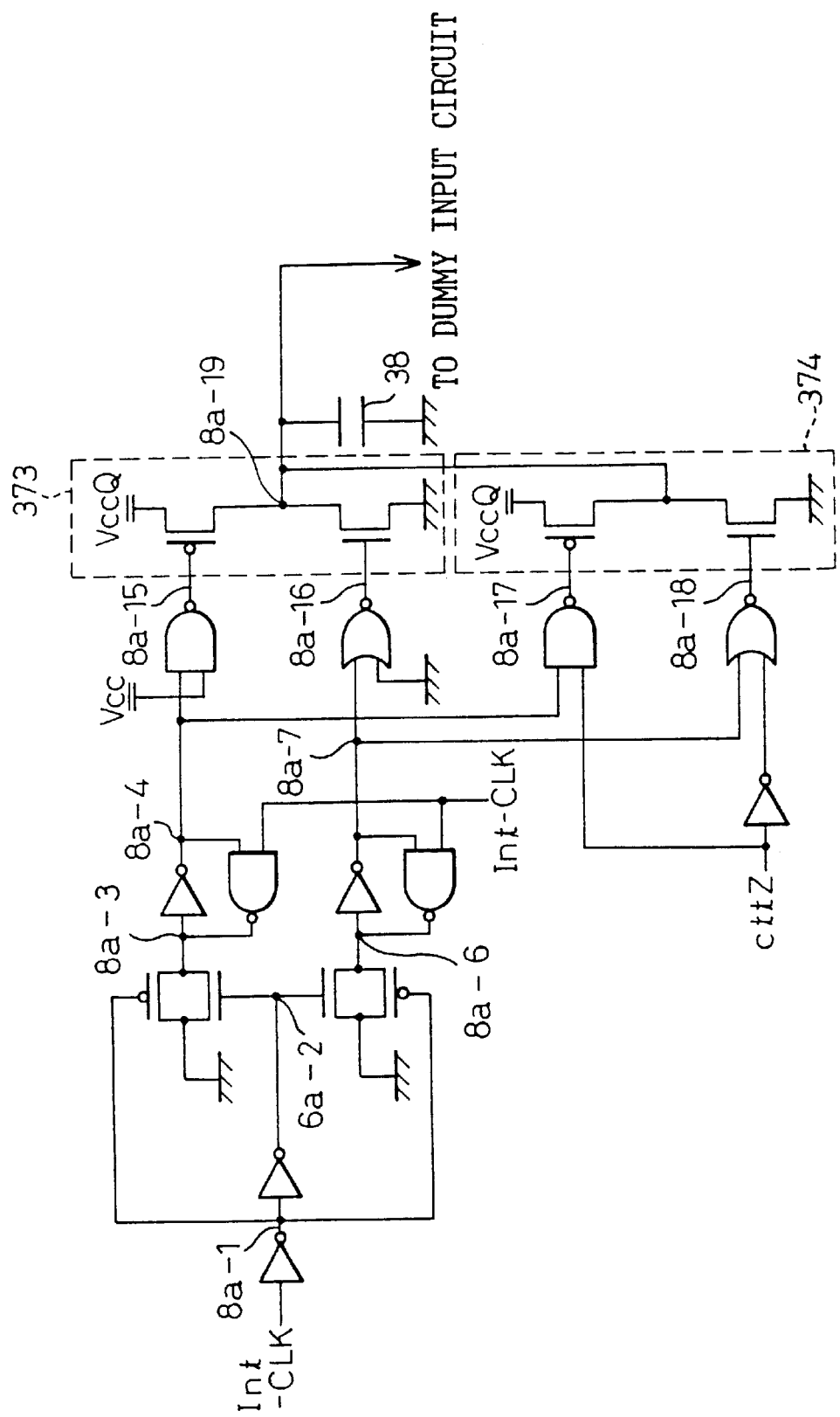
FIG. 27 is a diagram showing the circuitry of a dummy output circuit in the third embodiment.

FIG. 27 is a diagram showing the circuitry of a dummy output circuit in an SDRAM of the third embodiment. The SDRAM of the third embodiment has the same components as the SDRAM of the first embodiment except the dummy output circuit.

A current flowing into an output transistor in a driver is different between the SSTL and LVTTL standards. The SSTL standard requires that a larger current should flow. The current flowing into the output transistor varies depending on the dimensions of the transistor. A transistor used to meet the SSTL standard must therefore be larger in size. In general, a transistor employed in a driver is large in size. For including two drivers conformable to the SSTL and LVTTL respectively as shown in FIG. 26, a large area is needed. The dummy output circuit in the SDRAM of the third embodiment includes an LVTTL-conformable driver 373, and a driver 374 capable of causing a current conformable to the SSTL standard to flow when used in combination with the LVTTL-conformable driver 373. When the LVTTL standard is instructed, the driver 374 is brought to a high-impedance state. When the SSTL standard is instructed, both the LVTTL driver 373 and driver 374 operate so that a current conformable to the SSTL standard can flow.

The SSTL and LVTTL standards each stipulate an output load. An SDRAM of the fourth embodiment is an SDRAM in which dummy output loads can be switched.

Figure 28:
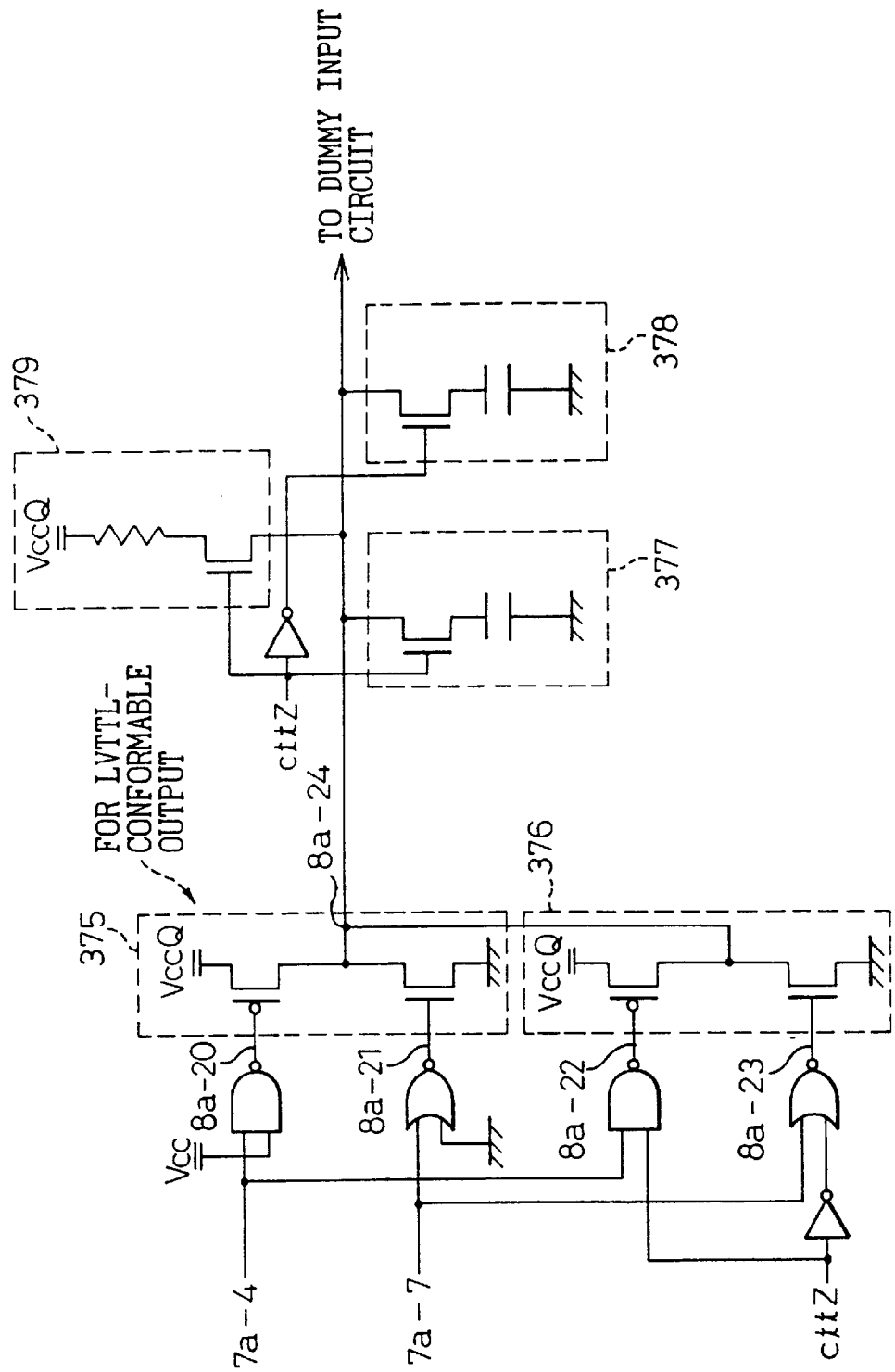
FIG. 28 is a diagram showing the circuitry of a dummy output circuit in the fourth embodiment.

FIG. 28 is a diagram showing the circuitry of a dummy output circuit in the SDRAM of the fourth embodiment. The SDRAM of the fourth embodiment has the same components as the SDRAM of the third embodiment except the dummy output loads.

As shown in FIG. 28, the dummy output circuit in the SDRAM of the fourth embodiment has two dummy output loads; an SSTL-conformable load 377 and LVTTL-conformable load 378. Either of the loads can be selectively connected to a dummy output terminal 8a-24 according to a selector signal cttz. A capacitive device having a capacitance of 30 pF is used as the SSTL-conformable load 377, and a capacitive device having a capacitance of 50 pF is used as the LVTTL-conformable load. Furthermore, when the SSTL-conformable load 377 is selected, a termination resistor 379 having one terminal thereof connected to a power supply VccQ is connected to the dummy output terminal 8a-24.

In the first to fourth embodiments, the dummy output circuit outputs data that rises or makes a low-to-high transition. The phase of the leading edge of the data relative to an external clock is detected. However, a variation in the magnitude of a delay occurring in an output circuit is different between data that rises to make a low-to-high transition and data that falls to make a high-to-low transition. In the configurations of the first to fourth embodiments, there is a difference in phase relative to the external clock between the rising data and falling data. In general, the circuitry like the ones shown in FIGS. 26 to 28 in which an n-channel transistor and p-channel transistor are connected in series between a power supply terminal and ground and either of the transistors is turned on according to data to be output is adopted for a driver in an output circuit. In this kind of driver, the driving abilities of the n-channel transistor and p-channel transistor may be unbalanced because of a difference in conditions for manufacturing between the n-channel transistor and p-channel transistor. This leads to the difference in phase. The fifth embodiment attempts to solve this problem.

Figure 29:
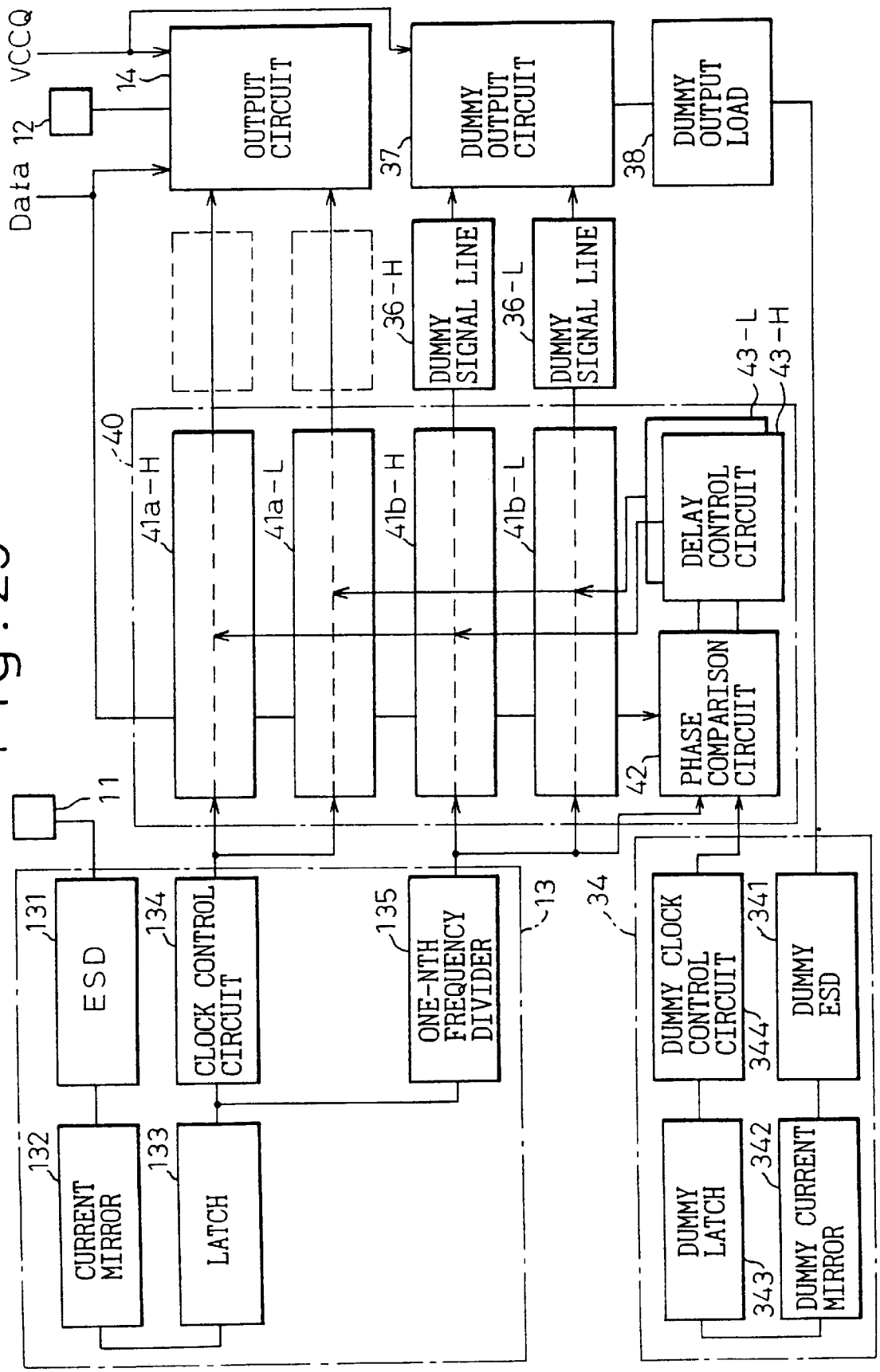
FIG. 29 is a diagram showing the configuration of the portion of an SDRAM of the fifth embodiment responsible for output timing control.

FIG. 29 is a diagram showing the configuration of an output timing control circuit in an SDRAM of the fifth embodiment.

As apparent from comparison between FIGS. 10 and 29, a difference of the SDRAM of the fifth embodiment from that of the first embodiment lies in a point that two delay circuits and two dummy delay circuits are included so that the phases of rising data and falling data can be adjusted independently. The difference from the first embodiment will be described below.

A first delay circuit 41a-H is a delay circuit for adjusting the output timing of rising data, and a second delay circuit 41a-L is a delay circuit for adjusting the output timing of falling data. A clock CLK output from the clock control circuit 134 is input to both the delay circuits. An output of the first delay circuit 41a-H is input to the output circuit 14 and used as a timing signal for outputting high-level data. An output of the second delay circuit 41a-L is input to the output circuit 14 and used as a timing signal for outputting low-level data. Likewise, a first dummy delay circuit 41b-H is a dummy delay circuit for adjusting the output timing of rising dummy data, and a second dummy delay circuit 41b-L is a dummy delay circuit for adjusting the output timing of falling dummy data. A clock Int-CLK output from the one-Nth frequency divider 135 is input to both the dummy delay circuits. An output of the first dummy delay circuit 41b-H is input to the dummy output circuit 37 over a dummy signal line 36-H and used as a timing signal for outputting high-level dummy data. An output of the second dummy delay circuit 41b-L is input to the dummy output circuit 37 over a dummy signal line 36-L and used as a timing signal for outputting low-level dummy data. The delay circuits have the same circuitry.

A delay control circuit is composed of two delay control circuits 43-H and 43-L having the circuitry shown in FIG. 11C. An output of the delay control circuit 43-H is used to specify the magnitude of a delay to be produced by the first delay circuit 41a-H and first dummy delay circuit 41b-H. An output of the delay control circuit 43-L is used to specify the magnitude of a delay to be produced by the second delay circuit 41a-L and second dummy delay circuit 41b-L.

Figure 30:
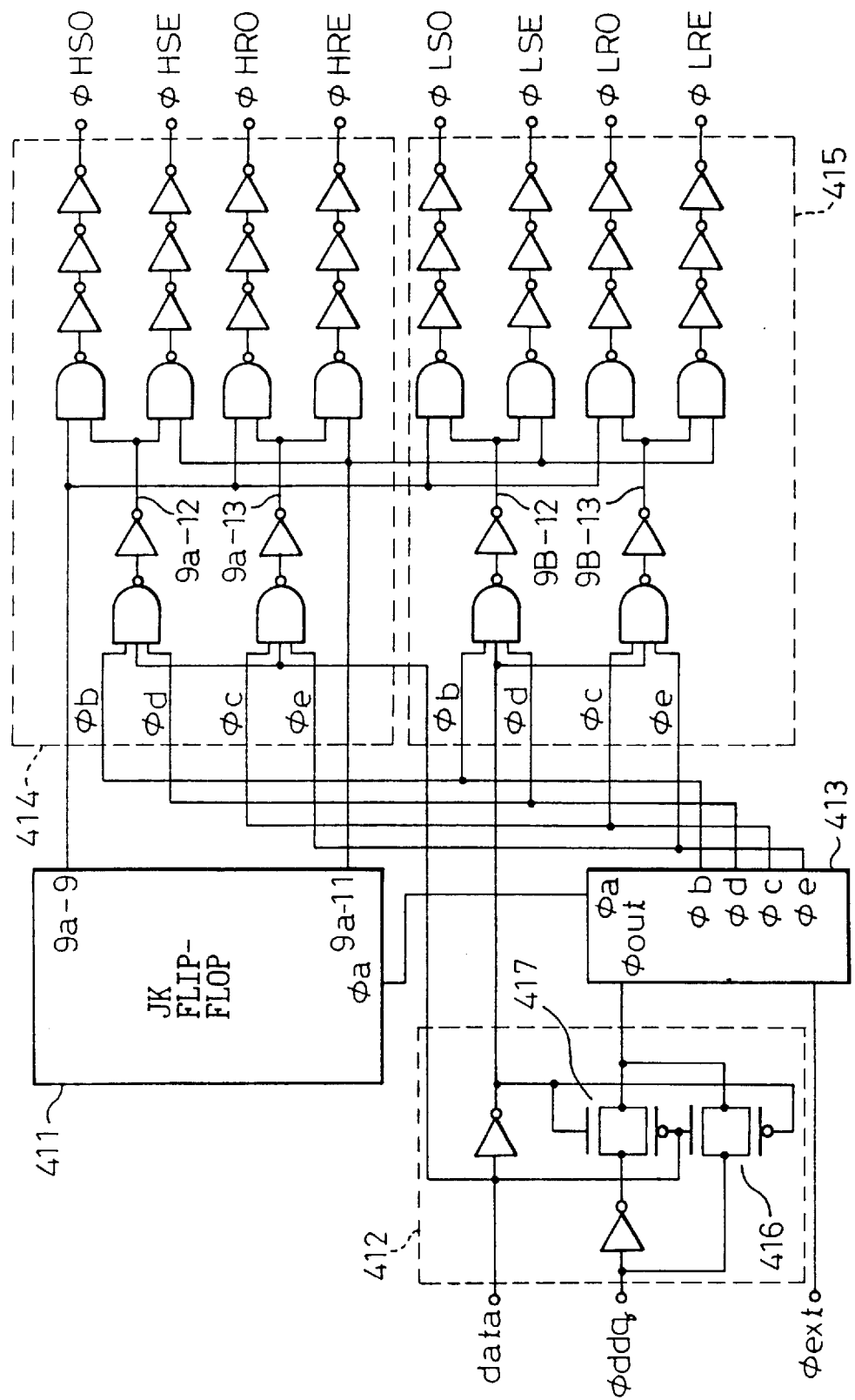
FIG. 30 is a diagram showing the circuitry of a phase comparison circuit in the SDRAM of the fifth embodiment.

FIG. 30 is a diagram showing the circuitry of a phase comparison circuit in the fifth embodiment. As apparent from comparison with FIGS. 16 and 18, a difference from the first embodiment lies in a point that a switching circuit 412 for causing a signal $\phi$ddq to go high in response to a signal, data, is included as a stage preceding a comparator of the phase comparison circuit, and in a point that two amplifiers are included; an amplifier 414 for outputting a high-level signal and an amplifier 415 for outputting a low-level signal.

In the switching circuit 412, for example, when the signal, data, is high, the signal $\phi$ddq makes a low-to-high transition. This enables output of a high-level signal. Since the signal, data, is high, a transfer gate 416 is turned on. This causes the signal $\phi$ddq to input as a signal $\phi$out to a phase comparator 413. On the contrary, when the signal, data, is low, a transfer gate 417 is turned on. A signal whose polarity is opposite to that of the signal $\phi$ddq is input as a signal $\phi$out to the phase comparator 413. The input $\phi$out of the phase comparator 413 is a signal always making a high to low transition irrespective of the input signal. The phase comparator 413 has the same circuitry as that shown in FIG. 16.

The two amplifiers 414 and 415 have the same circuitry as that shown in FIG. 18. A difference lies in a point that a NAND circuit that inputs signals $\phi$b to $\phi$e is formed as a circuit capable of inputting three signals and is controlled with the signal data. When the signal, data, is high, the amplifier 414 for outputting a high-level signal is activated to operate. When the signal, data, is low, the amplifier 415 for outputting a low-level signal is activated to operate. The operations of the circuit elements of the amplifiers are identical to those of the circuit shown in FIG. 18.

Figure 31:
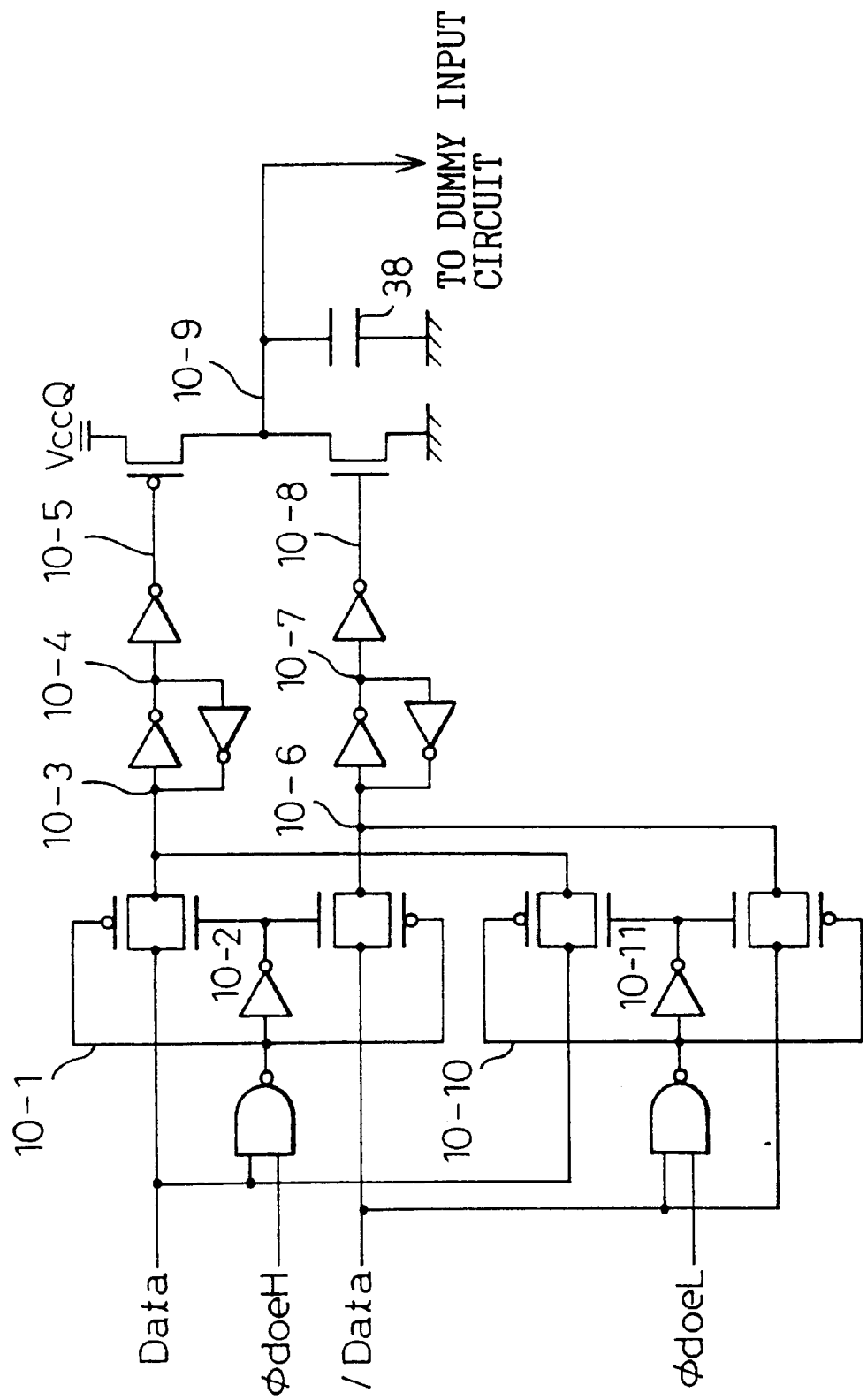
FIG. 31 is a diagram showing the circuitry of a dummy output circuit in the fifth embodiment.

FIG. 31 is a diagram showing the circuitry of the dummy output circuit 37 in the fifth embodiment.

Two activation signals $\phi$doeH and $\phi$doeL that are timing signals output from the first and second dummy delay circuits 41b-H and 41b-L are input to the dummy output circuit 37. The signal $\phi$doeH is an activation signal used to output a high-level signal, while the signal $\phi$doeL is an activation signal used to output a low-level signal. Which of the activation signals should be used is specified with the signal, data, and a signal/data.

Assuming that the signal, data, is high and the signal/data is low, the signal $\phi$doeH is validated. A switching signal for switching terminals 10-1 and 10-2 is output so that upper transfer gates in FIG. 31 operate. On the contrary, when the signal, data, is low and the signal/data is high, the signal doeL is validated. A switching signal for switching terminals 10-10 and 10-11 is output so that lower transfer gates in FIG. 31 operate. Once data is output to the dummy output circuit, the data is latched and held by the latch. Even if the validated activation signal is driven low, data is retained until the next activation signal is input.

The output circuit 14 has the same circuitry as that shown in FIG. 27 except that timing signals output from the first and second delay circuits 41a-H and 41a-L are input on behalf of the activation signals $\phi$doeH and $\phi$doeL.

Figure 32:
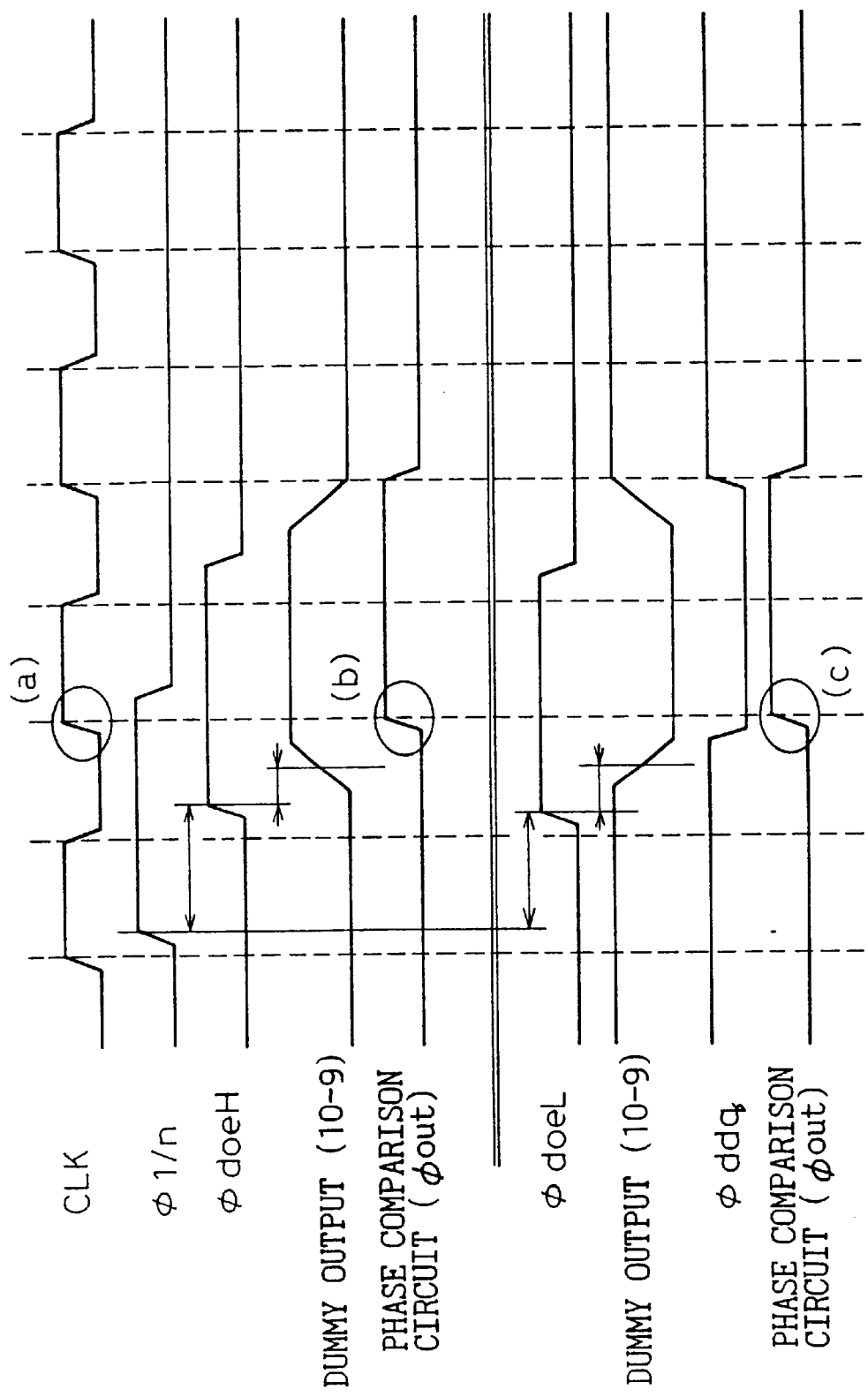
FIG. 32 is a timing chart showing the operations performed in the fifth embodiment.

FIG. 32 is a waveform diagram showing the operations of the components in the fifth embodiment. The upper part of the drawing is concerned with a high-level output, while the lower part thereof is concerned with a low-level output.

For providing a high-level output, the external clock CLK makes a low-to-high transition and is amplified by the input circuit 13. A signal $\phi$1/N is a signal having passed through the frequency divider 135 and input to the dummy delay circuits 41b-H and 41b-L. A signal $\phi$doeH is a signal having passed through the dummy delay circuit 41b-H and serves as an activation signal to be input to the dummy output circuit 37. With the activation signal, the dummy output circuit 37 operates to output a dummy output 10-9. The dummy output 10-9 is input to the dummy input circuit 34 and serves as an input signal $\phi$out of the phase comparison circuit 42. The phase comparison circuit compares the leading edge of the clock CLK that is an encircled part (a) of FIG. 32 with the leading edge of the input signal $\phi$out that is another encircled part (b) of FIG. 32.

For providing a low-level output, the operations performed until the signal $\phi$1/N is output are identical to the above operations. A signal $\phi$doeL is a signal having passed through the dummy delay circuit 41b-L different from the above dummy delay circuit, and input as an activation signal to the dummy output circuit 37. In response to the activation signal, the dummy output circuit 37 outputs a low-level signal. The signal is input to the dummy input circuit 34 and serves as a signal $\phi$ddq. The signal $\phi$ddq is reversed by the switching circuit 412 shown in FIG. 30 and input as a signal $\phi$out to the phase comparison circuit 42. The phase comparison circuit compares the leading edge of the clock CLK that is the encircled area (a) in FIG. 31 with the leading edge of the input signal $\phi$out thereof that is another encircled area (c) therein.

As mentioned above, in the fifth embodiment, the magnitude of a delay can be controlled differently between a high-level output and low-level output. A clock access time required for providing a high-level output can be agreed with a clock access time required for providing a low-level output. This leads to an expanded margin of a system using the SDRAM. Eventually, the system can be operated at a high speed.

In the first to fifth embodiments, a delay circuit for outputting output data, a dummy delay circuit analogous to the delay circuit, and a dummy output circuit are included. A dummy load analogous to a load connected to an output terminal is included, and a dummy output signal analogous to an actually-provided output signal is generated. The phase of the dummy output signal is compared with that of an external clock. The phase relationship of the output signal relative to the external clock is retained very accurately compared with that in the prior art. However, in a system using this kind of semiconductor device, routing a line to the output terminal is actually not constant. It is rare that a constant load (capacitance or output impedance) is retained all the time. It is therefore quite rare that the actual load connected to the output circuit is consistent with a dummy load. A slight temporal error occurs between an actual output waveform and a dummy output waveform.

Figure 33:
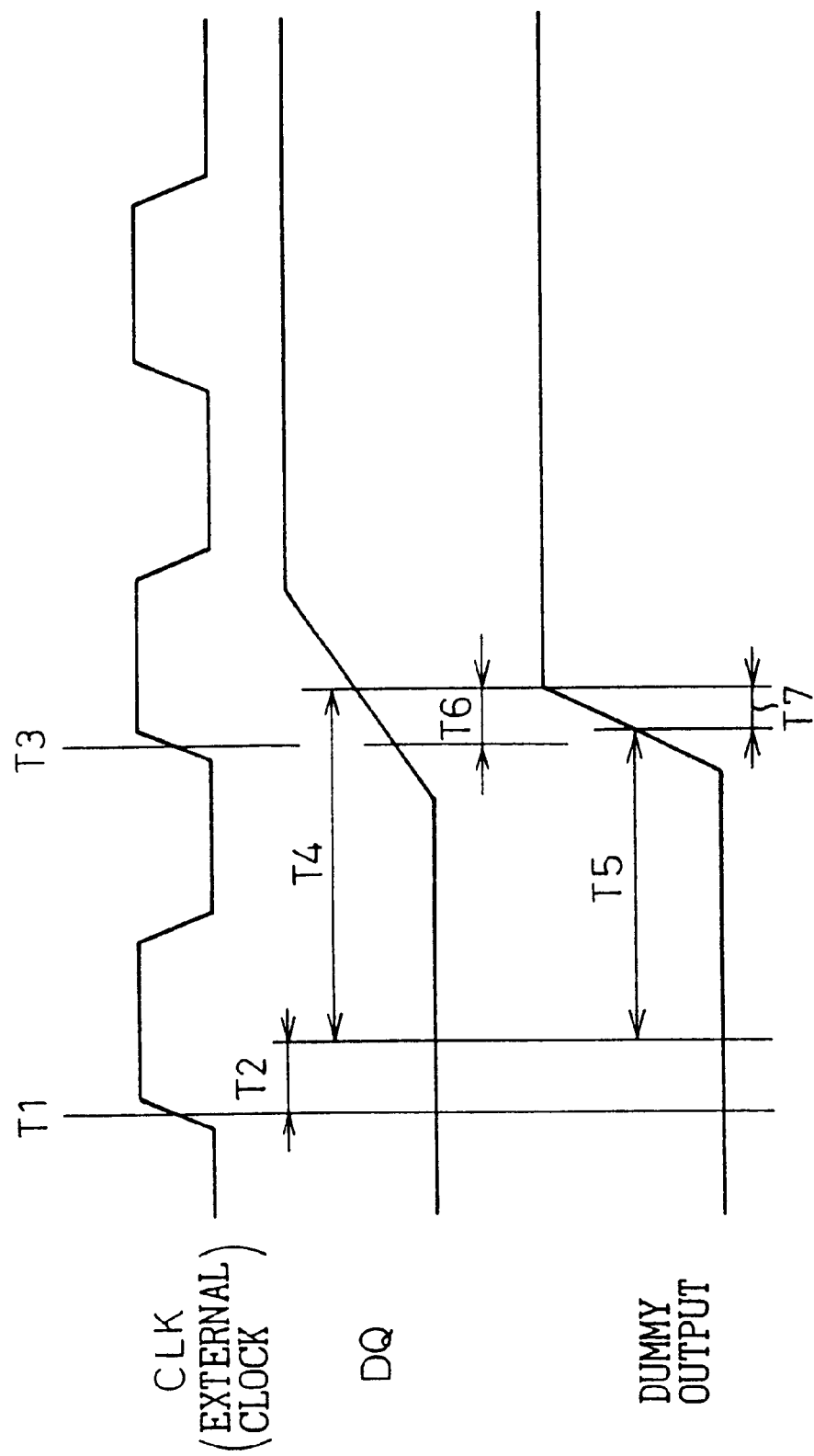
FIG. 33 is a diagram for explaining occurrence of an error deriving from a difference in characteristic of a dummy path from a normal path.

FIG. 33 is a diagram for explaining the occurrence of the error.

With the passage of an operating time T2 of an input circuit from a time instant T1 at which an external clock CLK rises, a delay circuit operates to delay an output timing signal. An output circuit then outputs data. The required time or the delay time shall be a time T4. Herein, a clock access time is a time T6. Even when an analogous dummy delay circuit is manufactured, it has some errors. Even when the same position in the dummy delay circuit as that in the delay circuit is selected, the magnitude of a delay produced by the dummy delay circuit may be different from that produced by the delay circuit. Furthermore, the magnitude of a delay produced by the dummy delay circuit may be different from that produced by the delay circuit because of an error in a dummy output circuit or dummy load from another created in the process of manufacturing. The magnitude of a delay produced by the dummy delay circuit is therefore a time T5. A time T7 in FIG. 33 is an error in the delay time.

This error is small. The slight temporal difference has posed no problem in the past. In a modern high-speed system, however, this small error dominates the limit of an operating speed and is posing a problem.

The sixth embodiment provides an SDRAM in which the negligible error is minimized. In the first to fifth embodiments, a delay circuit and a dummy delay circuit have the same magnitude of a delay specified according to a selector signal sent from a shared delay control circuit. In contrast, in the sixth embodiment, a phase comparison circuit and delay control circuit are provided for each of a delay circuit and dummy delay circuit. During an initialization period immediately after the power supply is turned on, a considerable number of dummy cycles are carried out. During each dummy cycle, dummy data is output from an output circuit. The delay circuit is controlled so that the dummy data can be phased with an external clock. On the other hand, the dummy delay circuit is controlled so that the dummy data output from a dummy output circuit can be phased with the external clock. In this state, the magnitude of a delay produced by the delay circuit is set to a value, determined in consideration of the influence of a actually-connected load, enabling output data of the output circuit to be phased with the external clock. Likewise, the dummy delay circuit is controlled to produce a magnitude of a delay enabling dummy output data to be phased with the external clock. In this state, if the dummy output data is input to the phase comparison circuit associated with the normal delay circuit, output data can be controlled so that the output data can follow the external clock so as to be phased with the external clock even if it varies. This configuration can be adapted to the SDRAM of the first embodiment. The sixth embodiment to be described below is an embodiment realized by adapting the configuration to the SDRAM of the fifth embodiment shown in FIG. 29.

Figure 34:
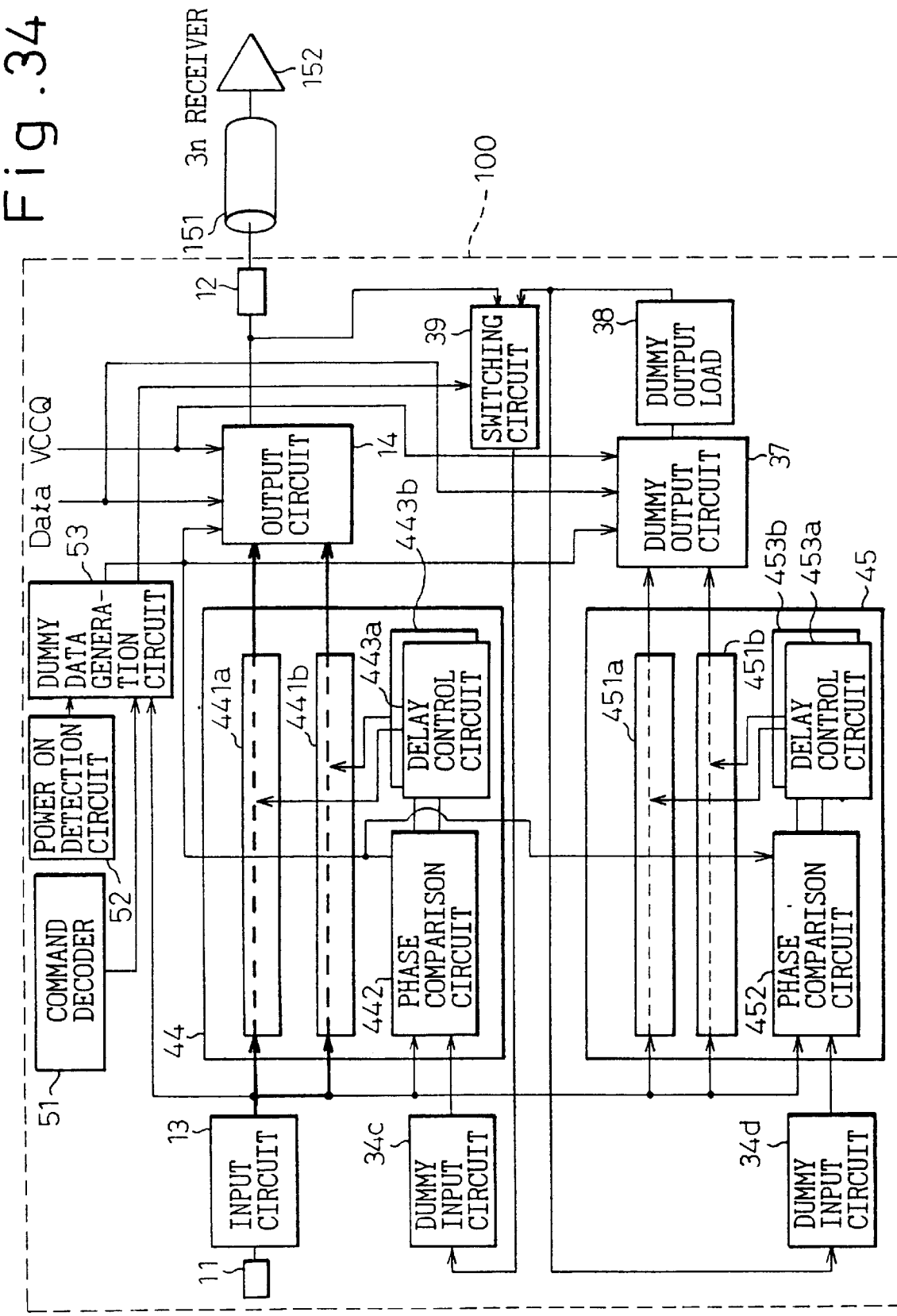
FIG. 34 is a diagram showing the configuration of the portion of an SDRAM of the sixth embodiment responsible for output timing control.

FIG. 34 is a block diagram showing the configuration of an SDRAM of the sixth embodiment.

As illustrated, in the sixth embodiment, a DLL 44 for generating a timing signal used to define the output timing of the output circuit 14 that output normal data, and a dummy DLL 45 for generating a dummy timing signal used to define the output timing of the dummy output circuit 37 that outputs a dummy output are included. The DLL 44 includes a high-level delay circuit 441a, a low-level delay circuit 441b, a phase comparison circuit 442, and delay control circuits 443a and 443b. The dummy DLL 45 includes a high-level dummy delay circuit 451a, a low-level dummy delay circuit 451b, a phase comparison circuit 452, and delay control circuits 453a and 453b. Dummy input circuits 34c and 34d are associated with the DLL 44 and dummy DLL 45 respectively. A signal corresponding to an external clock sent from the input circuit 13 is input to the delay circuits. A signal sent from the input circuit 13 and signals sent from the associated dummy input circuits 34c and 34d are input to the phase comparators. A supply voltage VccQ is applied to the output circuit 14, and an output timing signal sent from the DLL 44 is supplied thereto. An output of the output circuit 14 is applied to an output terminal 12 and supplied to the switching circuit 39. A wiring 151 on a printed-circuit board and an input circuit receiver 152 of another LSI are connected to the output terminal 12. The wiring and receiver are actual output loads. Likewise, the supply voltage VccQ is applied to the dummy output circuit 37, and a dummy output timing signal sent from the dummy DLL 45 is supplied thereto. An output of the dummy output circuit 37 is supplied to the dummy input circuit 34d via the dummy output load 38, and also supplied to the switched circuit 39. The switching circuit 39 switches a signal to be supplied to the dummy input circuit 34c to the output of the output circuit 14 of the output of the dummy output load 38. The foregoing dummy circuits and associated normal circuits are mutually analogous and have the same circuitries.

Also included are a dummy data generation circuit 53 for generating dummy data used to force the output circuit 14 and dummy output circuit 37 to output a low-level signal and high-level signal during a dummy cycle immediately after the power supply is turned on, a power on detection circuit 52 for detecting the fact that the power supply is turned on, and a command decoder 51.

The operations of the circuits in the sixth embodiment will be described below.

The phase comparison circuits 442 and 452 give control so that when the transition edges of an output signal and dummy output signal precede the rise time instant of an external clock, the magnitudes of delays to be produced by associated delay circuits are increased, and that when the transition edges thereof succeed the rise time instant thereof, the magnitudes of delays to be produced thereby are decreased. This control is given in relation to both the transition edges of the output signal and dummy output signal going high and the transit-ion edges thereof going low.

Thinking of a memory system in which the foregoing SDRAM is employed, immediately after the power supply of the system is turned on, the memory system starts operating synchronously with a clock so as to check and adjust the operations of various logics and a PLL included in the system. A considerable number of dummy cycles are therefore executed, and an external clock is input during each cycle. During a dummy cycle, if an operation for changing the magnitudes of delays to be produced by the delay circuits so that the transition edges of the output signal and dummy output signal exhibit a given phase relative to the external clock is repeated, the DLL and dummy DLL can be adjusted. However, immediately after the power supply is turned on, no information is written in the memory. The output signal and dummy output signal are stable. Adjustment cannot be carried out with the output signal and dummy output signal held stable. It is therefore necessary to internally generate data used to adjust the delay circuits during a dummy cycle. In this embodiment, the dummy data generation circuit 53 is newly included for this purpose. Dummy data is forcibly generated using the output waves of the power on detection circuit 52 and command decoder 51 which are included in a known SDRAM. Thus, the delay circuits are adjusted.

Figure 35:
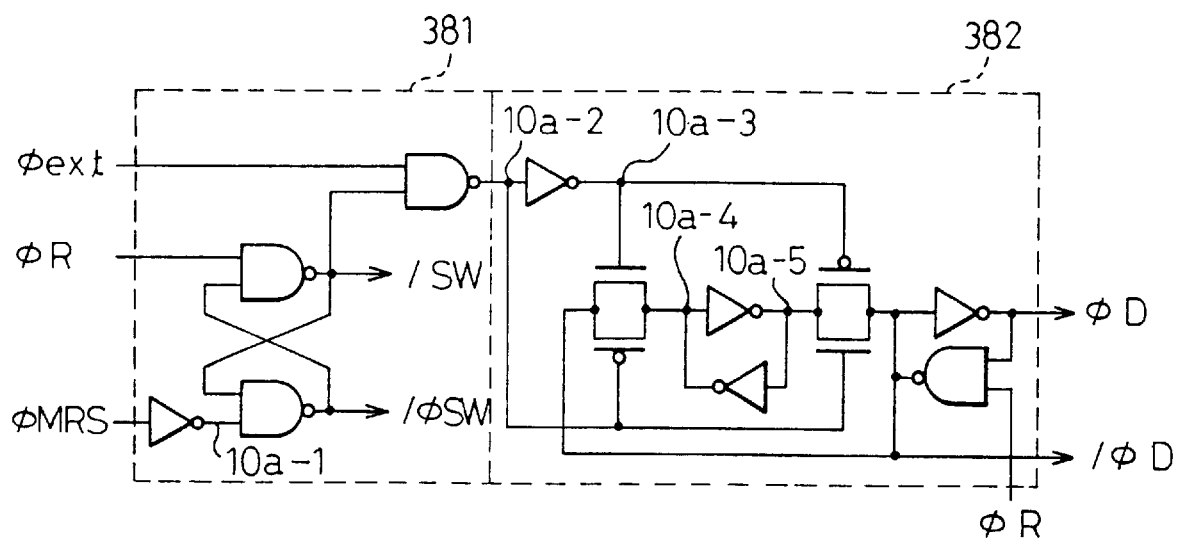
FIG. 35 is a diagram showing the circuitry of a dummy output circuit in the sixth embodiment.

FIG. 35 is a diagram showing the circuitry of the dummy data generation circuit in the sixth embodiment.

Figure 36:
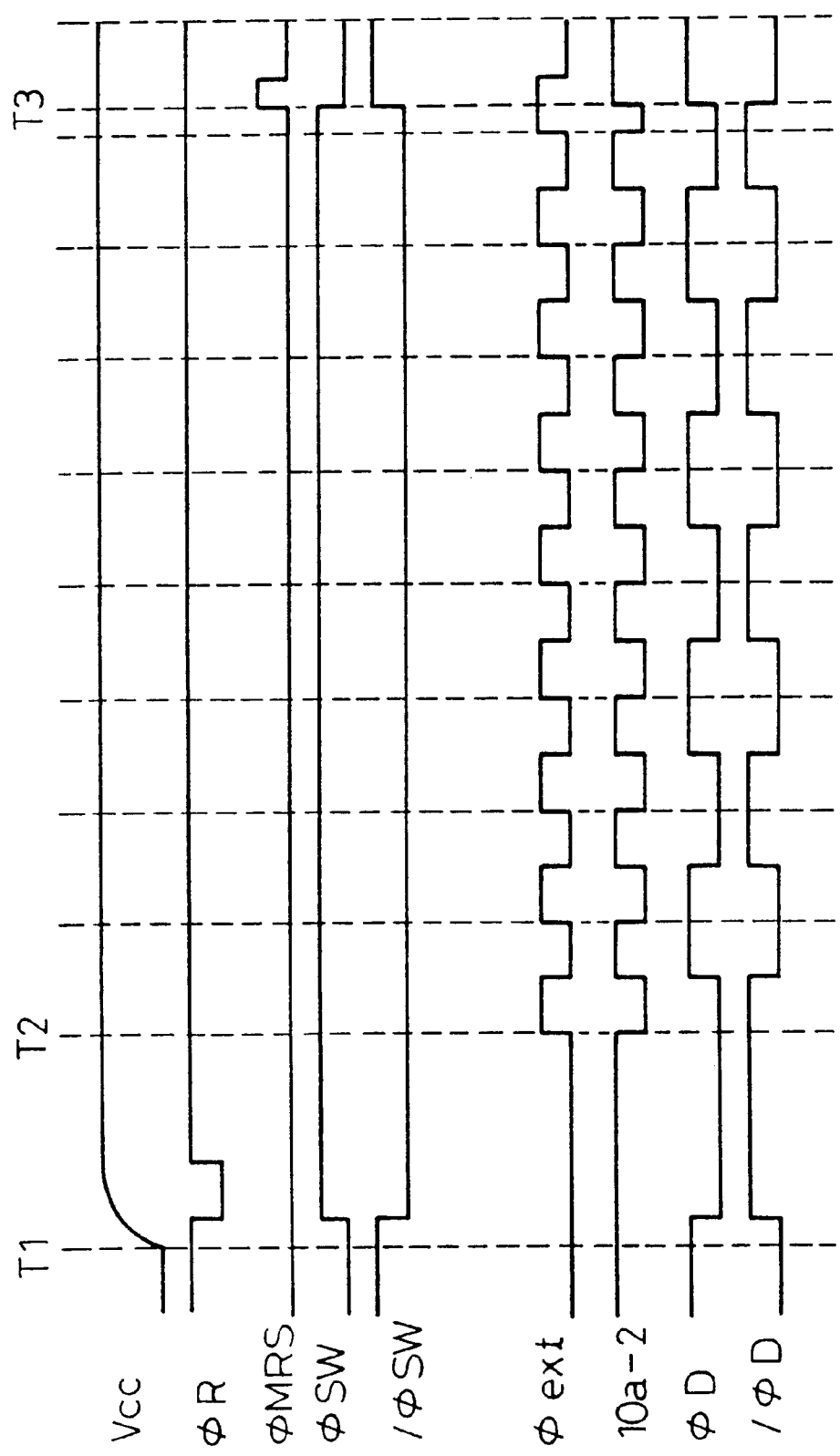
FIG. 36 is a timing chart showing the operations of the dummy output circuit in the sixth embodiment.

The dummy data generation circuit is composed of two units; an activation signal generator 381 and flip-flop 382. A signal φext made by amplifying the external clock CLK using the input circuit, a signal φR for informing the fact that the power supply is turned on, a signal φMRS for starting an operation actually after initialization of the memory is completed are input to the activation signal generator 381. The operations of the circuit elements will be described with reference to the waveforms shown in FIG. 36.

A voltage Vcc is applied and boosted at a time instant T1. Some time later, the power on detection circuit 52 operates to generate a signal φR. When the dummy data generation circuit 53 receives the signal, a signal φSW goes high and a signal /φSW goes low. At a time instant T2, an external signal φext serving as a reference signal is input. With this signal, the flip-flop 372 outputs a signal φD and /φD whose cycles are twice as long as that of an external clock. These signals are input to the output circuit and dummy output circuit and used as output data.

In the case of an SDRAM, it is necessary to set an operation mode in a mode register within each memory without fail prior to the start of actual operations. For setting an operation mode in the mode register, a mode register set instruction must be issued. In response to this instruction, the command decoder 51 outputs a signal φMRS. Assuming that the signal φMRS is issued at a time instant T3, the signal φSW goes low and the signal φSW goes high. The potential at a terminal 10a-2 is stabilized. Thereafter, dummy data has a fixed value.

Figure 37:
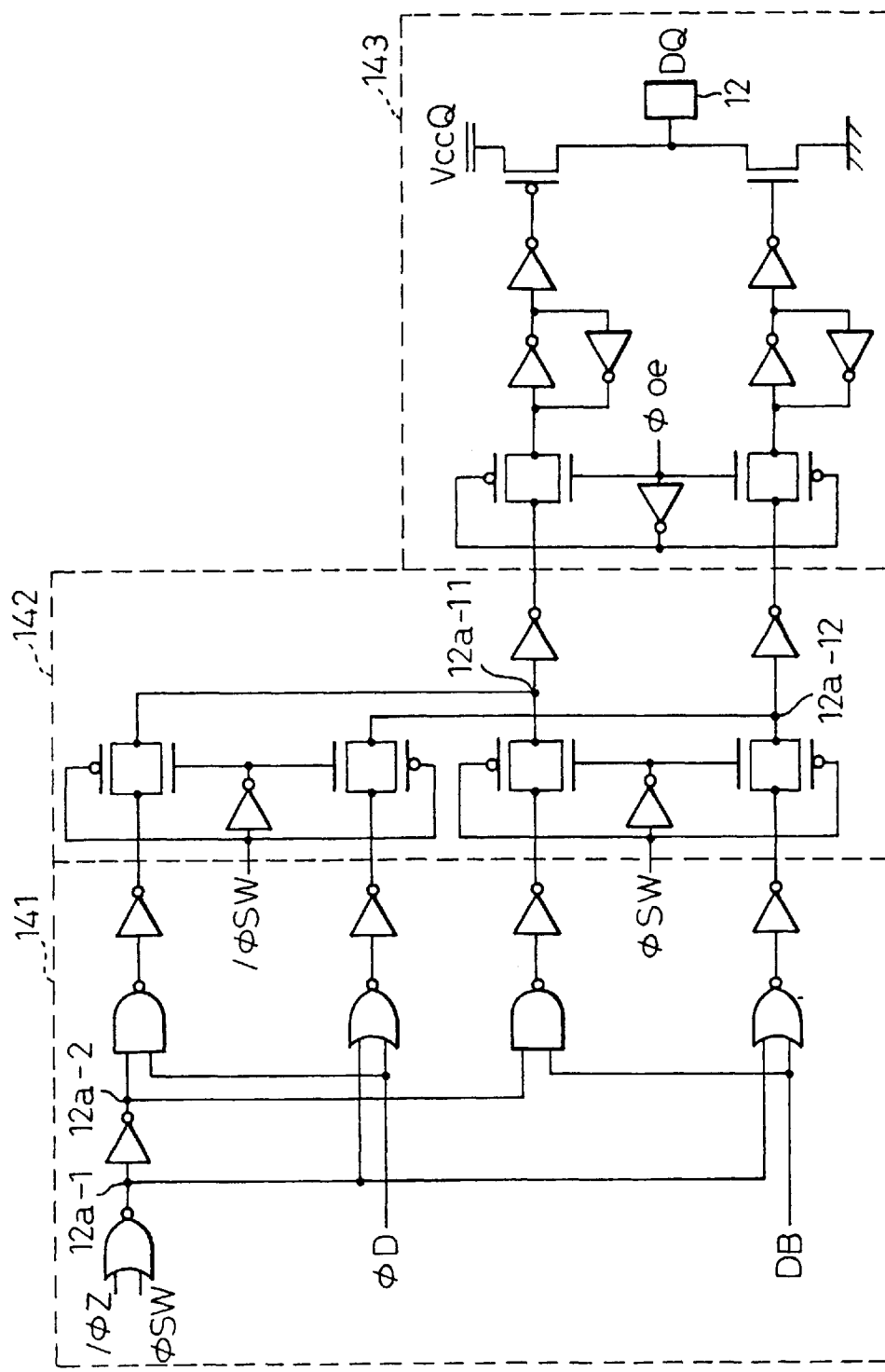
FIG. 37 is a diagram showing the circuitry of an output circuit in the sixth embodiment.
Figure 38:
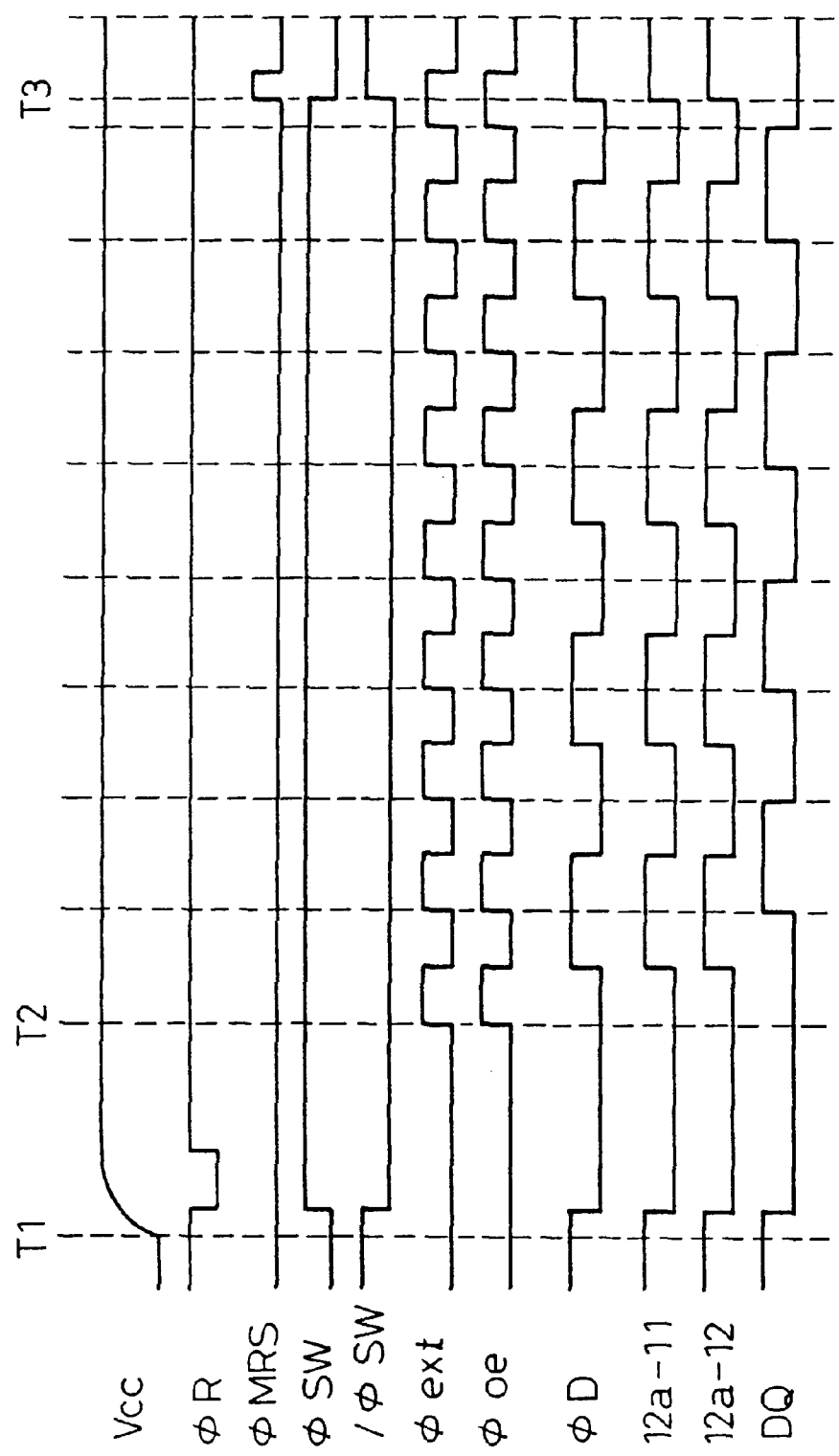
FIG. 38 is a timing chart showing the operations of the output circuit in the sixth embodiment.

FIG. 37 is a diagram showing the circuitry of the output circuit 14 in the sixth embodiment, and FIG. 38 is a timing chart showing the operations of the output circuit. The dummy output circuit 37 has the same circuitry as the output circuit but is smaller in dimensions. The dummy output circuit operates in exactly the same manner as the output circuit.

Dummy data generated by the dummy data generation circuit 53 is input to the output circuit 14. The output circuit 14 is composed of a high-impedance control unit 141, a dummy data switch 142, and an output amplifier 143. Dummy data is input to the high-impedance control unit 141. A signal /φZ is a signal for bringing an output to a high-impedance state. For making the impedance of an output high, the signal /φZ is driven low. During a dummy cycle immediately after the power supply is turned on during which the switch φSW is high, the signal /φZ is invalidated. The potential at a node 12a-1 goes low and the potential at a node 12a-2 goes high. Since the signal /φSW is low, dummy data φD can pass through the dummy data switch 142. By contrast, since the signal φSW is high, a signal DB on an actual data bus will not pass to nodes 12a-11 and 12a-12.

In this state, the dummy data φD is validated. When the dummy data φD is high, the potentials at the node 12a-11 and 12a-12 go high. When an output circuit activation signal φoe synchronous with an external clock φext (a signal passing through the DLL 44) goes high, a high-level signal is output as an output signal. On the contrary, when the dummy data φD is low, the potentials at the nodes 12a-11 and 12a-12 go low. When the signal φoe is driven high, a low-level signal is output as the output signal.

As mentioned above, a dummy cycle immediately after the power supply is turned on is used. The time instant at which the output signal goes high or low agrees with the rise time instant of the external clock by the DLL 44. The time instant at which the dummy output signal goes high or low agrees with the rise time instant by the dummy DLL 45. Needless to say, since the waveform of the output signal is slightly different from that of the dummy output, values set in the delay circuits in the DLL 44 and dummy DLL 45 are mutually different. At this time, the output signal and dummy output signal are synchronized with the external clock.

After a dummy cycle is completed (after the signal φMRS is output), a memory cycle actually starts. Data stored in a memory is output through the output terminal 12. The data is random. It is unknown what kind of data is output. In the SDRAM, the data input terminal and data output terminal 12 are I/O common terminals. Input data may be input through the terminals. In this case, the system including the DLL 44 cannot be used to adjust the delay circuits 441a and 441b. The switching circuit 39 is switched in order to switch an object-of-comparison signal to be fed to the DLL 44 from the output signal to the dummy output signal.

Figure 39:
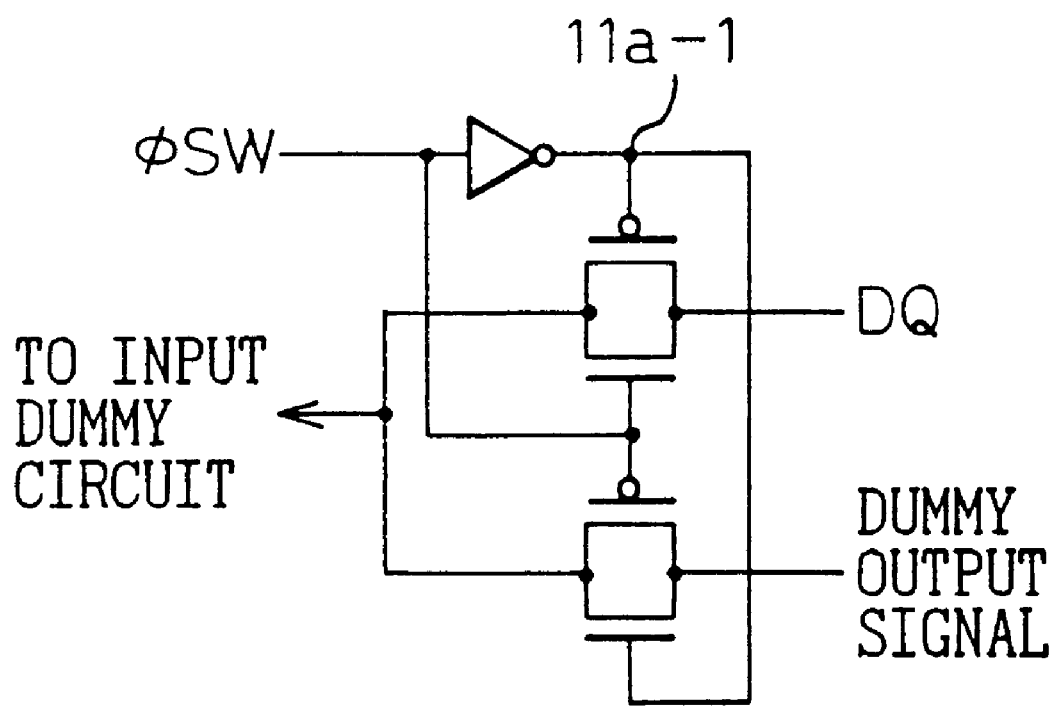
FIG. 39 is a diagram showing the circuitry of a switching circuit in the sixth embodiment.

FIG. 39 is a diagram showing the circuitry of the switching circuit 39. The switching circuit 39 includes two transfer gates each formed by connecting an n-channel transistor and p-channel transistor in parallel. A signal φSW is used to bring either of the transfer gates to a passing state.

Consequently, temperature or the like may vary during a memory cycle. It may become necessary to adjust the magnitude of a delay to be produced by each delay in the DLL 44. In this case, the dummy output signal is used as an object-of-comparison signal. Since the waveforms of the external clock, output signal, and dummy output signal agree with one another during a dummy cycle immediately after the power supply is turned on, a deviation of the waveform of the dummy output signal from that of the external clock should merely be detected. Once the phase of the dummy output signal is adjusted according to the result of the detection, the output signal is phased with the external clock.

In the sixth embodiment, the output signal can be phased with the external clock through a series of operations in consideration of a difference in wiring or load of an actually-employed printed-circuit board from another board. As a result, a sufficient margin can be ensured even for a system operating at a higher speed. The operations of the higher-speed system can be stabilized.

In the first to sixth embodiments, a dummy output circuit is included for outputting dummy data. The phase of an output signal is compared with that of an external clock.

Alternatively, the dummy output circuit may not be included. Nevertheless, the phase of the output signal of an output circuit can be compared with that of the external clock. The seventh embodiment is an embodiment in which the phase of an output signal is compared with that of an external clock.

Figure 40:
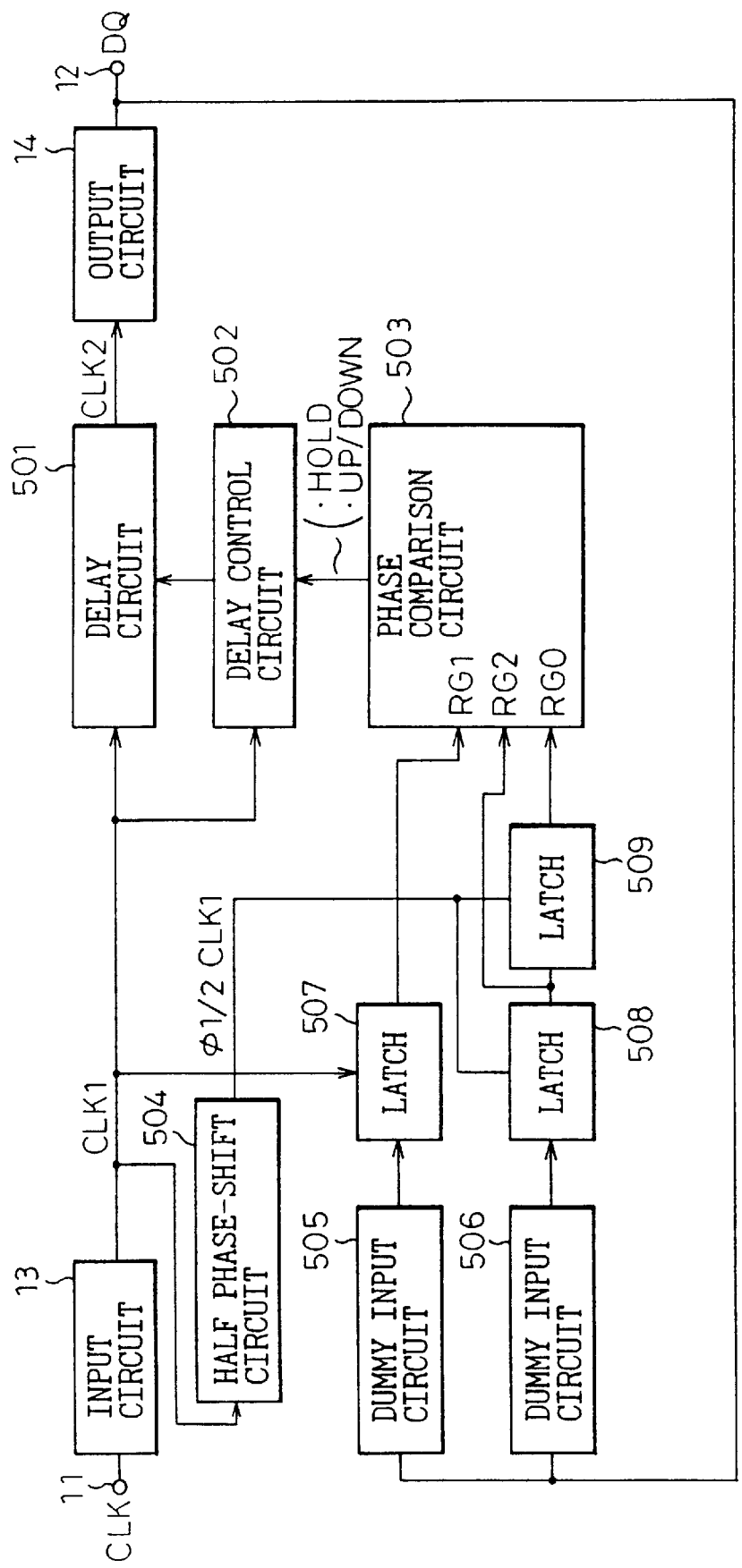
FIG. 40 is a diagram showing the configuration of the portion of an SDRAM of the seventh embodiment responsible for output timing control.

FIG. 40 is a diagram showing the configuration of an output timing control circuit in the seventh embodiment. As shown in FIG. 40, the output timing control circuit in the seventh embodiment comprises the input circuit 13, the output circuit 14, a delay circuit 501, a delay control circuit 502, a phase comparison circuit 503, a half phase-shift circuit 504 for generating a half-shifted clock, which is 180° out of phase with a clock CLK1 output from the input circuit 13, using the clock CLK1, first and second dummy input circuits 505 and 506, and first, second, and third latches 507, 508, and 509. The input circuit 13 and output circuit 14 are identical to those employed in the aforesaid embodiments. In the seventh embodiment, the phase comparison circuit 503 judges whether or not an output signal has made a state transition. If the output signal had made no state transition, the phase comparison circuit 503 outputs a hold signal (HOLD). Only when the output signal has made a state transition, does the phase comparison circuit compare phases, and it outputs a control signal (UP/DOWN), which instructs to increase or decrease the magnitude of a delay, to the delay control circuit 502 on the basis of the result of the comparison. The half phase-shift circuit 504, and the first, second, and third latches 507, 508, and 509 are circuits for generating a signal which the phase comparison circuit 503 uses to judge whether or not an output signal had made a state transition or to compare phases. The latches are normal latches. The circuitry of the normal latch is well-known. A description of the circuitry will therefore be omitted.

Figure 41:
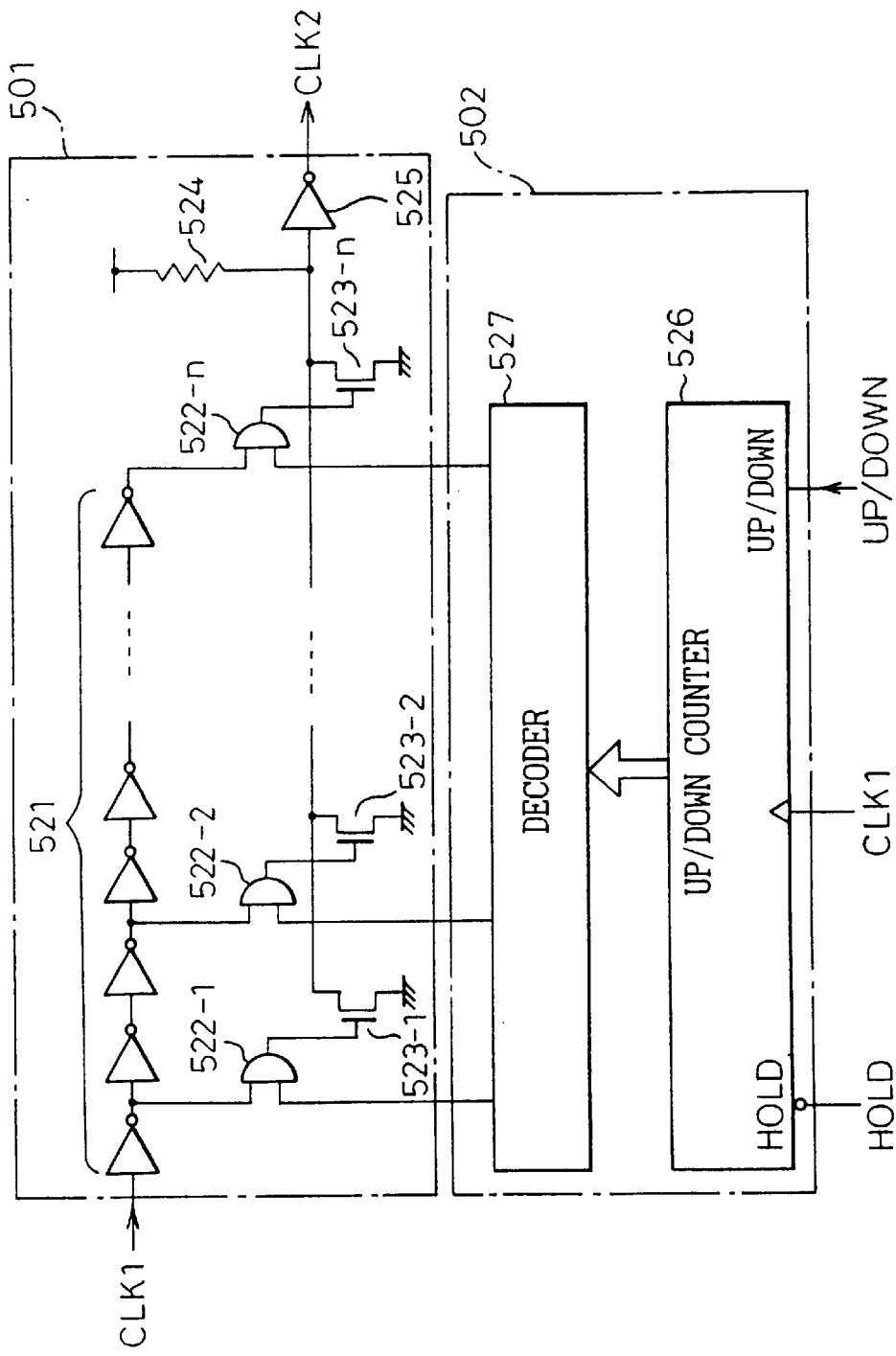
FIG. 41 is a diagram showing examples of the circuitry of a delay circuit in a receiving-side semiconductor device of the seventh embodiment and of the configuration of a delay control circuit therein.

FIG. 41 is a diagram showing an example of the circuitries of the first delay circuit 501 and delay control circuit 502. As illustrated, the delay circuit 501 includes a string of inverters 521 having a plurality of inverters connected in series, a string of AND gates having a plurality of AND gates 522-1, 522-2, etc., and 522-n arranged so that an output of every other stage of the string of inverters 521 can be input through one of input terminals of each AND gate, a string of transistors composed of n-channel transistors 523-1, 523-2, etc., and 523-n which input outputs of the AND gates through gates thereof, have sources thereof grounded, and have drains thereof connected in common, a resistor 524 connected between a signal line, on which the drains of the n-channel transistors are connected in common, a high-potential power supply, and a buffer 525 whose input terminal is connected on the signal line and which outputs an internal clock CLK2. The delay control circuit 502 is composed of an up/down counter 526 and a decoder 527. When the hold signal HOLD is low, the up/down counter 526 does not carry out a counting operation. When the hold signal HOLD is high, the up/down counter carries out a counting operation synchronously with the rise of a signal φ½CLK1. When the up/down signal UP/DOWN is high, a counting-up operation is carried out. When the up/down signal is low, a counting-down operation is carried out. The decoder 527 decodes an output of the up/down counter 29 and causes any one output to go high and another output to go low. When the up/down counter 526 counts up pulses, an output position of a high-level signal is shifted rightward. When the up/down counter 526 counts down pulses, the output position thereof is shifted leftward. Output terminal of the decoder 527 are connected to another input terminal of the AND gates 522-1, 522-2, etc., and 522-n. Only an AND gate to which a high-level signal is input from the decoder 527 is activated. Among the outputs of the string of inverters, a signal to be input to the activated AND gate is output as an internal clock CLK2. Since the number of stages of the string of inverters through which an output signal passes varies depending on which AND gate should be activated, the magnitude of a delay of the internal clock can be specified. An adjustment unit adopted for controlling the magnitude of a delay is the magnitude of a delay to be specified by passing a signal through two inverters. The delay control circuit 502 must be designed so that any path in the delay circuit 501 can be selected without fail in the same manner as that described in conjunction with FIGS. 11A to 15.

Figure 42:
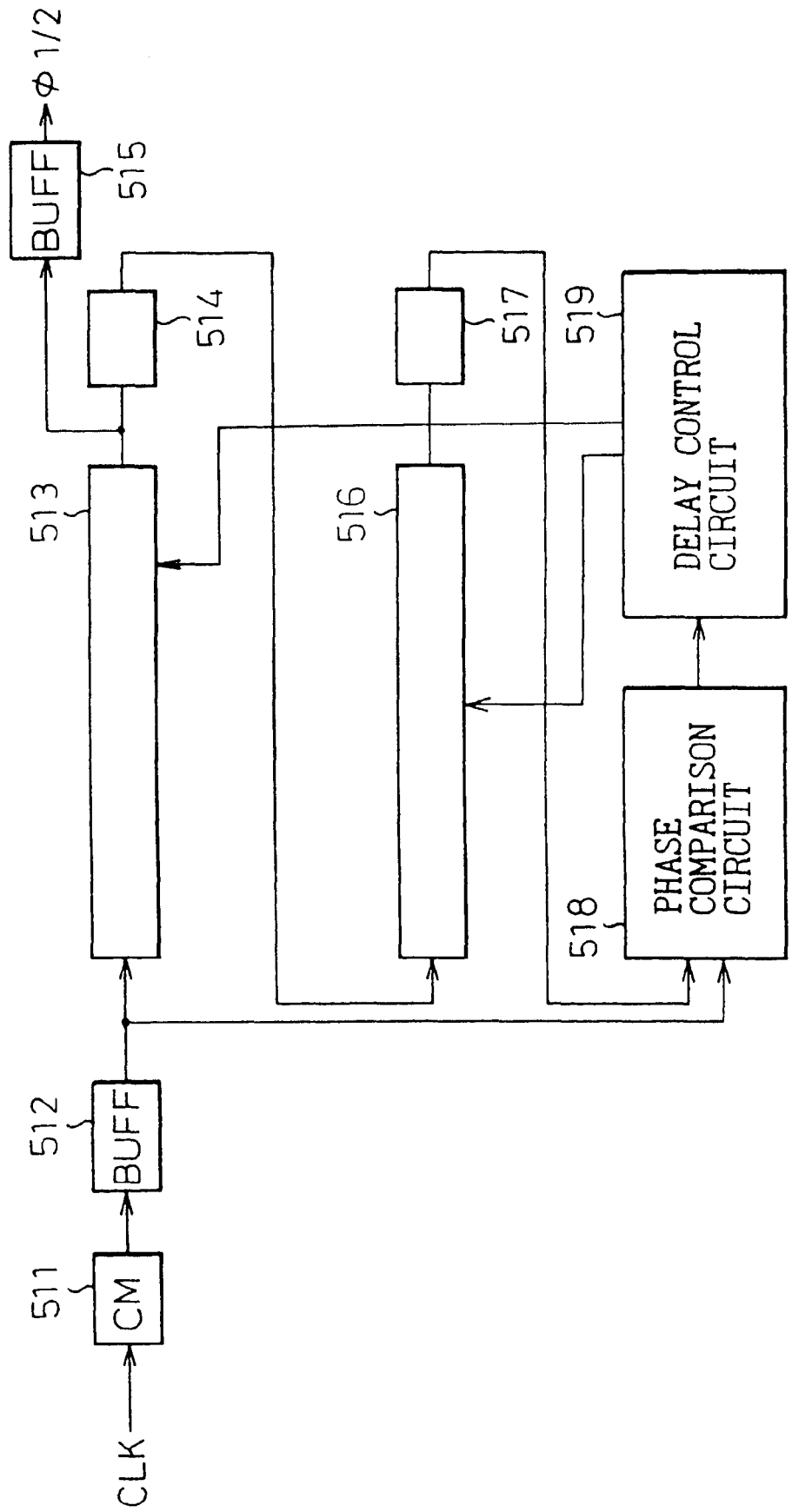
FIG. 42 is a diagram showing the configuration of a half phase-shift circuit in the seventh embodiment.

FIG. 42 is a diagram showing the configuration of a half phase-shift circuit 504. As shown in FIG. 42, the half phase-shift circuit 504 includes a current mirror 51 1, a clock input buffer 512, first and second half-phase delay circuits 513 and 516 having the same circuitry mutually, buffers 514 and 517, a phase comparison circuit 518, a delay control circuit 519, and a buffer 515 for outputting a half-phase clock CLK1. The current mirror 511 and clock input buffer 512, constitute an input circuit. The first and second half-phase delay circuits 513 and 516 are digital delay lines whose magnitudes of delays can be changed selectively and which are controlled to produce the same magnitude of a delay. The phase comparison circuit 518 compares the phase of a clock output from the buffer 512 with that of a clock output from the buffer 517, and outputs the result of the phase comparison to the delay control circuit 519. Based on the result of the phase comparison, the delay control circuit 519 controls the first and second half-phase delay circuits 513 and 516 so that the clock output from the buffer 512 can be phased with the clock output from the buffer 517. The circuitry shown in FIG. 43, which will be described later, is adopted for the phase comparison circuit 518, and the circuitry shown in FIG. 41 is adopted for the delay circuits 513 and 516.

A clock output from the buffer 512 is delayed by the first delay circuit 513, input to the second delay circuit 516 via the buffer 374, delayed by a magnitude identical to the magnitude of a delay produced by the first delay circuit 513, and then input to the phase comparison circuit 518 via the buffer 517. The phase comparison circuit 518 compares the phases of the clocks output from the buffers 512 and 517. The delay control circuit 519 changes the magnitudes of delays to be produced by the first and second delay circuits 513 and 516 on the basis of the result of the comparison so that the clocks can be phased with each other. When the clocks are phased with each other, since the path along which a signal is input from the first delay circuit 513 to the second delay circuit 516 via the buffer 514 has the same length as the path along which a signal is input from the second delay circuit 516 to the phase comparison circuit 518 via the buffer 517, the phase of a signal input to the second delay circuit 516 is shifted exactly by a half cycle from that of a signal input to the first delay circuit 513. The phases of the clocks output from the buffers 514 and 517 are therefore mutually shifted by a half cycle. A half-shifted clock φ½ generated by shifting the clock by a half cycle is output from the buffer 515. Using the half phase-shift circuit shown in FIG. 42, the half-shifted clock φ½ made by shifting the phase of a clock by exactly a half cycle can be provided.

In the seventh embodiment, since the half-shifted clock φ½ made by shifting the phase of a clock exactly by a half cycle is needed by other circuit elements, the circuitry shown in FIG. 42 is adopted. If a signal made by shifting the phase of a clock by exactly a half cycle is unnecessary, an inverter may be substituted for the circuitry.

In either case, the latch 507 latches an output of the dummy input circuit 505 synchronously with the rise of a clock CLK1. The latch 508 latches an output of the dummy input circuit 506 synchronously with the fall of the clock CLK1. The latch 509 latches an output of the latch 508 synchronously with the fall of the clock CLK1. The latch 509 therefore latches an output of the dummy input circuit 506 in one cycle after the clock CLK1 to be latched by the latch 508 falls. An output of the latch 507, an output of the latch 508, and an output of the latch 509 are input as outputs RG1, RG2, and RG0 to the phase comparison circuit 503.

Figure 43:
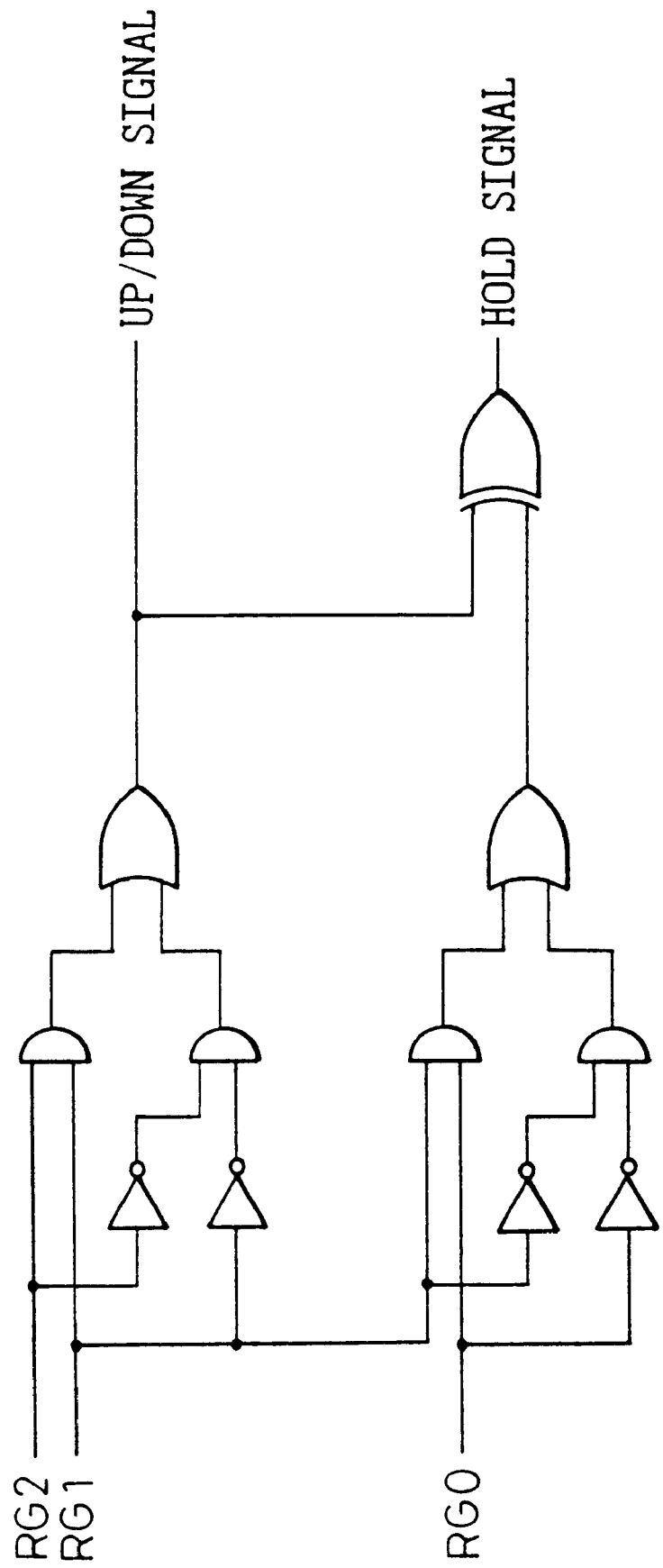
FIG. 43 is a diagram showing the circuitry of a phase comparison circuit in the seventh embodiment.

FIG. 43 is a circuit diagram showing the circuitry of the phase comparison circuit 503. The operations of the phase comparison circuit 503 will be described with reference to FIGS. 44 to 46.

Figure 44:
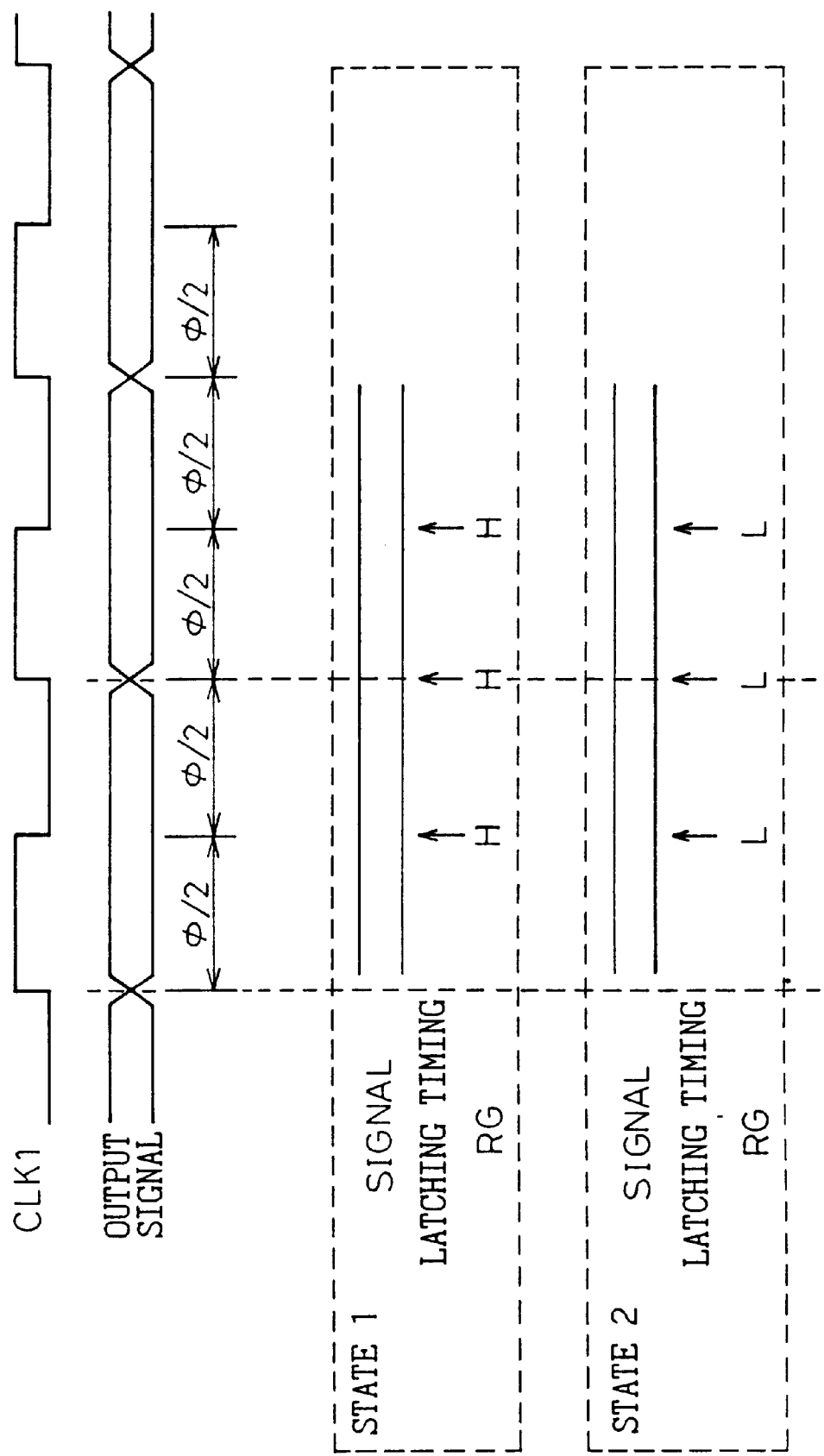
FIG. 44 is a diagram for explaining a phase judging operation in the seventh embodiment.

When no phase shift occurs, an output signal shall make a state transition at the leading edge of a clock CLK1φ1 output from the input circuit 13. Points indicated with arrows in FIG. 44 represent the timing of each latch of latching an output signal. In order from the left, the signals RG0, RG1, and RG2 are latched according to the arrow-indicated timing. State 1 in FIG. 44 is a state in which the output signal remains high but makes no state transition. At this time, the signals RG0, RG1, and RG2 are all high. A hold signal HOLD goes low. Since no phase shift can be identified, a counting operation is not carried out. Likewise, state 2 is a state in which the output signal remains low but makes no state transition. At this time, the signals RG0, RG1, and RG2 are all low. The hold signal HOLD goes low and no counting operation is carried out.

Figure 45:
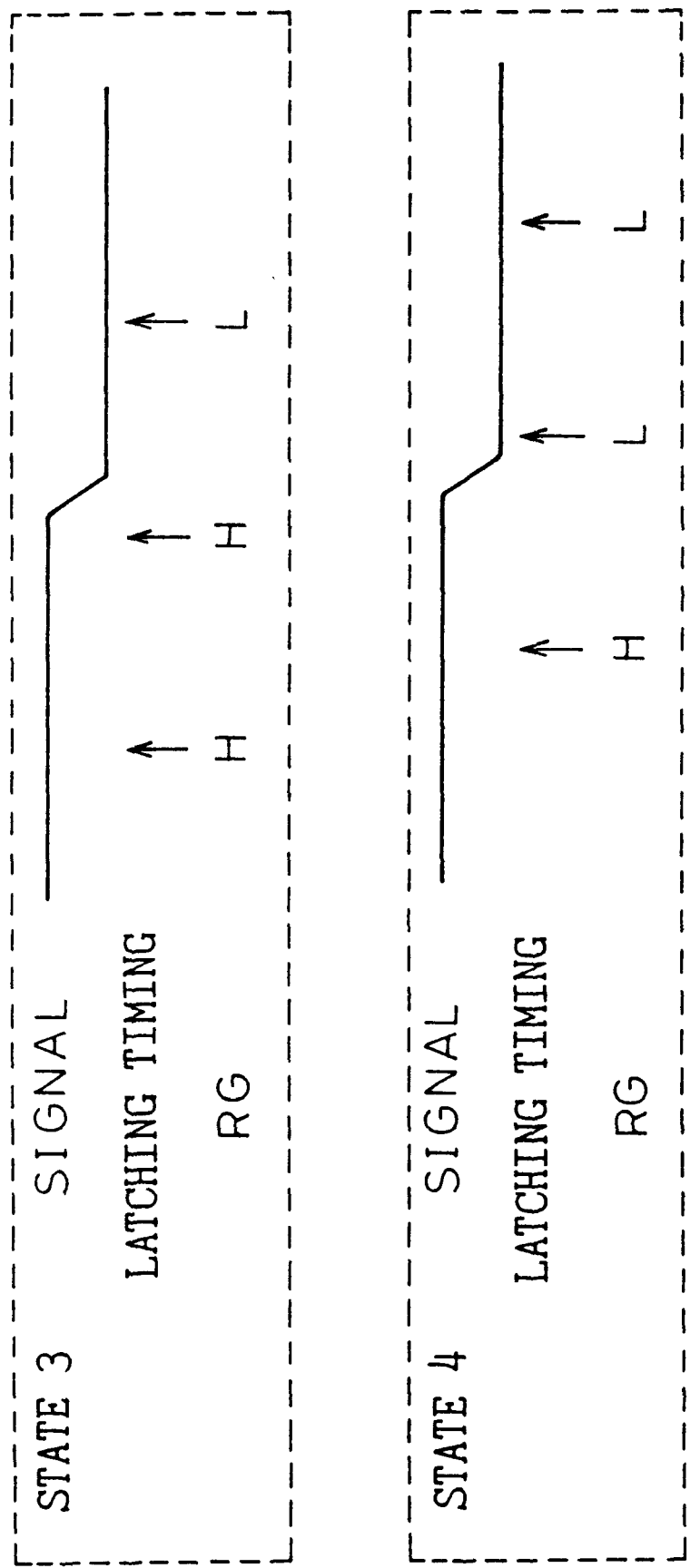
FIG. 45 is a diagram for explaining a phase judging operation in the seventh embodiment.

States 3 and 4 shown in FIG. 45 are states in which the output signal makes a high-to-low transition. In state 3 in which the transition edge of the output signal lags behind the leading edge of the clock CLK1, the signals RG0, RG1, and RG2 go high, high, and low respectively. In this state, the hold signal HOLD goes high and the up/down signal UP/DOWN goes low. The magnitude of a delay to be produced by the delay circuit 501 and specified by the delay control circuit 502 is decreased. In state 4 in which the transition edge of the output signal leads the leading edge of the clock CLK1, the signals RG0, RG1, and RG2 go high, low, and low respectively. In this case, the signal HOLD is driven high, and the signal UP/DOWN is driven high. The magnitude of a delay to be produced by the delay circuit 501 and specified by the delay control circuit 502 is increased.

Figure 46:
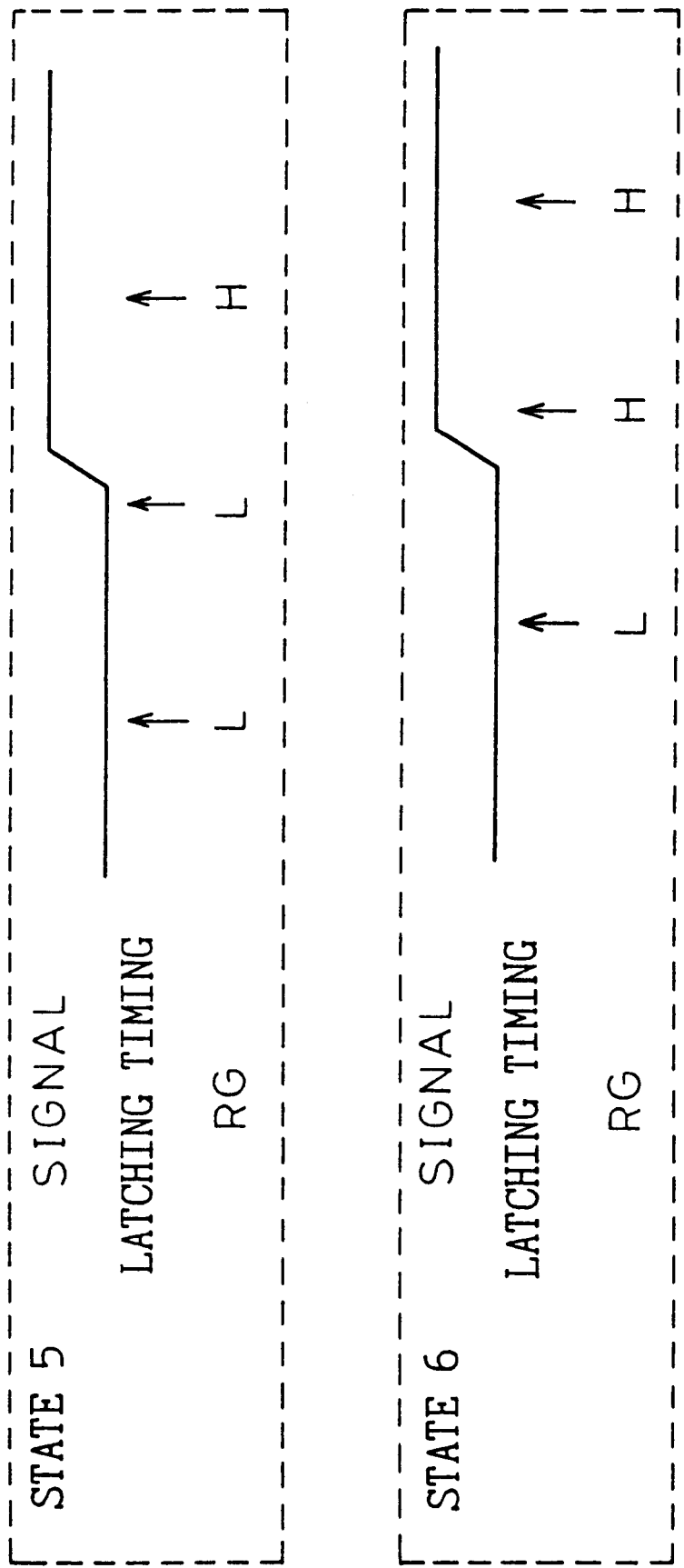
FIG. 46 is a diagram for explaining a phase judging operation in the seventh embodiment.

States 5 and 6 shown in FIG. 46 are states in which the output signal makes a low-to-high transition. In state 5 in which the transition edge of the output signal lags behind the leading edge of the clock CLK1, the signals RG0, RG1, and RG2 go low, low, and high respectively. In this case, the signal HOLD is driven high and the signal UP/DOWN is driven low, the magnitude of a delay to be produced by the delay circuit 501 and specified by the delay control circuit 502 is decreased. In state 6, in which the transition edge of the output signal leads the leading edge of the clock CLK1, the signals RG0, RG1, and RG2 go low, high, and high respectively. In this case, the signal HOLD is driven high and the signal UP/DOWN is driven high. The magnitude of a delay to be produced by the delay circuit 501 and specified by the delay control circuit 502 is increased.

In the truth table of FIG. 47, the values of the signals RG0, RG1, and RG2 and the requested operations are listed in one-to-one correspondence with the foregoing states.

As mentioned above, in the output timing control circuit in the seventh embodiment shown in FIG. 40, the phases of an output signal and clock are compared with each other, and control is given so that the output signal can be phased with the clock. The output signal is a varying signal that may assume a high or a low level. The phase comparison circuit 503 in the seventh embodiment judges whether or not the output signal has made a state transition. Only when the output signal has made a state transition, are phases compared. When the output signal has made no state transition, the delay control circuit 502 gives control so that the ongoing magnitude of a delay can be maintained. When the output signal has made no state transition, the output signal is fed back so that control is given according to the result of comparison performed by the phase comparison circuit 503 until the output signal is phased with the clock. Using the output signal, phase comparison can be achieved.

Figure 48:
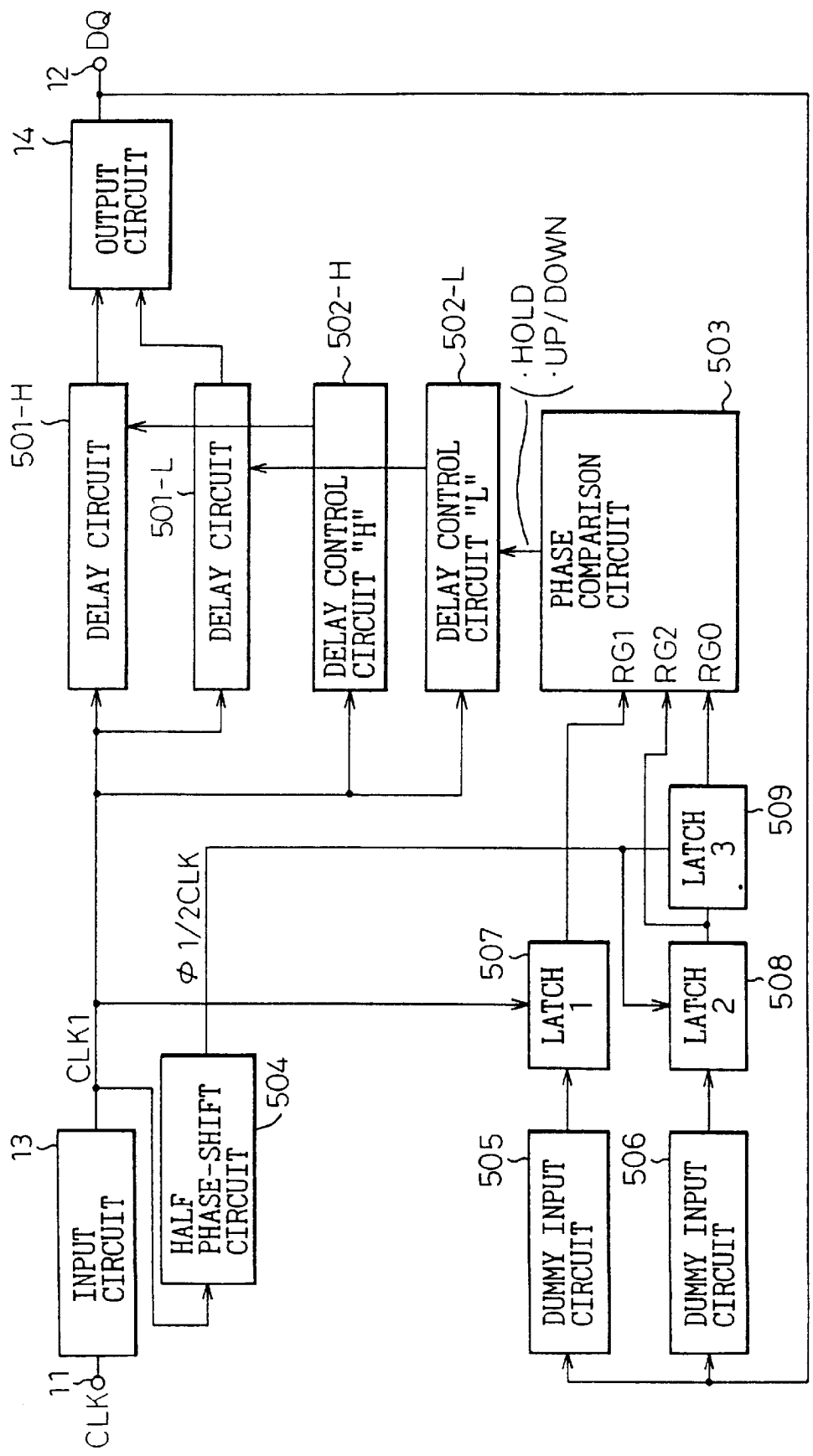
FIG. 48 is a diagram showing the configuration of the portion of an SDRAM of the eighth embodiment responsible for output timing control.

FIG. 48 is a block diagram showing the configuration of an output timing control circuit in the eighth embodiment. The output timing control circuit in the eighth embodiment is an example realized by adapting the configuration described in the fifth embodiment, in which timing control is given differently between when an output signal makes a low-to-high transition and when the output signal makes a high-to-low transition, to the output timing control circuit in the seventh embodiment. A difference from the seventh embodiment lies in a point that two delay circuits 501-H and 501-L, and two delay control circuits 502-H and 502-L for controlling the delay circuits mutually independently are included. A further description will be omitted.

For detecting the phase of an output signal relative to an external clock, a phase adjustment mode may be defined in order to carry out phase adjustment. For this purpose, a dummy data output circuit for outputting dummy data that makes a state transition at intervals of a given cycle as shown in FIG. 35 is included. In the phase adjustment mode, an output circuit outputs dummy data. The phase of an output signal of the output circuit is compared with that of an external clock. The output signal is fed back so that control is given until the output signal is phased with the external clock. After the output signal is phased with the external clock, the phase adjustment mode is switched to a normal mode. In the normal mode, the adjusted magnitude of a delay is retained. This way, a phase can be adjusted through feedback control in the same manner as that in the first to sixth embodiments.

Figure 49:
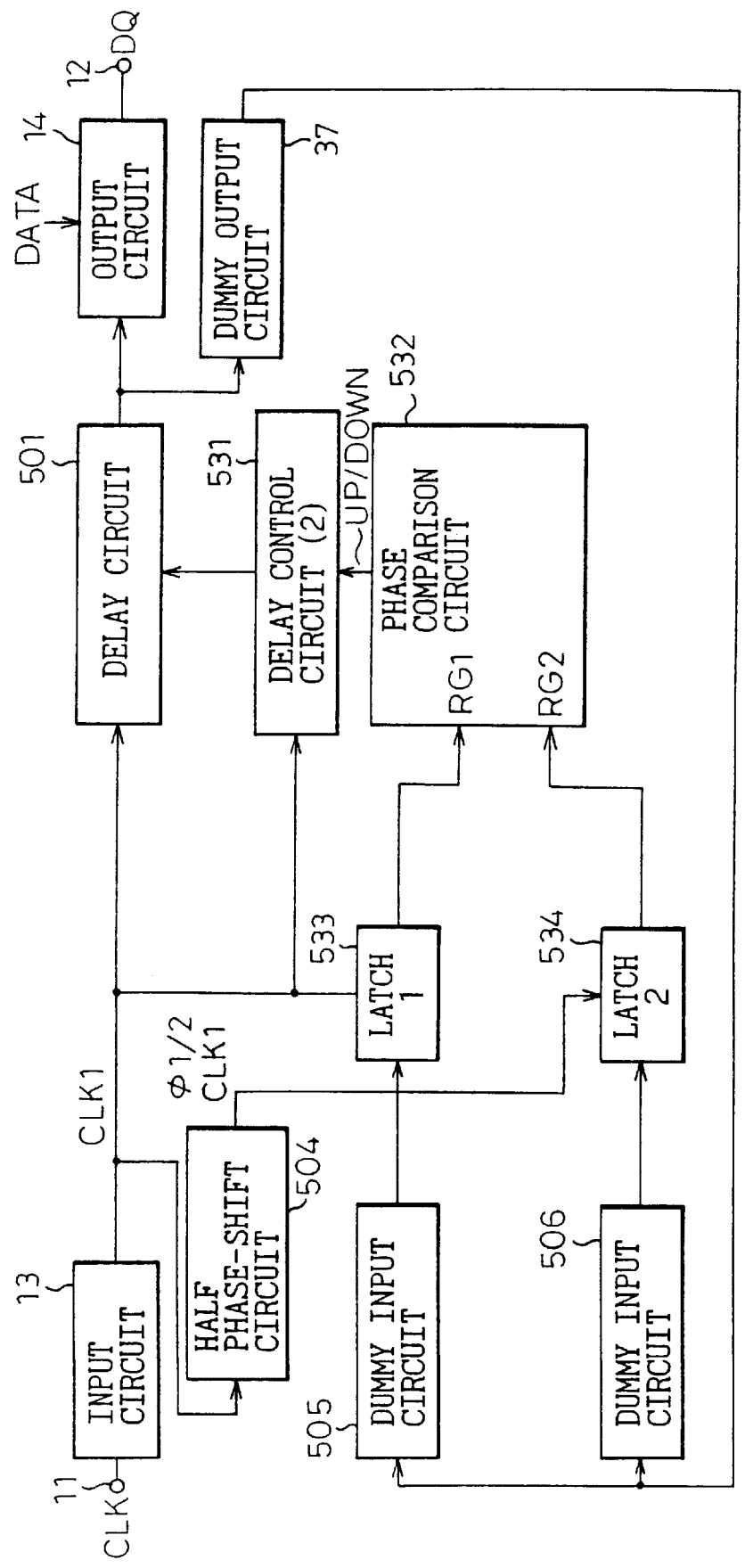
FIG. 49 is a diagram showing the configuration of the portion of an SDRAM of the ninth embodiment responsible for output timing control.

FIG. 49 is a block diagram showing the configuration of an output timing control circuit in the ninth embodiment. The output timing control circuit in the ninth embodiment is an example realized by employing another phase comparison circuit in the basic configuration of the output timing control circuit having the dummy output circuit shown in FIG. 8. As described previously, when the dummy output circuit is included, the dummy output circuit outputs dummy data that has been generated by a dummy data generation circuit and that makes a state transition at intervals of a given cycle. The phase of the output signal is compared with that of a clock. Since the dummy data makes a state transition at intervals of a given cycle, a phase comparison circuit 532 judges whether or not the output signal makes a state transition. If the output signal makes no state transition, it is unnecessary to output a hold signal so as not to change the magnitude of a delay to be produced by a delay circuit. The circuitry in the ninth embodiment includes a latch 533 for latching an output signal of a dummy input circuit 505 synchronously with a clock CLK1, and a latch 534 for latching an output signal of a dummy input circuit 506 synchronously with a clock φ½CLK1. An output of the latch 533 and an output of the latch 534 are input as signals RG1 and RG2 to the phase comparison circuit 532. The phase comparison circuit 532 identifies the phase of the output signal on the basis of the signals RG1 and RG2.

Figure 50:
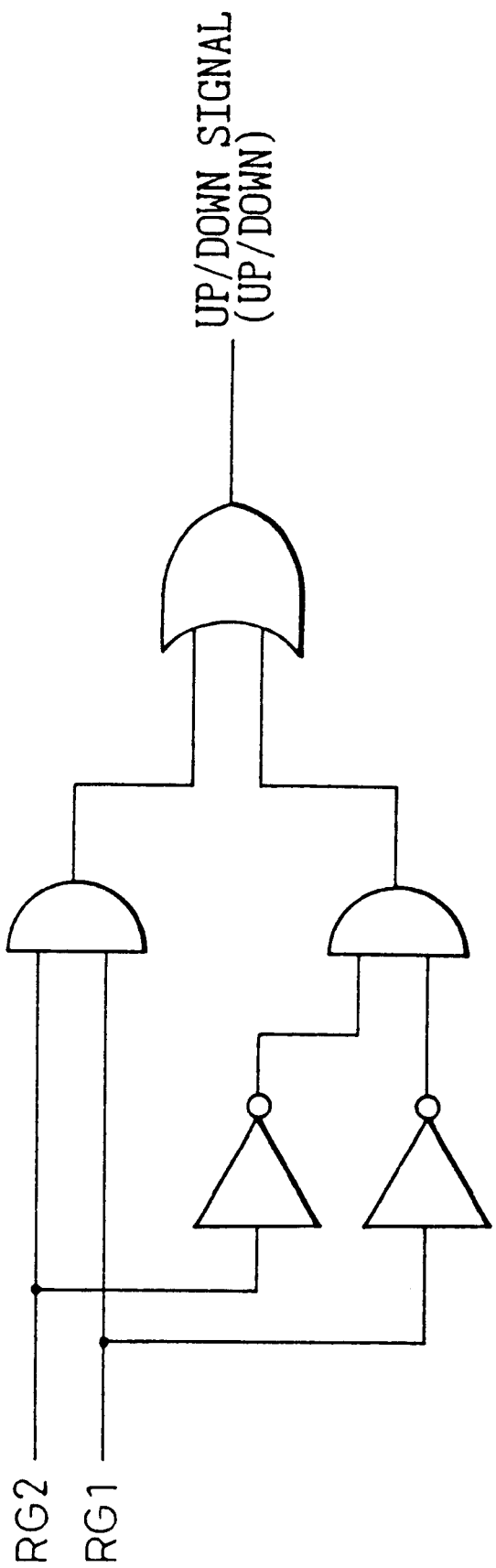
FIG. 50 is a diagram showing the circuitry of a phase comparison circuit in the ninth embodiment.

FIG. 50 is a diagram showing the circuitry of the phase comparison circuit 532 employed in the output timing control circuit in the ninth embodiment. As is apparent from the drawing, the phase comparison circuit includes only the circuit for calculating an up/down signal UP/DOWN which is included in the phase comparison circuit shown in FIG. 43. As mentioned above, in the ninth embodiment, it is judged whether or not an output signal makes a state transition. If the output signal makes no state transition, it is unnecessary to output a hold signal. A unit for generating the hold signal HOLD is therefore excluded.

FIGS. 51A and 51B are diagrams showing the judgment operations carried out by the phase comparison circuit 532 shown in FIG. 49. As shown in FIG. 51A, when an output signal DQ (an output of the dummy input circuit) lags behind a clock CLK1, signals RG1 and RG2 have different values. When the output signal DQ leads the clock CLK1, the signals RG1 and RG2 have the same value. When the signals RG1 and RG2 have different values, the phase comparison circuit 532 causes the up/down signal UP/DOWN to go low so as to decrease the magnitude of a delay of the clock. When the signals RG1 and RG2 have the same value, the phase comparison circuit 532 causes the signal UP/DOWN to go high so as to increase the magnitude of a delay of the clock.

Figures 52, 53:
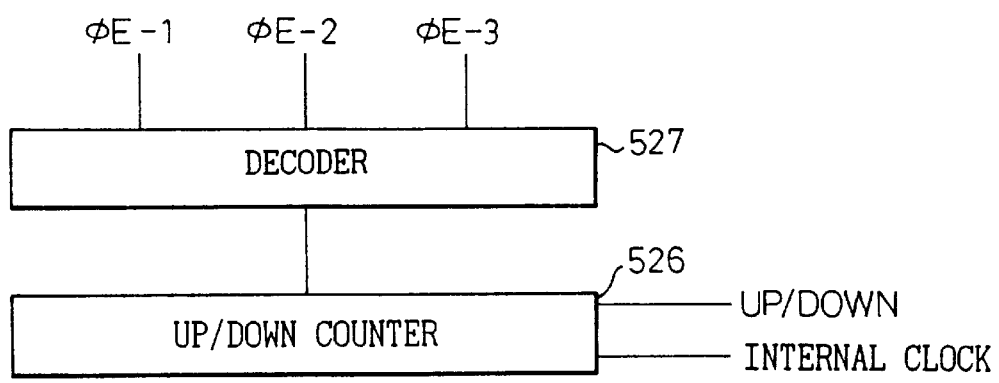
FIG. 52 is a truth table concerning a phase judging operation in the ninth embodiment.
FIG. 53 is a diagram showing the configuration of a delay control circuit in the ninth embodiment.

In the truth table of FIG. 52, the values of the signals RG1 and RG2 and the requested operations are listed in one-to-one correspondence to the foregoing states of the up/down signal.

Referring back to FIG. 49, the circuitries shown in FIG. 41, which are employed in the seventh embodiment, are adopted for the delay circuit 501 and delay control circuit 531. However, as shown in FIG. 53, the hold signal HOLD is not input to the up/down counter. The hold facility is unnecessary.

Figure 54:
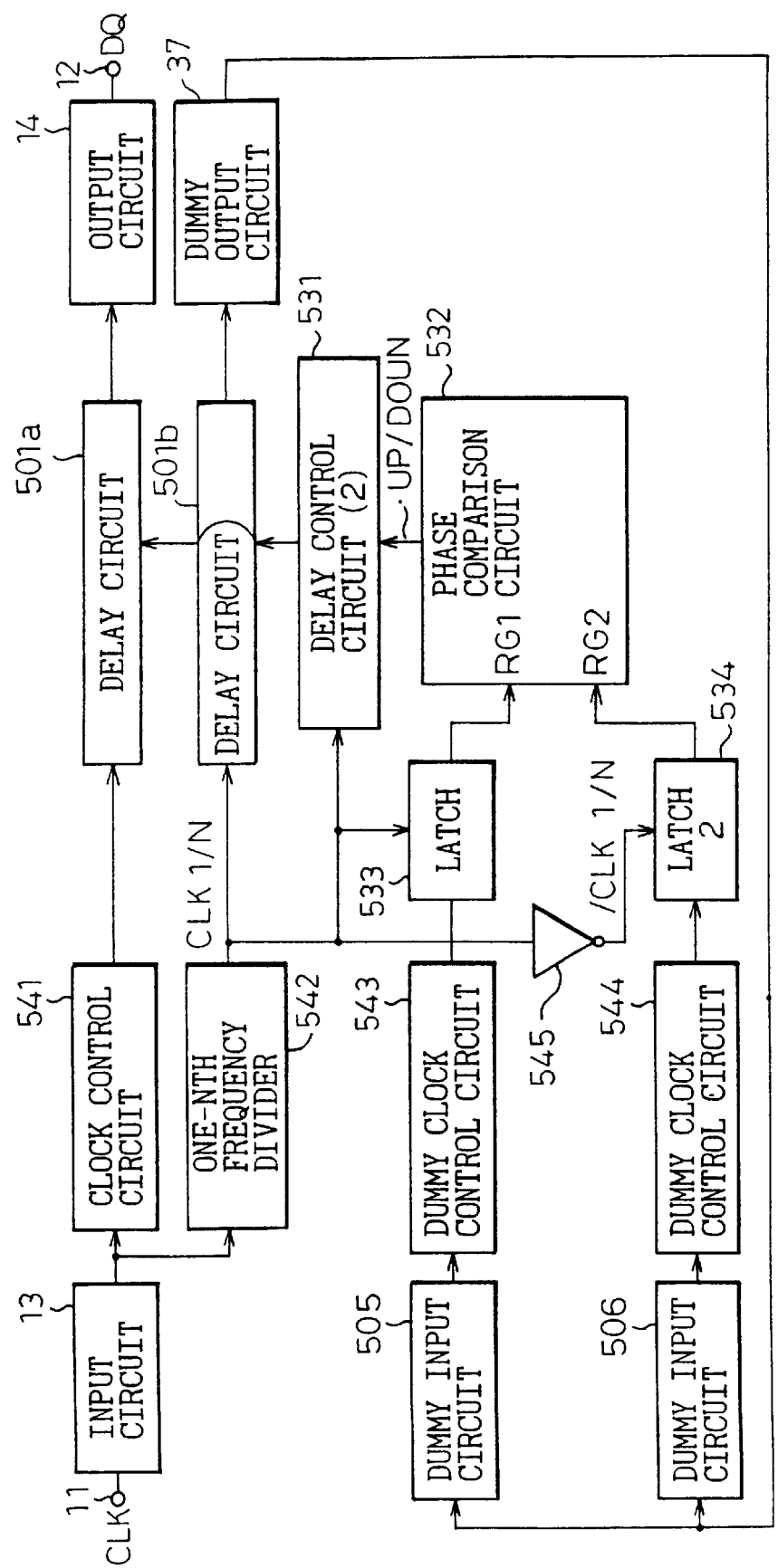
FIG. 54 is a diagram showing the configuration of the portion of an SDRAM of the tenth embodiment responsible for output timing control.

FIG. 54 is a block diagram showing the configuration of an output timing control circuit in the tenth embodiment. The output timing control circuit in the tenth embodiment is an example realized by adapting the configuration described in the first embodiment, in which a one-Nth frequency divider is used to set the cycle of an output signal of a dummy output circuit to one-Nth of the cycle of a clock, to the circuitry in the ninth embodiment. As illustrated, a difference from the ninth embodiment lies in the point that a one-Nth frequency divider 542, a clock control circuit 541 for delaying a clock by a magnitude equivalent to the magnitude of a delay occurring in the one-Nth frequency divider 542, a delay circuit 501b for delaying a clock CLK1/N whose frequency is one-Nth of the frequency of the clock, and dummy clock control circuits 543 and 544, located on the output stages of the dummy input circuits 505 and 506, for producing the same magnitude of a delay as the clock control circuit 541 are included, and in the points that a latch 533 latches an output of the dummy clock control circuit 543 synchronously with the clock CLK1/N, and a latch 534 latches an output of the dummy control circuit 544 synchronously with a clock /CLK1/N whose polarity is opposite to that of the clock CLK1/N. The other components are identical to those in the ninth embodiment.

Figure 55:
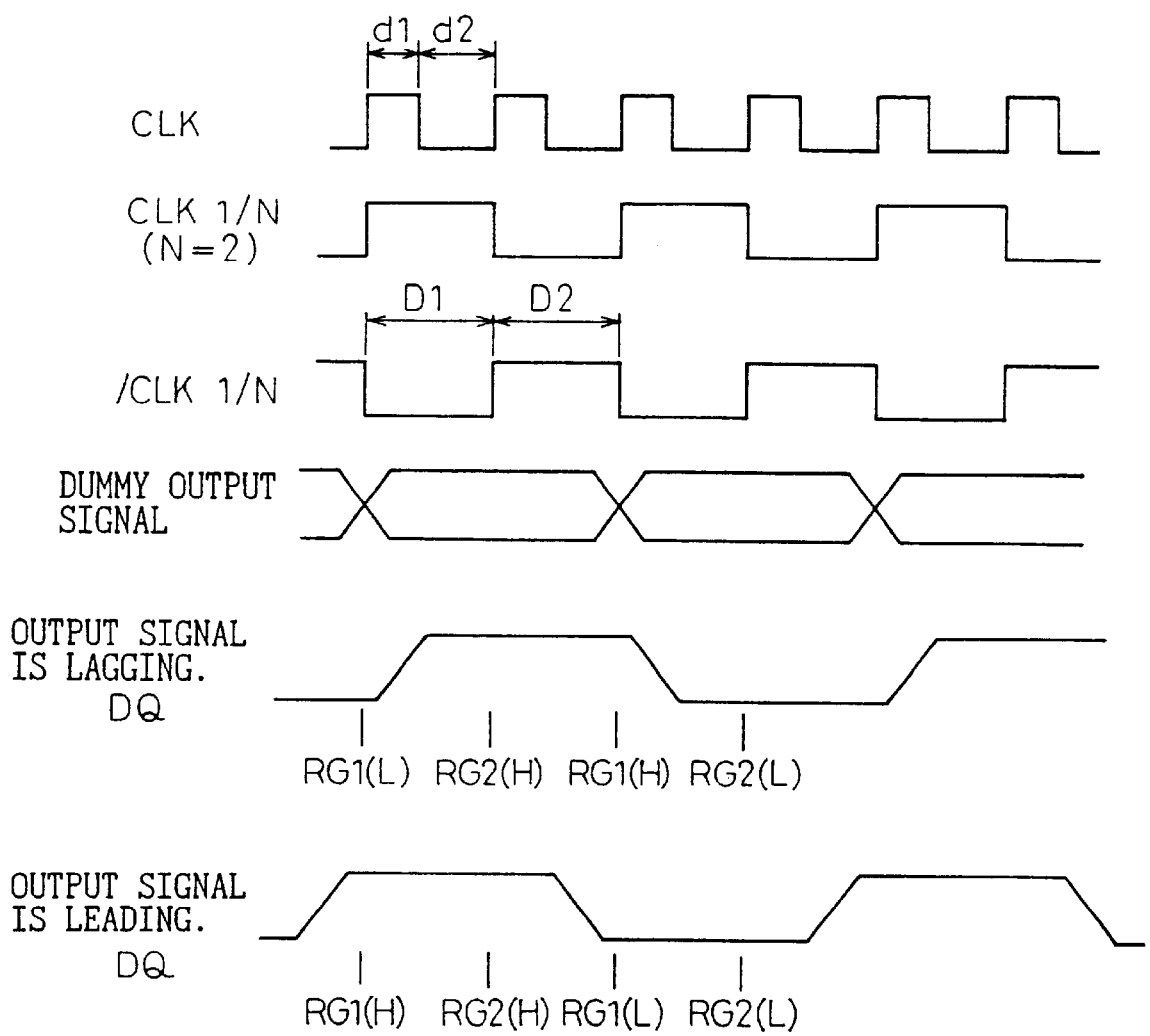
FIG. 55 is a diagram for explaining a phase judging operation in the tenth embodiment.

FIG. 55 is a diagram showing the judgment operations performed in the tenth embodiment. As illustrated, even when an external clock CLK fails to exhibit a duty cycle of 50% because of a decay or the like occurring during propagation, the transition edge of a signal CLK1/N whose frequency is one-Nth of the frequency of the external clock is synchronous with the leading edge of the external clock CLK. If the dummy output circuit 37 provides an output synchronously with the signal CLK1/N, a resultant dummy output signal makes a state transition synchronously with the leading edge of the signal CLK1/N. The timing according to which the latch 533 latches an output is therefore an occasion on which the signal CLK1/N is about to rise. The timing according to which the latch 534 latches an output is an occasion on which the signal CLK1/N is about to rise. In other words, the timing according to which the latch 534 latches an output coincides with about a middle point of the transition edge of the dummy output signal. When an output signal DQ lags behind the clock, signals RG1 and RG2 have different values. When the output signal DQ leads the clock, the signals RG1 and RG2 have the same value.

Figure 56:
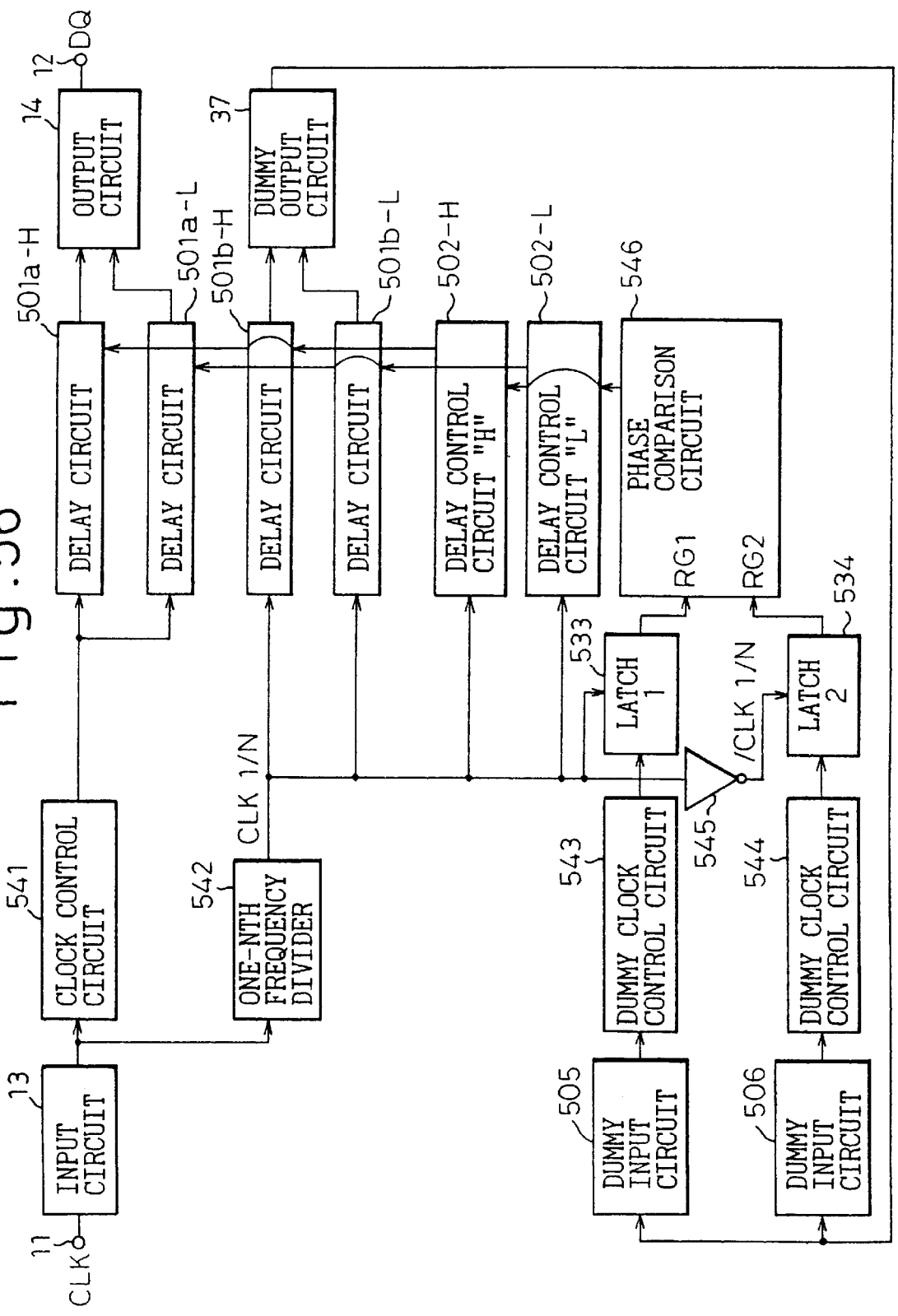
FIG. 56 is a diagram showing the configuration of the portion of an SDRAM of the eleventh embodiment responsible for output timing control.

FIG. 56 is a block diagram showing the configuration of an output timing control circuit in the eleventh embodiment. The output timing control circuit in the eleventh embodiment is an example realized by adapting the configuration described in the fifth embodiment, in which timing control is given differently between when an output signal makes a low-to-high transition and when the output signal makes a high-to-low transition, to the output timing control circuit in the tenth embodiment. A further description will be omitted.

In the aforesaid embodiments, an input signal to a dummy input circuit, that is, an output signal of a dummy output circuit is a signal having the same level as a clock input to an input circuit. However, as described previously, there are two system standards, LVTTL and SSTL. The output signal of the dummy output circuit may therefore not have the same level as the clock input to the input circuit. The twelfth embodiment is an embodiment in which the output timing can be carried out according to appropriate timing even in such a situation.

Figure 57:
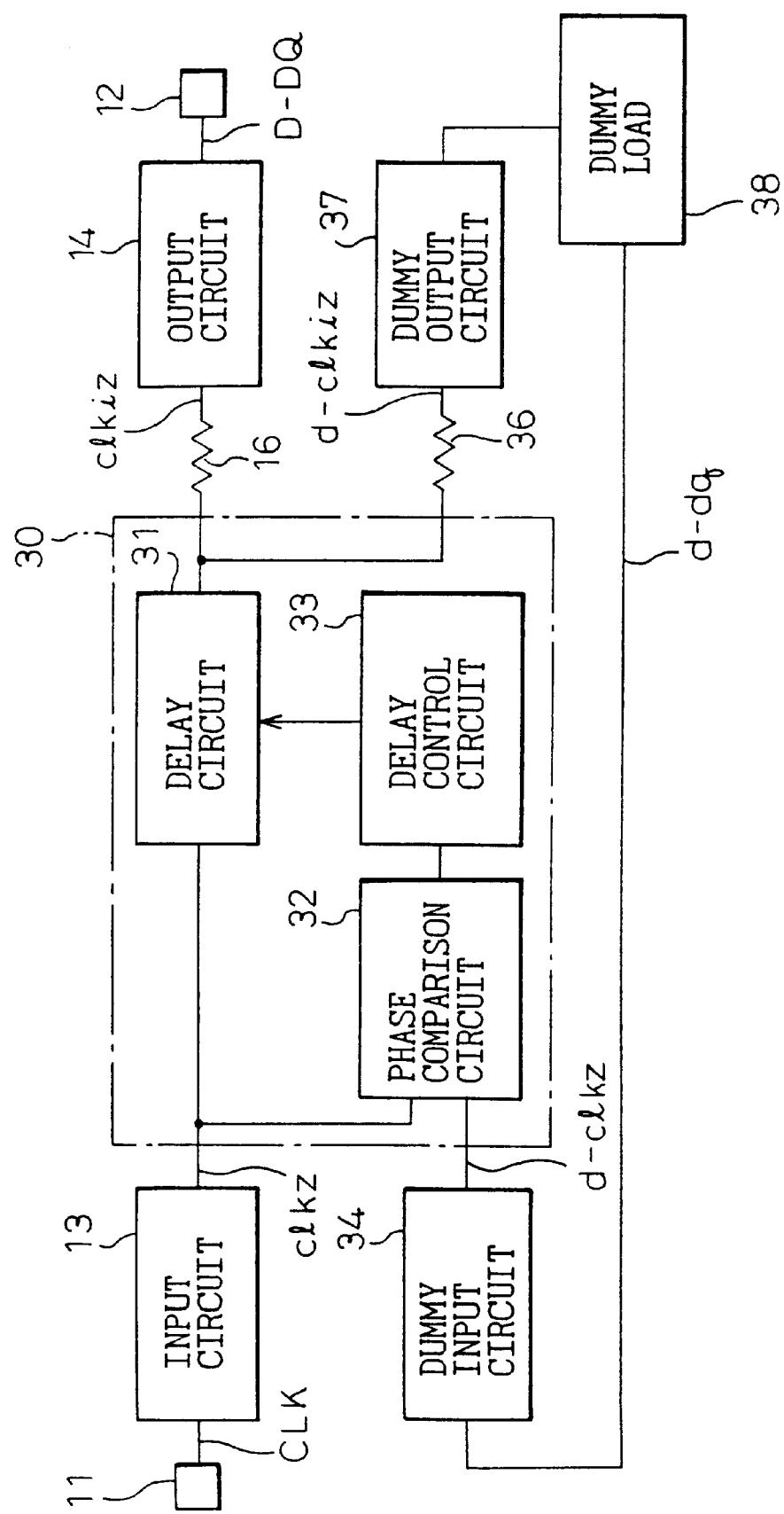
FIG. 57 is a diagram showing the configuration of an output timing control circuit in accordance with the present invention.

FIG. 57 is a diagram showing the configuration of an output timing control circuit in which the twelfth embodiment is implemented. A standard configuration that can be employed in the aforesaid embodiments is shown. To begin with, a problem occurring when the output signal of a dummy output circuit does not have, as mentioned above, the same level as a clock to be input to an input circuit will be described.

As already described, the output timing control circuit has the clock control unit (DLL) 30 interposed between the input circuit 13 for fetching an external clock input through the clock terminal 11 and outputting a signal clkz, and the output circuit 14 for outputting data through the data output DQ terminal 12. The output timing control circuit can adjust the phase of a clock to be supplied to the output circuit 14, that is, an output timing control signal clkiz. The DLL 30 includes the delay circuit 31 for delaying the signal clkz supplied from the input circuit 13. The magnitude of a delay to be produced by the delay circuit 31 can be changed by the delay control circuit 33. For adjustment, it is necessary to detect the phase of a data output DQ relative to an external clock CLK. Since the data output DQ makes state transitions at random, there is a difficulty in identifying a phase using the data output. A dummy output path along which dummy data d-dq is output according to the same timing according to which the output circuit 14 outputs data D-DQ is laid down so that the phase of the dummy data can be compared with that of the external clock CLK. In reality, the phase cannot be compared directly with the phase of the external clock clk. To enable the comparison of the phase of the output clkz of the input circuit 13 with the phase of the clock, a dummy input circuit 34 equivalent to the input circuit 13 is included. The dummy data d-dq is input to the dummy input circuit 34, and the phase of an output d-clkz of the dummy input circuit 34 is compared with the phase of the output clkz. A signal to be transmitted along the dummy output path must have the same timing as the data D-DQ. The dummy output path is composed of the dummy line 36 causing the same delay as the line 16 linking the DLL 30 and output circuit 14, the dummy output circuit 37, equivalent to the output circuit 14, for outputting dummy data, and a dummy load 38. The DLL 30 includes the phase comparison circuit 32 for comparing the signal clkz output from the input circuit with the signal d-clkz output from the dummy input circuit 34, and judges whether the signal d-clkz leads or lags behind the signal clkz. Based on the result of the judgment, the delay control circuit 33 increases or decreases the magnitude of a delay to be produced by the delay circuit 31 until the signal d-clkz exhibits a given phase relative to the signal clkz. After the signal d-clkz has the given phase relative to the signal clkz, the delay control circuit 33 retains the state.

Thus, the output timing control circuit includes a dummy path equivalent to a normal signal path. The phase of a dummy signal propagating along the dummy path is compared with the phase of an external clock.

Figure 58:
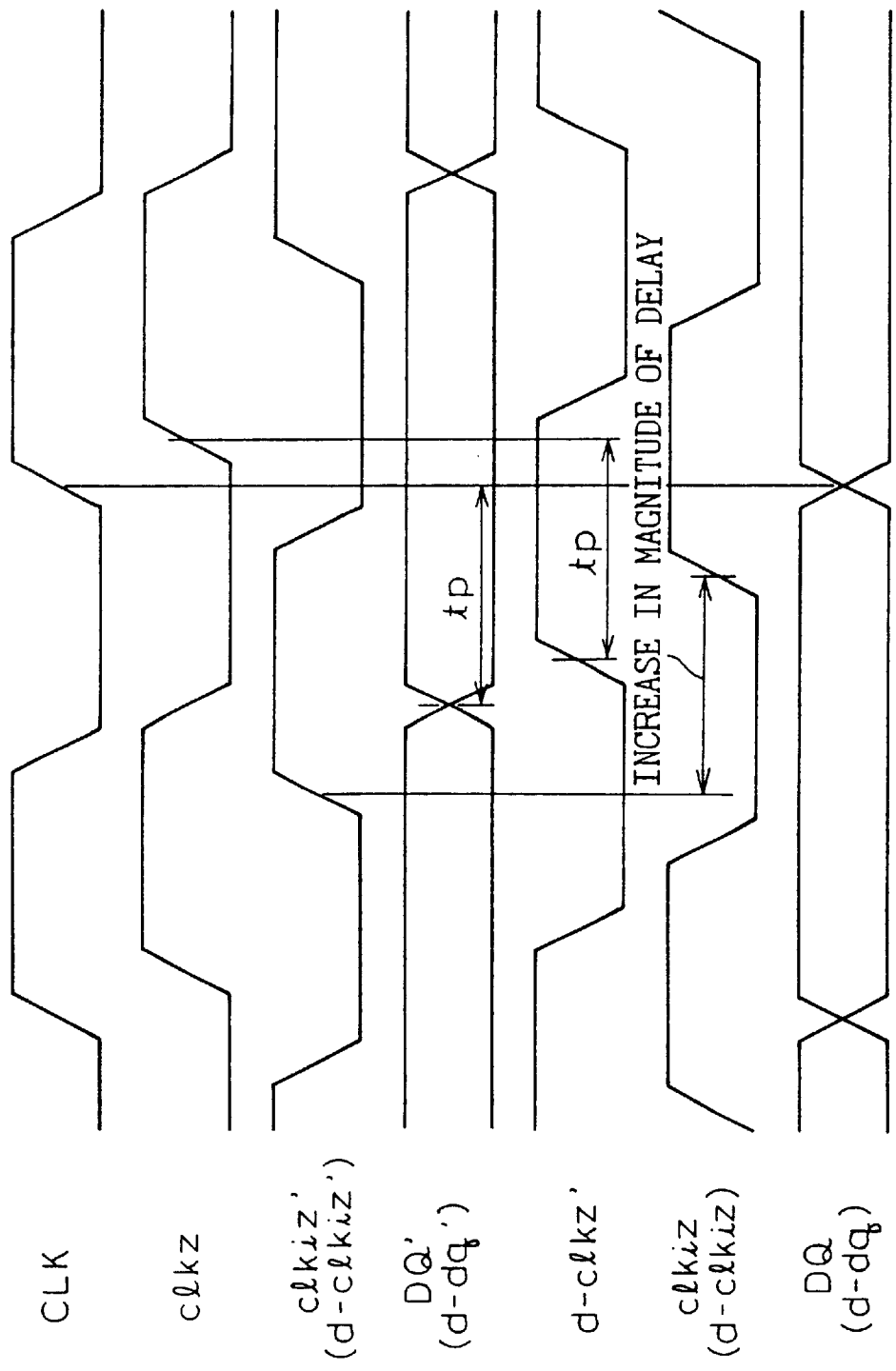
FIG. 58 is a diagram showing the operations of the output timing control circuit shown in FIG. 57.

FIG. 58 is a timing chart showing the operations of the output timing control circuit. FIG. 58 shows an example in which timing is adjusted so that a data output DQ can make a state transition synchronously with the rise of an external clock CLK. As shown in FIG. 58, an output clkz of the input circuit lags behind the external clock CLK. The output clkz is delayed by the delay circuit 31, and output as signals clkiz and d-clkiz. The signals clkiz and d-clkiz are delayed by the signal line and dummy signal line 36, and then input to the output circuit 14 and dummy output circuit 37. The output circuit 14 and dummy output circuit 37 duly output the data output DQ and dummy output d-dq. The dummy output d-dq is delayed by the dummy input circuit 34, and input as a signal d-clkz to the phase comparison circuit 32. At an initial step at which adjustment is not completed, the signals clkiz, d-clkiz, DQ, d-dq, and d-clkz shall be output as signals clkiz', d-clkiz', DQ', d-dq', and d-clkz' respectively. The phase comparison circuit 32 compares the signal clkz with the signal d-clkz'. Assuming that the signal clkz leads, as illustrated, the signal d-clkz' by a time tp, the signal DQ' leads the clock CLK by the time tp. The phase comparison circuit 32 therefore judges that the signal clkz leads the signal d-clkz'. Accordingly, the delay control circuit 33 increases by one step the magnitude of a delay to be produced by the delay circuit 31. The operations are continued until the signal clkz is phased with the signal d-clkz, that is, until the magnitude of a delay to be produced by the delay circuit 31 is increased by the time tp. When the magnitude of a delay is increased by the time tp, the signals clkiz and d-clkiz output from the delay circuit 31 have the illustrated waveform. Accordingly, the signals DQ and d-dq have the illustrated waveform. Eventually, the signal DQ comes to make a state transition synchronously with the rise of the external clock CLK.

In the output timing control circuit using the foregoing DLL, a difference in phase of an internal clock, which is delayed while propagating along a path from the clock terminal through the input circuit, signal line, and output circuit to the data output DQ terminal, from an external clock is adjusted by delaying the internal clock using the delay circuit until the output timing of the output circuit equals a given phase of the external clock CLK. This operation can be regarded as an operation of advancing the internal clock by the delay caused by the path. This way of thinking helps simplify the further description. The way of thinking will be utilized below.

Figure 59:
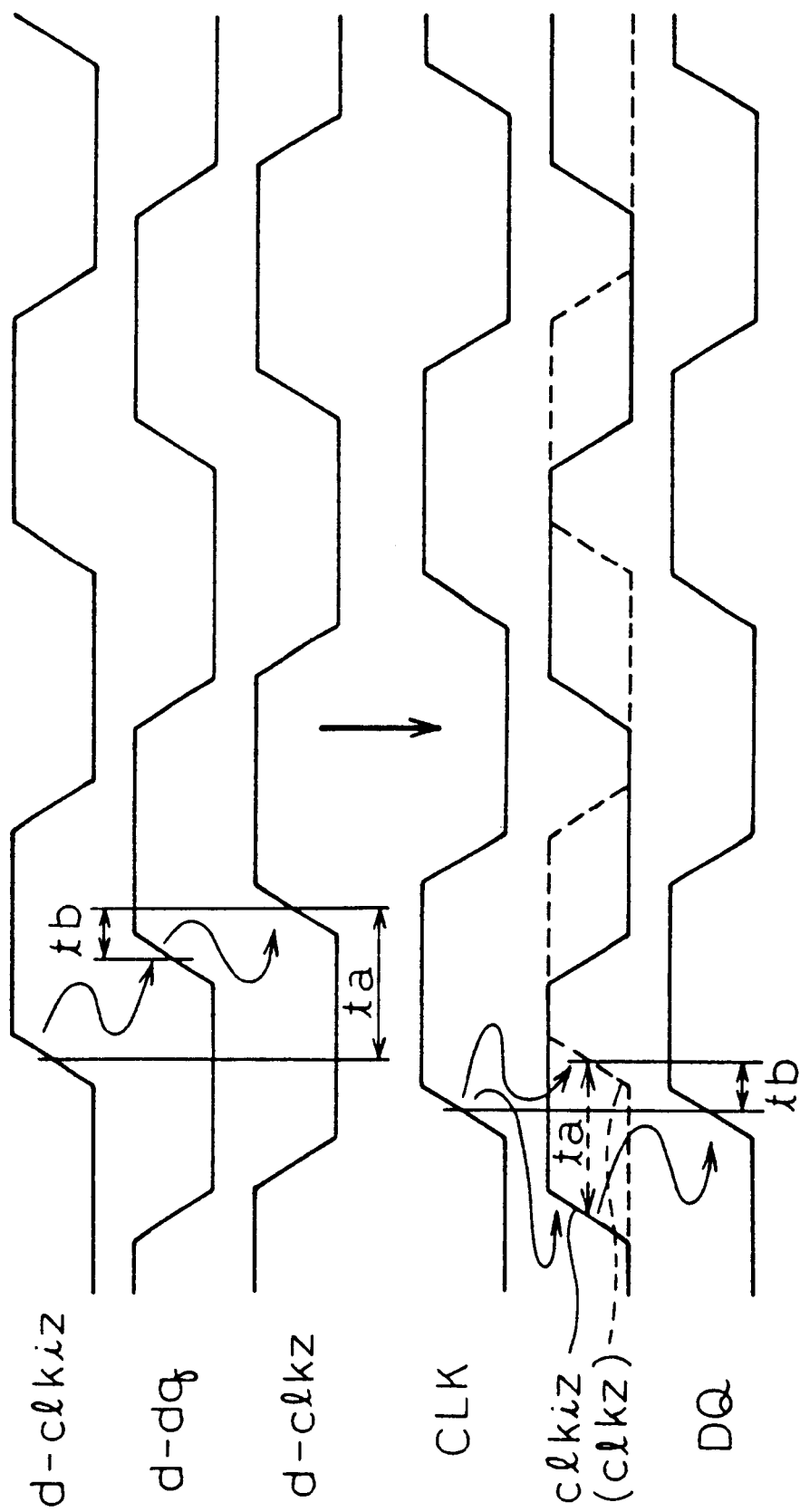
FIG. 59 is a diagram for explaining the operations of the output timing control circuit shown in FIG. 57.

FIG. 59 is a diagram for explaining the operations of the circuits shown in FIG. 57 in line with the above way of thinking. As mentioned previously, in an existing SDRAM, a time tAC is determined by the number of stages of logical elements ranging from a stage on which an external clock CLK is input to a stage on which a data output DQ is supplied, and by physical distance. Referring to FIG. 57, a delay of an internal signal occurring at the clock terminal 11 and input circuit 13 and along a long-distance line and a delay thereof occurring along a path reaching the DQ terminal through the output circuit (data latch) 14 come to the time tAC. Therefore, a path identical to the path is laid down inside a chip, and a delay occurring along the path is measured. Consequently, the time tAC required when the SDRAM operates can be calculated. The path used to calculate the time tAC is a dummy path. The delay occurring along the path is equal to a delay of an output d-clkiz of the dummy delay circuit occurring until the output d-clkiz is provided as a signal d-clkz after propagating along a path from the dummy signal line 36 through the dummy output circuit 37 and dummy output load 38 to the dummy input circuit 34. This delay is equivalent to the time tAC. The delay time shall be a time ta and the magnitude of a delay occurring in the input circuit 13 and dummy input circuit 34 shall be a magnitude tb. The delay circuit 31 subtracts the time ta from the cycle of the signal clkiz (actually, delays the signal clkiz), that is, advances the signal clkiz, whereby data can be output through the data output terminal synchronously with the clock CLK. This operation is generally referred to as delay-locked looping. In FIG. 59, for convenience' sake, the data output DQ shall make a state transition at intervals of the same cycle as the external clock CLK, and the leading edge of the data output DQ shall be controlled to coincide with the leading edge of the clock CLK. The same applies to subsequent diagrams.

Figure 60:
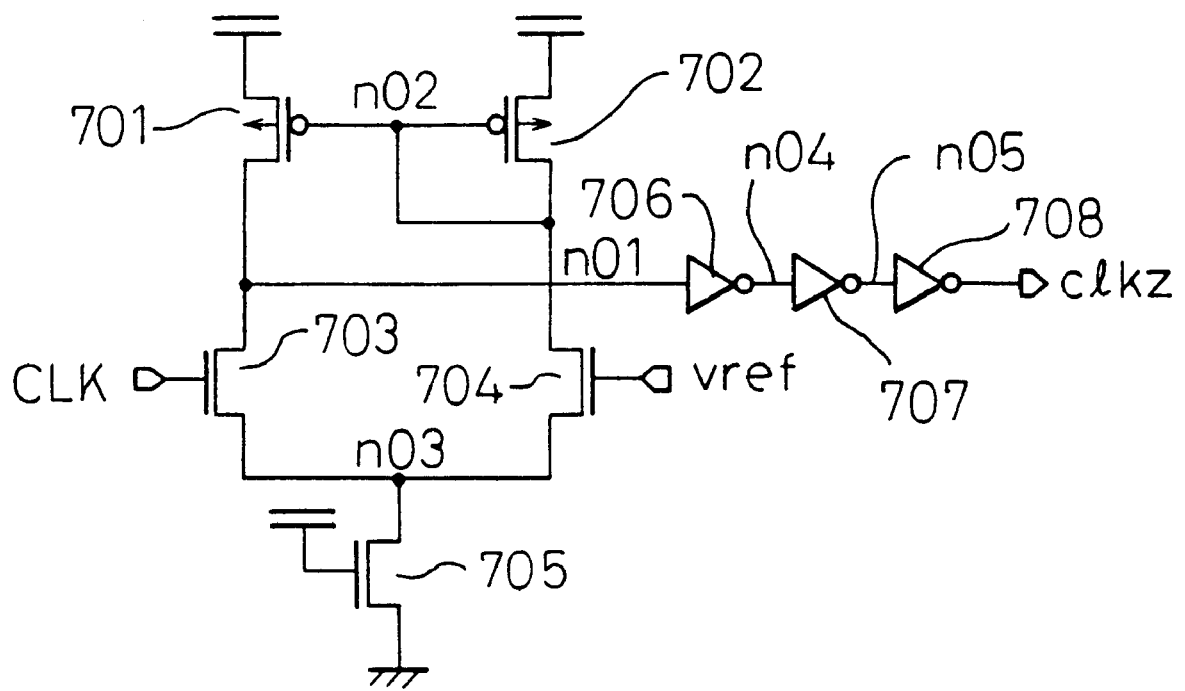
FIG. 60 is a diagram showing an example of the circuitry of an input circuit.

Now, a generally-adopted input circuit will be described briefly. FIG. 60 is a circuit diagram showing the circuitry of an input circuit generally employed in an SDRAM. An external clock CLK is applied to an input terminal CLK. The potential at a terminal vref is used as a reference level for judging whether an input level is higher or lower, and set to an intermediate potential between potentials VIH and VIL. However, when an initial input stage circuit having the inverting ratio of an inverter adjusted is employed, a level signal vref is not required. An inverted potential provided by the inverter may be used as the signal vref. Through an output terminal clkz, a signal which is in phase of the external clock CLK and of which level is conformed to a signal level employed in a CMOS is output.

As described previously, for existing semiconductor devices, a plurality of interface standards have been stipulated in order to make signals employed in one semiconductor device compatible with other semiconductor devices. As far as an SDRAM or a semiconductor device to be used in combination with an SDRAM is concerned, two standards, LVTTL and STLL, are generally adopted. According to the LVTTL standard, a voltage VIH is set to 2.0 V and a voltage VIL is set to 0.8 V. According to the SSTL standard, the voltage VIH is set to Vref+2.0 V, and the voltage VIL is set to vref–0.2 V. The signals have different amplitudes between the standards. When a signal having a different amplitude is input to the input circuit shown in FIG. 60, the characteristic of the input circuit changes.

Figure 61A:
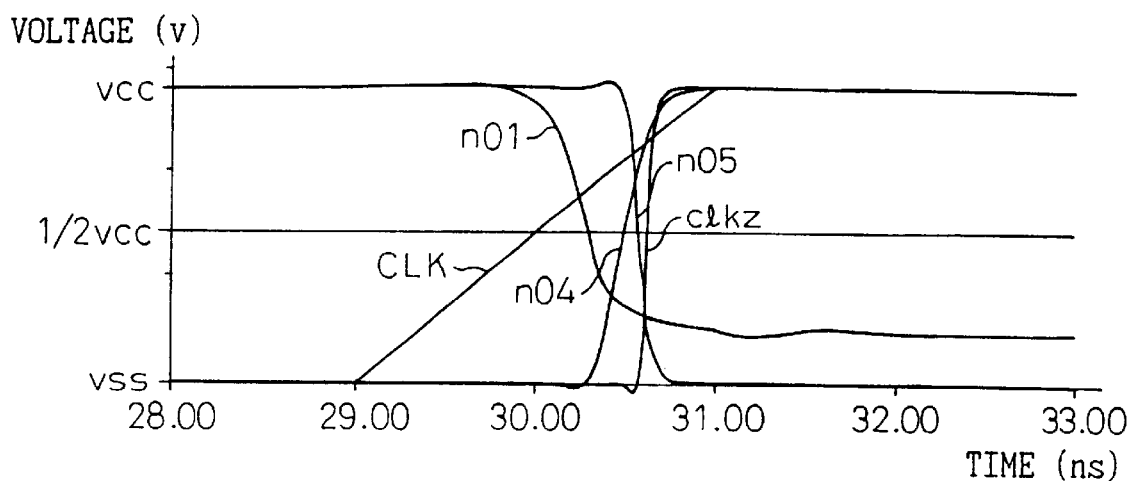
FIGS. 61A and 61B are diagrams showing the operations of the input circuit to be performed when the amplitude of a clock is different.
Figure 61B:
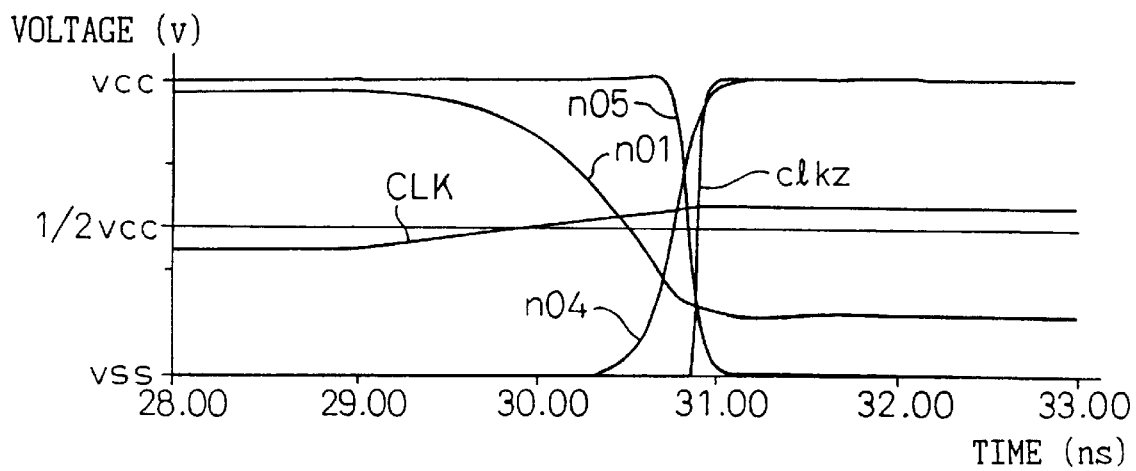

FIGS. 61A and 61B are diagrams showing a change in characteristic of the input circuit shown in FIG. 60 deriving from a difference in amplitude of an input signal. FIG. 61A shows the waveforms of internal operating waves according to the LVTTL standard, while FIG. 61B shows the waveforms of internal operating waves according to the SSTL standard. As is apparent from the drawings, when the SSTL is adopted, signals having the same amplitudes as those employed when the LVTTL is adopted are output internally. Depending on the conditions for an input wave, the response or response speed of the input circuit varies. To be more specific, the gain of the input circuit, that is, the amplification ability and response ability thereof are constant. The response ability differs between when a wave having a small amplitude is amplified to a CMOS level and when a wave having a large amplitude close to the CMOS level is amplified. When the slope of an input wave is steep, the response speed gets higher. When the slope is moderate, the response speed gets lower. For the alternating-current specifications of an SDRAM, signal levels are measured with a half of a voltage VCC. The aforesaid times are measured with the half voltage ½VCC. The above phenomenon is not limited to the circuit shown in FIG. 60 but may occur in any general input circuit.

An SDRAM is designed to be able to operate in response to any input signal conformable to either of the two standards of LVTTL and SSTL. For the SDRAM, the dummy output load 38 lying along the dummy path is determined by predicting a load to be applied externally of a device. This means that the SDRAM is designed in consideration of an output interface. In many SDRAMs, the amplitude of an output is larger than a difference between the potentials VIH and VIL. That is to say, the dummy output d-dq has a large amplitude. As far as the LVTTL is concerned, almost all users give control on the assumption that the input signal has as large an amplitude as an output signal. In the LVTTL, therefore, an external clock CLK input to the input circuit through a clock terminal has the same amplitude as the dummy output d-dq input to a dummy input circuit. No problem therefore occurs.

However, in the SSTL, the external clock CLK to be input to the input circuit through the clock terminal is an SSTL-conformable signal having a small amplitude, while the dummy output d-dq to be input to the dummy input circuit is a signal having a large amplitude. The input circuit therefore exhibits a difference in characteristic as discerned through comparison between FIGS. 61A and 61B. When the input circuit exhibits such a difference in characteristic, even if the output timing control circuit shown in FIG. 57 is employed, an error occurs in the output timing, that is, phase of an output. Occurrence of the error will be described with reference to FIG. 62.

Assuming that the external clock CLK is a signal having a small amplitude, the response of the input circuit to the clock is slow. A signal clkz output from the input circuit is output in a time lag tx. The signal clkz is delayed by a delay circuit. Consequently, signals clkiz' and d-clkiz' are output. In response to the signals, an output circuit and a dummy output circuit provide data DQ' and dummy data d-dq'. At this time, the transition edges of the data DQ' and data d-dq coincide with the leading edge of the clock CLK. A dummy input circuit receives the dummy data d-dq' and outputs a signal d-clkz'. However, since the dummy data d-dq' has a large amplitude, the time lag of the signal d-clkz' from the data d-dq' becomes a time ty. There is a phase difference, tq=tx−ty, between the signals clkz and d-clkz' which are compared by a phase comparison circuit. A delay control circuit increases the magnitude of a delay to be produced by the delay circuit so as to nullify the phase difference. As illustrated, when the phase difference between the signals clkz and d-clkz becomes null, the signal clkiz lags behind the signal clkiz' by a time tq. Data DQ is stabilized in a state in which the data DQ lags behind the clock CLK by the time tq. Thus, as far as a known output timing control circuit is concerned, when the external clock CLK is a signal having a small amplitude, a phase error occurs between the data output DQ and external clock CLK.

Figure 62:
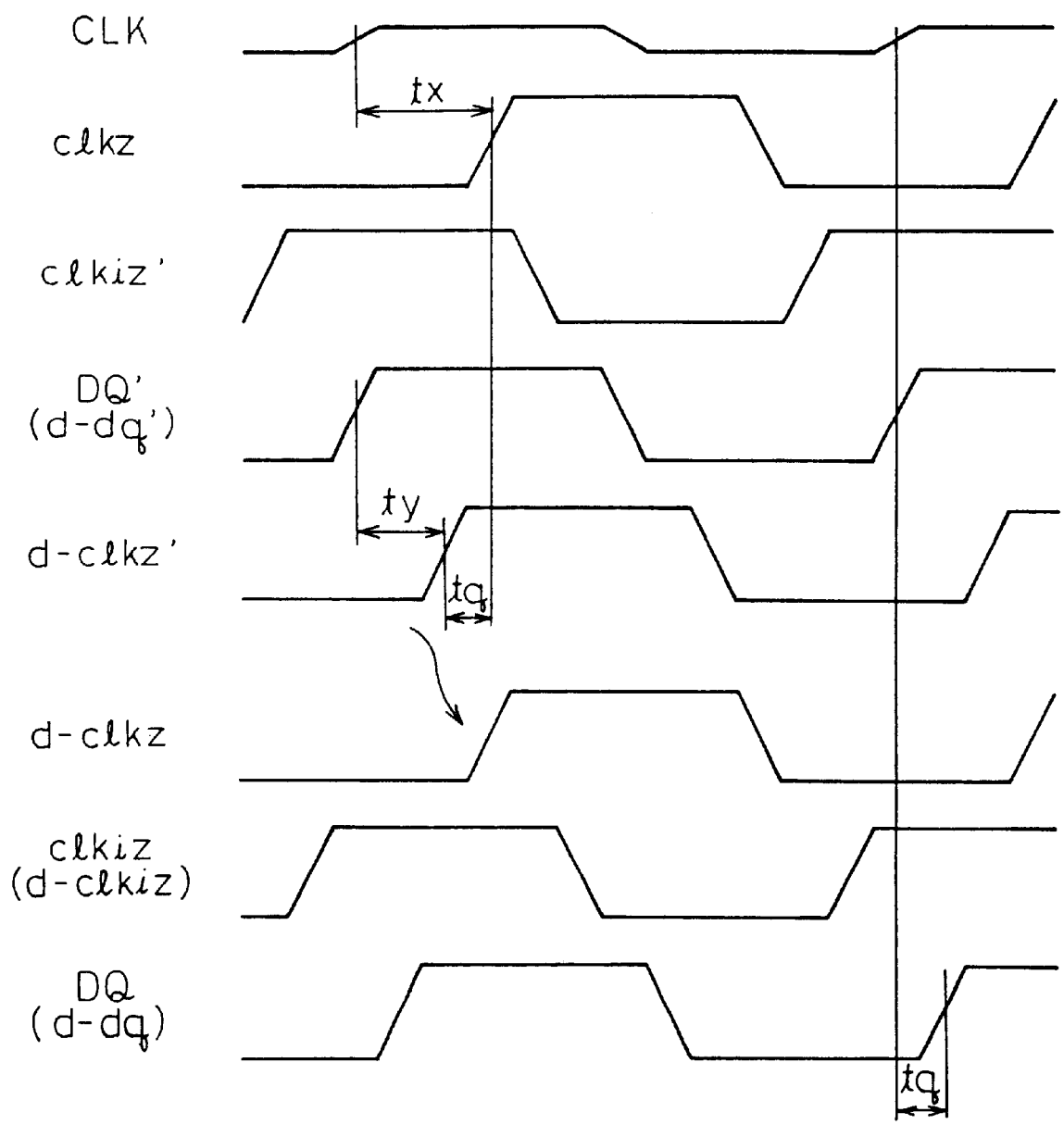
FIG. 62 is a diagram for explaining a problem underlying the output timing control circuit shown in FIG. 57.
Figure 63:
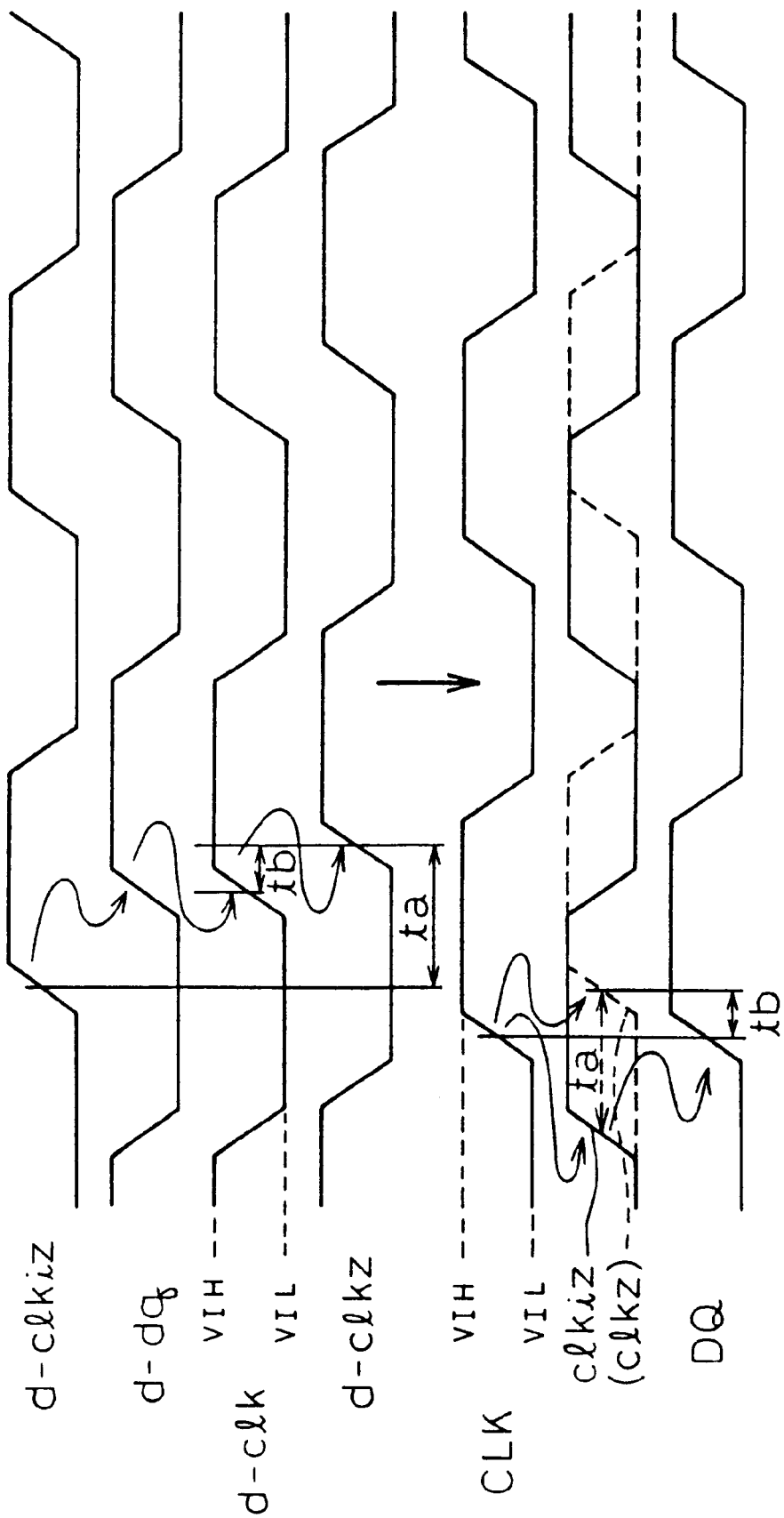
FIG. 63 is a diagram for explaining a problem underlying the output timing control circuit shown in FIG. 57.
Figure 64:
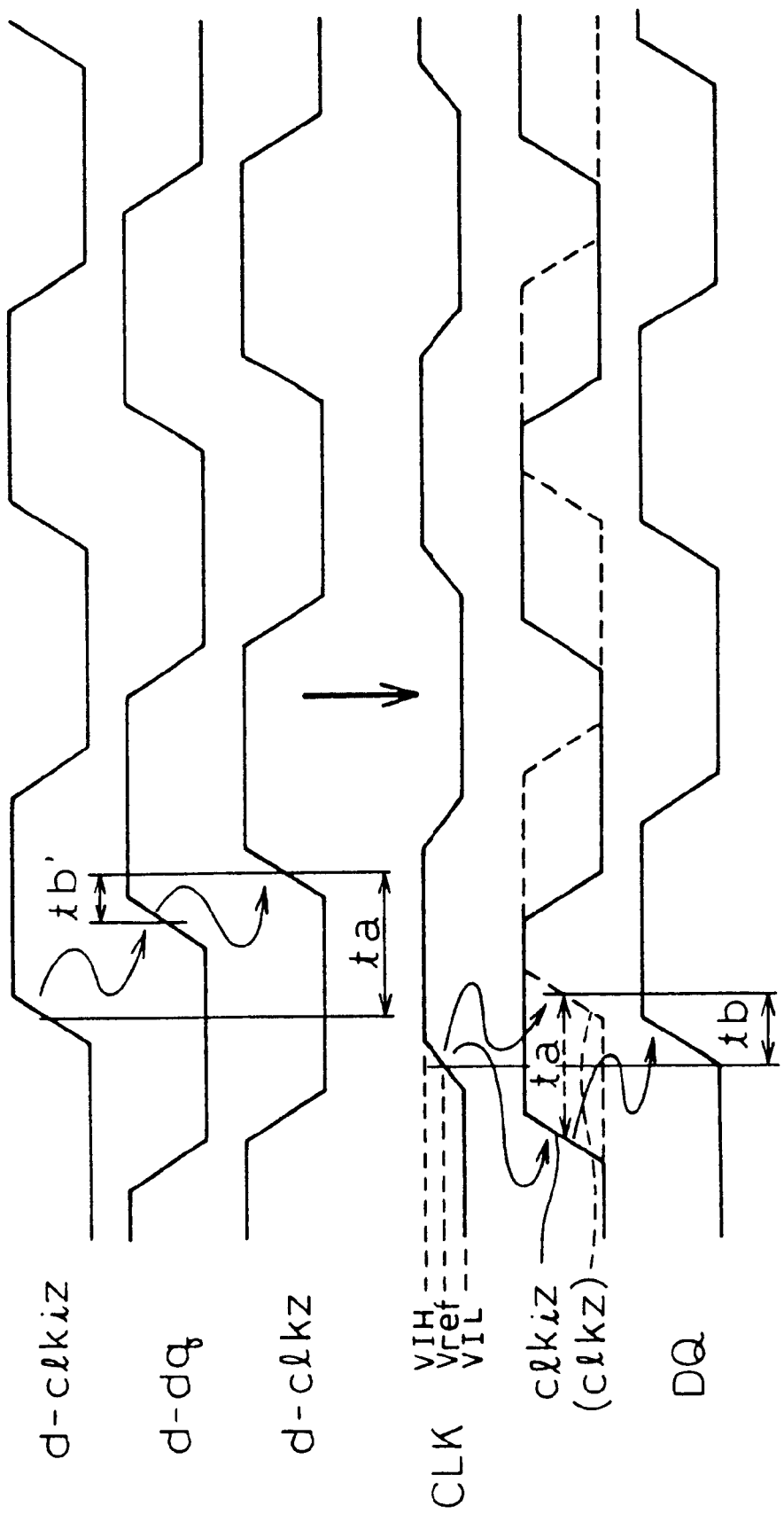
FIG. 64 is a diagram for explaining a problem underlying the output timing control circuit shown in FIG. 57.

FIGS. 63 and 64 are diagrams for explaining the phenomenon explained in conjunction with FIG. 62, in which a phase error occurs between a data output DQ and an external clock CLK because an input signal has a different amplitude, by utilizing the way of thinking described in conjunction with FIG. 59. FIG. 63 is concerned with the LVTTL, while FIG. 64 is concerned with the SSTL. In the case of the LVTTL shown in FIG. 63, a delay occurring in an input circuit is equal to a delay occurring in a dummy input circuit, tb. Therefore, when the signal clkiz is advanced by the measured magnitude of a delay occurring along a dummy path, the data output DQ is brought into phase with the external clock CLK. By contrast, when the SSTL is adopted, a delay tb occurring in the input circuit is different from a delay tb' occurring in the dummy input circuit. Even if the signal clkiz is advanced by the measured magnitude of a delay occurring along the dummy path, there is a phase difference between the external clock CLK and data output DQ. In a semiconductor device of the twelfth embodiment, this problem is solved. Even when a signal having a different amplitude is input, the data output DQ is always brought into phase with the external clock CLK.

Figure 65:
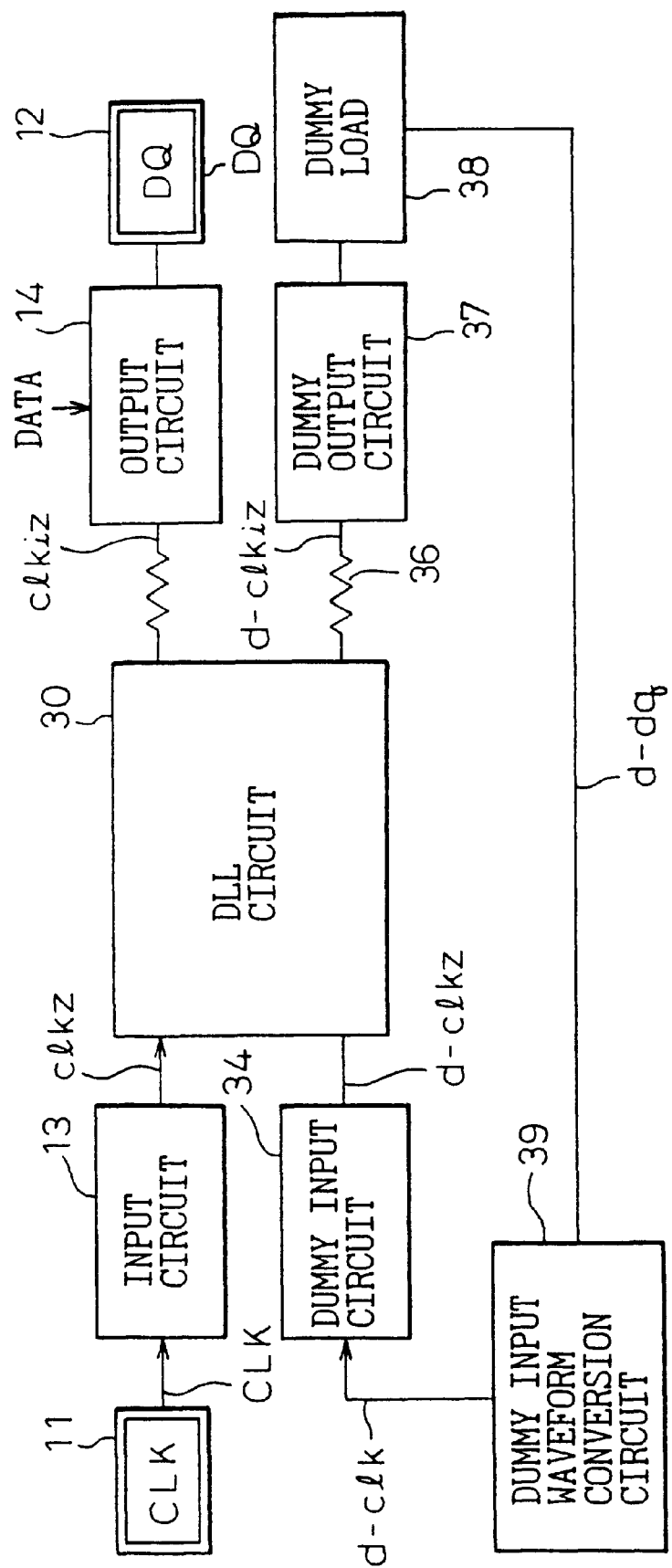
FIG. 65 is a diagram showing the basic configuration of an output timing control circuit in the twelfth embodiment.

FIG. 65 is a diagram showing the basic configuration of a semiconductor device of the twelfth embodiment. As shown in FIG. 65, the semiconductor device of the twelfth embodiment has, in addition to the components shown in FIG. 57, a dummy input waveform conversion circuit 39 for converting the waveform of dummy data d-dq input to the dummy input circuit 34 to a waveform identical to the waveform of an external clock CLK. The waveform of a dummy data signal is thus agreed with that of the external clock. Eventually, occurrence of a phase difference deriving from a difference in waveform between two signals is prevented.

Figure 66:
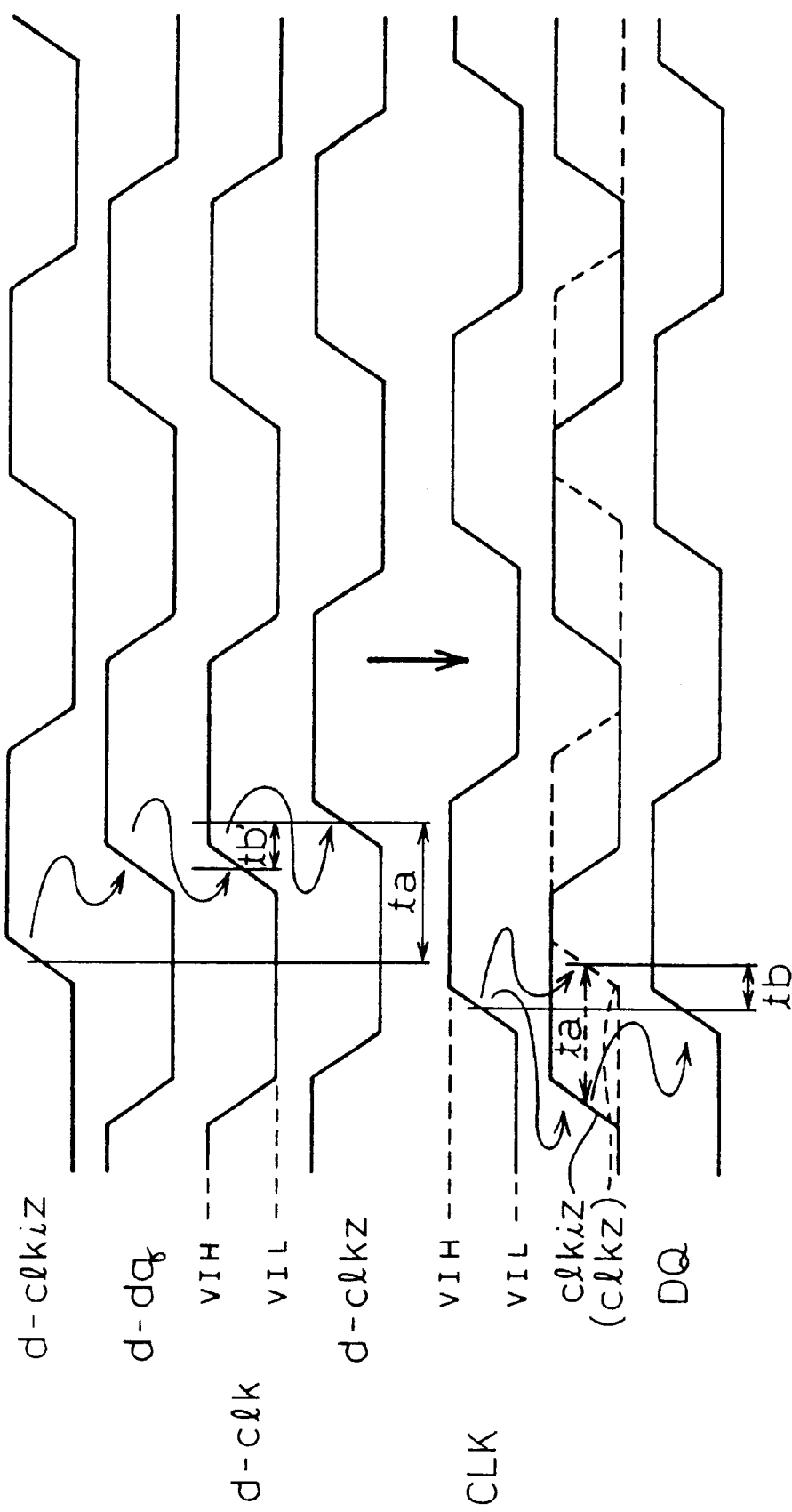
FIG. 66 is a diagram showing the operations of the output timing control circuit in the twelfth embodiment.
Figure 67:
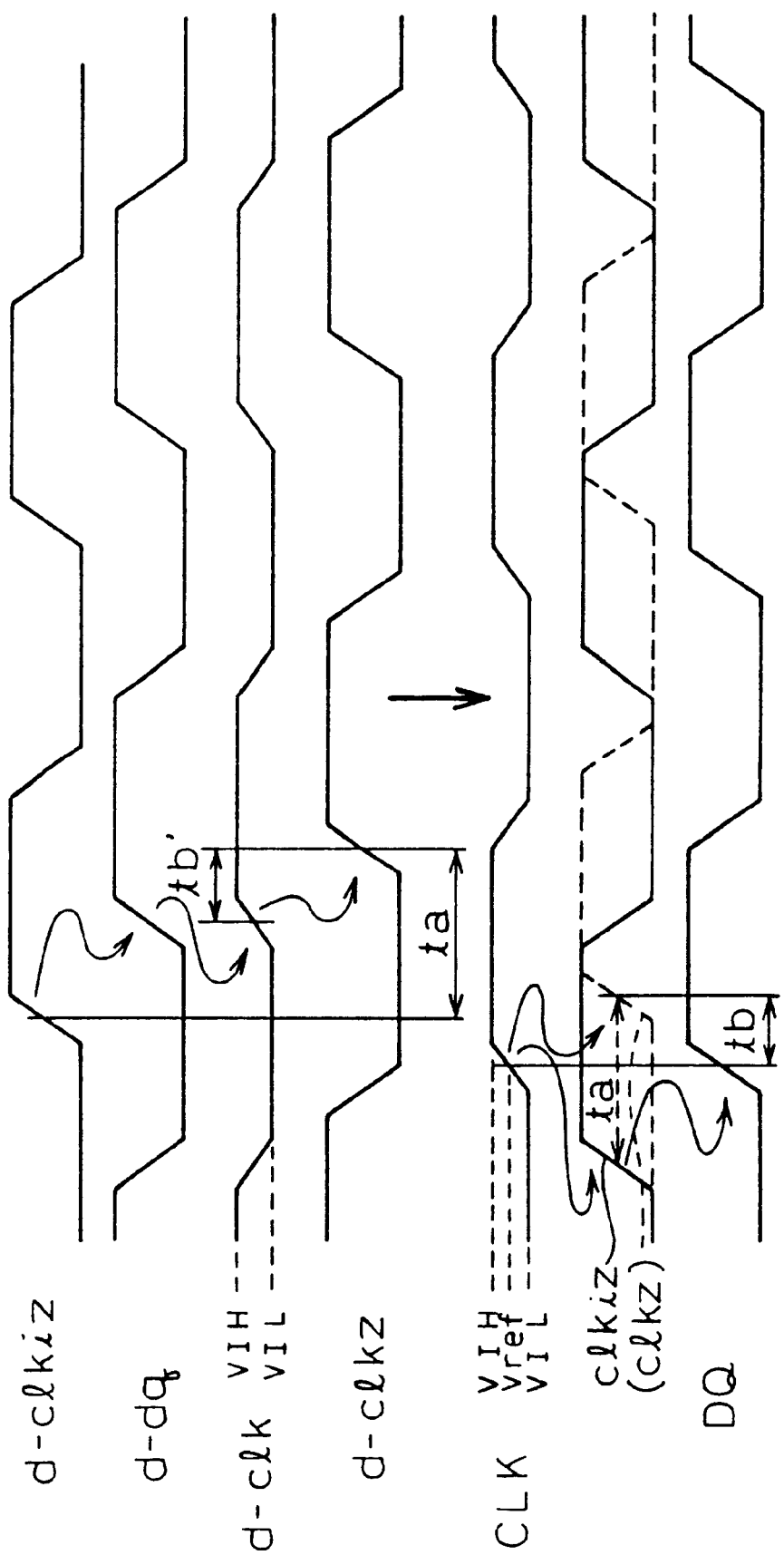
FIG. 67 is a diagram showing the operations of the output timing control circuit in the twelfth embodiment.

FIGS. 66 and 67 are diagrams for explaining the operations of the semiconductor device of the twelfth embodiment. FIG. 66 shows the operations in the LVTTL in which a large-amplitude signal is input, while FIG. 67 shows the operations in the SSTL in which a small-amplitude signal is input. As shown in FIG. 66, in the LVTTL, the dummy output signal d-dq has a large amplitude and is converted into a signal d-clk having the large amplitude by the dummy input waveform conversion circuit 39. At this time, a delay occurring in the dummy input waveform conversion circuit 39 has a negligible magnitude. Both an external clock CLK and the signal d-clk have a large amplitude, and the input circuit 13 and dummy input circuit 34 are mutually equivalent. A delay time tb' occurring in the dummy input circuit 34 is equal to a delay time tb occurring in the input circuit 13. Once the external clock CLK is advanced by a delay time ta occurring along the dummy path by means of the DLL 30, the output signal DQ is phased with the external clock CLK.

As shown in FIG. 67, in the SSTL, the dummy output signal d-dq has a large amplitude and is converted into a signal d-clk having a small amplitude by the dummy input waveform conversion circuit 39. At this time, a delay occurring in the dummy input waveform conversion circuit 39 has a negligible magnitude. With the conversion, both the external clock CLK and signal d-clk have a small amplitude. The input circuit 13 and dummy input circuit 34 are mutually equivalent. The delay time tb' occurring in the dummy input circuit 34 is equal to the delay time tb occurring in the input circuit 13. Once the external clock CLK is advanced by the delay time ta occurring along the dummy path by means of the DLL 30, the output signal DQ is phased with the external clock CLK.

Figure 68A:
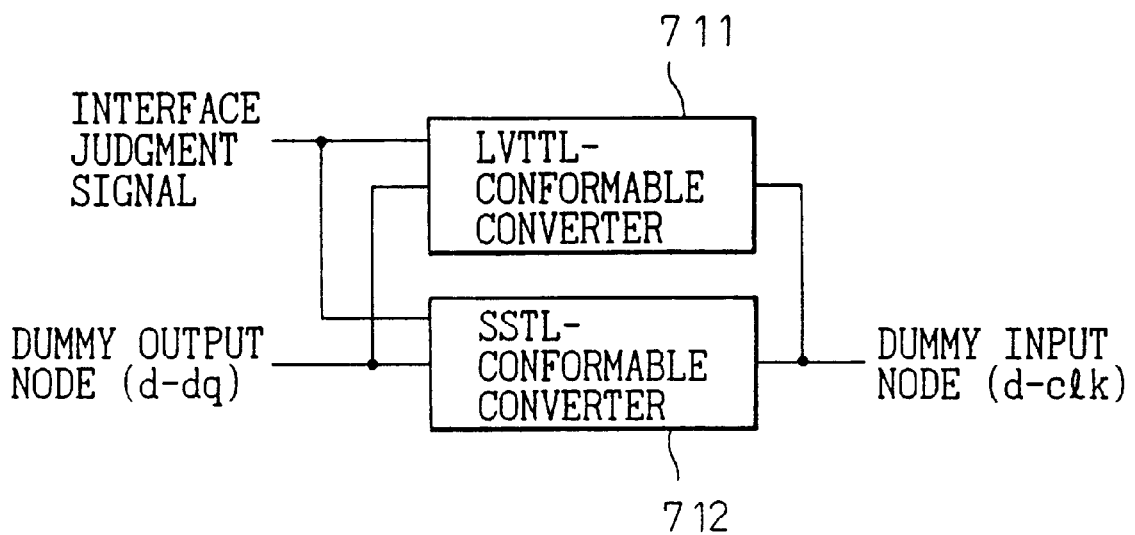
FIGS. 68A and 68B are diagrams showing a dummy input waveform conversion circuit in the twelfth embodiment.
Figure 68B:
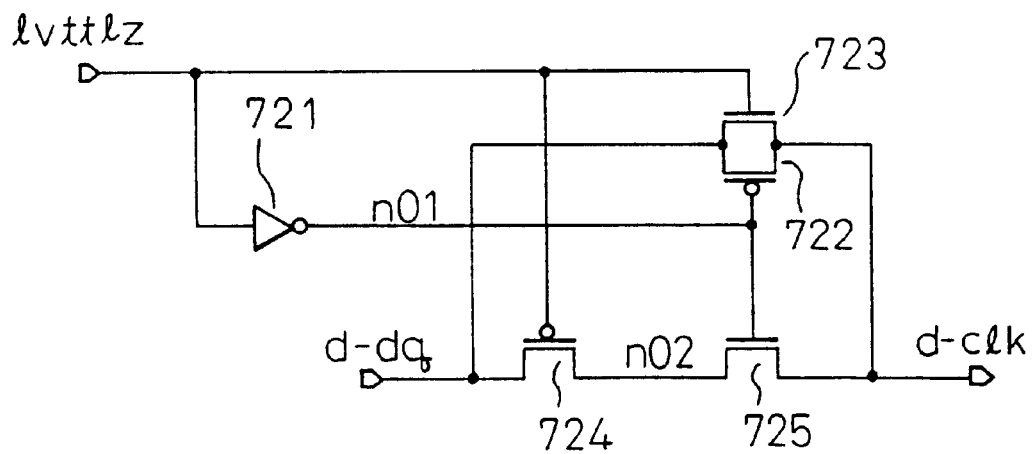

FIGS. 68A and 68B are diagrams showing the configuration of the dummy input waveform conversion circuit in the twelfth embodiment. FIG. 68A is a block diagram showing the basic configuration, and FIG. 68B is a circuit diagram. As shown in FIG. 68A, the dummy input waveform conversion circuit includes an LVTTL-conformable converter 711 and SSTL-conformable converter 712. The LVTTL-conformable converter 711 and SSTL-conformable converter 712 share a dummy output node and a dummy input node. A dummy output d-dq output from the dummy output circuit 37 to the dummy load 38 is input through the dummy output node. A dummy input d-clk resulting from waveform conversion is output through the dummy input node and input to the dummy input circuit 34. Either of the VTTL-conformable converter 711 and SSTL-conformable converter 712 is activated with an interface judgment signal lvttlz. The dummy output d-dq is converted by an activated converter. Consequently, the dummy input d-clk is output. The interface judgment signal lvttlz is a signal generated by a circuit incorporated in a chip for specifying which interface standard is adopted to operate the chip. When an interface employed is conformable to LVTTL, the signal lvttlz goes high. When the interface is conformable to the SSTL, the signal lvttlz goes low.

In an actual dummy input waveform conversion circuit in the twelfth embodiment, the LVTTL-conformable converter 711 is, as shown in FIG. 68B, formed with a transfer gate composed of a p-channel transistor 722 and an n-channel transistor 723. The SSTL-conformable converter 712 is formed with a circuit made by connecting a p-channel transistor 724 and n-channel transistor 725 in series. The interface judgment signal lvttlz is applied to the gate of the n-channel transistor 723 of the LVTTL-conformable converter 711 and to the gate of the p-channel transistor 724 of the SSTL-conformable converter 712. A signal whose polarity is opposite to that of the interface judgment signal lvttlz is applied to the gate of the p-channel transistor 722 of the LVTTL-conformable converter 711 and to the gate of the n-channel transistor 725 of the SSTL-conformable converter 712.

Figure 69:
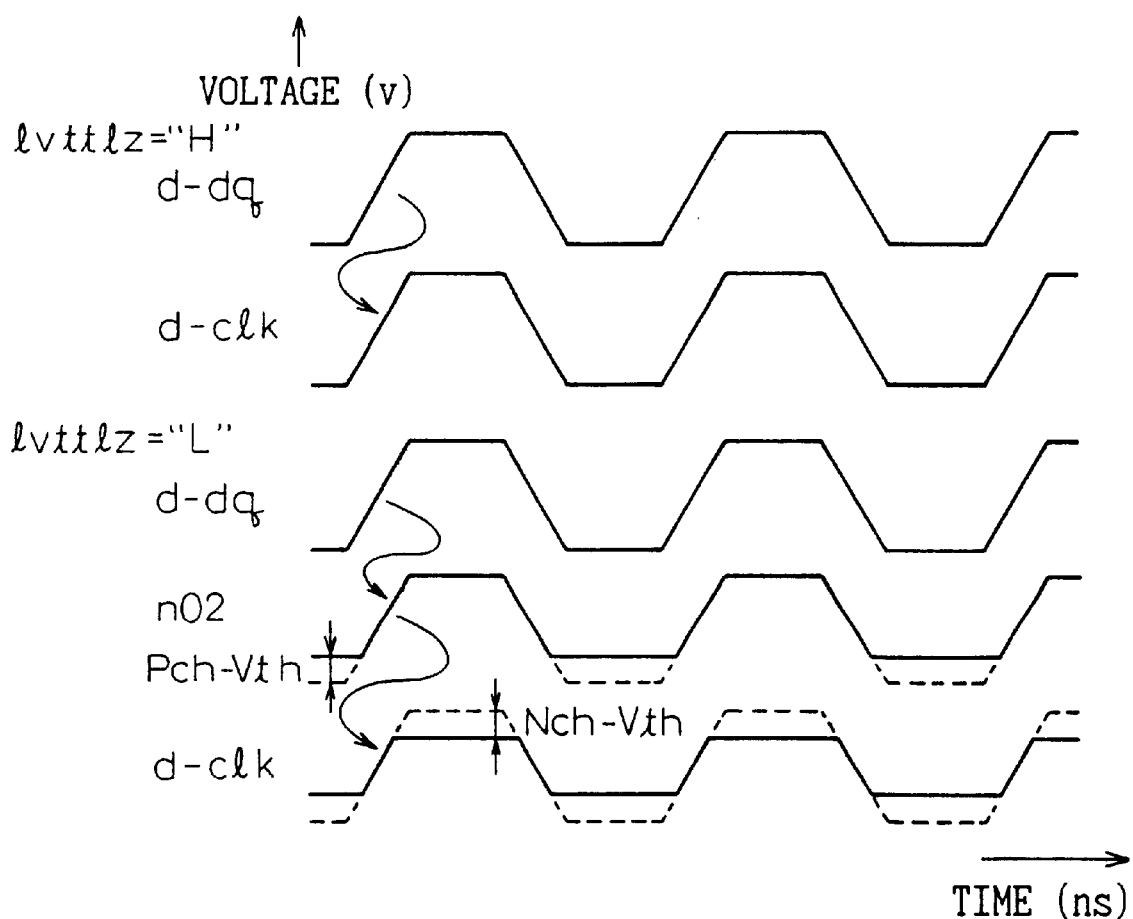
FIG. 69 is a diagram showing the operations of the dummy input waveform conversion circuit in the twelfth embodiment.

FIG. 69 is a diagram showing the operations of the dummy input waveform conversion circuit in the twelfth embodiment. When LVTTL is specified, the interface judgment signal lvttlz is high. The transistors 722 and 723 are turned on, and the transistors 724 and 725 are turned off. The transfer gate composed of the transistors 722 and 723 enters a passing state, while the path made by connecting the transistors 724 and 725 in series enters a cutoff state. In other words, the LVTTL-conformable converter 711 is activated, while the SSTL-conformable converter 712 is inactivated. An input signal d-dq therefore passes through the transfer gate and is output as a signal d-clk with the waveform held intact.

When the SSTL is specified, the interface judgment signal lvttlz is low. The transistors 722 and 723 are turned off, and the transistors 724 and 725 are turned on. The transfer gate composed of the transistors 722 and 723 enters the cutoff state. The path made by connecting the transistors 724 and 725 in series enters the passing state. In other words, the LVTTL-conformable converter 711 is inactivated, and the SSTL-conformable converter 712 is activated. Since the-transistors 724 and 725 are on, a signal n02 developed after the signal d-dq passes through the p-channel transistor 724 has a level calculated by subtracting the threshold voltage of the p-channel transistor 724, Pch-Vth, from the level of the signal d-dq. A signal d-clk has a level calculated by subtracting the threshold voltage of the n-channel transistor 725, Nch-Vth, therefrom. The amplitude of a wave input to the input circuit is therefore decreased and approximated to that of an SSTL-conformable signal having a small amplitude which is input externally. In the circuit shown in FIG. 68, a delay occurring in the LVTTL-conformable converter 711 or SSTL-conformable converter 712 is of a negligible level.

Figure 70:
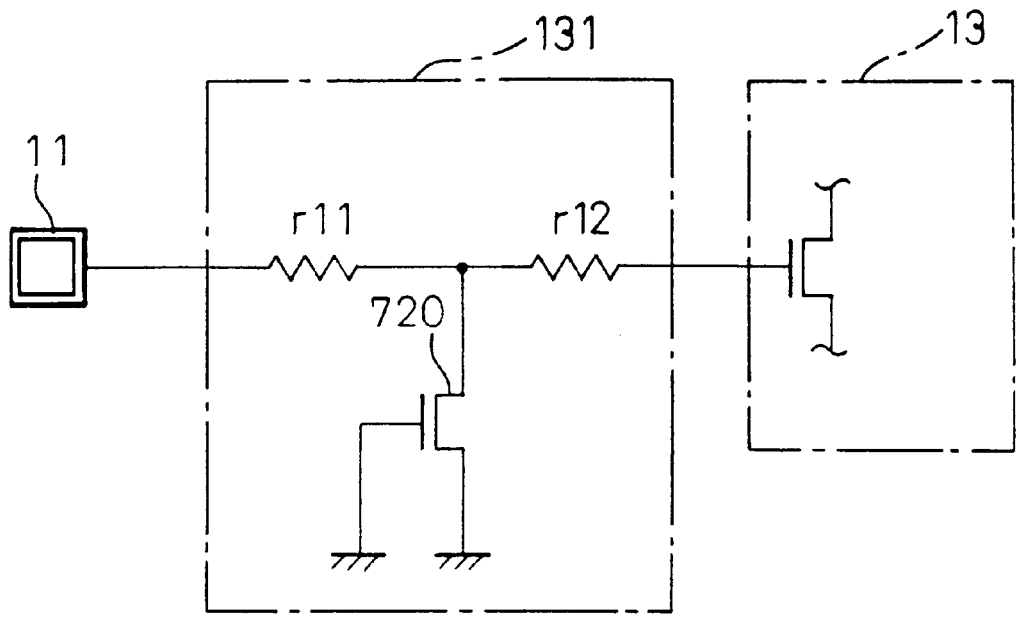
FIG. 70 is a diagram showing the circuitry of an ESD circuit designed for improving a withstanding voltage against static electricity which is interposed between an electrode pad and input circuit.
Figure 71:
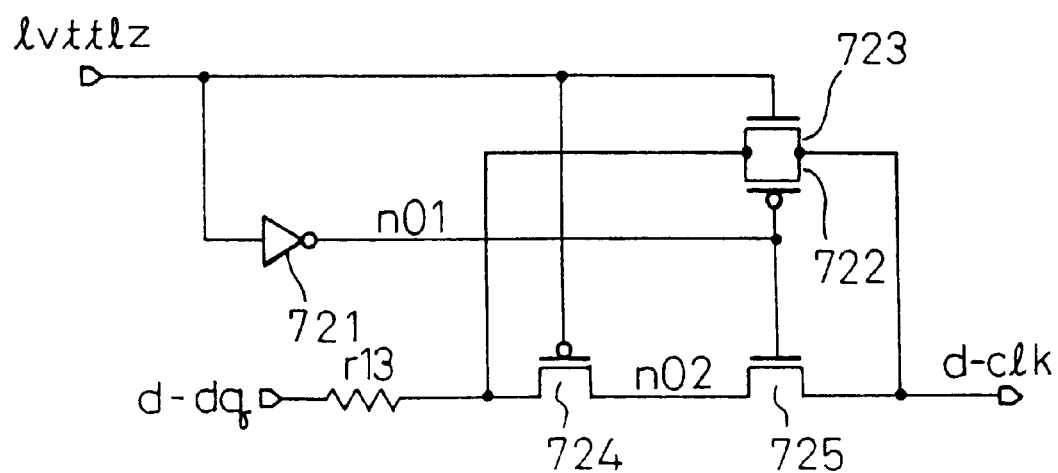
FIG. 71 is a diagram showing a variant of the dummy input waveform conversion circuit in the twelfth embodiment in which a delay having the same magnitude as a delay occurring in the ESD circuit occurs.

In general, for improving a withstanding voltage against static electricity originating from an electrode pad linked to external pins, a circuit like the one shown in FIG. 70, which is referred to as an ESD circuit, is interposed between an electrode pad 11 and the input circuit 13. As illustrated, the ESD circuit includes no logical element. However, since resistors r11 and r12 are inserted into a signal path, a delay is caused by the resistors. The delay caused by the resistors must be taken into account in designing a dummy path. It is conceivable to connect a circuit equivalent to the ESD circuit to the dummy input circuit 34. Alternatively, the dummy input waveform conversion circuit 39 may be designed to produce a delay equivalent to the delay caused by the ESD circuit. In this case, in the circuitry shown in FIG. 68B, assuming that the on-state resistance of the p-channel transistor 722 is rm01, the on-state resistance of the n-channel transistor 723 is rm02, the on-state resistance of the p-channel transistor 724 is rm03, and the on-state resistance of the n-channel transistor 725 is rm04, the values of the resistances rm01, rm02, rm03, and rm04 are determined so that rm01* rm02/(rm01+rm02) and rm03+rm04 will be equal to the resistance of the ESD circuit. Another method is, as shown in FIG. 71, to include a resistor r13 so that the resistance of the dummy input waveform conversion circuit 39 will be equal to that of the ESD circuit. Owing to the circuitry, a delay equivalent to the delay caused by the ESD circuit can be produced. This results in the further improved precision in timing adjustment.

In the dummy input waveform conversion circuit in the twelfth embodiment shown in FIG. 68B, when the SSTL is specified, the waveform of an input is determined with the threshold voltages Pch-Vth and Nch-Vth. The amplitude thereof cannot therefore be controlled arbitrarily. Depending on a use situation, it may become necessary to convert the amplitude of an input to an amplitude other than the amplitude determined with the threshold voltages. From this viewpoint, there is a problem that a usable range is limited. A dummy input waveform conversion circuit in the thirteenth embodiment solves this problem and can convert the amplitude of an input signal into any amplitude.

Figure 72A:
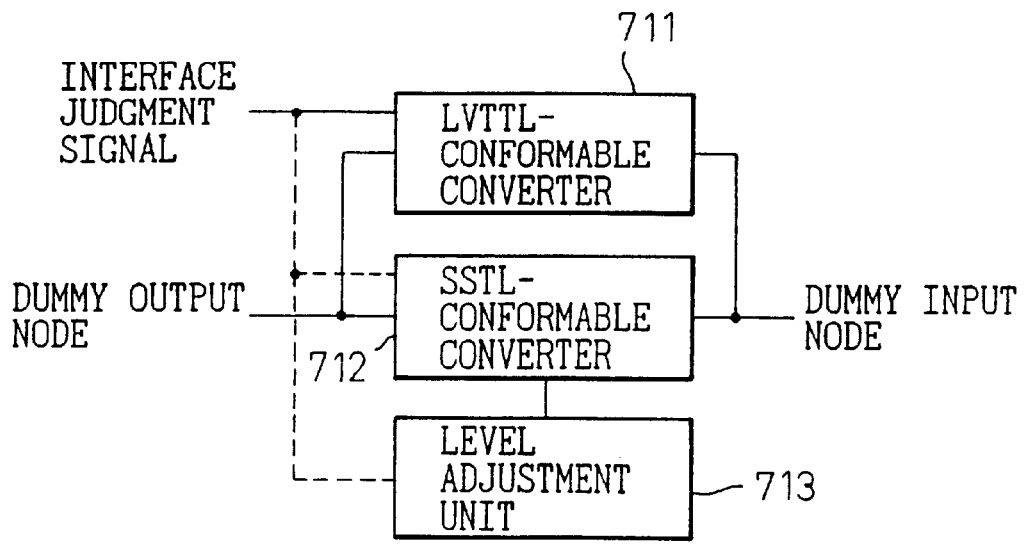
FIGS. 72A and 72B are diagrams showing a dummy input waveform conversion circuit in the thirteenth embodiment of the present invention.
Figure 72B:
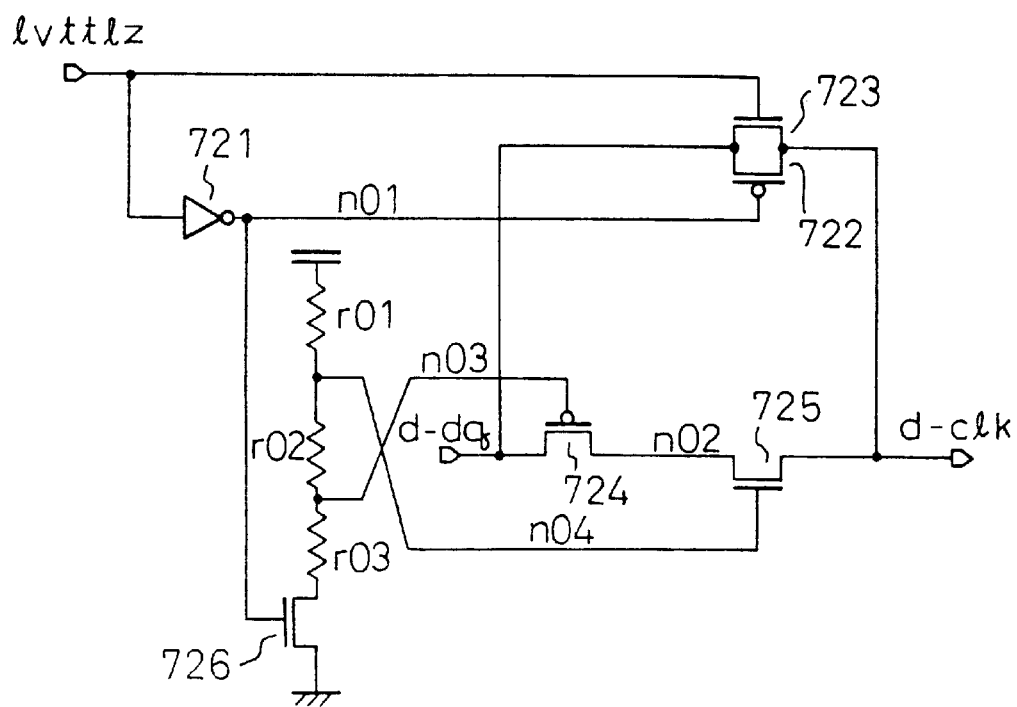
Figure 73:
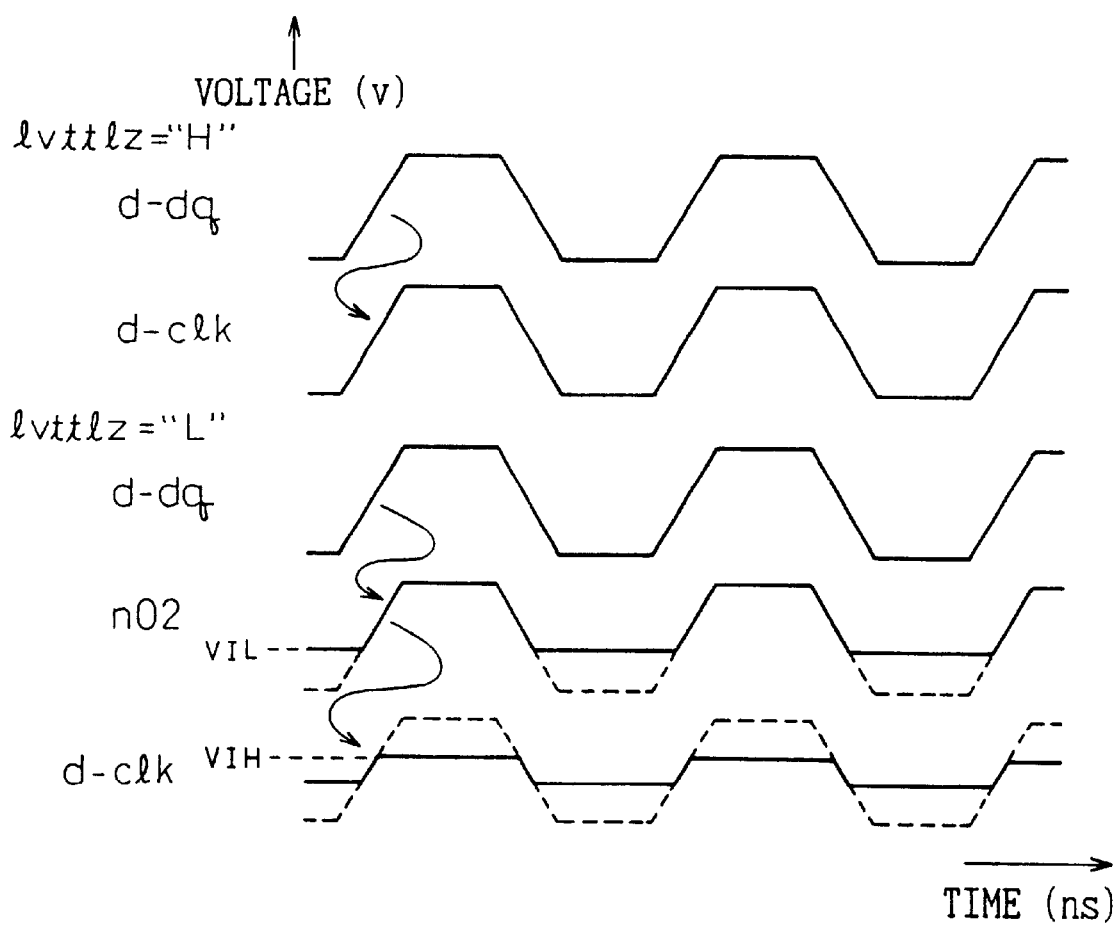
FIG. 73 is a diagram showing the operations of the dummy input waveform conversion circuit in the thirteenth embodiment.

FIGS. 72A and 72B are diagrams showing the configuration of a dummy input waveform conversion circuit in the thirteenth embodiment. FIG. 72A is a block diagram showing the basic configuration, and FIG. 72B is a circuit diagram. FIG. 73 is a diagram showing the operations of the dummy input waveform conversion circuit in the thirteenth embodiment. As apparent from comparison with FIGS. 68A and 68B, the dummy input waveform conversion circuit in the thirteenth embodiment has, in addition to the components of the dummy input wave conversion circuit in the twelfth embodiment, a level adjustment unit 713 for controlling the gate potentials of the transistors 724 and 725 so that the level of a signal d-clk output from the SSTL-conformable converter 712 can be controlled. The level adjustment unit 713 develops potentials VIH and VIL by bringing about a voltage drop using resistors r01 to r03 connected in series, and causes a potential |VIL|−|Pch-Vth| to develop at the gate of the n-channel transistor 724 and a potential |VIH|−|Nch-Vth| to develop at the gate of the n-channel transistor 725. The signal d-clk becomes a signal whose amplitude is defined with the potentials VIH and VIL. An n-channel transistor 726 is connected to the resistors r01 to r03 of the level adjustment unit 713. The n-channel transistor 726 is on in the SSTL. This causes the level adjustment unit 713 to become active. The potentials VIH and VIL are developed. In the LVTTL, the n-channel transistor 726 is turned off, and the level adjustment unit 713 is inactivated. Thus, a current is prevented from flowing into the level adjustment unit. This results in a minimized power consumption.

In the first and second embodiments, the interface judgment signal lvttlz is used to determine whichever of the LVTTL-conformable converter 711 or SSTL-conformable converter 712 should be activated. The interface judgment signal is set in anticipation of a waveform of an output to a semiconductor device. However, there is a possibility that a signal not having an anticipated waveform may be input. This poses a problem that an output signal does not exhibit a given phase relative to an external clock. A dummy input waveform conversion circuit in the fourteenth embodiment solves this problem.

Figure 74:
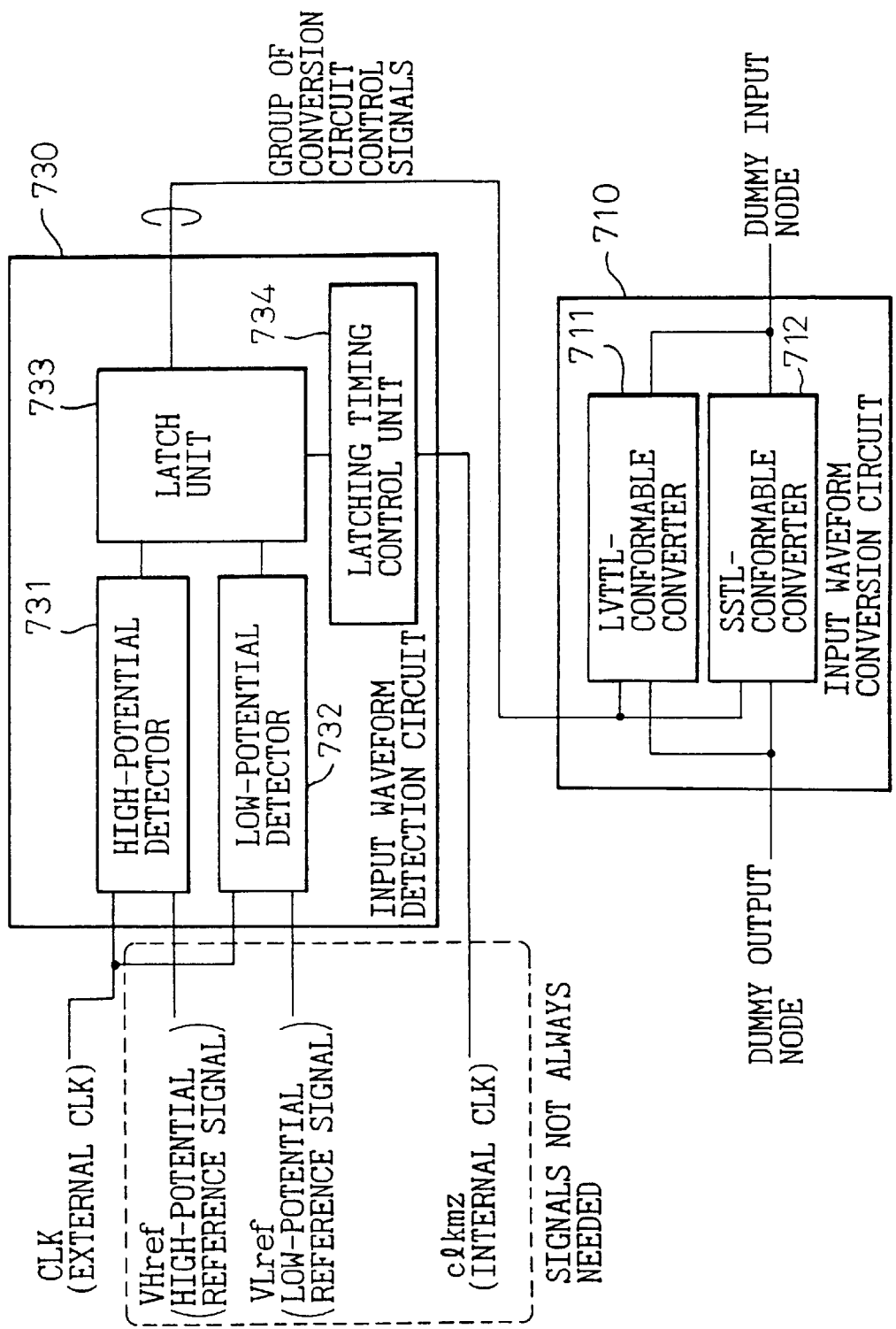
FIG. 74 is a diagram showing the basic configuration of a dummy input waveform conversion circuit in the fourteenth embodiment.

FIG. 74 is a diagram showing the basic configuration of a dummy input waveform conversion circuit in the fourteenth embodiment. As shown in FIG. 74, the dummy input waveform conversion circuit has, in addition to the components of the dummy input waveform conversion circuit 710 in the twelfth embodiment, an input waveform detection circuit 730 for detecting the amplitude of an external clock CLK. Incidentally, the dummy input waveform conversion circuit in the thirteenth embodiment shown in FIGS. 72A and 72B may be substituted for the dummy input waveform conversion circuit 710 in the twelfth embodiment. Based on the result of detection performed by the input waveform detection circuit 730, either of the LVTTL-conformable converter 711 and SSTL-conformable converter 712 of the dummy input waveform conversion circuit 710 is activated. The input waveform detection circuit 730 includes a high-potential detector 731 for detecting whether or not the level of an external clock CLK becomes higher than a first given level, a low-potential detector 732 for detecting whether or not the level of the external clock CLK becomes lower than a second given level, and a latch unit 733 for latching the results of detection performed by the high-potential detector 731 and low-potential detector 732 in response to a control signal sent from a latching timing control unit 734. For merely identifying the LVTTL or SSTL, the employment of either of the high-potential detector 731 and low-potential detector 732 will do. Detection in both the directions would improve detection precision. If a plurality of detection circuits were included for comparing the external clock with a plurality of levels, the precision would further improve. Herein, the description proceeds on the assumption that the level of the external clock is compared with two high and low levels.

Figure 75:
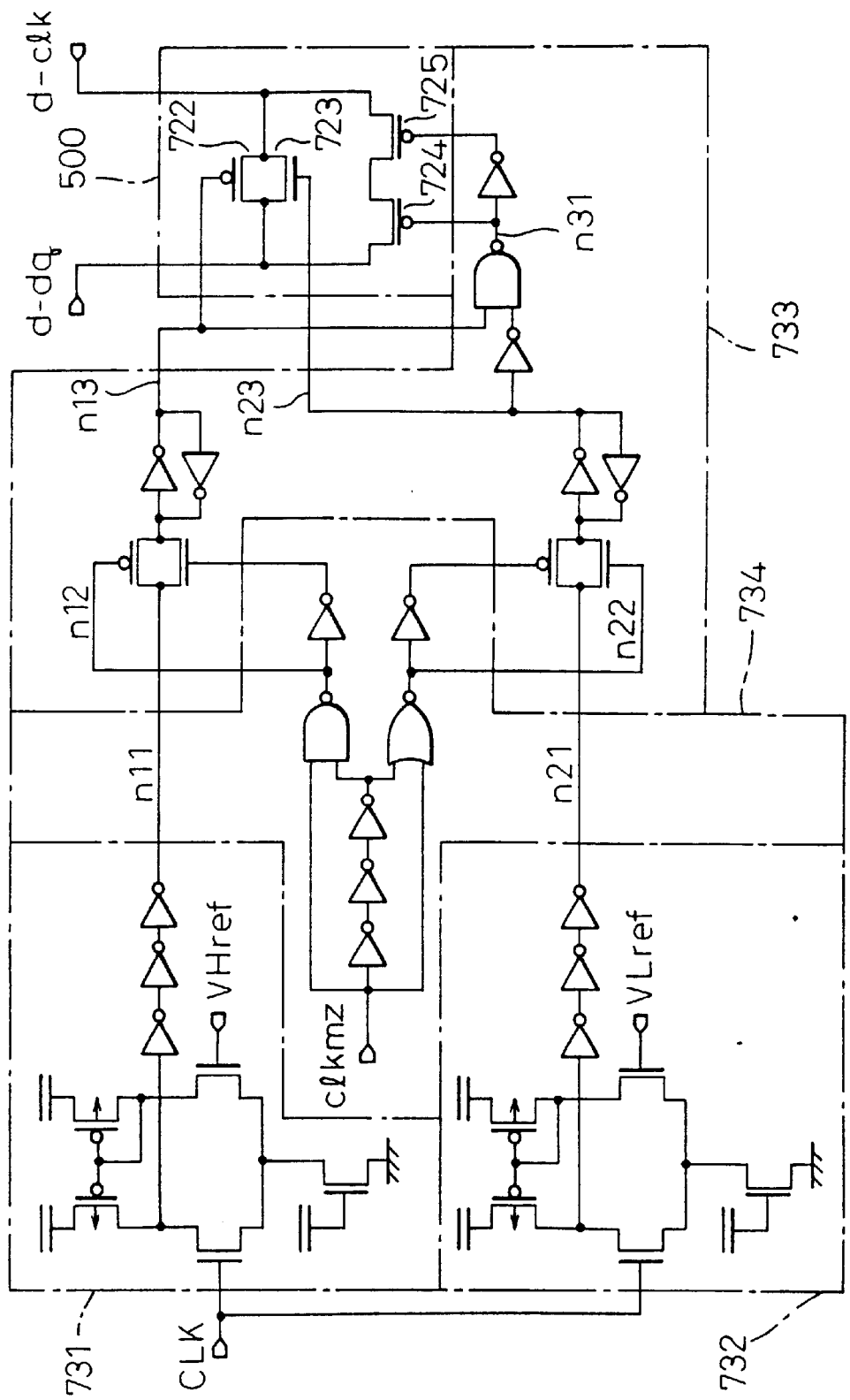
FIG. 75 is a circuit diagram of the dummy input waveform conversion circuit in the fourteenth embodiment.

FIG. 75 is a diagram showing the actual circuitry of the dummy input waveform conversion circuit in the fourteenth embodiment. The high-potential detector 731 is formed with a current mirror using the level of a signal VHref as a reference level. The low-potential detector 732 is formed with a current mirror using the level of a signal VLref as a reference level. The level VHref is lower than a voltage VCC and higher than a voltage Vref. The level VLref is higher than a voltage VSS and lower than the voltage Vref. The outputs of the two current mirrors are amplified to CMOS-conformable levels by an inverter, and output as signals n11 and n21 to the latch unit 733. A signal clkmz is a signal synchronous with the clock CLK. Herein, a signal generated for another purpose by another part of a chip is used as the signal clkmz. The signal clkmz may be generated by the dummy input waveform conversion circuit. The latching timing control unit 734 generates pulses n12 and n22 from the signal clkmz for the purpose of latching. The latch unit 733 includes a first latch for latching an output of the high-potential detector 731 responsively to the pulse n12, and a second latch for latching an output of the low-potential detector 732 responsively to the pulse n22. When the clock CLK is high, if the pulse n12 goes low, the signal n11 is latched by the first latching circuit. Consequently, a signal n13 is transmitted. Likewise, when the clock CLK is low, if the pulse n22 goes high, the signal n21 is latched by the first latch. Consequently, a signal n23 is transmitted. Based on the values of the signals n13 and n23 resulting from latching, the waveform of a dummy output to be output through a terminal d-dq is converted into the one identical to the waveform of a dummy input to be input through a terminal d-clk, and then transmitted. Current mirrors are used as the high-potential detector 731 and low-potential detector 32. Alternatively, circuits utilizing the inverting ratio of an inverter will do. In other words, a threshold value of an output of an inverter may be used as a reference. In this case, the signals VHref and VLref are unnecessary.

FIGS. 76 to 79 are timing charts showing the operations of the circuit in the fourteenth embodiment shown in FIG. 75.

Figure 76:
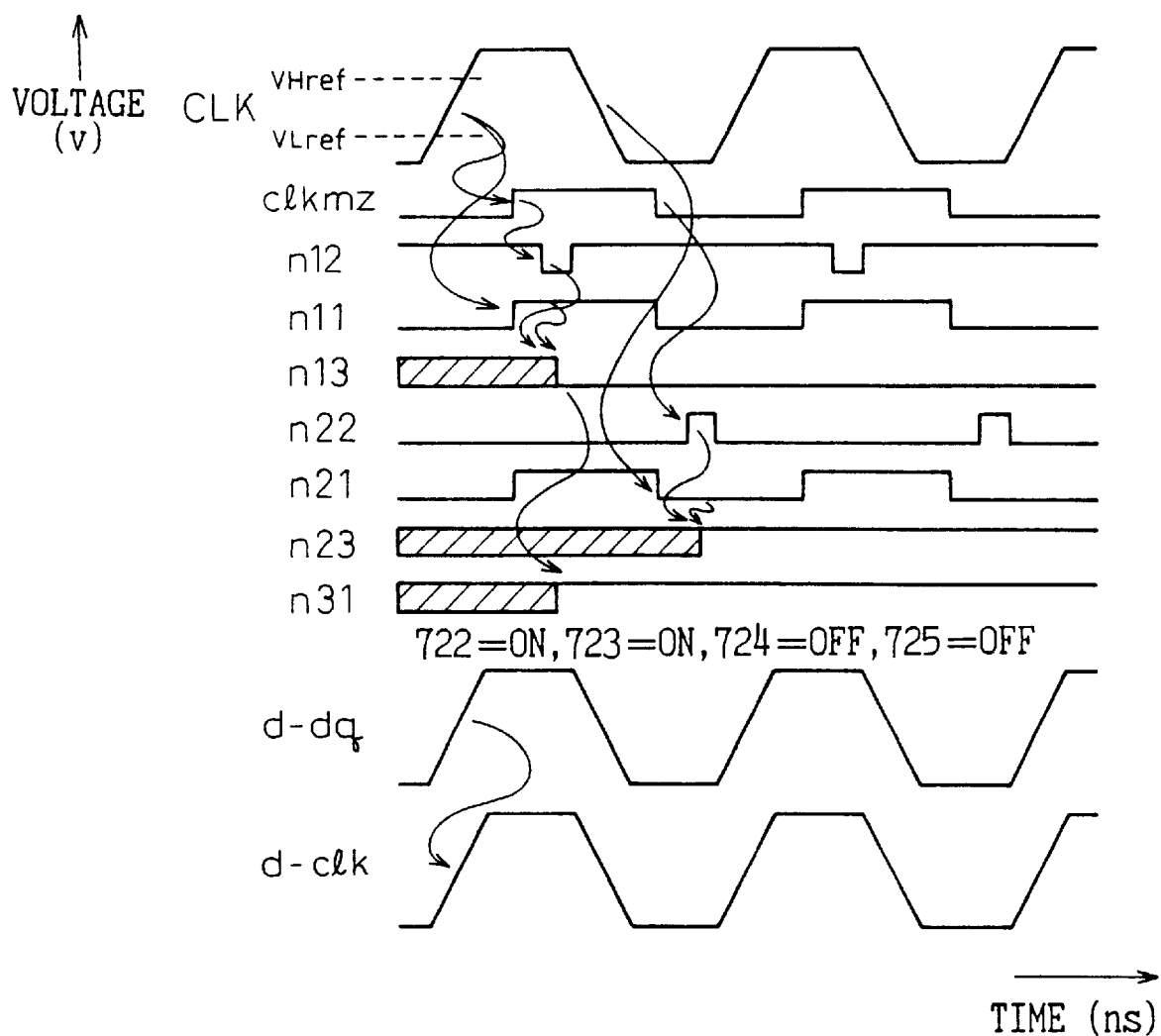
FIG. 76 is a diagram showing the operations of the dummy input waveform conversion circuit in the fourteenth embodiment.

When the LVTTL is adopted, as shown in FIG. 76, a wave whose level exceeds those of the levels VHref and VLref is input as a clock CLK. When it is said that the LVTTL is adopted, this means that a signal having a large amplitude is input. The signal is not necessarily a signal conformable to the LVTTL standard. In this case, the "high" level of the clock CLK exceeds the level VHref. A signal in phase with and synchronous with the clock CLK is transmitted as the signal n11. Likewise, since the "low" level of the clock CLK exceeds the level VLref, a signal in phase with and synchronous with the clock CLK is transmitted as the signal n21. The signal clkmz is synchronous with the clock CLK. The pulse n12 going low is generated at the leading edge of the signal clkmz, and the pulse n22 going high is generated at the trailing edge of the signal clkmz. During the duration of the pulse n12, the signal n11 is high and the signal n13 is low. During the duration of the pulse n22, the signal n21 is low and the signal n23 is high. The signal n31 is therefore driven high. The transistors 722 and 723 are turned on and the transistors 724 and 725 are turned off. This means that the LVTTL-conformable converter 711 is turned on and the SSTL-conformable converter 712 is turned off. The signal d-dq is transmitted as a signal d-clk with the waveform held intact. Consequently, a wave having a large amplitude is transmitted from the dummy input circuit.

Figure 77:
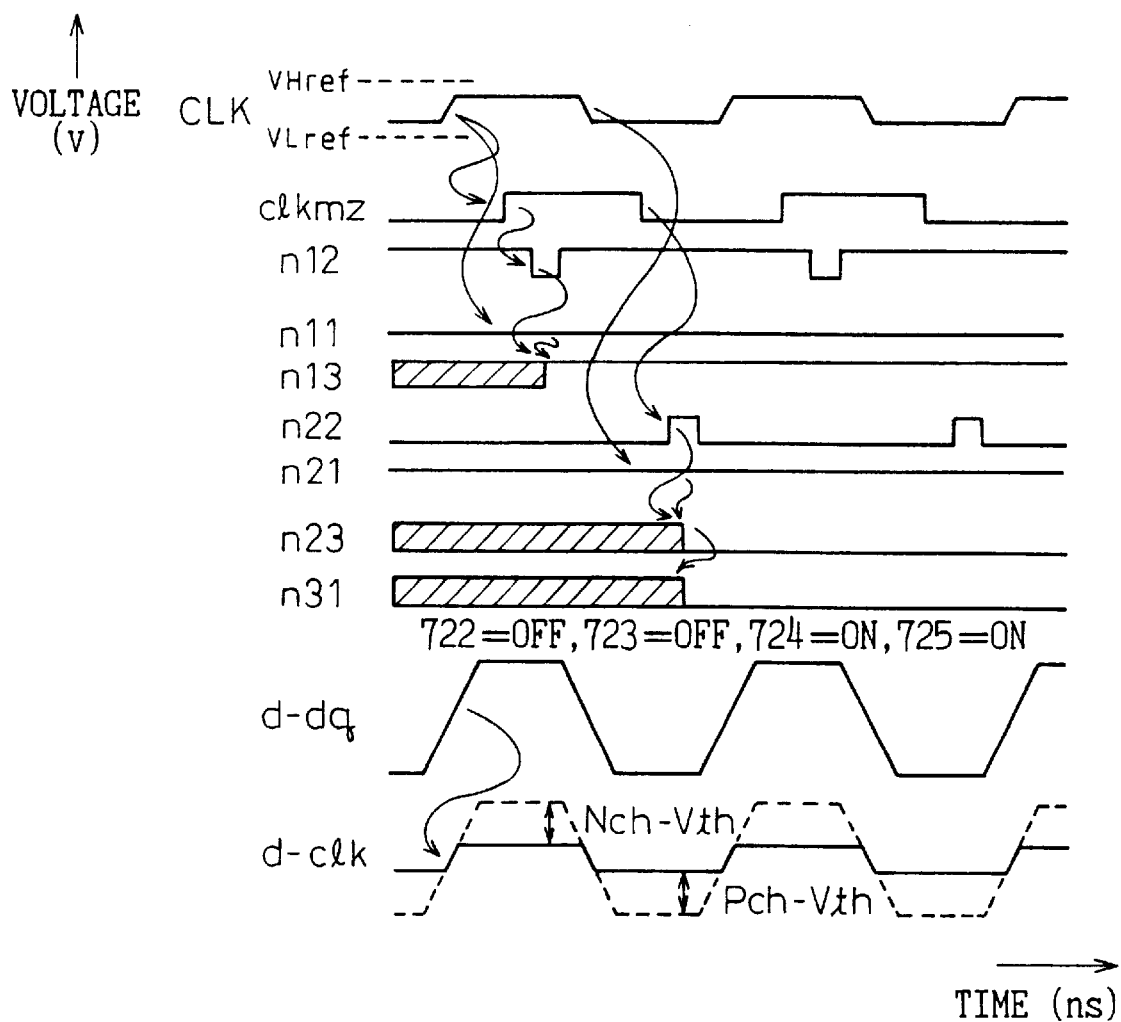
FIG. 77 is a diagram showing the operations of the dummy input waveform conversion circuit in the fourteenth embodiment.

When the SSTL is adopted, as shown in FIG. 77, a wave whose level does not exceed the levels VHref and VLref is input as a clock CLK. When it is said that the SSTL is adopted, this means that a signal having a small amplitude is input. The signal is not necessarily a signal conformable to the SSTL standard. In this case, since the "high" level of the clock CLK does not exceed the level VHref, the signal n11 goes low irrespective of the level of the clock CLK. Likewise, since the "low" level of the clock CLK will not fall below the level VLref, the signal n21 is high irrespective of the level of the clock CLK. The signal n13 is therefore driven high, the signal n23 is driven low, and the signal n31 is driven low. The transistors 722 and 723 are therefore turned off, and the transistors 724 and 725 are turned on. This means that the LVTTL-conformable converter 711 is turned off and the SSTL-conformable converter 712 is turned on. The waveform of the signal d-dq becomes a waveform resulting from subtraction of the threshold voltages Pch-Vth and Nch-Vth by the transistors 724 and 725. Consequently, the signal d-clk is transmitted. Thus, a wave having a small amplitude is transmitted from the dummy input circuit.

Figure 78:
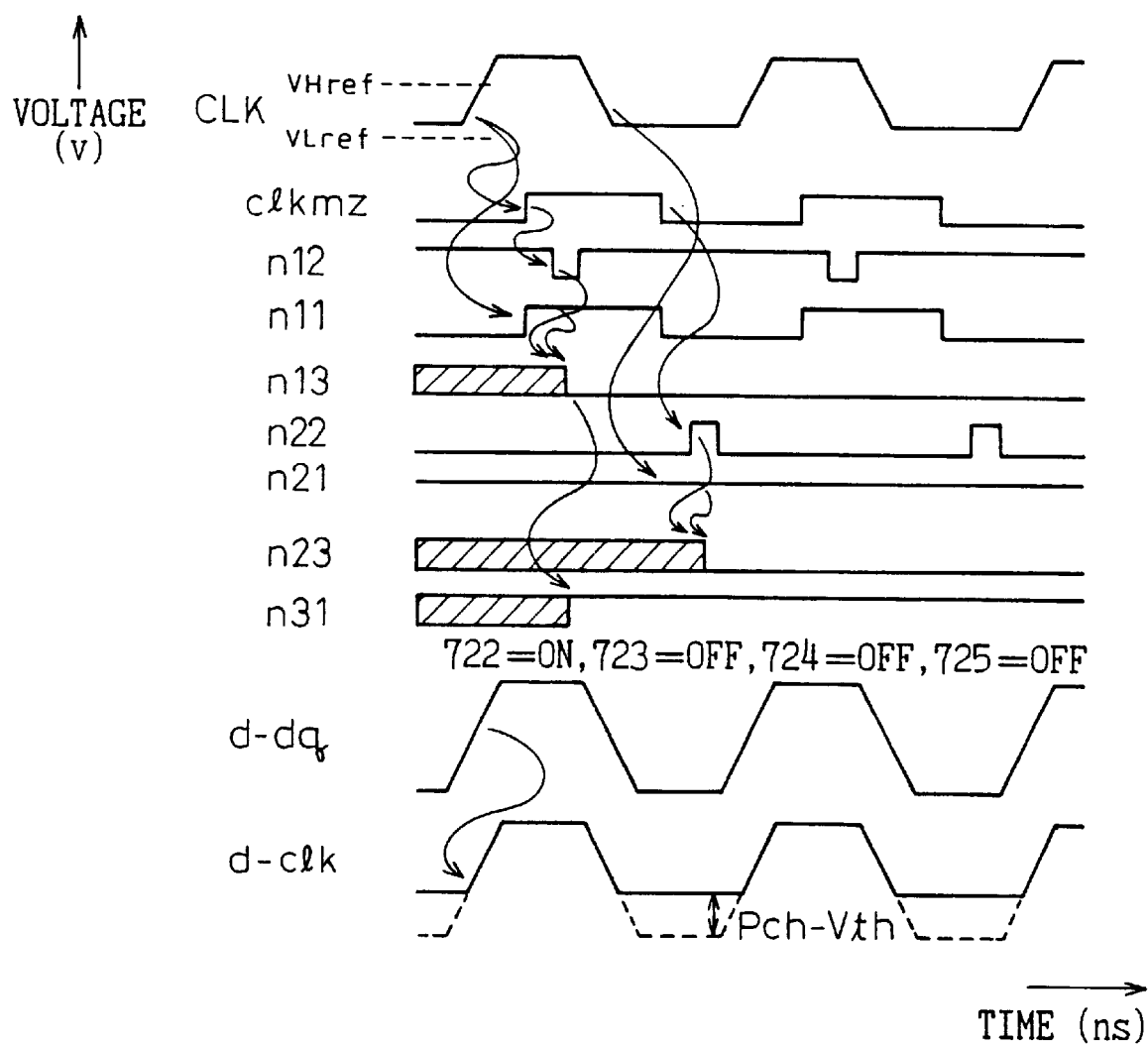
FIG. 78 is a diagram showing the operations of the dummy input waveform conversion circuit in the fourteenth embodiment.

FIG. 78 shows the operations performed when a wave whose level exceeds the level VHref but does not fall below the level VLref is input as an external clock CLK. In this case, a variant of the SSTL that is an SSTL-1 is adopted. Anyhow, a wave which has an intermediate amplitude and whose low level is rather high should merely be input. In this case, since the high level of the clock CLK exceeds the level VHref, a wave in phase with and synchronous with the clock CLK is transmitted as the signal n11. However, since the low level of the clock CLK will not fall below the level VLref, the signal n21 is always high irrespective of the level of the clock CLK. The signal n13 is therefore driven low, the signal n23 is driven low, and the signal n31 is driven high. The p-channel transistor 722 is turned on, the n-channel transistor 723 is turned off, and the transistors 724 and 725 are turned off. The signal d-dq is therefore transmitted via the transistor 722 alone. Consequently, the signal d-clk whose waveform results from subtraction of the threshold voltage Pch-Vth from the low potential of the signal d-dq is transmitted.

Figure 79:
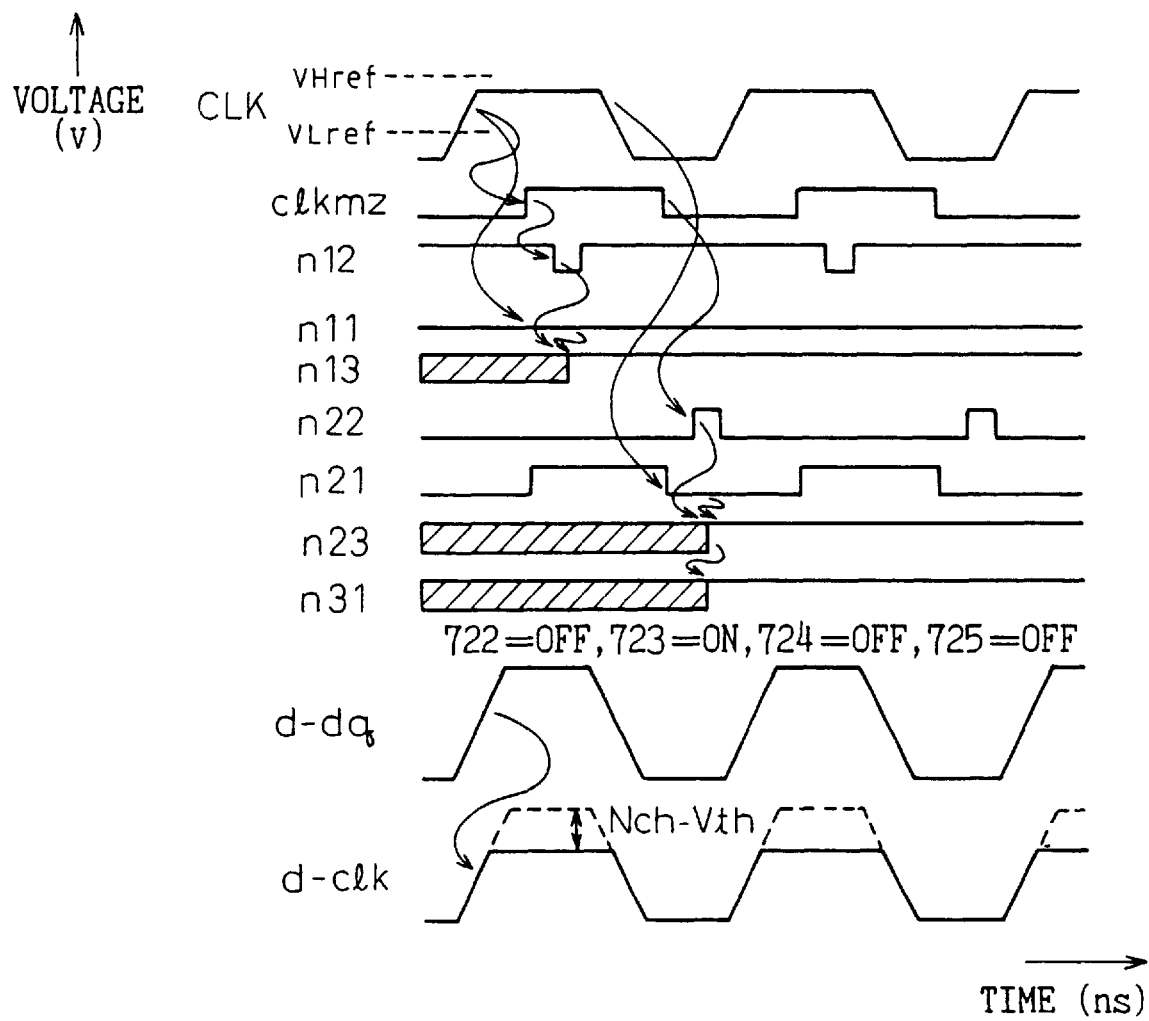
FIG. 79 is a diagram showing the operations of the dummy input waveform conversion circuit in the fourteenth embodiment.

FIG. 79 shows the operations performed when a wave whose low level falls below the level VLref but whose high level does not exceed the level VHref is input as an external clock CLK. Herein, a variant of the SSTL that is an SSTL-2 is adopted. A wave which has an intermediate amplitude and whose high level is rather low should merely be input. In this case, the low level of the clock CLK falls below the level VLref, a wave in phase with and synchronous with the clock CLK is transmitted as the signal n21. However, since the high level of the clock CLK will not exceed the level VHref, the signal n11 is always low irrespective of the level of the clock CLK. The signal n13 is therefore driven high, the signal n23 is driven high, and the signal n31 is driven high. The p-channel transistor 722 is turned off, the n-channel transistor 723 is turned on, and the transistors 724 and 725 are turned off. The signal d-dq is therefore transmitted via the n-channel transistor 723 alone. Consequently, the signal d-clk whose waveform results from subtraction of the threshold voltage Nch-Vth-from the high potential of the signal d-dq is transmitted.

As mentioned above, in the fourteenth embodiment, the amplitude of an input external clock is judged, and the amplitude of an output is converted according to the result of the judgment. The amplitude of an input signal and that of a dummy signal input to the dummy input circuit can therefore be agreed with each other reliably. Consequently, the output exhibits a given phase relative to the external clock irrespective of the amplitude of the external clock.

In the first to fourteenth embodiments, an output timing control circuit for a semiconductor device of the present invention has been described. How to adapt such an output timing control circuit to a semiconductor device will be described in conjunction with another embodiment.

Figure 80:
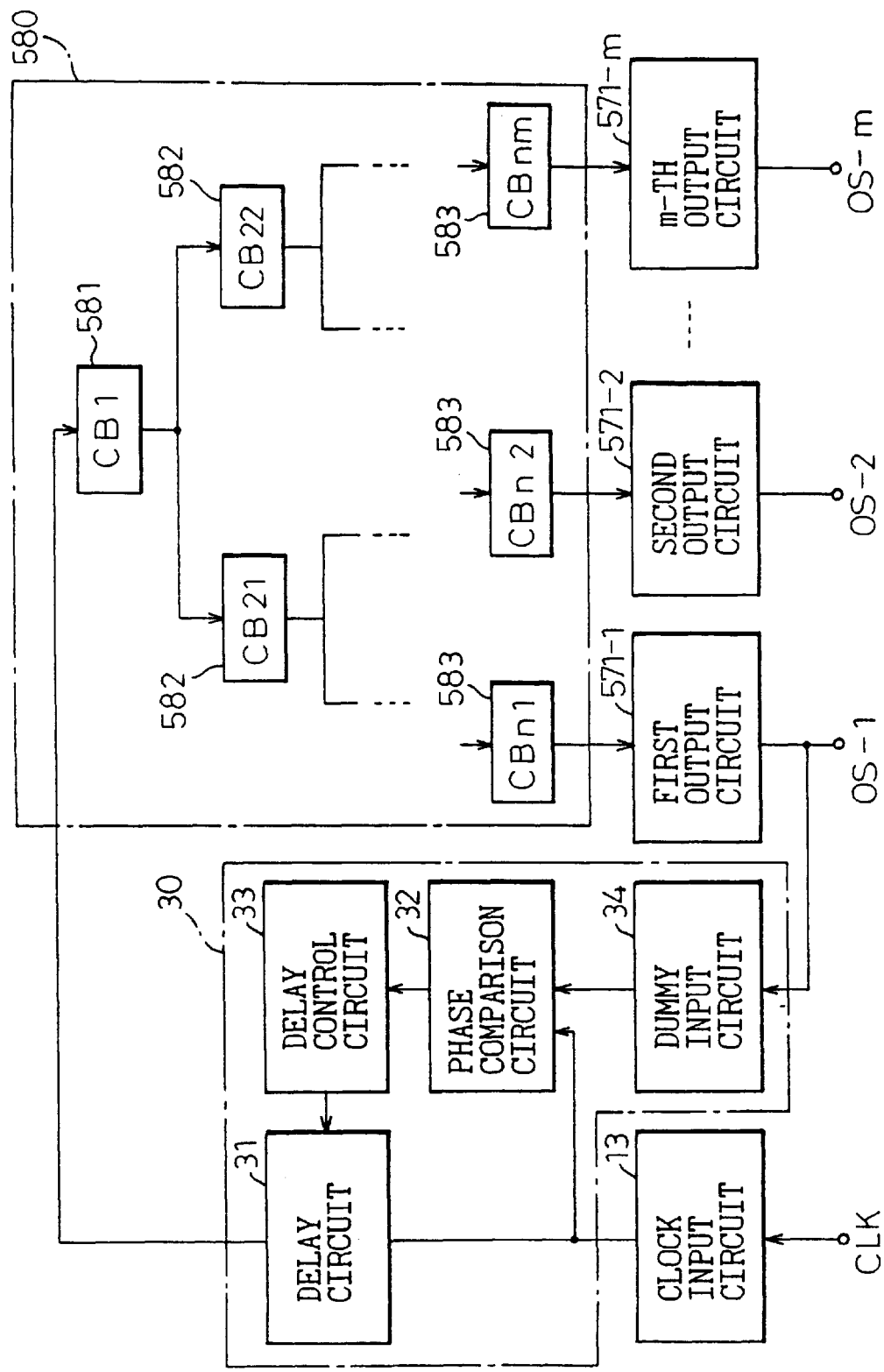
FIG. 80 is a diagram showing the arrangement of a clock input circuit, output timing control circuit, clock distribution circuit, and output circuit in an SDRAM of the fifteenth embodiment.

FIG. 80 is a diagram showing the arrangement of the clock input circuit 13, output timing control circuit 30, first to m-th output circuits 571-1, 571-2, etc., and 571-m, and a clock signal distribution circuit 580.

As illustrated, this semiconductor device outputs a plurality of signals OS-1, OS-2, etc., and OS-m. The output circuits 571-1, 571-2, etc., and 571-m are associated with the output signals. The clock distribution circuit 580 distributes a clock, which is input from the clock input circuit 13 via the output timing control circuit 30, into the output circuits 571-1, 571-2, etc., and 571-m arranged in the semiconductor device via a plurality of buffers (CB1, CB21, etc., and CBnm) 581 to 583. The lengths of lines reaching distribution destinations, and the numbers of buffers through which the clock passes are mutually the same. Thus, an equidistant wiring is realized. In FIG. 80, clocks input to the output circuits 571-1, 571-2, etc., and 571-m are all in phase. The clock input circuit 13 and output timing control circuit 30 are located near one of the output circuits 571-1, 571-2, etc., and 571-m, or herein, the first output circuit 571-1. The output timing control circuit 30 gives control so that an output signal of the first output circuit 571-1 can be phased with the external clock CLK. As mentioned above, since the clock distribution circuit 580 has the equidistant wiring, the clocks input to the output circuits are all in phase. If the output signal of the first output circuit 571-1 is synchronous with the external clock CLK, the output signals of all the output circuits will be synchronous with the external clock CLK.

In a semiconductor device to which any of the circuitries of the first to fifteenth embodiments is adapted, compared with a known semiconductor device, the precision in synchronism of an output signal with an external clock improves drastically. An embodiment in which a semiconductor system is constructed using semiconductor devices capable of providing an output with the high precision ensured for synchronism with the external clock will be described below.

Figure 81:
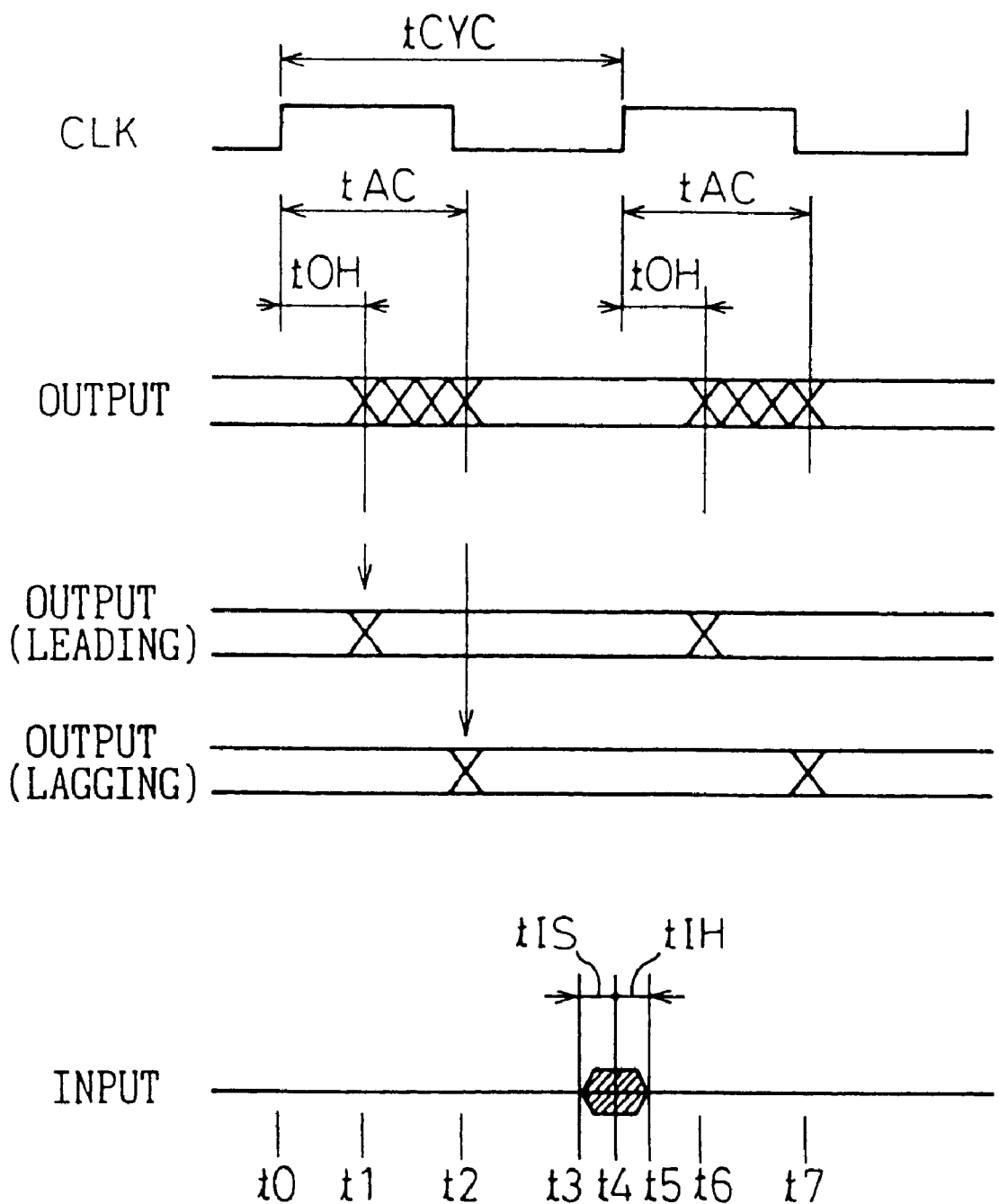
FIG. 81 is a diagram showing output timing in a semiconductor device of a prior art.

A known output timing and underlying problems will be described. FIG. 81 is a diagram for explaining the output timing of a known semiconductor device for outputting data synchronously with an external clock. In the known semiconductor device, an operation for outputting data is started responsively to the rise of an external clock CLK (t0). An output actually develops at an output terminal some time later. The time differs with a difference of one process from another, a fluctuation in supply voltage, a change in temperature, or the like. When the time is the shortest, the output develops at a time instant t1. When the time is the longest, the output develops at a time instant t2. That is to say, a clock access time ranges from a time tOH starting with the leading edge of the external clock to a time tAC. The times tOH and tAC are stipulated in the specifications for a semiconductor device. The time interval between the time instants t1 and t2 is a time which cannot be used actually and during which data is uncertain.

On a side receiving such an output, a setup time tIS and a hold time tIH are needed. The times tIS and tIH are defined in relation to the leading edge of the external clock. A start time instant of the setup time tIS is a time instant t3, and an end time instant of the hold time tIH is a time instant t5. In the drawing, a difference between the time interval t2–t6 and the time interval t3–t5 is regarded as a timing margin of the system. The timing margin must be long enough to absorb errors caused by various factors in the system.

In recent years, the frequency of an external clock has gotten higher and higher. This poses a problem that the timing margin cannot be preserved sufficiently.

Figure 82:
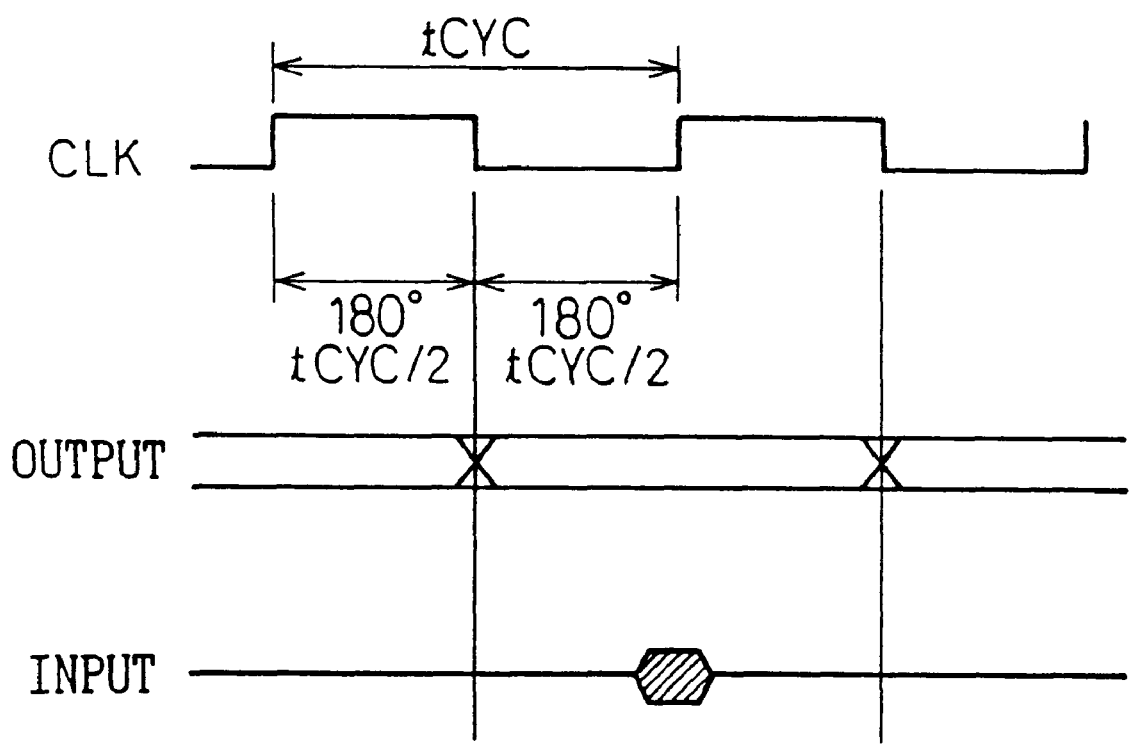
FIG. 82 is a diagram showing output timing in a semiconductor device of the present invention.

FIG. 82 is a diagram showing output timing in a semiconductor device of the present invention. In the known semiconductor device, as shown in FIG. 81, an output operation is started at the leading edge of an external clock. In contrast, in the semiconductor device of the present invention, an output signal is output synchronously with the trailing edge of the external clock. Needless to say, the leading and trailing edges of the external clock have a phase difference of 180° between them. The external clock is therefore a signal having a duty cycle of 50%. As already described, in the semiconductor device of the present invention, the output timing of an output signal can be controlled so that the output signal exhibits a given phase relative to the external clock. The output signal develops immediately at an output terminal synchronously with the trailing edge of the external clock. The middle point during a period during which the output signal is finalized coincides with the leading edge of the external clock. The same timing margin can be preserved before and after input. Assuming that the cycle of the external clock gets shorter gradually, the merit of providing an output according to the foregoing timing will be more apparent.

Figure 83:
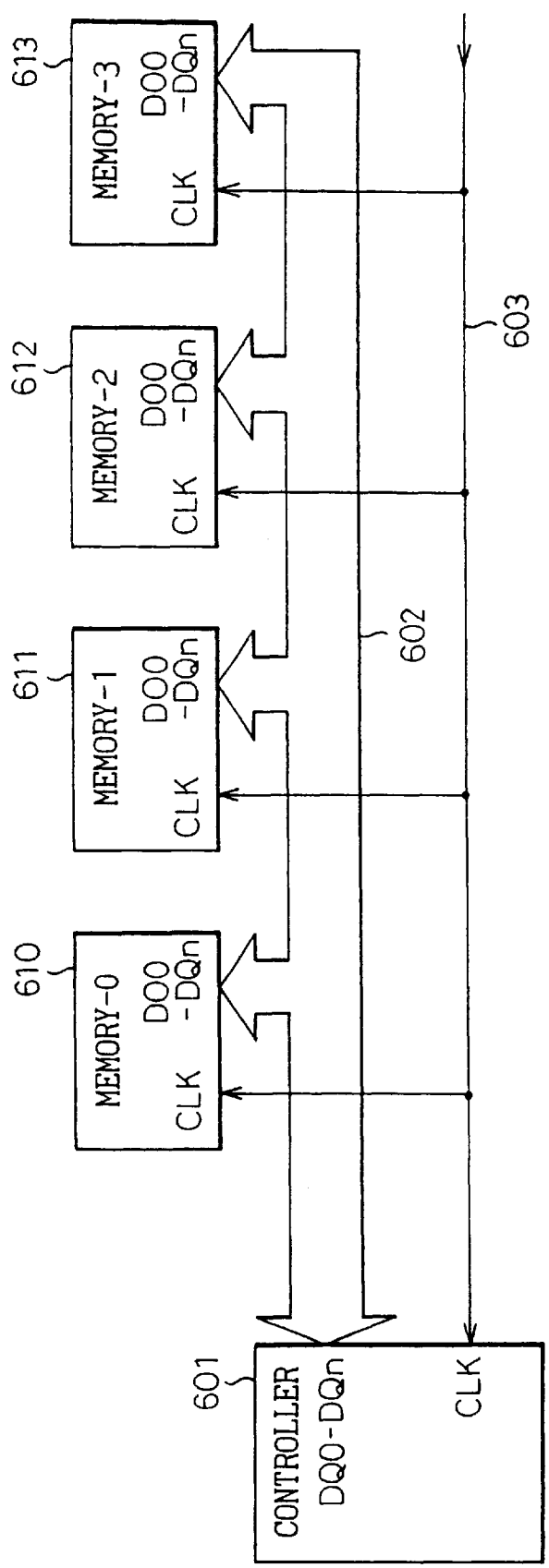
FIG. 83 is a diagram showing the arrangement of devices and the signal lines in a semiconductor system of the sixteenth embodiment.
Figure 84:
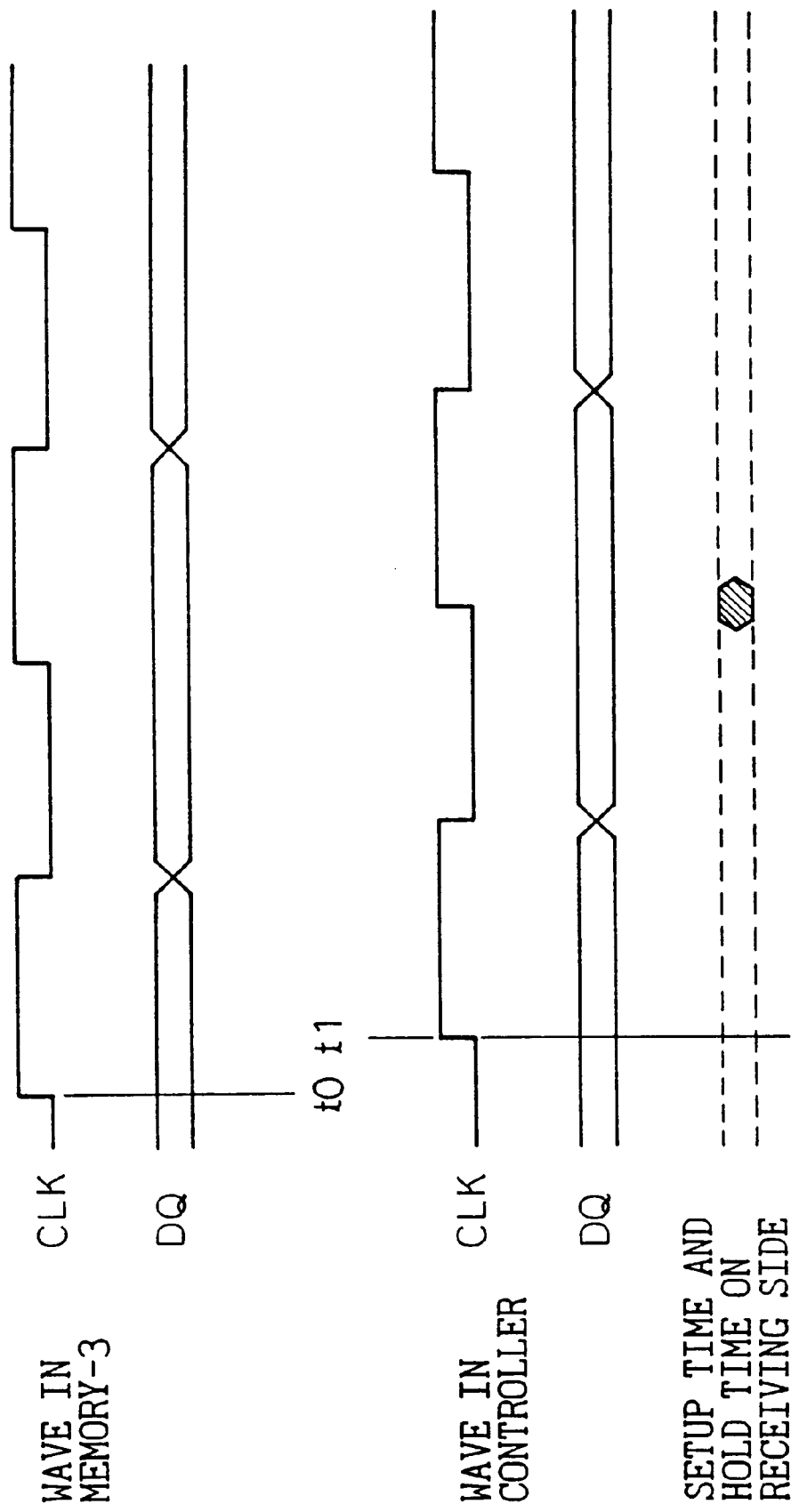
FIG. 84 is a timing chart showing the waveforms of signals employed in the sixteenth embodiment.

FIG. 83 is a diagram showing the arrangement of devices and the layout of signal lines in a memory system of the sixteenth embodiment constructed using semiconductor memories 610 to 613 each capable of controlling the output timing of an output signal so that the output signal exhibits a given phase relative to an external clock. FIG. 84 is a diagram showing the phase relationship of data relative to a clock CLK in the memory system of the sixteenth embodiment.

In the drawing, there is shown a controller 601 in the memory system. The semiconductor memories 610 to 613 are arranged as illustrated. Data items stored in the semiconductor memories 610 to 613 are output over a data bus 602 synchronously with a clock CLK applied to a clock line 603. Assuming that the propagation direction over the clock line 603 of the clock CLK is a direction from the right in the drawing to the left therein, the time required for the clock CLK to reach the rightmost memory 3 is the shortest. The time required for the clock CLK to reach the leftmost memory is the longest. However, talking of the time required for data output synchronously with the clock CLK to reach the controller 601, the time required for data output from the leftmost memory is the shortest. If the propagation speed over the clock line 603 of the clock CLK is equal to the propagation speed over the data bus 602 of the data signal, as shown in FIG. 84, data items output from the memories reach the controller 601 according to the timing according to which the clock CLK reaches the controller 601. The controller 601 should therefore fetch data synchronously with the clock CLK.

Figure 85:
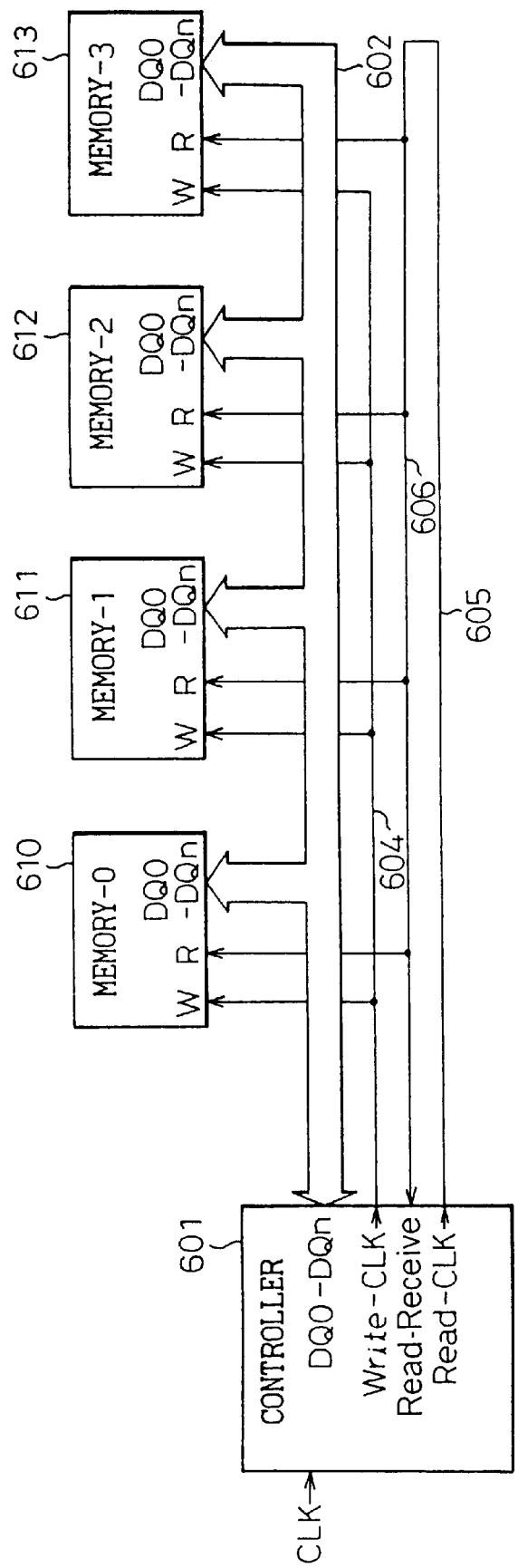
FIG. 85 is a diagram showing the arrangement of devices and the signal lines in a semiconductor system of the seventeenth embodiment.

FIG. 85 is a diagram showing the arrangement of devices and the layout of signal lines in a memory system of the seventeenth embodiment.

In the memory system of the seventeenth embodiment, a clock CLK is input to the controller 601 first. The controller 601 uses the clock CLK to generate a writing clock Write-CLK and a read clock Read-CLK. A clock line over which the clock Read-CLK propagates is a signal line 605. The clock Read-CLK is sent back to the controller 601 over a signal line 606 after propagated to the position of the rightmost memory 613 over the signal line 605. The clock Read-CLK is supplied to the memories over the signal line 606. Data items output from the memories are fetched into the controller 601 in the same manner as those in the sixteenth embodiment.

In the seventeenth embodiment, the clock Read-CLK propagating over the signal line 606 is input as a clock Read-Receive to the controller 601. The magnitude of the delay of the clock Read-CLK is adjusted so that the clock Read-Receive is phased with the clock Read-CLK.

Figure 86:
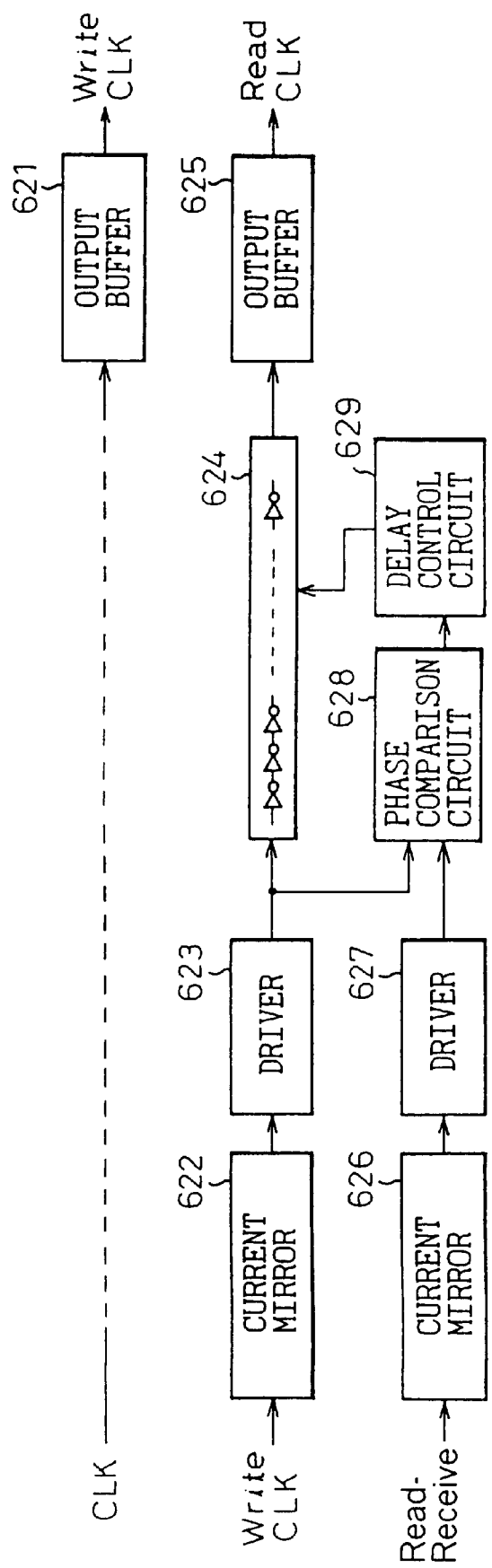
FIG. 86 is a diagram showing a clock timing adjustment system in a controller in the seventeenth embodiment.

FIG. 86 is a diagram showing the systems of clocks within the controller 601 in the seventeenth embodiment.

As shown in FIG. 86, an externally-input clock CLK is input to an output buffer 621, and then output as a clock Write-CLK. The clock Write-CLK passes through a current mirror 622 and driver 623 so as to be amplified. After being delayed by a specified magnitude by a delay circuit 624, the clock Write-CLK is output as a clock Read-CLK from an output buffer 625. The returning clock Read-CLK is received as a clock Read-Receive. After passing through a current mirror 626 and driver 627, the clock Read-Receive is input to a phase comparison circuit 628. An output of the driver 623 is also input to the phase comparison circuit 628, whereby the phase of the output is compared with that of the clock. Based on the result of the comparison, a delay control circuit 629 specifies a magnitude of a delay to be produced by the delay circuit. Thus, the magnitude of the delay of the clock Read-CLK is adjusted so that the clocks Read-CLK and Read-Receive will be in phase with each other.

Figure 87:
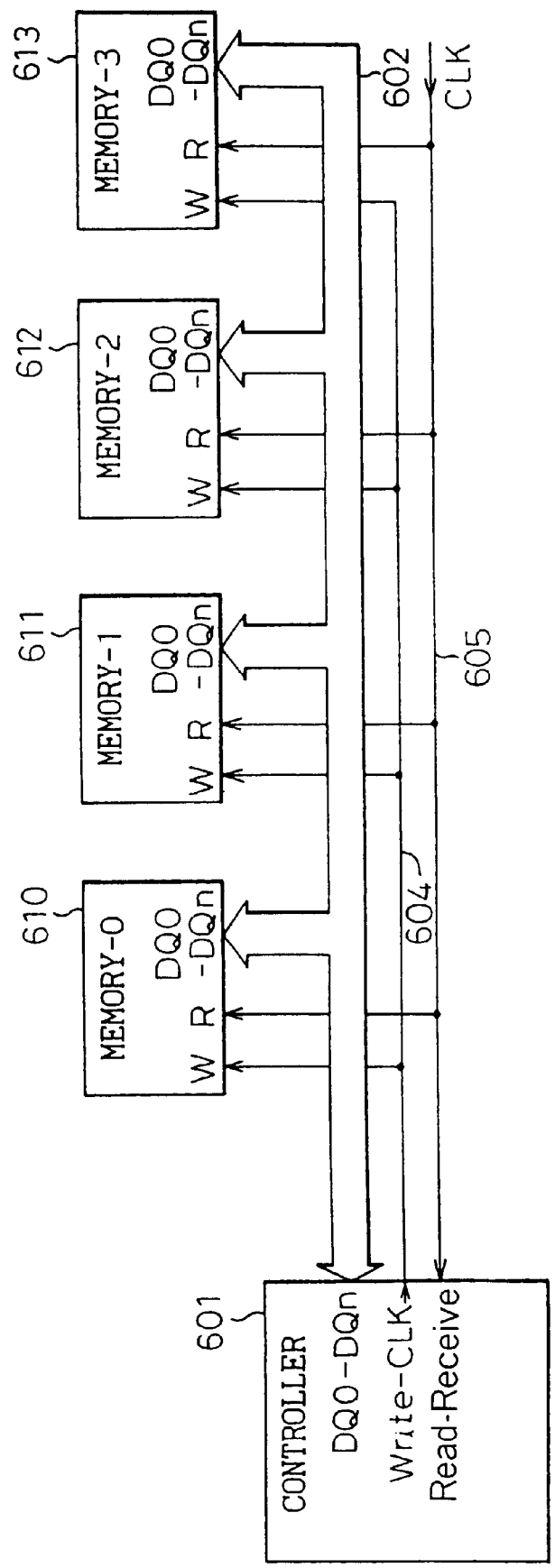
FIG. 87 is a diagram showing the arrangement of devices and the signal lines in a semiconductor system of the eighteenth embodiment.

FIG. 87 is a diagram showing the arrangement of devices and the layout of signal lines in a memory system of the eighteenth embodiment.

In the memory system of the eighteenth embodiment, like the one of the sixteenth embodiment, a clock CLK propagating in a direction in which data items output from memories propagate is received as a clock Read-Receive by the controller 601. The controller 601 generates a writing clock Write-CLK using the clock Read-Receive. Reading data from the memories is carried out synchronously with the clock CLK. The magnitude of the delay of the output clock Write-CLK is adjusted so that the clock will be phased with the clock Read-Receive.

Figure 88:
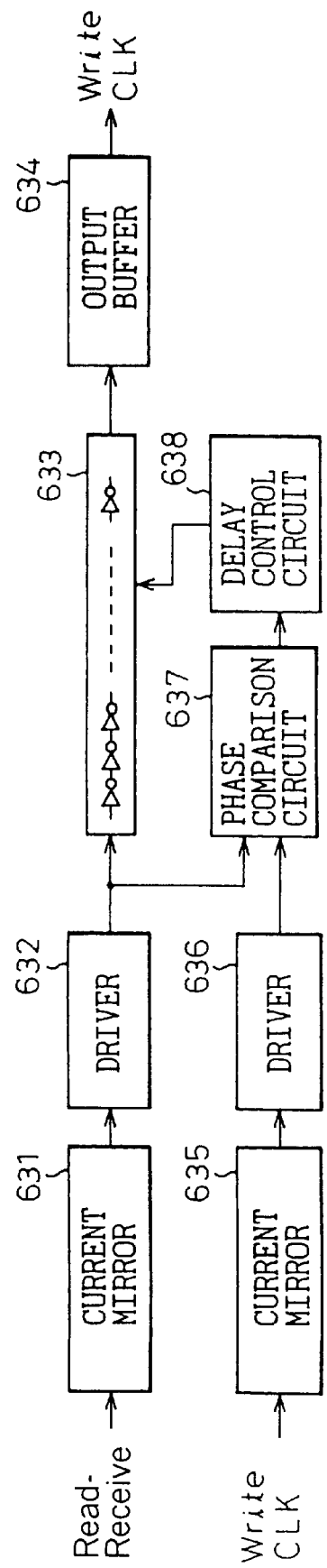
FIG. 88 is a diagram showing a clock timing adjustment system in a controller in the eighteenth embodiment.

FIG. 88 is a diagram showing the systems of clocks within the controller 601 in the eighteenth embodiment.

As shown in FIG. 88, an externally-input clock Read-Receive is amplified while passing through a current mirror 631 and driver 632. After being delayed by a specified magnitude by a delay circuit 633, the clock is output as a clock Write-CLK from an output buffer 634. The clock Write-CLK is input to a phase comparison circuit 637 after passing through a current mirror 635 and driver 636. An output of the driver 632 is also input to the phase comparison circuit 637, whereby the phase of the output is compared with that of the clock. Based on the result of the comparison, a delay control circuit 638 specifies the magnitude of a delay to be produced by the delay circuit 633. Thus, the clock Write-CLK is adjusted so that it is phased with the clock Read-Receive.

Figure 89:
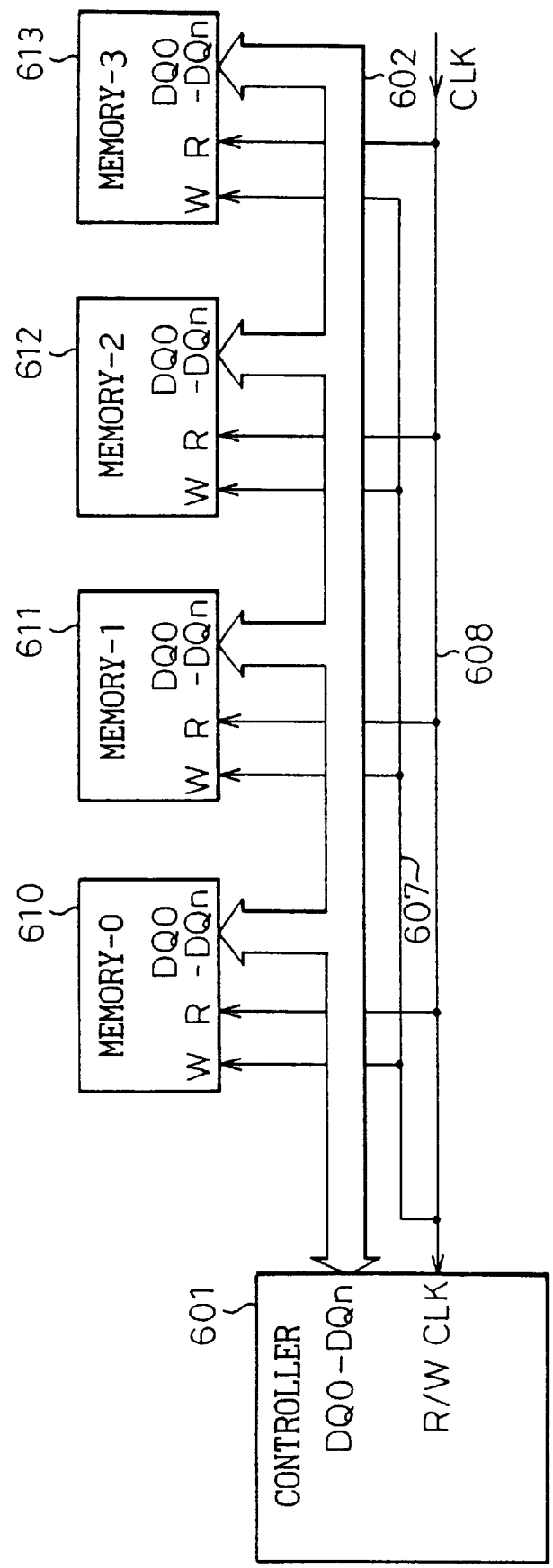
FIG. 89 is a diagram showing the arrangement of devices and the signal lines in a semiconductor system of the nineteenth embodiment.

FIG. 89 is a diagram showing the arrangement of devices and the layout of signal lines in a memory system of the nineteenth embodiment.

In the memory system of the nineteenth embodiment, a clock terminal of the controller 601 is shared by a read clock and writing clock. Like the memory system of the sixteenth embodiment, a clock CLK propagating in a direction in which data output from memories propagate is received as a clock R/W-CLK by the controller 601. Fetching of data output from the memories into the controller 601 is carried out in the same manner as that in the sixteenth embodiment. The clock CLK is branched to a clock line 607 immediately before input to the controller 601, and returned in an opposite direction to serve as a writing clock. Data output from the controller 601 and to be written in a memory therefore propagates in parallel with the writing clock. The question is how to bring the data to be written in a memory into phase with the writing clock.

Figure 90:
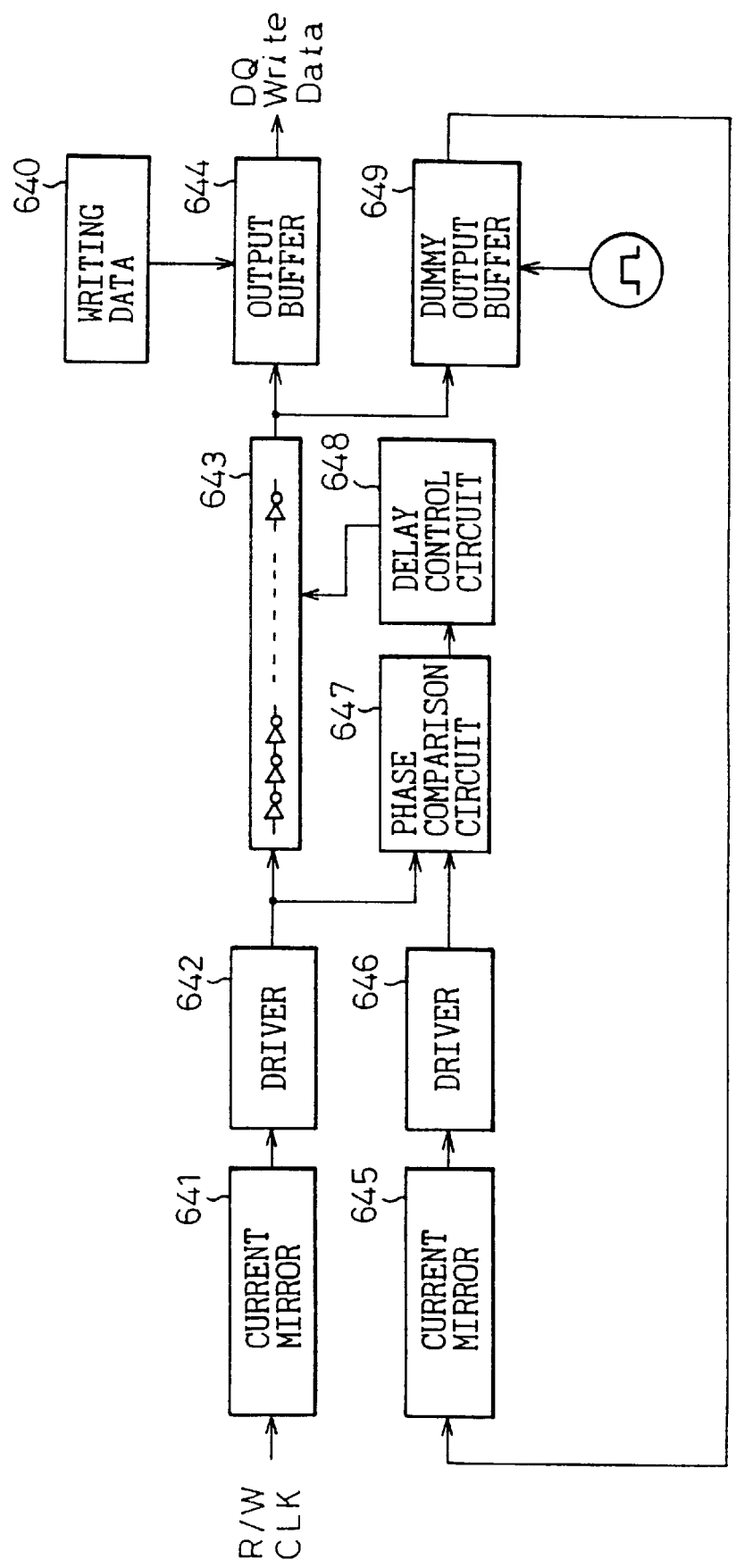
FIG. 90 is a diagram showing a clock timing adjustment system in a controller in the nineteenth embodiment.

FIG. 90 is a diagram showing the systems of clocks within a controller 601 in the nineteenth embodiment.

As shown in FIG. 90, an externally-input clock R/W-CLK is amplified while passing through a current mirror 641 and driver 642. After being delayed by a specified magnitude by a delay circuit 643, the clock is supplied to a data output buffer 644. The data output buffer 644 outputs data read from a writing data register 640 synchronously with a timing signal supplied from the delay circuit 643. The timing signal is delayed by a magnitude equal to the magnitude of a delay occurring in the data output buffer 644 by means of a dummy output buffer 649, and then input to a current mirror 645. An output of the current mirror 645 passes through a driver 646, and is then input to a phase comparison circuit 647. An output of the driver 642 is also input to the phase comparison circuit 647, whereby the phase of the output is compared with the phase of the clock. Based on the result of the comparison, a delay control circuit 648 specifies the magnitude of a delay to be produced by the delay circuit 643. Thus, the writing data Write-Data is phased with the clock R/W-CLK that is the writing clock.

As described so far, according to the present invention, a signal output from an actual circuit is compared with an external clock, and a magnitude of a delay is adjusted so that the output signal has a given phase relationship relative to the external clock. Despite a difference in characteristic of one semiconductor device from another, a change in temperature, a fluctuation in supply voltage, or the like, the phase relationship of the output signal relative to the external clock can be retained accurately at a given value.

Furthermore, a dummy input circuit and dummy output circuit are included. A signal to be compared with the external clock is a signal resembling the actual output signal. The phase of the output signal can be adjusted accurately.

Furthermore, the phase of rising output data and the phase of falling output data are adjusted. A phase error from the external clock can be minimized.

Furthermore, even when a dummy circuit is manufactured to be analogous to a circuit actually in charge of output, there is a difference between the dummy circuit and the actual output circuit. Moreover, a load actually connected to an output terminal is unpredictable. It is unavoidable that an anticipated dummy load becomes different from the actual load. Such a difference leads to an error in adjusted phase. According to the present invention, the error is taken into account in adjusting the phase of an output. The error can therefore be further reduced.

Furthermore, even when the amplitude or waveform of an external clock is different from that of an output of a dummy output circuit, the phase of the output can be accurately set to a given phase.

Using such a semiconductor device, a semiconductor system capable of operating at a high speed can be realized.

What is claimed is:

1. A semiconductor device operating synchronously with an external clock, comprising:

a data output circuit for outputting an output data according to an output timing signal so that the data output circuit outputs the output data synchronously with only one of a rising edge and a falling edge of the external clock;

a data input circuit for fetching an input data according to an input timing signal so that the data input circuit fetches the input data synchronously with only the other of the rising edge and the falling edge of the external clock; and a timing signal generation circuit including:
   a delay circuit for delaying the external clock and outputting the output timing signal; and
   a timing comparison circuit having input nodes, which is coupled to receive the output timing signal and the external clock, for comparing phases at the input nodes, wherein a delay time of the delay circuit, which is changed by a comparison result at the timing comparison circuit, is controlled so that an output timing of the output data from the data output circuit is synchronized with only the one of the rising edge and the falling edge of the external clock.

* * * * *